US012568796B2

(12) United States Patent
Prasad et al.

(10) Patent No.: US 12,568,796 B2
(45) Date of Patent: Mar. 3, 2026

(54) SEMICONDUCTOR PROCESS EQUIPMENT

(71) Applicant: Applied Materials, Inc., Santa Clara, CA (US)

(72) Inventors: Bhaskar Prasad, Jamshedpur (IN); Kirankumar Neelasandra Savandaiah, Bangalore (IN); Thomas Brezoczky, Los Gatos, CA (US); Lakshmikanth Krishnamurthy Shirahatti, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 418 days.

(21) Appl. No.: 18/141,926

(22) Filed: May 1, 2023

(65) Prior Publication Data

US 2024/0153801 A1 May 9, 2024

Related U.S. Application Data

(60) Provisional application No. 63/423,350, filed on Nov. 7, 2022.

(51) Int. Cl.
H01L 21/677 (2006.01)
H01J 37/32 (2006.01)
(Continued)

(52) U.S. Cl.
CPC .. H01L 21/67709 (2013.01); H01J 37/32733 (2013.01); H01L 21/67201 (2013.01); (Continued)

(58) Field of Classification Search
CPC ............. H01L 21/677; H01L 21/67709; H01L 21/67706; H01L 21/67712; H01L 21/6773; H01L 21/67742
See application file for complete search history.

(56) References Cited

U.S. PATENT DOCUMENTS 5,180,048 A    1/1993  Kawada et al.
5,569,350 A    10/1996  Osada et al.
(Continued)

FOREIGN PATENT DOCUMENTS

CN    101158852 A    4/2008
CN    111321377 A    6/2020
(Continued)

OTHER PUBLICATIONS

U.S. Appl. No. 18/081,493, filed Dec. 14, 2022.
(Continued)

*Primary Examiner* — Kaitlin S Joerger
(74) *Attorney, Agent, or Firm* — Patterson + Sheridan, LLP

(57) ABSTRACT

A substrate process station includes a housing including a transport region and process region. The process station further includes a magnetic levitation assembly disposed in the transport region configured to levitate and propel a substrate carrier. The magnetic levitation assembly includes a first track segment including first rails disposed in the transport region and below the process region, wherein the first rails each include a first plurality of magnets. The process station further includes a pedestal assembly comprising a pedestal disposed within the housing. The pedestal is moveable between a pedestal transfer position and a process position, wherein the pedestal is disposed between the first rails in the pedestal transfer position to receive a substrate from the substrate carrier, and wherein the pedestal is moveable between the first rails to position the received substrate in the process region in the process position.

18 Claims, 62 Drawing Sheets

(51) Int. Cl.
| | |
|---|---|
| *H01L 21/67* | (2006.01) |
| *H01L 21/683* | (2006.01) |
| *H01L 21/687* | (2006.01) |

(52) U.S. Cl.
CPC ...... *H01L 21/677* (2013.01); *H01L 21/67706* (2013.01); *H01L 21/67712* (2013.01); *H01L 21/6773* (2013.01); *H01L 21/67742* (2013.01); *H01L 21/67748* (2013.01); *H01L 21/6838* (2013.01); *H01L 21/68742* (2013.01); *H01L 21/68785* (2013.01)

(56) References Cited

U.S. PATENT DOCUMENTS

| | | | | |
|---|---|---|---|---|
| 5,641,054 | A * | 6/1997 | Mori | H01L 21/67184 |
| | | | | 198/465.1 |
| 6,157,106 | A | 12/2000 | Tietz et al. | |
| 6,206,176 | B1 | 3/2001 | Blonigan et al. | |
| 6,231,716 | B1 | 5/2001 | White et al. | |
| 7,293,950 | B2 * | 11/2007 | Bonora | H01L 21/67778 |
| | | | | 104/282 |
| 7,438,175 | B2 | 10/2008 | White et al. | |
| 7,841,820 | B2 | 11/2010 | Bonora et al. | |
| 7,948,122 | B2 | 5/2011 | Compter et al. | |
| 7,964,038 | B2 | 6/2011 | Patalay et al. | |
| 7,994,486 | B2 | 8/2011 | Smick et al. | |
| 8,104,951 | B2 | 1/2012 | Aderhold et al. | |
| 8,851,817 | B2 | 10/2014 | Bonora et al. | |
| 9,390,950 | B2 | 7/2016 | Sorabji et al. | |
| 9,588,443 | B2 | 3/2017 | Shibazaki | |
| 9,964,863 | B1 | 5/2018 | Babayan et al. | |
| 10,204,810 | B2 | 2/2019 | Hoey et al. | |
| 10,236,197 | B2 | 3/2019 | Janakiraman et al. | |
| 10,256,124 | B2 * | 4/2019 | Mooring | H01L 21/67161 |
| 10,262,887 | B2 | 4/2019 | Hao et al. | |
| 10,283,397 | B2 | 5/2019 | Willwerth et al. | |
| 10,460,977 | B2 | 10/2019 | Breninger et al. | |
| 10,483,141 | B2 | 11/2019 | Janakiraman et al. | |
| 10,490,436 | B2 | 11/2019 | Ghosh et al. | |
| 10,734,265 | B2 | 8/2020 | Janakiraman et al. | |
| 10,770,337 | B2 | 9/2020 | Lee et al. | |
| 10,784,142 | B2 | 9/2020 | Marcelynas et al. | |
| 10,851,453 | B2 | 12/2020 | Tsai et al. | |
| 10,892,180 | B2 | 1/2021 | Chia et al. | |
| 11,232,965 | B2 | 1/2022 | Newman et al. | |
| 11,377,310 | B2 | 7/2022 | Aust et al. | |
| 11,508,595 | B2 | 11/2022 | Aust et al. | |
| 11,527,424 | B2 | 12/2022 | Berger et al. | |
| 2002/0018842 | A1 | 2/2002 | Dunlow | |
| 2002/0034883 | A1 | 3/2002 | Klein et al. | |
| 2002/0108842 | A1 | 8/2002 | Bonora et al. | |
| 2003/0178145 | A1 | 9/2003 | Anderson et al. | |
| 2003/0219977 | A1 | 11/2003 | Pomarede et al. | |
| 2004/0005211 | A1 | 1/2004 | Lowrance et al. | |
| 2004/0023495 | A1 | 2/2004 | Butterfield et al. | |
| 2004/0058293 | A1 | 3/2004 | Nguyen et al. | |
| 2004/0255442 | A1 | 12/2004 | McDiarmid et al. | |
| 2006/0102078 | A1 | 5/2006 | Fairbairn et al. | |
| 2006/0156981 | A1 | 7/2006 | Fondurulia et al. | |
| 2006/0283688 | A1 * | 12/2006 | Blonigan | H01L 21/67709 |
| | | | | 198/369.6 |
| 2007/0009652 | A1 * | 1/2007 | Manz | C23C 14/20 |
| | | | | 430/311 |
| 2007/0160507 | A1 | 7/2007 | Satoh et al. | |
| 2007/0269297 | A1 | 11/2007 | Meulen et al. | |
| 2008/0175694 | A1 | 7/2008 | Park et al. | |
| 2008/0232947 | A1 | 9/2008 | van der Meulen et al. | |
| 2008/0266037 | A1 | 10/2008 | Williams | |
| 2009/0314211 | A1 | 12/2009 | Du Bois et al. | |
| 2010/0062592 | A1 | 3/2010 | Clark | |
| 2010/0136773 | A1 | 6/2010 | Akae et al. | |
| 2010/0226737 | A1 | 9/2010 | Sakaue et al. | |
| 2011/0312189 | A1 | 12/2011 | Kim et al. | |
| 2012/0109355 | A1 | 5/2012 | Baccini et al. | |
| 2012/0213614 | A1 | 8/2012 | Bonora et al. | |
| 2012/0249291 | A1 | 10/2012 | Holcomb et al. | |
| 2013/0171757 | A1 | 7/2013 | Ponnekanti et al. | |
| 2014/0020629 | A1 | 1/2014 | Tsai et al. | |
| 2015/0114823 | A1 | 4/2015 | Lee et al. | |
| 2017/0250379 | A1 * | 8/2017 | Verplancken | C23C 14/243 |
| 2017/0331359 | A1 * | 11/2017 | Paweletz | H02K 41/031 |
| 2018/0339816 | A1 | 11/2018 | Oldendorf et al. | |
| 2018/0374732 | A1 | 12/2018 | Klein et al. | |
| 2019/0348264 | A1 | 11/2019 | Tsai et al. | |
| 2020/0026060 | A1 | 1/2020 | Takato | |
| 2020/0232088 | A1 | 7/2020 | White et al. | |
| 2020/0262060 | A1 | 8/2020 | Hosek et al. | |
| 2020/0262660 | A1 | 8/2020 | Hosek et al. | |
| 2020/0381276 | A1 | 12/2020 | Yedla et al. | |
| 2021/0024929 | A1 | 1/2021 | Yokota et al. | |
| 2021/0249291 | A1 * | 8/2021 | Raatz | B65G 54/02 |
| 2021/0265188 | A1 * | 8/2021 | Moura | G05D 3/125 |
| 2021/0296150 | A1 | 9/2021 | Berger et al. | |
| 2021/0328146 | A1 | 10/2021 | Heymanns et al. | |
| 2021/0354934 | A1 | 11/2021 | Aust et al. | |
| 2022/0003718 | A1 | 1/2022 | Watanabe | |
| 2022/0013383 | A1 | 1/2022 | Savandaiah et al. | |
| 2022/0037181 | A1 | 2/2022 | Hatano et al. | |
| 2022/0130700 | A1 | 4/2022 | Newman et al. | |
| 2022/0208426 | A1 | 6/2022 | Aust et al. | |
| 2022/0285179 | A1 * | 9/2022 | Chung | H01L 21/67173 |
| 2022/0293451 | A1 | 9/2022 | Sulyman et al. | |
| 2022/0293452 | A1 | 9/2022 | Sulyman et al. | |
| 2022/0301921 | A1 * | 9/2022 | Shindo | H01L 21/67167 |
| 2022/0336258 | A1 | 10/2022 | Srivastava et al. | |
| 2022/0393618 | A1 | 12/2022 | Aust et al. | |
| 2022/0415635 | A1 | 12/2022 | Yedla et al. | |
| 2022/0415687 | A1 | 12/2022 | Hatano et al. | |
| 2022/0415688 | A1 | 12/2022 | Hatano et al. | |
| 2023/0055201 | A1 * | 2/2023 | Ehmann | B65G 49/061 |
| 2023/0085667 | A1 * | 3/2023 | Hudgens | H01L 21/67196 |
| | | | | 414/800 |
| 2023/0132174 | A1 | 4/2023 | Thanu et al. | |
| 2024/0153803 | A1 * | 5/2024 | Prasad | C23C 14/56 |
| 2024/0363382 | A1 * | 10/2024 | Oldendorf | H01L 21/67173 |

FOREIGN PATENT DOCUMENTS

| | | |
|---|---|---|
| CN | 113707585 A | 11/2021 |
| DE | 102018006259 A1 | 12/2019 |
| EP | 1681261 A1 | 7/2006 |
| EP | 4222779 A1 | 8/2023 |
| JP | 62121134 A | 6/1987 |
| JP | H06324297 A | 11/1994 |
| KR | 10-20210081597 A | 7/2021 |
| KR | 1020220099611 A | 7/2022 |
| TW | 202141675 A | 11/2021 |
| WO | 2008077048 A2 | 6/2008 |
| WO | 2011102410 A1 | 8/2011 |
| WO | 2015007385 A1 | 1/2015 |
| WO | 2015043712 A1 | 4/2015 |
| WO | 2015140155 A1 | 9/2015 |
| WO | 2015158725 A1 | 10/2015 |
| WO | 2015162177 A1 | 10/2015 |
| WO | 2015189263 A1 | 12/2015 |
| WO | 2016162288 A1 | 10/2016 |
| WO | 2019037858 A1 | 2/2019 |
| WO | 2019052657 A1 | 3/2019 |
| WO | 2019145035 A1 | 8/2019 |
| WO | 2019238416 A1 | 12/2019 |
| WO | 2020126040 A1 | 6/2020 |
| WO | 2020192911 A1 | 10/2020 |
| WO | 2021106796 A1 | 6/2021 |
| WO | 2021106799 A1 | 6/2021 |
| WO | 2021223843 A1 | 11/2021 |
| WO | 2022044834 A1 | 3/2022 |
| WO | 2022072075 A1 | 4/2022 |

OTHER PUBLICATIONS

International Search Report/ Written Opinion issued to PCT/US2023/079455 on Mar. 6, 2024.

(56) References Cited

OTHER PUBLICATIONS

Yu et al.; Controller design and implementation of six-degree-of-freedom magnetically levitated positioning system with high precision; Proc. IMechE vol. 222 Part I: J. Systems and Control Engineering; 12 pages.

Zhu et al; Design and Control of a Six Degrees-of-Freedom Magnetically Levitated Positioning System; IFAC PapersOnLine 49-21 (2016) pp. 127-132.

Temposonics; Sensor Selector Guide; Retrieved from the Internet at: <https://www.temposonics.com/docs/temposonicslibraries/literature/sensor_selector_guide_industrial_551814_en.pdf?sfvrsn=5fde8874_12>; 21 pages.

Linear Motion Tips; How do Magnettostrictive sensors work ?; Retrieved from the Internet at: <https://www.linearmotiontips.com/how-do-magnetostrictive-sensors-work/> 9 Pages.

International Search Report and Written Opinion in related application PCT/US2023/035709 dated Feb. 5, 2024.

* cited by examiner

2600

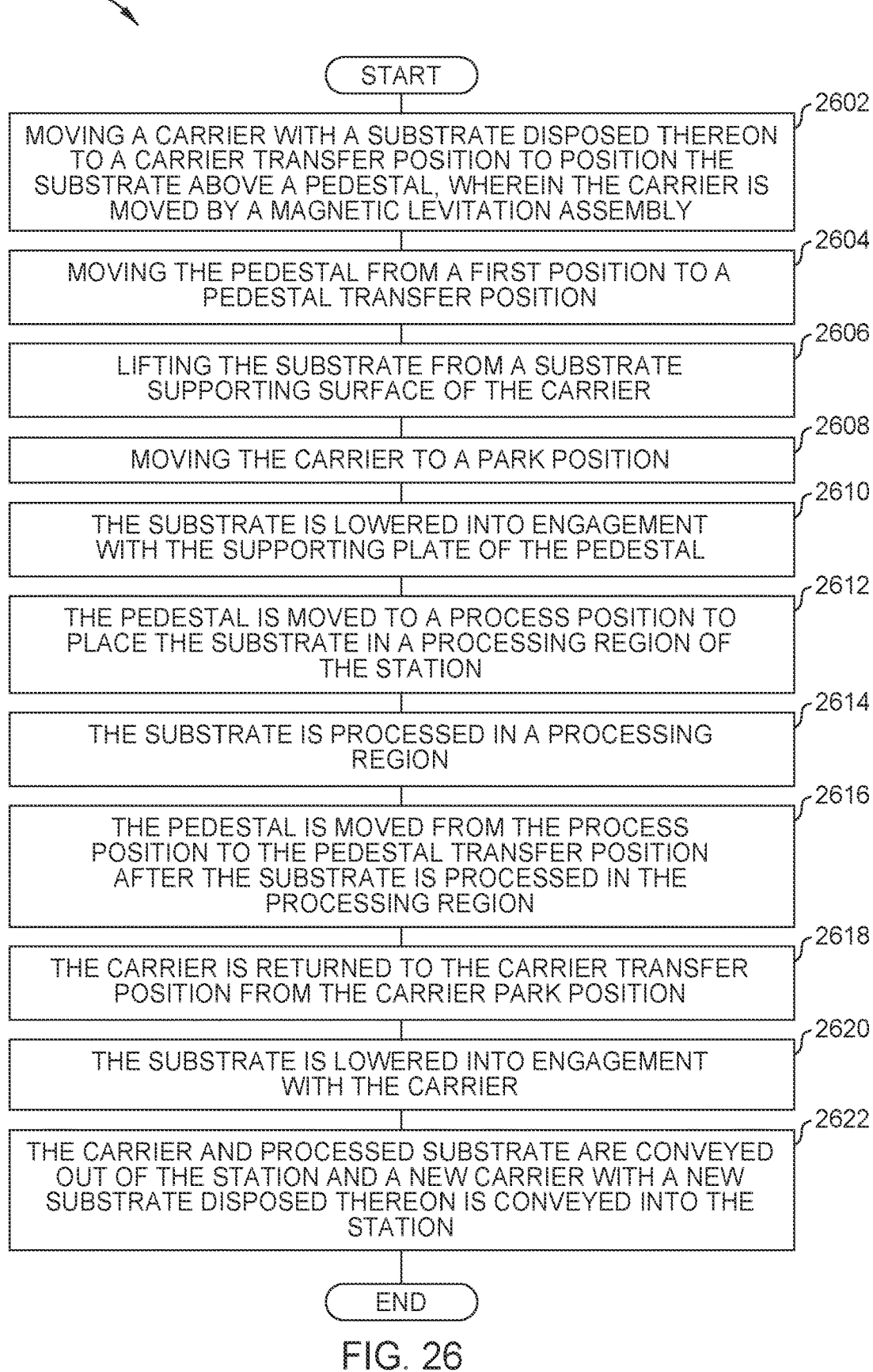

START

2602
MOVING A CARRIER WITH A SUBSTRATE DISPOSED THEREON TO A CARRIER TRANSFER POSITION TO POSITION THE SUBSTRATE ABOVE A PEDESTAL, WHEREIN THE CARRIER IS MOVED BY A MAGNETIC LEVITATION ASSEMBLY

2604
MOVING THE PEDESTAL FROM A FIRST POSITION TO A PEDESTAL TRANSFER POSITION

2606
LIFTING THE SUBSTRATE FROM A SUBSTRATE SUPPORTING SURFACE OF THE CARRIER

2608
MOVING THE CARRIER TO A PARK POSITION

2610
THE SUBSTRATE IS LOWERED INTO ENGAGEMENT WITH THE SUPPORTING PLATE OF THE PEDESTAL

2612
THE PEDESTAL IS MOVED TO A PROCESS POSITION TO PLACE THE SUBSTRATE IN A PROCESSING REGION OF THE STATION

2614
THE SUBSTRATE IS PROCESSED IN A PROCESSING REGION

2616
THE PEDESTAL IS MOVED FROM THE PROCESS POSITION TO THE PEDESTAL TRANSFER POSITION AFTER THE SUBSTRATE IS PROCESSED IN THE PROCESSING REGION

2618
THE CARRIER IS RETURNED TO THE CARRIER TRANSFER POSITION FROM THE CARRIER PARK POSITION

2620
THE SUBSTRATE IS LOWERED INTO ENGAGEMENT WITH THE CARRIER

2622
THE CARRIER AND PROCESSED SUBSTRATE ARE CONVEYED OUT OF THE STATION AND A NEW CARRIER WITH A NEW SUBSTRATE DISPOSED THEREON IS CONVEYED INTO THE STATION

END

FIG. 26

SEMICONDUCTOR PROCESS EQUIPMENT

CROSS-REFERENCE TO RELATED APPLICATIONS

This application claims the benefit of U.S. Prov. Pat. App. No. 63/423,350, entitled "Semiconductor Process Equipment," filed Nov. 7, 2022. The aforementioned application is herein incorporated by reference in its entirety.

BACKGROUND

Field

Embodiments disclosed herein generally relate to semiconductor process equipment used to convey semiconductor substrates.

Description of Related Art

Semiconductor devices are typically formed on semiconductor substrates using numerous process chambers, where each process chamber is used to complete one or more of the various steps (e.g., depositions) to form the semiconductor devices, such as a memory chip. Substrate transfer systems are typically used to move the substrates between each of the process chambers. The process chambers as well as the substrate transfer system can each be held at vacuum. Two common arrangements used for substrate transfer systems include a cluster arrangement and a linear arrangement.

A substrate transfer system using a cluster arrangement includes a central region surrounded by the different process chambers. The central region can be connected to a load lock chamber in order to maintain the vacuum environment within the substrate transfer system when the substrates are supplied and removed from the substrate transfer system. The central region, or transfer chamber, also typically includes a fixed robot that rotates about a central axis to move substrates to and from the load lock chamber as well as between the process chambers. These conventional robots are often limited to only transferring one or two substrates at a time and can cause the footprint of the central region to be large, due to the need for the robot to rotate and extend into the process chambers without the robots arms interfering with the walls of the central region chamber in which the robot resides. These types of conventional robots can also be a source of particles, which is undesirable.

A substrate transfer system using a linear arrangement typically includes a conveyor having a rectangular top surface with process chambers on one side or opposing sides of the conveyor. The conveyor can be connected to a load lock chamber in order to maintain the vacuum environment within the substrate transfer system when the substrates are supplied and removed from the substrate transfer system. One or more robots that can be positioned near each of the process chambers to transfer the substrates between the conveyor and the process chambers. The conveyors used in these linear substrate transfer systems can be a source of particle generation, and require regular and involved maintenance activities to assure that the conveyor is performing correctly. Furthermore, the conveyor can only be moved in one direction at a time, which can limit the movement of the substrates on the conveyor reducing throughput.

Therefore, there is a need for improved substrate transfer systems that have reduced particle generation and footprint as well as increased throughput.

SUMMARY

The present disclosure generally relates to substrate processing equipment, including the conveyance of carrier with object disposed thereon into a station by a magnetic levitation assembly and the transfer of the object from the carrier to a pedestal.

In one embodiment, a substrate process station includes a housing including a transport region and process region. The process station further includes a magnetic levitation assembly disposed in the transport region configured to levitate and propel a substrate carrier. The magnetic levitation assembly includes a first track segment including first rails disposed in the transport region and below the process region, wherein the first rails each include a first plurality of magnets. The process station further includes a pedestal assembly comprising a pedestal disposed within the housing. The pedestal is moveable between a pedestal transfer position and a process position, wherein the pedestal is disposed between the first rails in the pedestal transfer position to receive a substrate from the substrate carrier, and wherein the pedestal is moveable between the first rails to position the received substrate in the process region in the process position.

In one embodiment, a method of processing a substrate within a substrate process station includes moving a carrier with a substrate disposed thereon to a carrier transfer position within the substrate process station to position the substrate above a pedestal. The carrier is moved by a magnetic levitation assembly disposed within the substrate process station. The method further includes moving the pedestal from a first position to a pedestal transfer position beneath the substrate. The method further includes extending lift pins to raise the substrate from a substrate supporting surface of the carrier. The method further includes moving the carrier to a park position within the substrate process station using the magnetic levitation assembly. The method further includes retracting the lift pins to lower the substrate onto a substrate supporting surface of the pedestal. The method further includes moving the pedestal to a process position to place the substrate in a process region of the substrate process station. The method further includes processing the substrate in the process region.

In one embodiment, a substrate process station includes a housing including a transport region and process region. The process station further includes a source assembly. The process station further includes a magnetic levitation assembly disposed in the transport region. The magnetic levitation assembly includes a first track segment including a first plurality of electromagnets, and a second track segment including a second plurality of electromagnets. The process station further includes a pedestal assembly comprising a pedestal disposed within the housing, an actuator assembly, and lift pins. The process station further includes a controller comprising a non-transitory computer-readable medium comprising instructions that when executed by one or more processors in the controller cause the substrate process station to conduct an operation. The operation includes activating one or more of the first plurality of electromagnets to move a carrier with a substrate disposed thereon to a carrier transfer position above the pedestal. The operation further includes actuating the actuator assembly to move the pedestal from a first position to a pedestal transfer position beneath the substrate disposed on the carrier. The operation further includes extending the lift pins to disengage the substrate from the carrier. The operation further includes activating one or more of the first plurality of electromagnets and one or more of the second plurality of electromagnets to move the carrier from the carrier transfer position to a carrier park position within the substrate process station. The operation further includes retracting the lift pins to place the substrate on a surface of the pedestal. The operation further includes actuating the actuator assembly to move the pedestal to a process position to place the substrate in the process region. The operation further includes operating the source assembly to process the substrate within the process region.

In one embodiment, a substrate process station includes a housing including a transport region and process region. The process station further includes a magnetic levitation assembly disposed in the transport region configured to levitate and propel a carrier. The magnetic levitation assembly includes a first track segment including first rails disposed in the transport region and below the process region, wherein the first rails each include a first plurality of magnets. The process station further includes a pedestal assembly comprising a pedestal disposed within the housing, the pedestal moveable between a pedestal transfer position and a process position, wherein the pedestal is disposed between the first rails in the pedestal transfer position to receive an object from the carrier, and wherein the pedestal is moveable between the first rails.

In one embodiment, a method of transferring an object within a substrate process station includes moving a carrier with an object disposed thereon to a carrier transfer position within the substrate process station to position the object above a pedestal. The carrier is moved by a magnetic levitation assembly disposed within the substrate process station. The method further includes moving the pedestal from a first position to a pedestal transfer position beneath the substrate. The method further includes extending lift pins to raise the object from a supporting surface of the carrier. The method further includes moving the carrier to a park position within the substrate process station using the magnetic levitation assembly. The method further includes retracting the lift pins to lower the object onto a supporting surface of the pedestal. The method further includes moving the pedestal to a process position.

In one embodiment, a substrate station includes a housing including a transport region. The substrate station further includes a magnetic levitation assembly disposed in the transport region configured to levitate and propel a substrate carrier. The magnetic levitation assembly includes a first track segment including first rails and second rails. The magnetic levitation assembly further includes a first actuator attached to each first rail, wherein each first actuator is configured to move the corresponding first rail between a first upper position and a first lower position relative to the housing. The magnetic levitation assembly further includes a second actuator attached to each second rail, wherein each second actuator is configured to move the corresponding second rail between a second upper position and a second lower position relative to the housing.

In one embodiment, a substrate station includes a housing including a transport region. The substrate station further includes a magnetic levitation assembly disposed in the transport region configured to levitate and propel a substrate carrier. The magnetic levitation assembly includes a first magnetic track segment configured to propel the carrier within the transport region in a first axial direction, wherein the first track segment is rotatable relative to the housing to propel the carrier within the transport region in a second axial direction.

In one embodiment, a substrate station includes a housing including a transport region. The substrate station further includes a first track segment disposed in the transport region. The first track segment includes a pair of first rails, each first rail including a plurality of first electromagnets configured to convey a substrate carrier in a first axial direction and a plurality of first permanent magnets configured to levitate the substrate carrier. The first track segment further includes a pair of second rails perpendicular to the pair of first rails, wherein each second rail includes a plurality of second electromagnets configured to convey the substrate carrier in a second axial direction and a plurality of second permanent magnets configured to levitate the substrate carrier.

In one embodiment, a substrate processing system including at least one processing line. The at least one processing line includes a first station, a second station, a third station, and a fourth station that each include a first magnetic levitation assembly configured to change an axial direction of travel of a substrate carrier from a first axial direction of travel to a second axial direction of travel. The at least one processing line further includes at least one substrate process station positioned between the second station and the third station, wherein the at least one substrate process station comprises a second magnetic levitation assembly configured to move the substrate carrier.

In one embodiment, a substrate processing system includes a first processing line including a first process station arrangement including a plurality of first process stations including magnetic rails configured to move a first carrier in a first axial direction. The substrate processing system further includes a second processing line including a second process station arrangement including a plurality of second process stations including second magnetic rails configured to move a second carrier in the first axial direction. The substrate processing system further includes a central arrangement of stations shared by the first processing line and the second processing line and disposed between the first process station arrangement and the second process station arrangement. The central arrangement of stations includes a plurality of stations including a magnetic levitation assembly configured to move the first and second carriers in the first axial direction and configured to move the first and second carriers in a second axial direction.

In one embodiment, a substrate processing system including a first plurality of stations in a linear arrangement. A substrate carrier is conveyable through the first plurality of stations in a first linear direction of travel along a first conveyance plane along a plurality of magnetic rails. The substrate carrier is moveable between positions along the first linear direction within each first plurality of stations by the magnetic rails. The at least one of the plurality of stations comprises a housing including a transport region and process region, wherein at least two of the plurality of magnetic rails are disposed in the transport region and are configured to levitate and propel the substrate carrier. The at least one of the plurality of stations further comprises a pedestal assembly comprising a pedestal disposed within the housing, the pedestal moveable between a substrate loading position and a process position.

In one embodiment, a substrate process station includes a housing including a transport region and a first process region. The substrate process station further includes a first magnetic levitation assembly disposed in the transport region configured to levitate and propel a first carrier, the first magnetic levitation assembly including a first pair of magnetic rails disposed in the transport region and below the first process region. The substrate process station further includes a second magnetic levitation assembly disposed in the transport region below the first magnetic levitation assembly and configured to levitate and propel a second carrier, the second magnetic levitation assembly including a second pair of magnetic rails. The substrate process station further includes a first pedestal disposed within the housing. The first pedestal moveable between a pedestal transfer position and a process position, wherein the first pedestal is disposed between the first rails and second rails in the pedestal transfer position to receive a first substrate from the first carrier. Wherein the first pedestal is raised between the first rails and second rails to position the received first substrate in the first process region in the process position.

In one embodiment, a substrate processing system includes an arrangement of stations including a plurality of stations, each station including a first magnetic levitation assembly and a second magnetic levitation assembly disposed in a transport region of the station. The first magnetic levitation assemblies are aligned to convey a first carrier along a first conveyance plane. The second magnetic levitation assemblies are aligned to convey the first carrier along a second conveyance plane. The substrate processing system further includes a first lift station and a second lift station located at opposing ends of the arrangement of stations, wherein the first and second lift stations are configured to move the first carrier between the first conveyance plane and the second conveyance plane.

In one embodiment, a method of operating a substrate support system includes transferring a first substrate from a first carrier onto a first pedestal in a first station. The method further includes processing the first substrate in the first station while disposed on the first pedestal. The method further includes transferring the first substrate onto the first carrier from the first pedestal. The method further includes conveying the first carrier with the first substrate disposed thereon into a second station along a first conveyance plane, wherein the first carrier is conveyed using a first magnetic levitation assembly disposed in a transport region of both the first and second stations. The method further includes conveying a second carrier with a second substrate disposed thereon from the second station to the first station along a second conveyance plane, wherein the second carrier is conveyed using a second magnetic levitation assembly disposed in the transport region of both the first and second stations.

In one embodiment, a shutter station includes a housing including a transport region. The shutter station further includes a first magnetic levitation assembly disposed in the transport region configured to levitate and propel a first carrier. The shutter station further includes a shutter garage coupled to the housing. The shutter station further includes an arm moveable from a first position to a second position, wherein a substrate supported on the arm is disposed in the shutter garage when the arm is in the first position. The shutter station further includes a pedestal disposed within the transport region and moveable to a transfer position to receive a shutter disk disposed on the arm in the second position, wherein the shutter disk is disposed above the pedestal when the arm is in the second position.

In one embodiment, a shutter station includes a housing including a transport region. The shutter station further includes a first magnetic levitation assembly disposed in the transport region configured to levitate and propel a first carrier between a park position and a carrier transfer position. The shutter station further includes a shutter assembly. The shutter assembly includes a shutter carriage including a first support member configured to support a first shutter disk. The shutter assembly further includes an actuation assembly configured to move the shutter carriage within the housing. The shutter carriage is moveable from a first position to a second position to place the first shutter disk in a first shutter transfer position above the first carrier. The shutter carriage is moveable from the second position to a third position while first carrier is in the park position to engage the first shutter disk with first carrier and to disengage the first shutter disk from the first support member.

In one embodiment, a method of transferring a shutter to a carrier includes moving an arm with a shutter disk disposed thereon from a first position to a second position to place the shutter disk above a pedestal. The method further includes extending a plurality of lift pins coupled to the pedestal into a recess of the arm to engage the shutter disk and to disengage the shutter disk from the arm. The method further includes moving the arm to the first position after the shutter disk is disengaged from the arm. The method further includes retracting the plurality of lift pins to engage the shutter disk with the carrier levitated above a magnetic levitation assembly.

In one embodiment, a station includes a housing including a transport region and a process region. The station further includes a first carrier. The first carrier includes a base including a plurality of first magnets and a port formed in the base. The first carrier further includes a plurality of substrate support assemblies coupled to the base. Each support assembly includes a second magnet and a support member attached to the second magnet, wherein the support member is moveable between an extended and retracted position relative to the base. The station further includes a first magnetic levitation assembly disposed in the transport region including a plurality of third magnets configured to interact with the plurality of first magnets to levitate and propel the first carrier. The magnetic levitation assembly further includes a fourth magnet for each substrate support assembly to selectively interact with the second magnet to move the support member to the retracted position. The station includes a pedestal assembly disposed in the transport region, wherein the pedestal is extendable through the port to a process position.

In one embodiment, a carrier includes a base, a plurality of first magnets arranged about edges of the base, and a port formed in the base. The carrier further includes a plurality of substrate support assemblies coupled to the base. Each support assembly includes a second magnet and a support member attached to the second magnet, wherein the support member is moveable between an extended and retracted position relative to the base. Each support member is configured to support a substrate in the extended position.

In one embodiment, a method of operating a station includes positioning a carrier above a pedestal with a magnetic levitation assembly, wherein a substrate is engaged with a plurality of support members in an extended position. The method further includes extending a plurality of lift pins coupled to the pedestal to disengage the substrate from the plurality of support members. The method further includes activating a plurality of first electromagnets of the magnetic levitation assembly to move the plurality of support members to a retracted position. The method further includes moving the pedestal through a port formed in the carrier to a process position to position the substrate in a process region of the station.

BRIEF DESCRIPTION OF THE DRAWINGS

So that the manner in which the above recited aspects are attained and can be understood in detail, a more particular description of embodiments described herein, briefly summarized above, may be had by reference to the appended drawings.

It is to be noted, however, that the appended drawings illustrate typical embodiments and are therefore not to be considered limiting; other equally effective embodiments are contemplated.

FIG. 100 is a top view of a substrate processing system with, according to one embodiment.

FIG. 248 is a bottom view of a carrier.

FIG. 26 is a flowchart of a method of moving a substrate.

DETAILED DESCRIPTION

The present disclosure relates generally to semiconductor process equipment used to transfer semiconductor substrates between process stations. More specifically, embodiments disclosed herein are related to systems used to transfer semiconductor substrates between process stations using a transport device that employs one or more magnetic levitation elements.

Using magnetic levitation to transport substrates between process chambers offers a number of advantages, First, magnetic levitation enables designs with reduced footprint, because robots, which are typically used to transfer the substrates into and out of the process chambers, are removed in some embodiments. Reducing the footprint of a substrate processing system can reduce the capital costs of a substrate processing system, as well as the operating and maintenance costs of the system and reduce the costs associated with the foot-print that the tool takes up in a semiconductor fab.

Using magnetic levitation to transport substrates generates fewer particles and less contamination as compared to mechanical systems that have moving parts and vacuum compatible greases, which can generate particles and outgas in a vacuum environment. For example, the movement of a central conveyor to transport substrates between process chambers can generate particles from the motion of the conveyor relative to its supporting components and from the contact between a substrate and the conveyor. The generated particles and contamination can negatively affect product quality and in some cases reduce production yield.

Using magnetic levitation to transport the substrate between stations increases the throughput of a substrate processing system. In conventional substrate processing systems, the substrate is transferred to and from processing chambers by one or more robotic arms. For example, a substrate may be picked up by a first robotic arm from a load lock, transferred from the first robotic arm to a second robotic arm, and then placed in a chamber, such as a process chamber, by the second robotic arm. Each transfer of the substrate takes time that could be used to process the substrate. As a result, each transfer increases the amount of time necessary to process the substrate. Conveying the substrate between stations of a substrate processing system by magnetic levitation eliminates the robotic arms. Additionally, the amount of time to convey the substrate between stations by magnetic levitation is significantly less than the amount of time to transfer the substrate by robotic arms. It is believed that magnetic levitation can be used to increase throughput of a substrate processing system by up to or more than 50%.

Figure 1A:
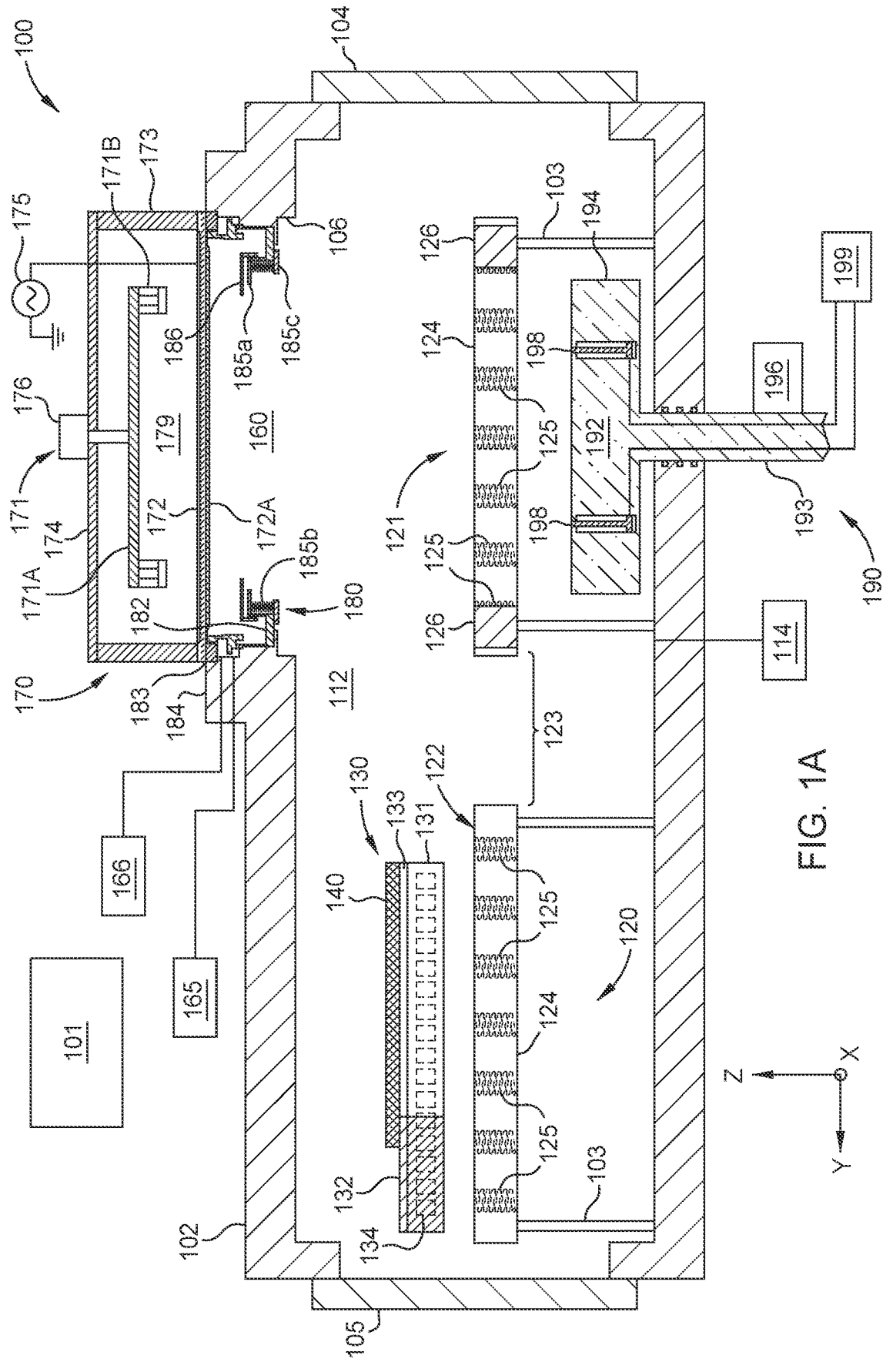
FIG. 1A is a side cross-sectional view of a process station with a carrier levitated above magnetic levitation rails disposed therein, according to one embodiment.

FIGS. 1A-1I illustrate an exemplary process station 100 that can be used to process a substrate. An X-Y-Z coordinate system is included in FIGS. 1A-1I to illustrate the axial direction of travel of components of the process station 100 and a carrier 130 being conveyed within the process station 100. FIG. 1A illustrates a cross-sectional view of the process station 100. As shown in FIG. 1A, the process station 100 includes a housing 102, a first slit valve 104, a second slit valve 105, a magnetic levitation assembly 120, a source assembly 170, a process kit assembly 180, and a pedestal assembly 190. A controller 101 is in communication with the process station 100 and controls the one or more components of the process station 100. An opening 106 is formed in an upper wall of the housing 102 between the magnetic levitation assembly 120 and the source assembly 170.

A transport region 112 is formed within the housing 102. The transport region 112 has sufficient dimensions such that the magnetic levitation assembly 120 disposed therein can levitate the carrier 130 without contacting a wall of the housing 102. The transport region 112 extends from the first slit valve 104 to the second slit valve 105.

The magnetic levitation assembly 120 is disposed within the transport region 112 formed within one or more walls of the housing 102. The first slit valve 104 and the second slit valve 105 are disposed on both ends of the transport region 112. The slit valves 104, 105 are selectively opened to allow the carrier 130 to enter or exit the process station 100. The slit valves 104, 105 are also selectively closed to isolate the process station 100 from an outside environment and/or another station. The transport region 112 may be in communication with a vacuum pump 114 to evacuate the transport region 112. For example, the vacuum pump 114 may reduce the pressure within the transport region 112 to a sub-atmospheric pressure on the order of about $10^{-3}$ torr. The vacuum pump 114 may be a turbopump, cryopump, roughing pump or other useful device that is able to maintain a desired pressure within the transport region 112.

Figure 1B:
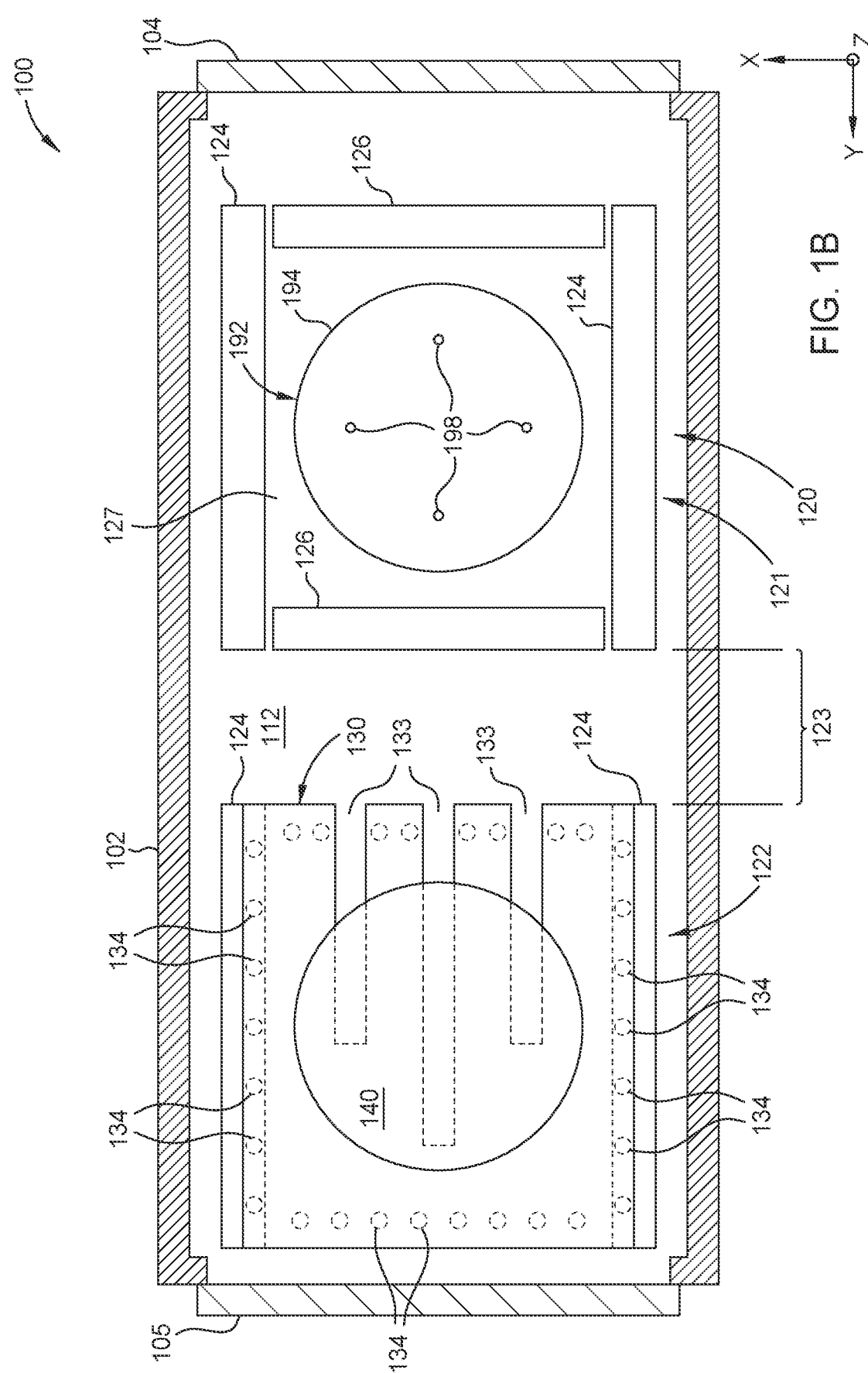
FIG. 1B is a top cross-sectional view of a process station with a carrier levitated above magnetic levitation rails disposed therein, according to the embodiment of FIG. 1A.
Figure 1C:
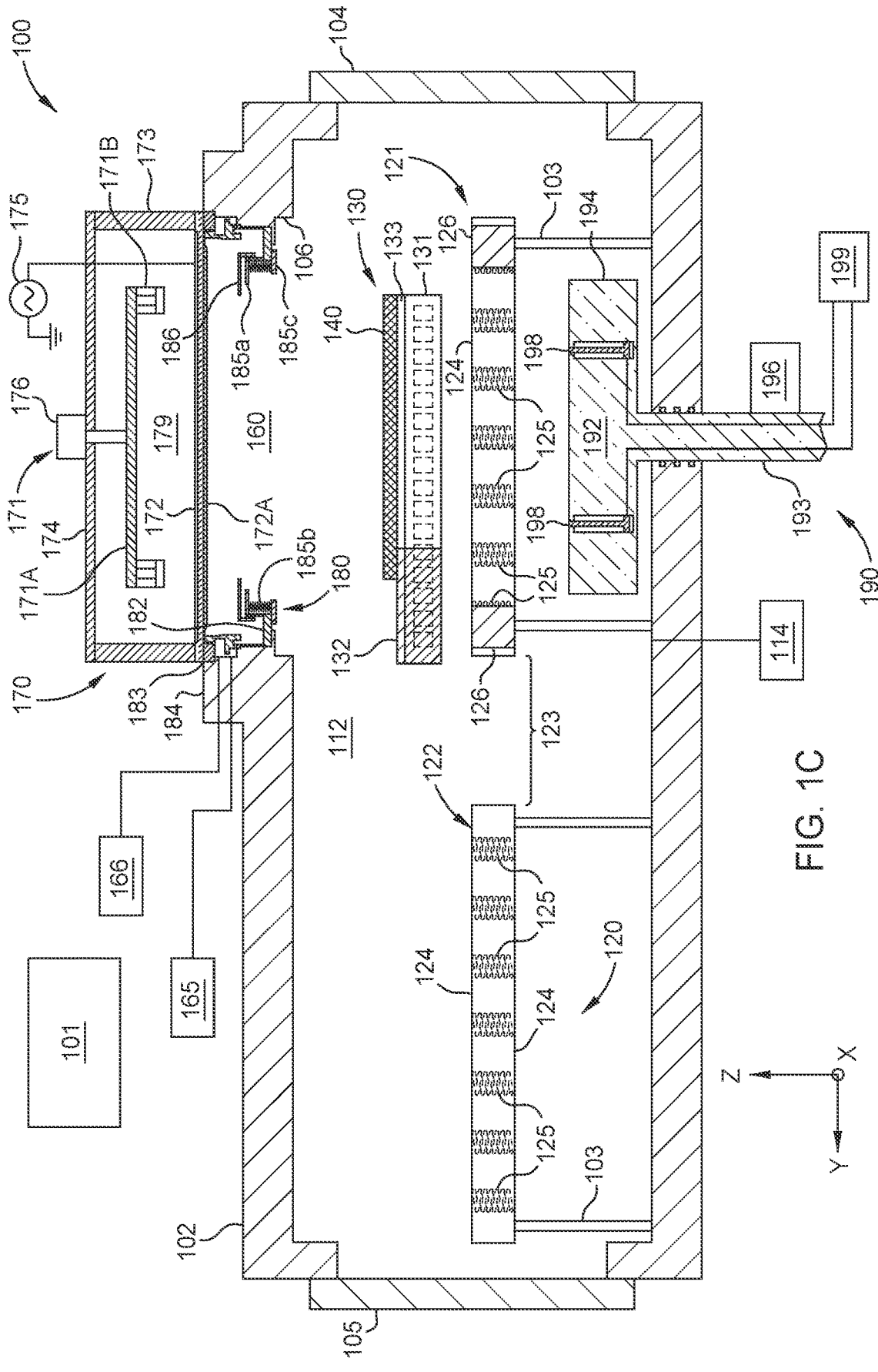
FIG. 1C is a side cross-sectional view of a process station with a carrier having a substrate disposed thereon in a carrier transfer position, according to the embodiment of FIG. 1A.

The carrier 130 with a substrate 140 placed thereon may be conveyed into the transport region 112 while the first slit valve 104 is in the open position such that the carrier 130 is levitated above the magnetic levitation assembly 120. The magnetic levitation assembly 120 levitates the carrier 130 and selectively moves the carrier 130 in a linear fashion to one or more positions along an axial direction (e.g., Y-direction) within the transport region 112. The carrier 130 is moveable to a carrier transfer position (FIG. 1C) to transfer the substrate 140 to the pedestal assembly 190. Once the substrate 140 is transferred to the pedestal assembly 190, the carrier 130 is moved to the carrier park position (FIG. 1E). The pedestal assembly 190 is actuated to lift the substrate in the Z-direction to place the substrate in a process region 160 of the source assembly 170 for processing (FIG. 1F). After the process is complete, the pedestal assembly 190 lowers the substrate 140 back into the transport region 112 where the substrate 140 is transferred back onto the carrier 130.

The carrier 130 includes a base 131 and a substrate supporting surface 132. The base 131 includes a plurality of magnets 134, such as a plurality of permanent magnets. The plurality of magnets 134 may be arranged adjacent the edges of the base 131 so that the magnets 134 may interact with at least one rail 124, 126 of the magnetic levitation assembly 120. In some configurations, the plurality of magnets 134 may be arranged such that they form a Halbach array or other similar configuration. The substrate 140 can be placed on the substrate supporting surface 132 of the carrier 130. The carrier 130 may include one or more slots 133 formed in the substrate supporting surface 132 as shown in FIG. 1B.

Figure 1D:
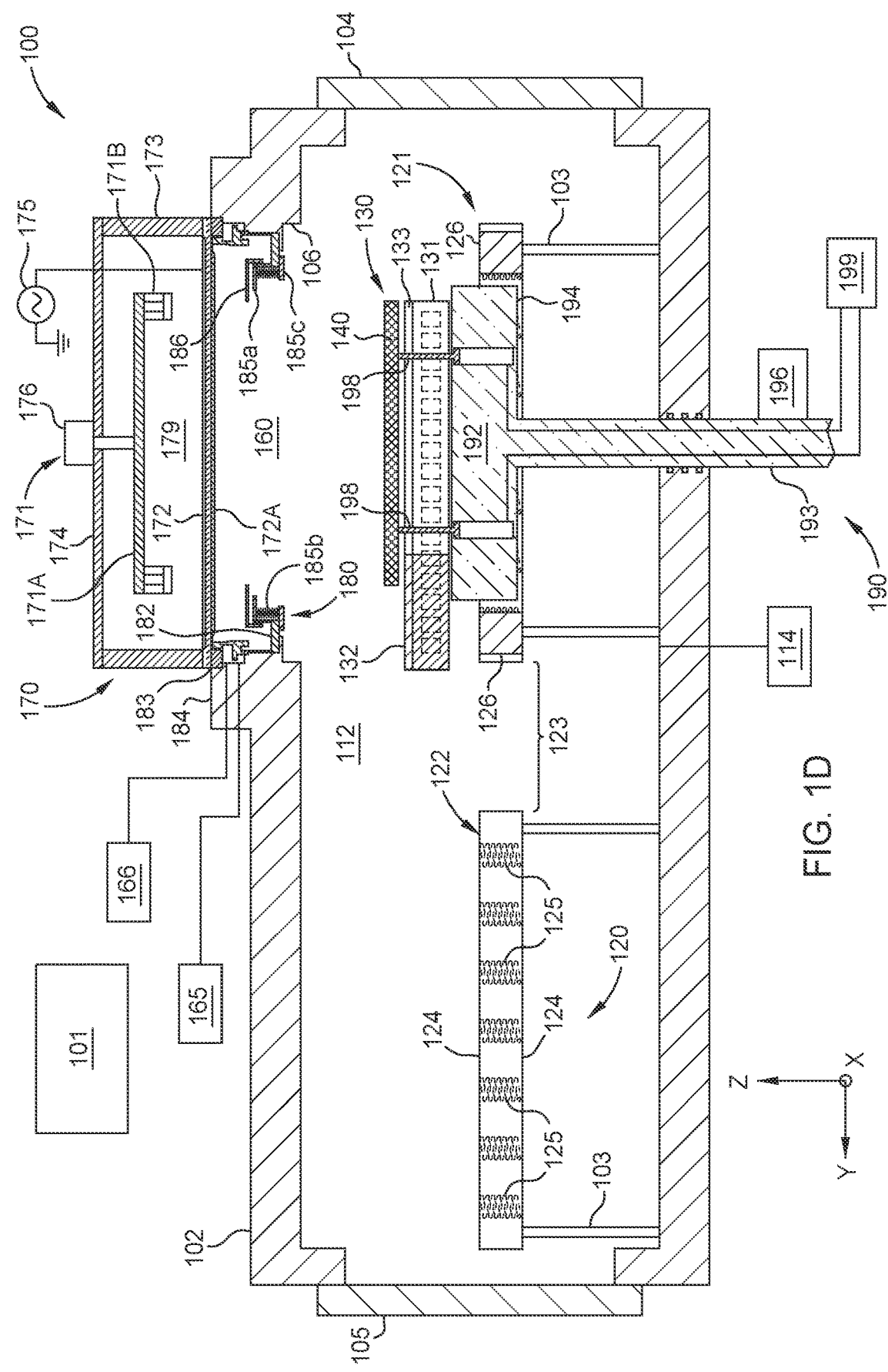
FIG. 1D is side cross-sectional view of a process station with a carrier in the carrier transfer position and a substrate disengaged from the carrier, according to the embodiment of FIG. 1A.
Figure 1E:
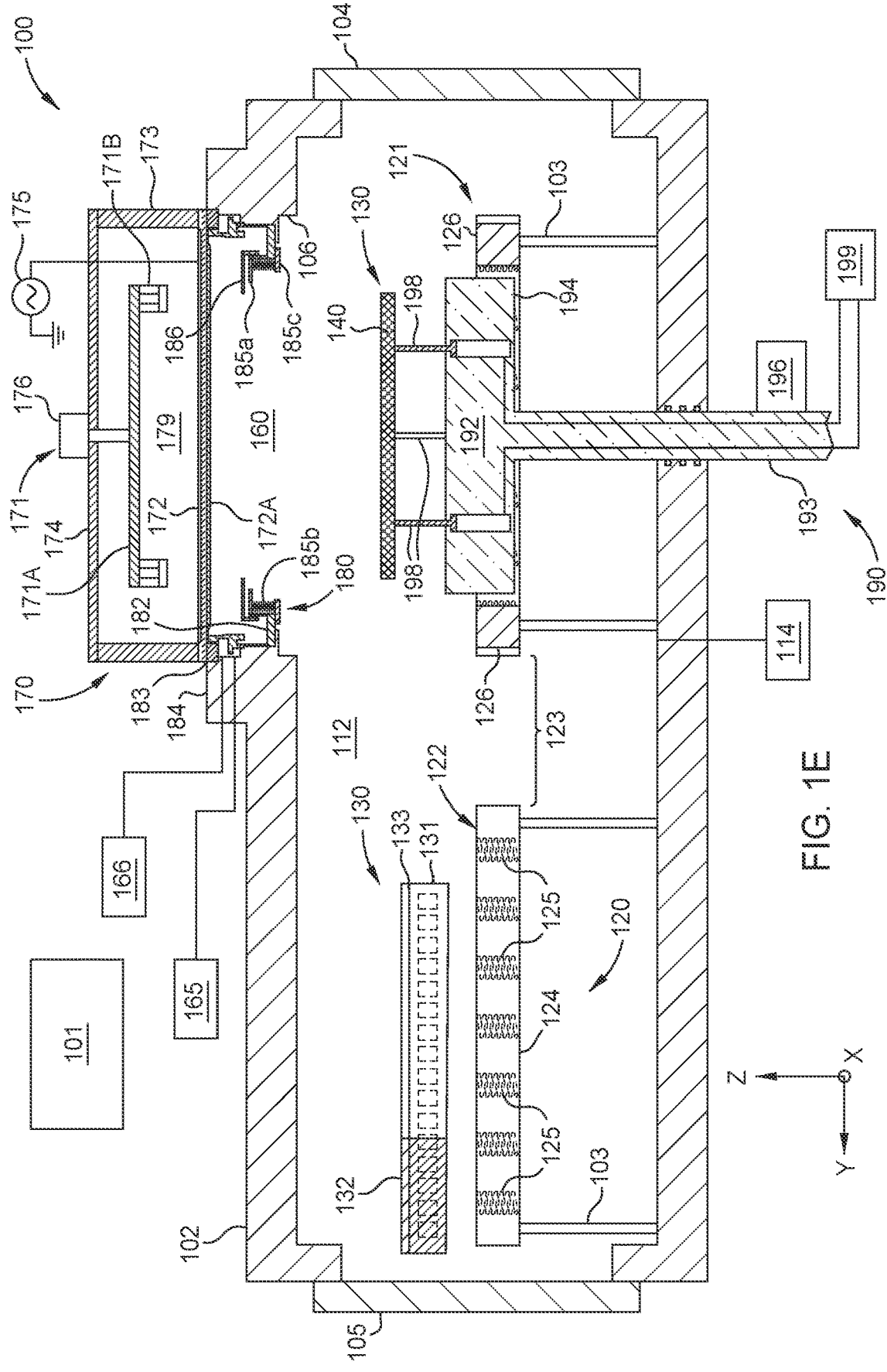
FIG. 1E is a side cross-sectional view of a process station with a carrier in a carrier park position, according to the embodiment of FIG. 1A.
Figure 1F:
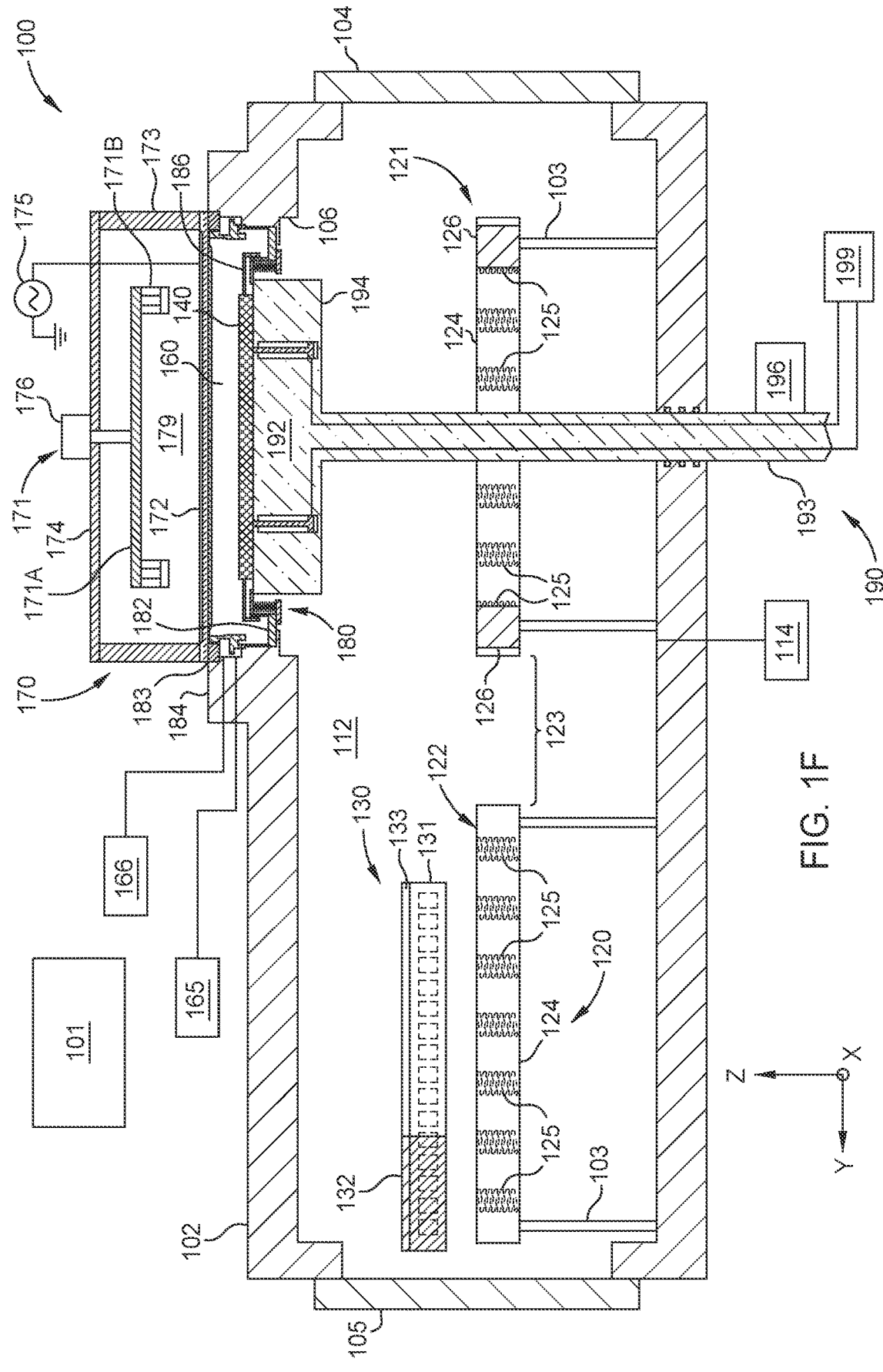
FIG. 1F is a side cross-sectional view of a process station with the substrate disposed in a process region, according to the embodiment of FIG. 1A.

Lift pins 198 of the pedestal assembly 190 can be inserted through a corresponding slot 133 to engage the bottom surface of the substrate 140 when the carrier 130 is in the carrier transfer position as shown in FIG. 1D. In some embodiments, the substrate supporting surface 132 does not include slots 133 but instead is shaped, such as having a hemispherical recess, to allow the lift pins 198 to contact the underside of the substrate 140.

The substrate carrier 130 may be formed from a non-magnetic material, such as aluminum. In some embodiments, it is beneficial to select the material from which the substrate carrier 130 is made to include a material that can also withstand high processing temperatures. In one example, the substrate carrier 130 is made from a ceramic material (e.g., alumina, quartz, zirconia, etc.). In some cases, the substrate carrier 130 may be coated with an electrically conductive coating to resolve any charge build-up issues in the substrate carrier 130 during processing within the process station 100.

The magnetic levitation assembly 120 may include a first track segment 121 and a second track segment 122. Each track segment 121, 122 may be positioned within the transport region 112 by one or more rail support members 103 connected to the housing 102. The first track segment 121 and the second track segment 122 each include plurality of magnets that interact with the magnets 134 of the carrier 130 to levitate and propel the carrier 130. The carrier 130 is moveable between the first track segment 121 and the second track segment 122. The carrier 130 is in a carrier transfer position when levitated above the first track segment 121 as shown in FIGS. 1C and 1*n* a park position when levitated above the second track segment 122 as shown in FIG. 1E.

As shown in FIGS. 1A and 1B, a gap 123 separates the first track segment 121 from the second track segment 122. The size of the gap 123 can be selected to facilitate moving the carrier 130 and substrate 140 over the gap 123 between the first track segment 121 and second track segment 122 without losing control of the carrier 130. The process station 100 may have a slit valve that extends across the gap 123 when closed to bifurcate the transport region 112 (as shown by valve 1108 in FIG. 11B). The transport region 112 may be bifurcated by this slit valve to create a buffer region to further isolate the process region 160 from other stations and/or an outside environment. In some embodiments, the magnetic levitation assembly 120 does not have a gap 123 between track segments. Instead, a single track segment made of a pair of rails extends across the transport region 112 from the first slit valve 104 to the second slit valve 105.

The first track segment 121 and the second track segment 122 may be a pair of spaced apart magnetic first rails 124 as shown in FIG. 1B. In some embodiments, a track segment, such as the first track segment 121, may optionally include a second pair of rails 126 perpendicular to first rails 124 as shown in FIG. 1B. Each rail 124, 126 includes a plurality of magnets. The plurality of magnets may include electromagnets, permanent magnets, or a combination of both electromagnets and permanent magnets. The second rails 126 may be disposed between each first rail 124 as shown in FIG. 1B. The second rails 126 may be shorter than or equal in length to the first rails 124. In some embodiments, the first rails 124 and second rails 126 touch. In some embodiments, the first rails 124 and second rails 126 are integral with one another. As shown in FIG. 1A, the first rails 124 and second rails 126 are positioned within the transport region 112 by rail support members 103 connected to the housing 102.

Each rail 124, 126 is shown in FIG. 1A as having a plurality of electromagnets in the form of coils 125 disposed within the respective rail. Power supplied to the coils 125 generates an electromagnetic field. The controller 101 can adjust the amount of electricity supplied to each coil 125 to adjust the strength of the generated magnetic fields. In some embodiments, each coil 125 can be separated from the other coils 125 by about the same distance to provide consistent control of the movement and orientation of the levitated carrier 130 relative to the respective track segment 121, 122.

The rails 124, 126 are arranged to accommodate the travel of the pedestal assembly 190 through the magnetic levitation assembly 120 in addition to being arranged to levitate the carrier 130. As shown in FIG. 1B, a space 127 is between the rails 124, 126. A support plate 194 of the pedestal assembly 190 can pass through the space 127 in the Z-direction without contacting the rails 124, 126.

In some embodiments, the process station 100 includes a plurality of sensors (not shown) to detect the position of the substrate carriers 130 within the transport region 112. For example, in one embodiment a plurality of Hall Effect sensors or magnetic encoders may be positioned at various locations in the transport region 112 to detect a 3-dimensional position of the substrate carriers 130. The sensors may be connected to the controller 101 to provide feedback on the position of the substrate carriers 130 to the controller 101. The controller 101 can use the signals from the sensors in feedback control loops to make adjustments when needed to the power levels provided to the different individual coils 125, so that the positions of the substrate carriers 130 can be changed or maintained.

As shown, the opening 106, the source assembly 170, and the process kit assembly 180 are disposed above the first track segment 121. The source assembly 170, the process kit assembly 180, and the pedestal assembly 190 are used together to enable a desired process to be performed within a process region 160 of the process station 100. In various embodiments of the disclosure provided herein, the process region 160 within each of the process stations 100 is configured to be separately isolatable from the transport region 112. The process region 160 is isolated to substantially prevent electromagnetic energy, vapors, gases and/or other undesirable contaminants from adversely affecting the process performed on the substrate 140 in the process region 160. When isolated from the transport region 112, during substrate processing performed within the process station 100, the process region 160 is generally enclosed by one or more processing surfaces of the source assembly 170 and a sealing assembly 185 of the process kit assembly 180.

FIG. 1A illustrates the source assembly 170 adapted to perform a physical vapor deposition ("PVD") deposition process. The exemplary source assembly 170 includes a magnetron assembly 171, a target 172, process assembly walls 173 coupled to the housing 102, a lid 174 and a sputtering power supply 175. In this configuration, a processing surface 172A of the PVD target 172 generally defines at least a portion of the upper portion of the process region 160. The magnetron assembly 171 includes a magnetron region 179 in which the magnetron 171A is rotated by use of a magnetron rotation motor 176 during processing. The target 172 and magnetron assembly 171 are typically cooled by the delivery of a cooling fluid (e.g., deionized water) to the magnetron region 179 from a fluid recirculation device (not shown). The magnetron 171 includes a plurality of magnets 171B that are configured to generate magnetic fields that extend below the processing surface 172A of the target 172 to promote a sputtering process performed in the process region 160 during a PVD deposition process.

The pedestal assembly 190 includes a pedestal 192 and an actuator assembly 196. The pedestal 192 includes a shaft 193 connected to a support plate 194, and lift pins 198.

The lift pins 198 may be extended and retracted in the Z-direction. For example, the lift pins 198 extend to lift the substrate 140 off the carrier 130 and then retract to place the substrate 140 into engagement with the upper surface of the support plate 194. A lift pin actuator 199 may supply a hydraulic or pneumatic fluid to extend or retract the lift pins 198. The lift pin actuator 199 may include a stepper or servo motor actuated lead screw assembly, linear motor assembly, pneumatic cylinder actuated assembly or other conventional mechanical linear actuation mechanism. In some embodiments, the lift pins are disposed in the support plate 194 as shown in FIG. 1A. In other embodiments, the lift pins 198 may be disposed outside of the support plate 194. For example, the lift pins 198 may be coupled to a plate surrounding the shaft 193 that is raised and lowered relative to the pedestal supporting surface 194 by an actuator. The lift pins 198 may be extended and retracted through a corresponding hole formed in the pedestal 192 by the movement of the plate relative to the supporting surface 194.

The actuator assembly 196 is actuated to raise or lower the pedestal 192 in the Z-direction. The actuator assembly 196 is coupled to the pedestal shaft 193, which is supported by bearings (not shown) that are coupled to a lower wall of the housing 102 to guide the pedestal shaft 193 as it is translated by the actuator assembly 196, A seal, such as a bellows assembly (not shown), is used to form a seal between the outer diameter of the pedestal shaft 193 and a portion of the lower wall of the housing 102, such that a vacuum environment created within the transport region 112, by use of the vacuum pump 114, is maintained during normal operation. The actuator assembly 196 may be mounted to the housing 102. The actuator assembly 196 may include a stepper or servo motor actuated lead screw assembly, Hear motor assembly, pneumatic cylinder actuated assembly or other conventional mechanical Hear actuation mechanism.

During operation, the actuator assembly 196 is configured move the pedestal assembly between positions within the process station 100. The pedestal 192 is positionable in a lower position (e.g., FIGS. 1A and 1C) which is vertically (Z-direction) below the first track segment 121. The pedestal 192 may be moved to a pedestal transfer position (FIG. 1D) to place the surface of the support plate 194 below the carrier 130 (e.g., transfer plane) without contacting the carrier 130. Once the substrate 140 is transferred to the support plate 194 using the lift pins 198 and the carrier 130 is moved to the park position (FIG. 1E), the pedestal 192 may be moved to a process position (FIG. 1F), which is vertically above the first track segment 121 such that the substrate 140 is disposed in the process region 160.

The process kit assembly 180 may include a process region shield 182, an isolation ring 183, the sealing assembly 185 which may be positioned over and/or within the opening 106 formed within the housing 102, a deposition ring (not shown), and a cover ring 186. In some embodiments, the support plate 194 contacts a portion of the process kit assembly 180, such as the sealing assembly 185, to form the process region 160. The process region 160 may be evacuated via a vacuum pump 165 coupled to a station wall 184 of the housing 102 via a first port within the station wall 184.

For example, the vacuum pump 165 may reduce the pressure within the process region 160 to a sub-atmospheric pressure on the order of about $10^{-3}$ torr. The vacuum pump 165 may be a turbopump, cryopump, roughing pump or other useful device that is able to maintain a desired pressure within the process region 160. The station wall 184 is coupled to a gas source assembly 166, and is configured to deliver one or more process gases (e.g., Ar, N$_2$) to the process region 160 through a plenum during processing.

The process region shield 182 is positioned on a lower portion of the station wall 184. The process region shield 182 is typically used to collect deposition sputtered from the target 172 and to enclose a portion of the process region 160. The isolation ring 183, which is formed from a dielectric material, is configured to support the target 172 and be position on the station wall 184. The isolation ring 183 is used to electrically isolate the target 172, when it is biased by the sputtering power supply 175, from the grounded station wall 184.

During processing of a substrate 140, e.g., FIG. 1F, the substrate 140 is engaged with the support plate 194 of the pedestal 192 which is positioned in the process position below the source assembly 170. When in the process position, a region of the support plate 194 forms a separable seal with a portion of the sealing assembly 185 so as to substantially fluidly isolate the process region 160 from the transport region 112. Thus, when in the process position, the support plate 194, the sealing assembly 185, the process region shield 182, the station wall 184, the isolation ring 183 and target 172 substantially enclose and define the process region 160.

The sealing assembly 185 may include an upper plate 185a, bellows 185b, and a lower plate 185c. The bellows 185b is positioned between the upper plate 185a and the lower plate 185c. In some embodiments, the seal formed between the portion of the support plate 194 and the upper plate 185a of the sealing assembly 185 is created at a sealing region that is formed by physical contact between a surface of the region of the support plate 194 and a surface of the upper plate 185a. In some embodiments, the flexible bellows assembly 185b of the sealing assembly 185 is configured to be extended in the vertical (Z) direction as the portion of the support plate 194 is placed in contact with the surface of the portion of the sealing assembly 185 by use of the actuator assembly 196 in the pedestal assembly 190. The compliant nature of the flexible bellows 185b assembly allows any misalignment or planarity differences between the surface of the portion of the support plate 194 and the surface of the portion of the sealing assembly 185 to be taken up so that a reliable, repeatable and separable seal can be formed. The flexible bellows assembly 185b may be a stainless steel bellows assembly or Inconel bellows assembly, among others.

While process station 100 shown in FIG. 1A is shown as adapted to perform a PVD deposition process, the source assembly 170 can include different hardware to perform a different process. For example, the source assembly 170 may be adapted to perform chemical vapor deposition (CVD"), plasma enhanced chemical vapor deposition ("PECVD"), atomic layer deposition ("ALD"), plasma enhanced atomic layer deposition ("PEALD"), etch, lithography, ion implantation, ashing, cleaning, thermal process (e.g., rapid thermal processing, anneal, cool down, thermal management control) degas, and/or other useful substrate processes.

In one example, the source assembly 170 of a process station that is adapted to perform a CVD deposition process, a PECVD deposition process or an etch process includes a gas distribution plate, or showerhead, that is configured to deliver a precursor gas or etching gas into the process region 160 and across a surface of a substrate. Generally, a showerhead, or gas distribution plate, includes a metal, quartz or ceramic plate that has a plurality of holes (e.g., greater than 100 holes) formed therein to restrict and thus allow an even distribution of a gas to flow from an upstream side of the showerhead to a downstream side of the showerhead, which is positioned adjacent to the process region 160 of a process station 100 during processing. The gas (e.g., precursor gas or etching gas) is delivered to the upstream side of the showerhead and through the showerhead by a precursor gas source (not shown) typically disposed outside of the process station 100. In this configuration of the source assembly 170, the one or more processing surfaces that define at least a portion of the process region 160 is the lower surface of the gas distribution plate, or showerhead (e.g., surfaces that contact the process region). In this configuration, the magnetron assembly 171 and target are not used, and the sputtering power supply 175 can be replaced with a RF power supply that is configured to bias the gas distribution plate.

The controller 101 may include a programmable central processing unit (CPU) which is operable with a memory (e.g., non-volatile memory) and support circuits. The support circuits are conventionally coupled to the CPU and comprise cache, clock circuits, input/output subsystems, power supplies, and the like, and combinations thereof coupled to the various components of the station 100, to facilitate control of the station 100. For example, in some embodiments the CPU is one of any form of general purpose computer processor used in an industrial setting, such as a programmable logic controller (PLC), for controlling various polishing system components and sub-processors. The memory, coupled to the CPU, is non-transitory and is typically one or more of readily available memory such as random access memory (RAM), read only memory (ROM), floppy disk drive, hard disk, or any other form of digital storage, local or remote.

Herein, the memory is in the form of a computer-readable storage media containing instructions (e.g., non-volatile memory), that when executed by the CPU, facilitates the operation of the station 100. The instructions in the memory are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods and operations described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

FIGS. 1A-1I illustrate an operation within the process station 100. FIGS. 1A-1B illustrate the process station 100 after the carrier 130, with substrate 140 disposed thereon, has entered the transport region 112 through the open first slit valve 104. The carrier 130 may have entered the process station 100 from a load lock station or another process station 100. The carrier 130 is levitated above the second track segment 122 in the park position. The first and second slit valves 104, 105 are closed once the carrier 130 and substrate 140 are within the transport region 112.

Figures 10A, 10B:
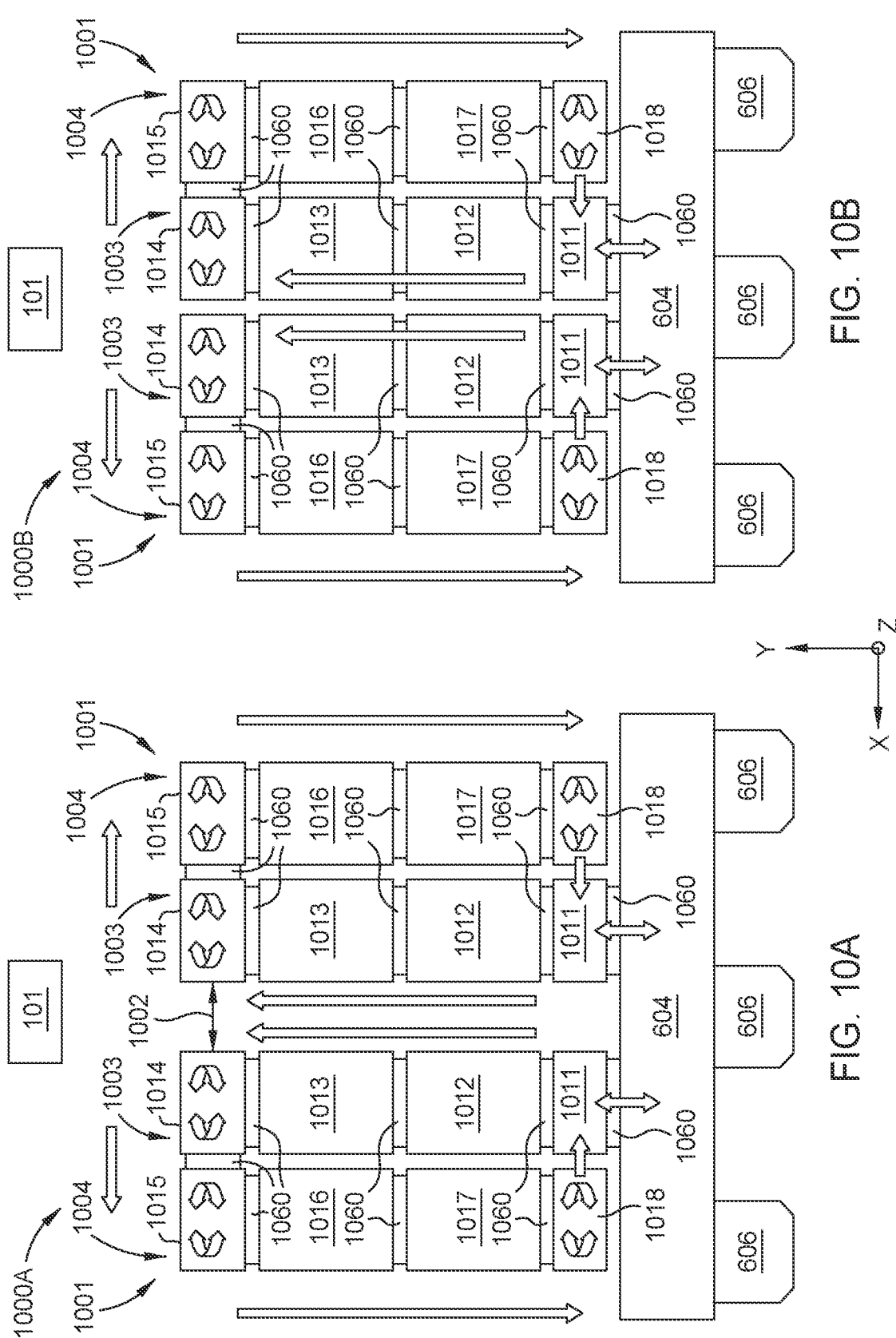
FIG. 10A is a top schematic view of a substrate processing system, according to one embodiment.
FIG. 10B is a top schematic view of a substrate processing system, according to one embodiment.
Figure 10C:
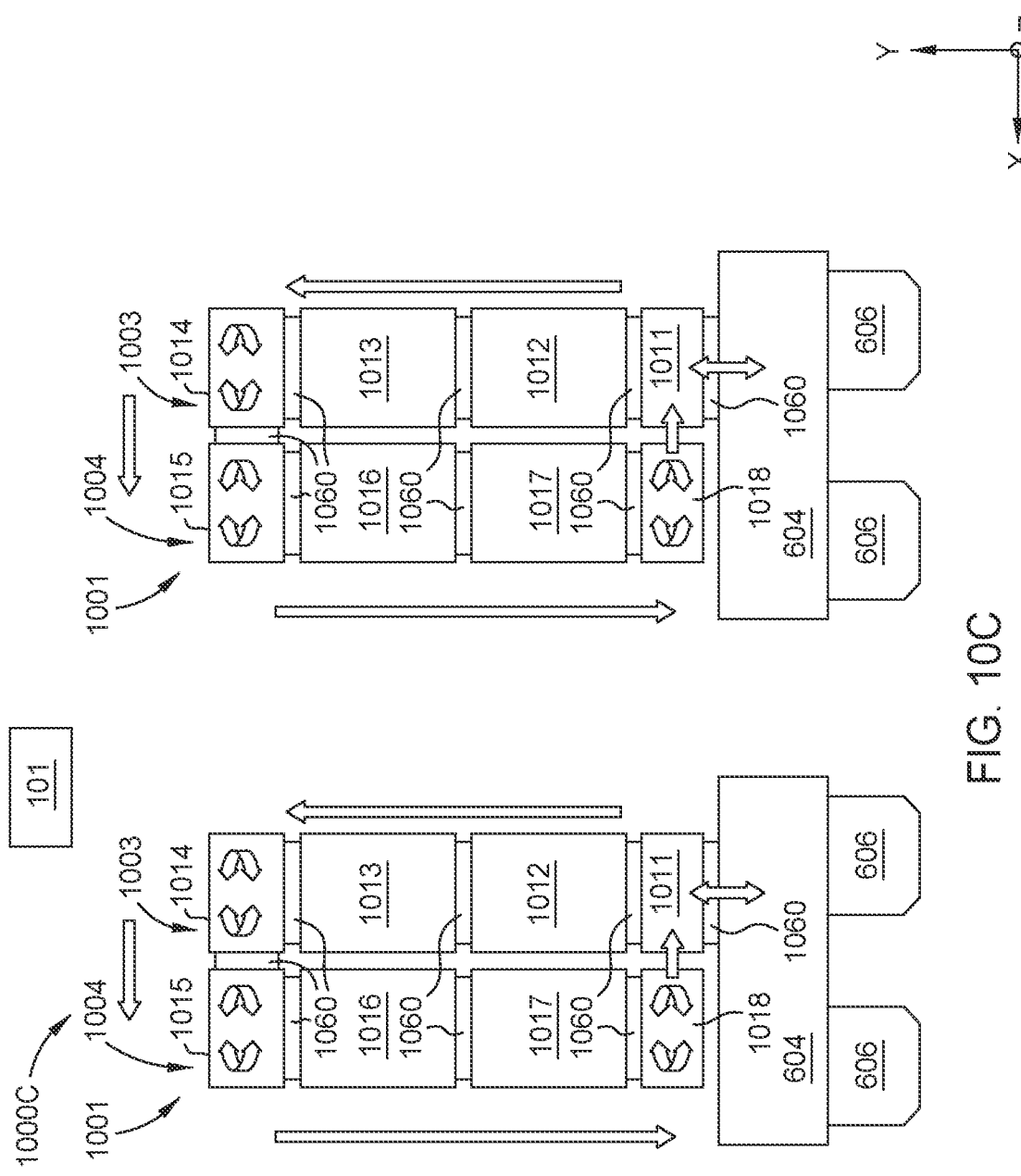
FIG. 10D is a top view of a substrate processing system with, according to one embodiment.
FIG. 10E is a top view of a substrate processing system with, according to one embodiment.

The carrier 130 is moved to the carrier transfer position as shown in FIG. 10 to place the substrate 140 above the support plate 194 which is in the lower position. The carrier 130 may be moved to this position after entering the first slit valve 104 without being prior conveyed to the park position shown in FIGS. 1A-1B. The actuator assembly 196 is actuated to move the pedestal 192 to the pedestal transfer position prior to, during, or after the carrier 130 is moved to the carrier transfer position. The lift pins 198 are placed adjacent a corresponding slot 133 when the pedestal 192 is the pedestal transfer position. The lift pins 198 are actuated to pass through the slots 133 to lift the substrate 140 so that the substrate 140 is disengaged from the substrate supporting surface 132. FIG. 1D shows the substrate 140 disengaged from the substrate supporting surface 132 and supported on the lift pins 198. The carrier 130 then moves to the park position while the substrate 140 remains supported on the lift pins 198 as shown in FIG. 1E. The lift pins 198 exit the slots 133 as the carrier 130 moves away from the carrier transfer position. The lift pins 198 are retracted to place the substrate 140 on the upper surface of the support plate 194 after the carrier 130 is clear from the pedestal 192.

The pedestal 192 is raised to the process position to move the substrate 140 from the transport region 112 and into the process region 160 through the opening 106 as shown in FIG. 1F, The support plate 194 is shown engaged with the sealing assembly 185. The substrate 140 undergoes a process in the process region 160, such as PVD. The slit valves 104, 105 may be closed during processing.

Figure 1G:
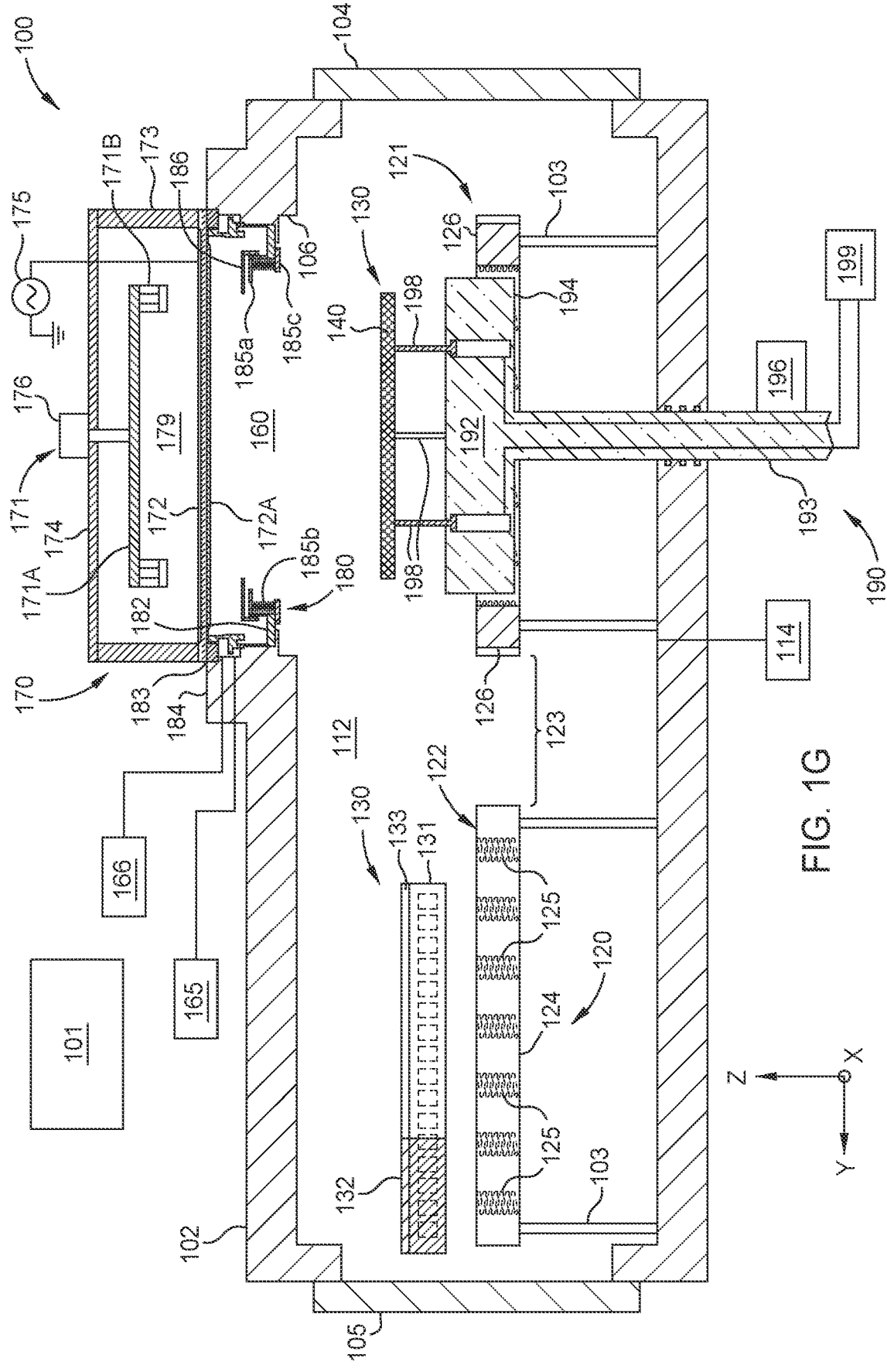
FIG. 1G is a side cross-sectional view of a process station with the substrate lowered into a transport region from a process region, according to the embodiment of FIG. 1A.
Figure 1H:
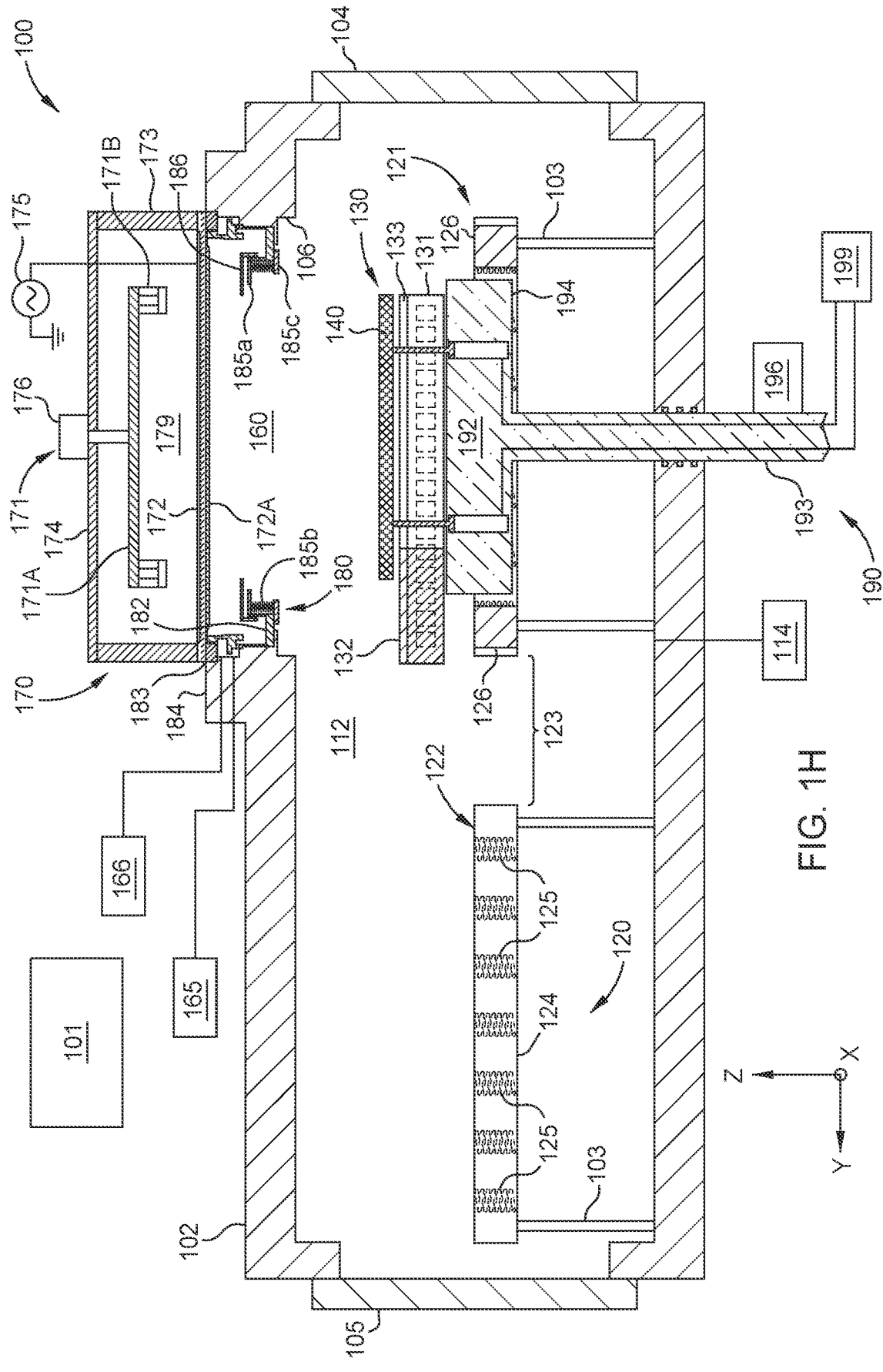
FIG. 1H is a side cross-sectional view of a process station with a carrier in the carrier transfer position and a substrate disengaged from the carrier, according to the embodiment of FIG. 1A.
Figure 1I:
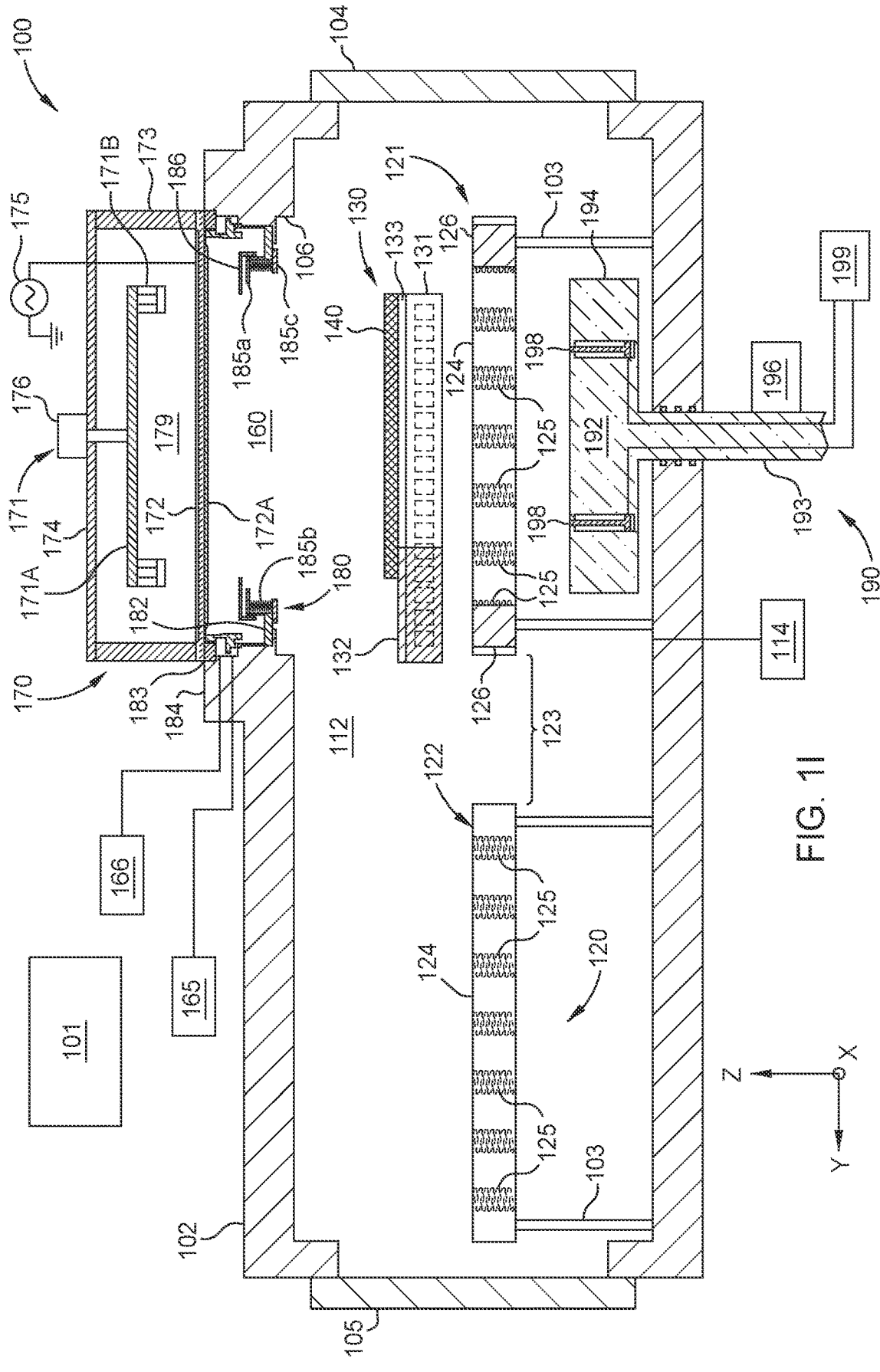
FIG. 1I is a side cross-sectional view of a process station with a substrate placed back on a carrier in the carrier transfer position, according to the embodiment of FIG. 1A.

Once the process is completed, the pedestal 192 is returned to the pedestal transfer position as shown in FIG. 1G. The lift pins 198 are actuated to lift the substrate 140 above the support plate 194 to allow sufficient clearance for the substrate supporting surface 132 to move beneath the substrate 140. The carrier 130 is moved from the park position to the carrier transfer position as shown in FIG. 1H to place the substrate supporting surface 132 beneath the substrate 140 without contacting the substrate 140. The lift pins 198 enter the slots 133 as the carrier 130 moves to the carrier transfer position. Once the carrier 130 is in the carrier transfer position, the lift pins 198 are retracted to lower the substrate 140 into engagement with the substrate supporting surface 132. The pedestal 192 is moved back to the lower position as shown in FIG. 1I.

The controller 101 may cause the slit valves 104, 105 to open. The carrier 130 and substrate 140 are conveyed out of the process station 100 through the open second slit valve 105. An additional carrier 130 and substrate 140 may be conveyed into the process station 100 through the open first slit valve 104 to repeat the processing of a substrate 140 within the process region 160. The carrier 130 exiting the process station 100 through the second slit valve 105 may enter another process station, such as an additional process station 100, to subject the substrate 140 to an additional process.

In some embodiments, the carrier 130 may enter the transport region 112 through the second slit valve 105 and exit through the first slit valve 104 rather than entering through the first slit valve 104 and exiting through the second slit valve 105 as discussed above. In some embodiments, the opening 106, source assembly 170, and process kit assembly 180 may be disposed above the second track segment 122 rather than the first track segment 121.

Many of the following embodiments described in this disclosure use features similar to or the same as those shown in FIGS. 1A-1H. These features allow the substrate carriers to move throughout the substrate processing systems with little or no contact with the other parts of the substrate processing systems, which minimizes particle generation. Additionally, these features allow a substrate to move between stations without being retrieved and placed by a robotic arm, which improves throughput of the system since the substrate is not being transferred from one robot arm to another, or from a robot arm to a processing chamber.

In general, a substrate 140 is subjected to a fabrication sequence within a substrate processing system to create desired properties. The substrate processing system includes a plurality of stations, such as process station 100, coupled together to perform each process of the fabrication sequence. The carrier 130 conveys the substrate 140 through the substrate processing system to each station in sequence. The carrier 130 may need to change an axial direction of travel depending on the arrangement of stations.

Figure 2A:
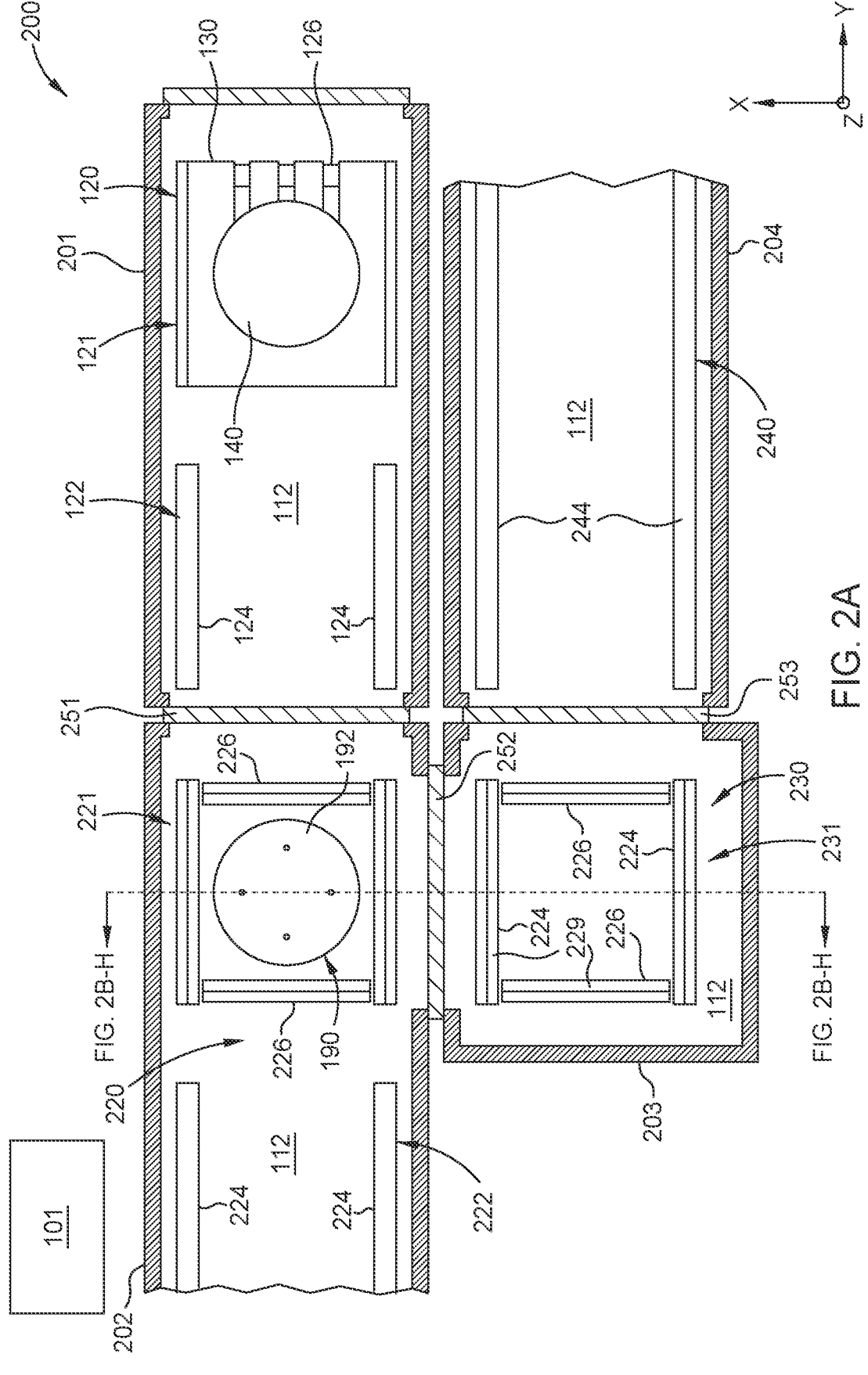
FIG. 2A is a partial top cross-sectional view of an arrangement of stations with a substrate disposed on a carrier located in a first station, according to one embodiment.

FIG. 2A illustrates an exemplary arrangement of stations 200. The arrangement of stations 200 may be included in a substrate processing system to fabricate a substrate. An X-Y-Z coordinate system is included in the figure to illustrate the axial direction of travel of the carrier 130 and substrate 140 within the arrangement of stations 200. The arrangement 200 may include a first station 201, a second station 202, a third station 203, and a fourth station 204. FIG. 2A is a top view of a cross-section of the arrangement of stations 200 to show the transport regions 112 of each of the stations 201, 202, 203, 204. The carrier 130 transports the substrate 140 through each of the stations 201-204 in sequence. The second station 202 and third station 203 are routing stations configured to change the axial direction of travel of the carrier 130 so that carrier moves in a linear fashion in a first axial direction (e.g., Y-direction) instead of linearly in a second axial direction (e.g., X-direction), or vice versa.

The first station 201 may be a process station 100. The second station 202 may be a process station that is similar to process station 100. The third station 203 may be a load lock station and the fourth station 204 may be a conveyance station.

FIGS. 2B-2H illustrate a partial cross-section of the arrangement of stations 200 about line 2B-H to show the transport region of the second station 202 and third station 204. The source assembly 170 and process kit assembly 180 of the second station 202 are not shown.

Figures 2B, 2C:
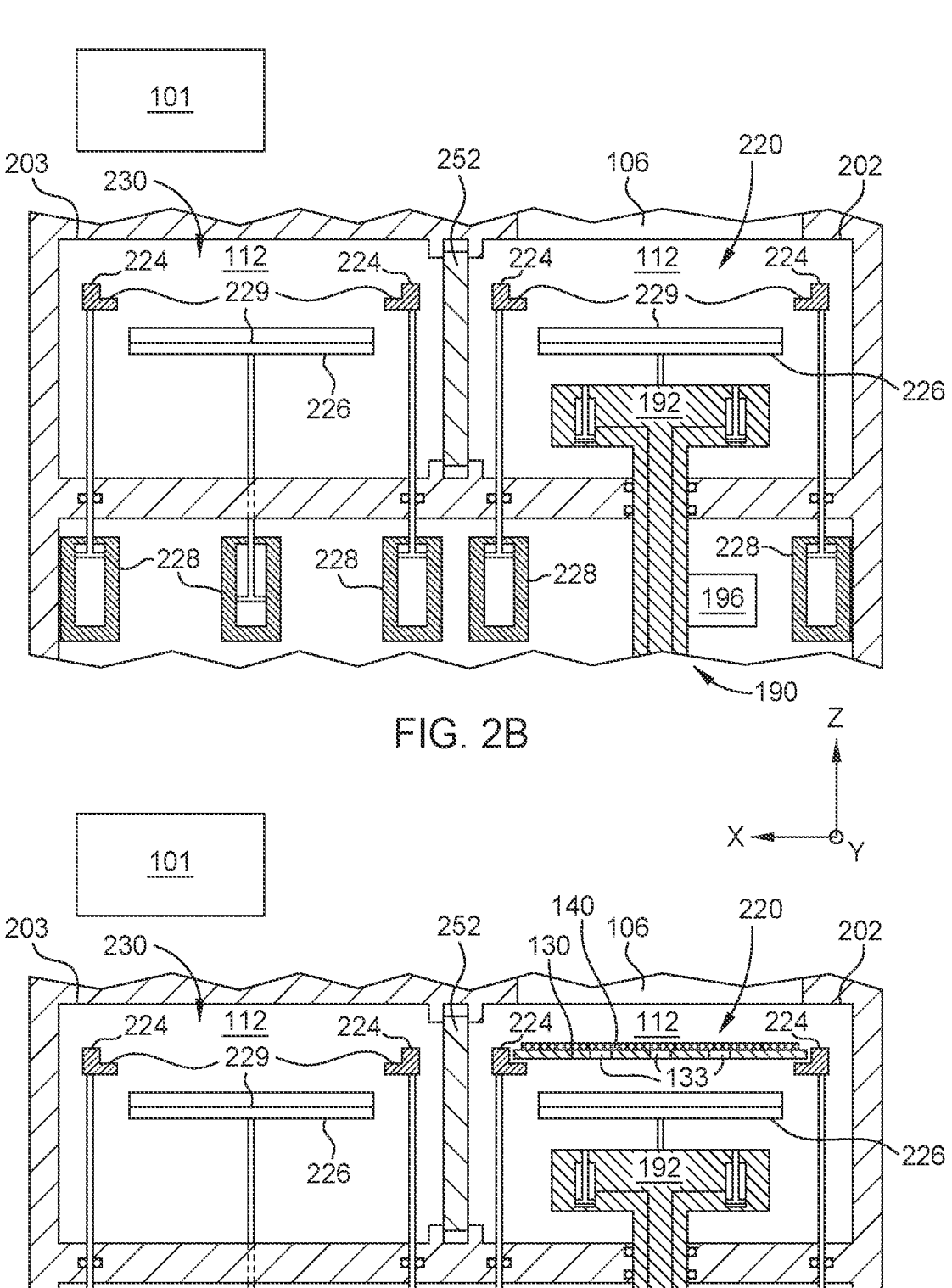
FIG. 2B is a partial side cross-sectional view of the arrangement of stations, according to the embodiment of FIG. 2A.
FIG. 2C is a partial side cross-sectional view of the arrangement of stations showing a carrier levitated by a first rack segment of a second station of the arrangement of stations, according to the embodiment of FIG. 2A.

The second station 202 includes a magnetic levitation assembly 220 with a selectively changeable axial direction of conveyance. The axial direction of conveyance is changed to change the axial direction of travel of the carrier 130 from a first axial direction, such as the Y-direction, to a second axial direction, such as the X-direction. The magnetic levitation assembly 220 includes a first track segment 221, a second track segment 222, and an actuators 228. The first track segment 221 includes first rails 224 second rails 226. Each rail 224, 226 is connected to an actuator 228. Each actuator 228 moves a respective rail 224, 226 in the Z-direction. The second track segment 222 also includes a set of first rails 224. The first rails 224 and second rails 226 may include a plurality of magnets, such as coils 125 to generate an electromagnetic field, to levitate and move the carrier 130. As shown in FIG. 2B, the rails 224, 226 may include a shoulder 229 formed between the top and bottom surface of each rail 224, 226. The carrier 130 may be levitated above the rails 224, 226 above the shoulder 229.

The first rails 224 are moveable in the Z-direction between an upper position (FIG. 2B) and a lower position (FIG. 2E) relative to the second rails 226 by extending or retracting the actuator 228 connected to each rail 224. The second rails 226 may be moved in the Z-direction between an upper position (FIG. 2E) and a lower position (FIG. 2B) relative to the first rails 224 by a respective actuator 228. The actuators 228 may be a hydraulic actuators, pneumatic actuators, linear electric actuators, or any other actuator suitable to raise and lower the rails 224, 226.

The rails 224, 226 are raised and lowered by the actuators 228 to facilitate changing the axial direction of conveyance of the magnetic levitation assembly 220. The magnetic levitation assembly 220 conveys the carrier 130 in the Y-direction when the first rails 224 are in the upper position and the second rails 226 are in the lower position. The magnetic levitation assembly 220 conveys the carrier 130 in the X-direction when the second rails 226 are in the upper position and the first rails 224 are in the lower position.

Each second rail 226 may be disposed between the first rails 224 as shown in FIG. 2A. In some embodiments, the first rails 224 are positioned such that the first rails 224 do not extend beyond the end of the second rails 224 as shown in FIG. 2A. In some embodiments the first rails 224 may be positioned to extend beyond an end of the second rails 226, or the rails 224 may be positioned such that an edge of the rail 224 is flush with the end of the second rails 226. In some embodiments, the second rails 226 are shorter than or equal in length to the first rails 224.

The third station 203 includes a magnetic levitation assembly 230 with a selectively changeable axial direction of conveyance. The axial direction of conveyance is changed to change the axial direction of travel of the carrier 130. The magnetic levitation assembly 230 includes a first track segment 231 that is similar to the first track segment 221 of the second station 202 and actuators 228 connected to each rail 224,226 of the first track segment 231, and is labeled accordingly. While the third station 203 is illustrated as a load lock station, the third station 203 may instead be a process station similar to the second process station 202.

The magnetic levitation assemblies 220, 230 of the second station 202 and third station 203 are coordinated to change the axial direction of travel of the carrier 130. FIGS. 2A-2I illustrate an example operation of conveying the substrate 140 and carrier 130 through the arrangement of stations 200.

FIG. 2A illustrates the carrier 130 and substrate 140 disposed in the transport region 112 of the first station 201. The substrate 140 may be processed within the first station 201 in a similar manner as described with respect to process station 100. Once processing in the first station 201 is complete, the carrier 130 is conveyed from the first station 201 into the second station 202 in the Y-direction while a slit valve 251 is in an open position.

FIG. 2B illustrates a cross-sectional view of the second station 202 and third station 203 before the carrier 130 and substrate 140 are conveyed therein from the first station 201. The first rails 224 are in the upper position and the second rails 226 are in the lower position. The first rails 224 of the first track segment 221 are substantially co-planar with the first rails 224 of the second track segment 222 when in the upper position. The controller 101 may adjust the magnetic field of the second track segment 122 of the first station 201 and the first rails 224 of the first track segment 221 of the second station 202 to convey the carrier 130 into the second station 202 in the Y-direction. FIG. 2C shows the carrier 130 disposed in the second station 202 and levitating above the first rails 224. Electromagnets within the second rails 226 may be shut-off while the second rails 226 are in the lower position and the first rails 224 are in the upper position. While not shown, a second carrier may be conveyed out of the third station 203 and into the fourth station 204 in the Y-direction while the carrier 130 is conveyed into the second station 202.

Once the carrier 130 and substrate 140 are disposed in the second station 202, the substrate 140 is processed in a similar manner as described with respect to process station 100. The carrier 130 is moved to the carrier transfer position above the first track segment 221 to transfer the substrate 140 onto the lift pins 198. The carrier 130 moves to the park position above the second track segment 222 after the substrate 140 is transferred onto the lift pins 198. The pedestal 192 is moved to the process position to place the substrate 140 into the process region 160 of the second station 202 for processing. Once the process is complete, the pedestal 192 is lowered to the pedestal transfer position and the lift pins 198 are extended to position the substrate 140 above the support plate 194. The carrier 130 returns to the carrier transfer position, where the substrate 140 is transferred from the lift pins 198 to the carrier 130.

Figures 2D, 2E:
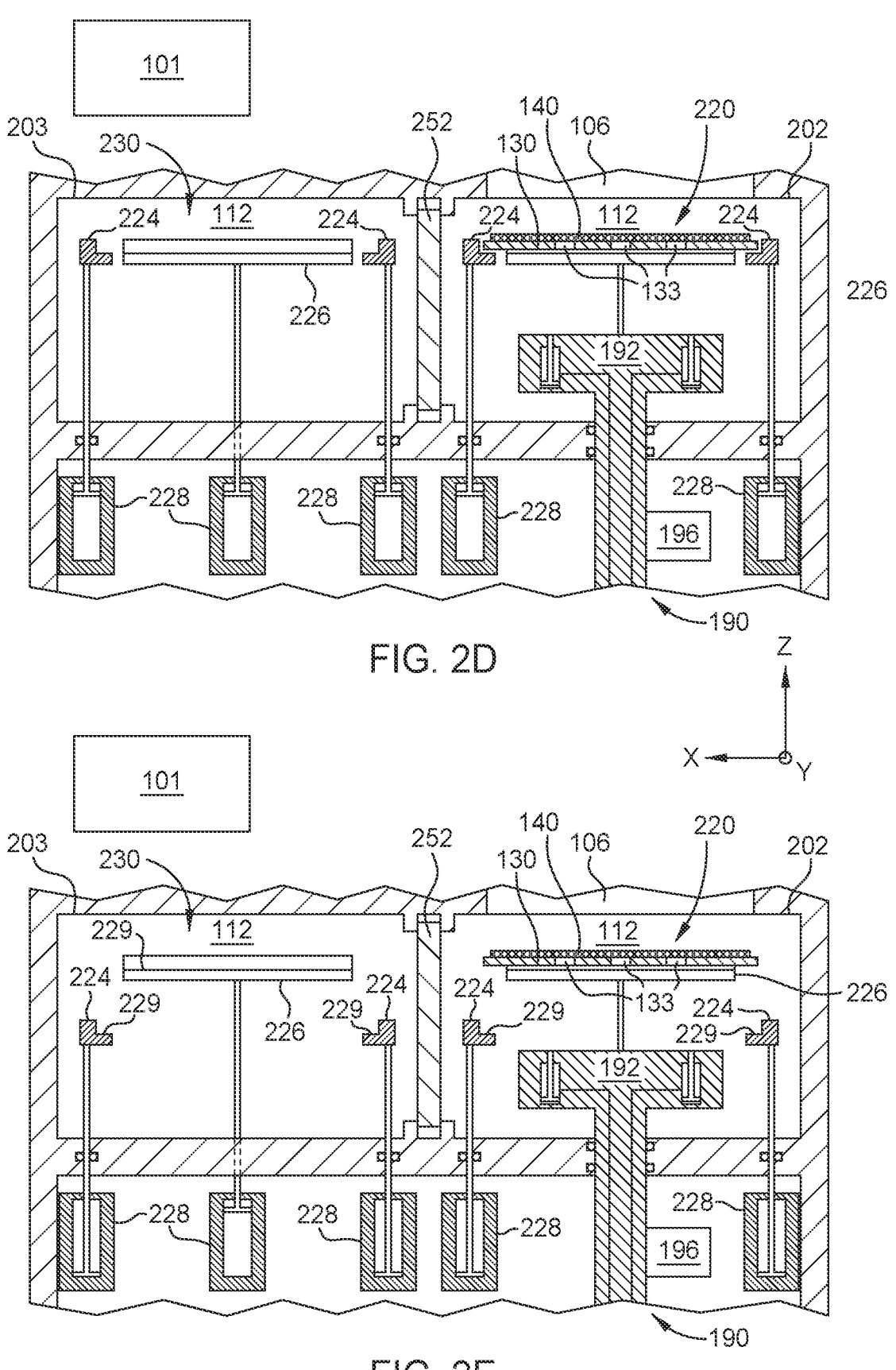
FIG. 2D is a partial side-cross-sectional view of the arrangement of stations showing a change in position of the rails of the first track segment of a second and third station of the arrangement of stations, according to the embodiment of FIG. 2A.
FIG. 2E is a partial side-cross-sectional view of the arrangement of stations showing a change in position of the rails of the first track segment of a second and third station of the arrangement of stations, according to the embodiment of FIG. 2A.

The second rails 226 of the second station 202 and third station 203 are raised from the lower position to the upper position as shown in FIG. 2D. The second rails 226 in the second station 202 are substantially co-planar with second rails 226 in the third station 203 when in the upper position. Electromagnets within the second rails 226 may be activated prior to or after the second rails 226 reach the upper position to levitate the carrier 130. Once the second rails 226 are in the upper position, the first rails 224 in both stations 202, 203 are moved to the lower position as shown in FIG. 2E to clear a path for the carrier 130 to be conveyed between the second rails 226 of second station 202 and third station 203 in the X-direction. The electromagnets within the first rails 224 may be deactivated while the first rails 224 are in the lower position.

Figures 2F, 2G:
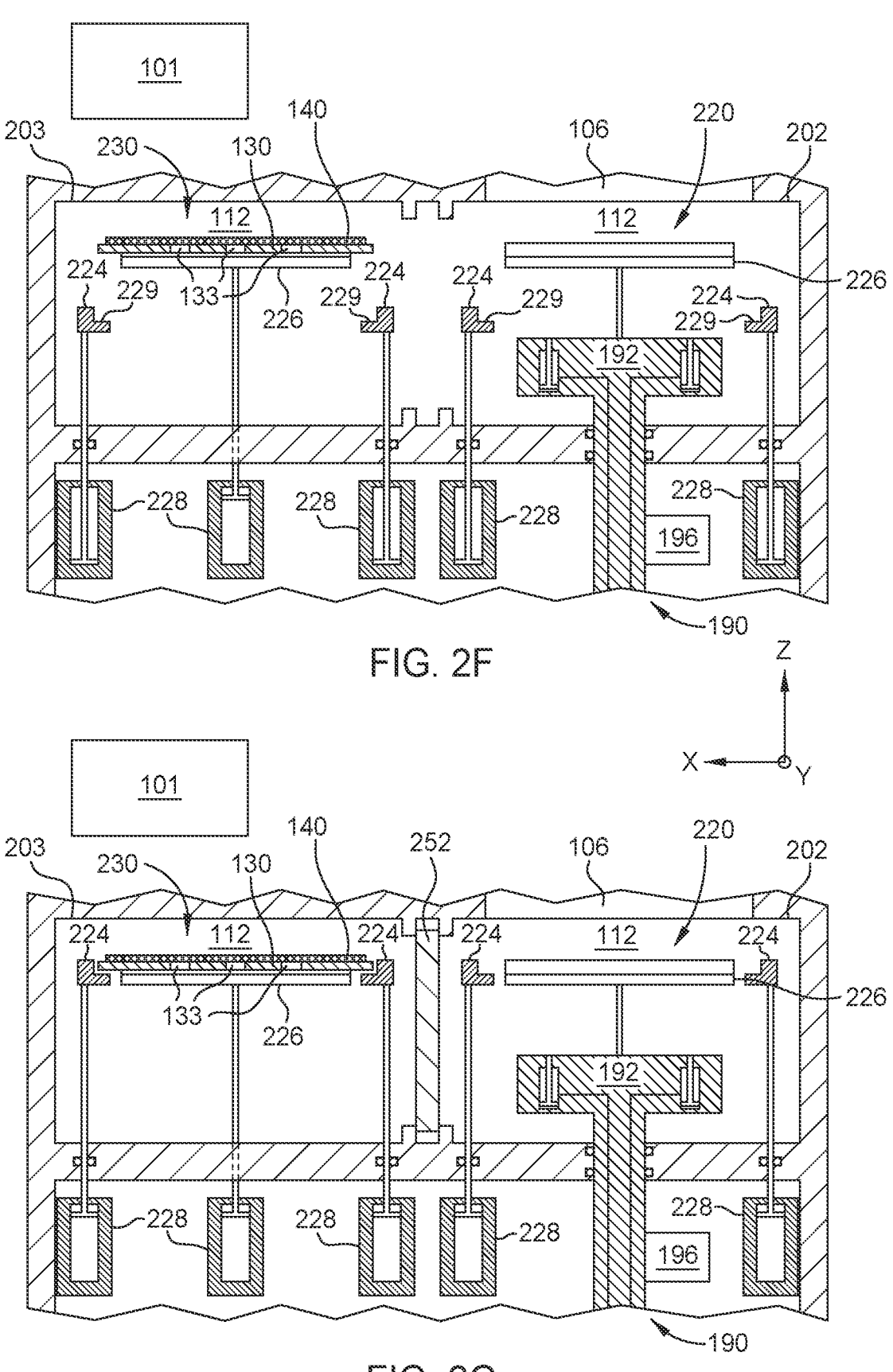
FIG. 2F is a partial side-cross-sectional view of the arrangement of stations showing that a carrier has moved into a third station from a second station of the arrangement of stations, according to the embodiment of FIG. 2A.
FIG. 2G is a partial side-cross-sectional view of the arrangement of stations showing a change in position of the rails of the first track segment of a second and third station of the arrangement of stations, according to the embodiment of FIG. 2A.
Figure 2H:
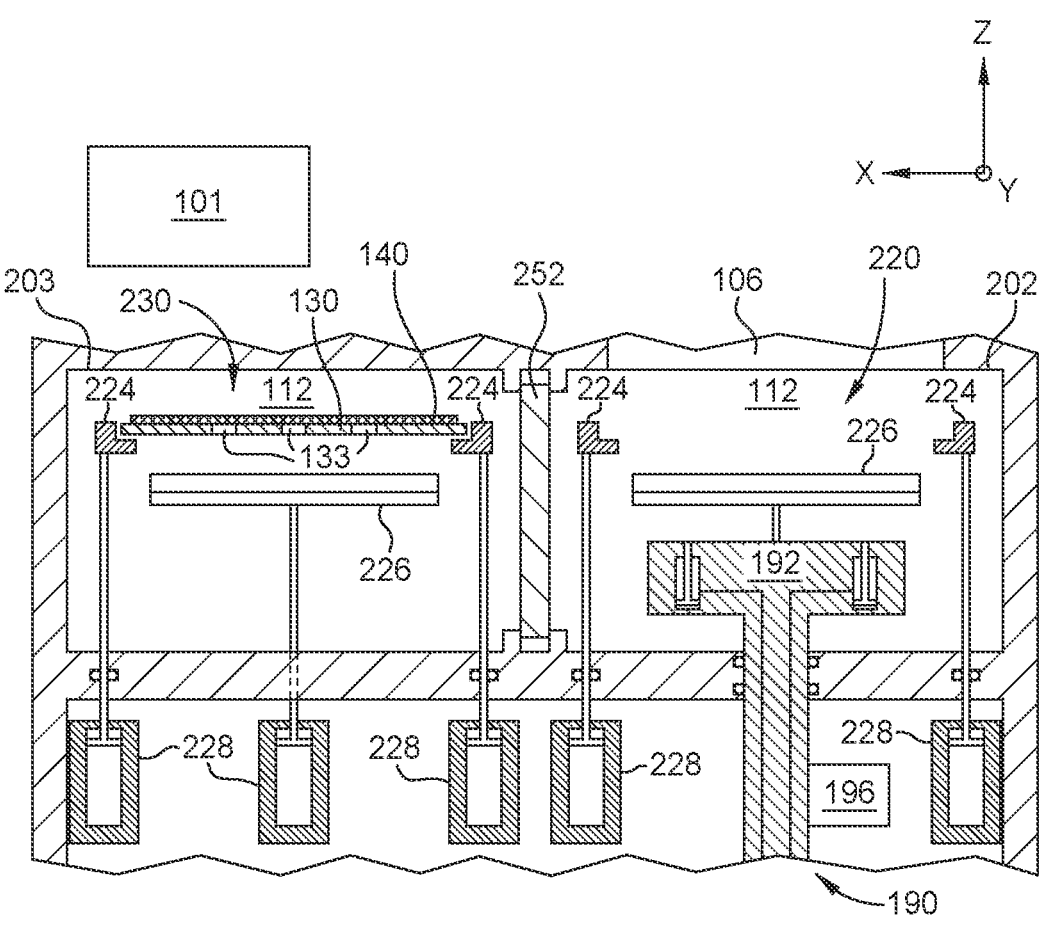
FIG. 2H is a partial side-cross-sectional view of the arrangement of stations showing a change in position of the rails of the first track segment of a second and third station of the arrangement of stations, according to the embodiment of FIG. 2A.
Figure 2I:
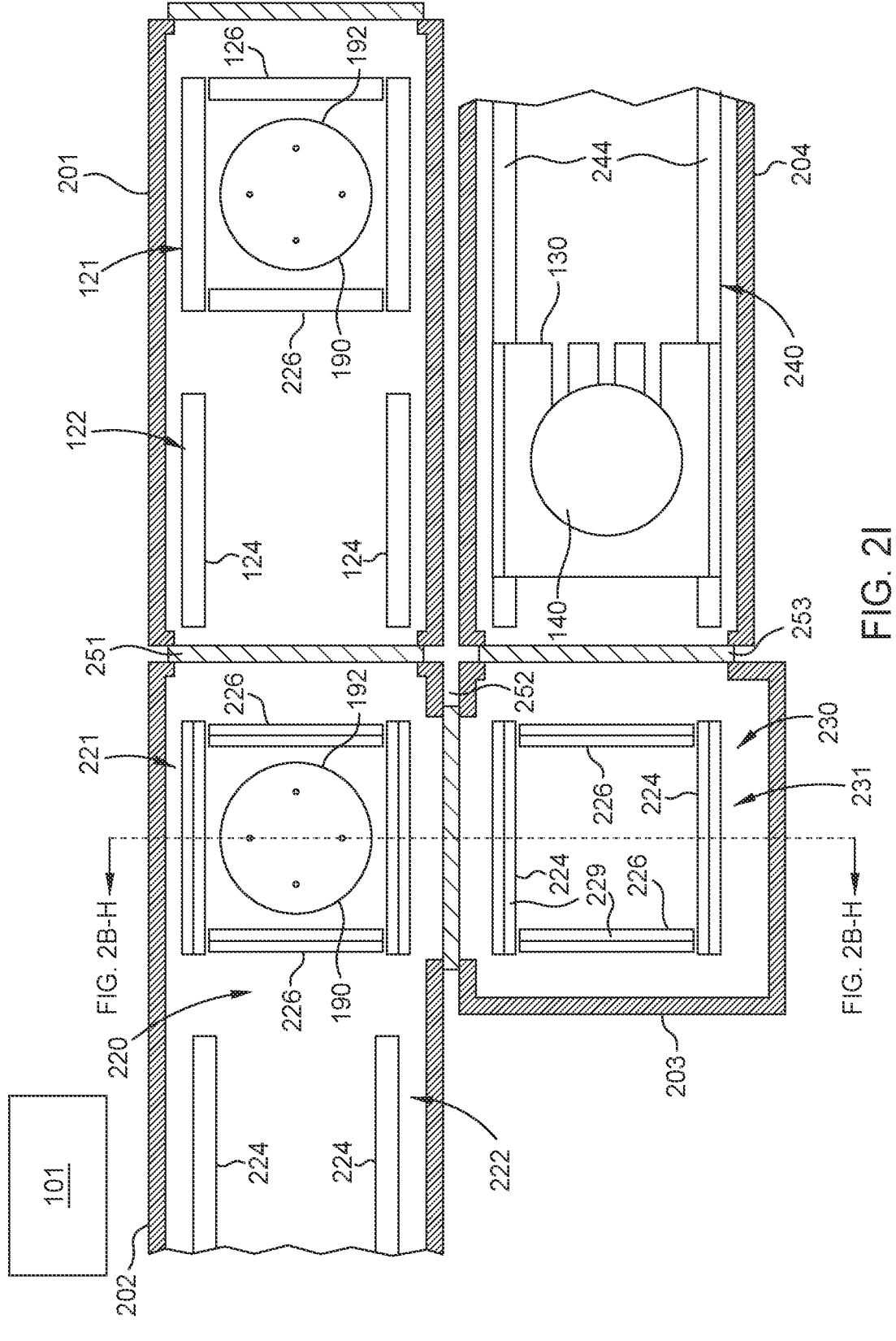
FIG. 2I is a partial top cross-sectional view of an arrangement of stations showing a substrate on a carrier disposed in a fourth station after traveling through a first, second, and third station of the arrangement of stations, according to the embodiment of FIG. 2A.

The carrier 130 is then conveyed into the third station 203 as shown in FIG. 2F while a second slit valve 252 is in the open position. For example, the controller 101 may adjust the magnetic field of the second rails 226 of the second station 202 and third station 203 to convey the carrier 130 into the third station 203 in the X-direction. Once the carrier 130 and substrate 140 are disposed in the third station 203, the first rails 224 in both the second station 202 and third station 203 are returned to the upper position as shown in FIG. 2G. The first rails 224 are substantially co-planar with rails 244 of the fourth station 204 in the upper position. The second rails 226 in both the second station 202 and third station 203 are then returned to the lower position as shown in FIG. 2H to clear a path for the carrier 130 to travel in the Y-direction from the third station 203 to the fourth station 204 while a third slit valve 253 is in an open position. FIG. 2I is a top view of the arrangement of stations 200 showing the carrier 130 and substrate 140 disposed in the fourth station 204 after being conveyed out of the third station 203. The fourth station 204 has a magnetic levitation assembly 240 that may be similar to magnetic levitation assembly 120, but may only have a single pair of magnetic rails 224 as shown in FIGS. 2A and 2I.

In some embodiments, the rails 224 and 226 in the second station 202 and the third station 203 are raised and lowered simultaneously. In some embodiments, the rails 224, 226 in each station 202, 204 are raised asynchronously. For example, the controller 101 may instruct the third station 203 to move the rails second rails 226 to the upper position and to move the first rails 224 to the lower position in preparation to receive a carrier 130 in the X-direction while the carrier 130 is conveyed into the second station 202 in the Y-direction.

Figure 3A:
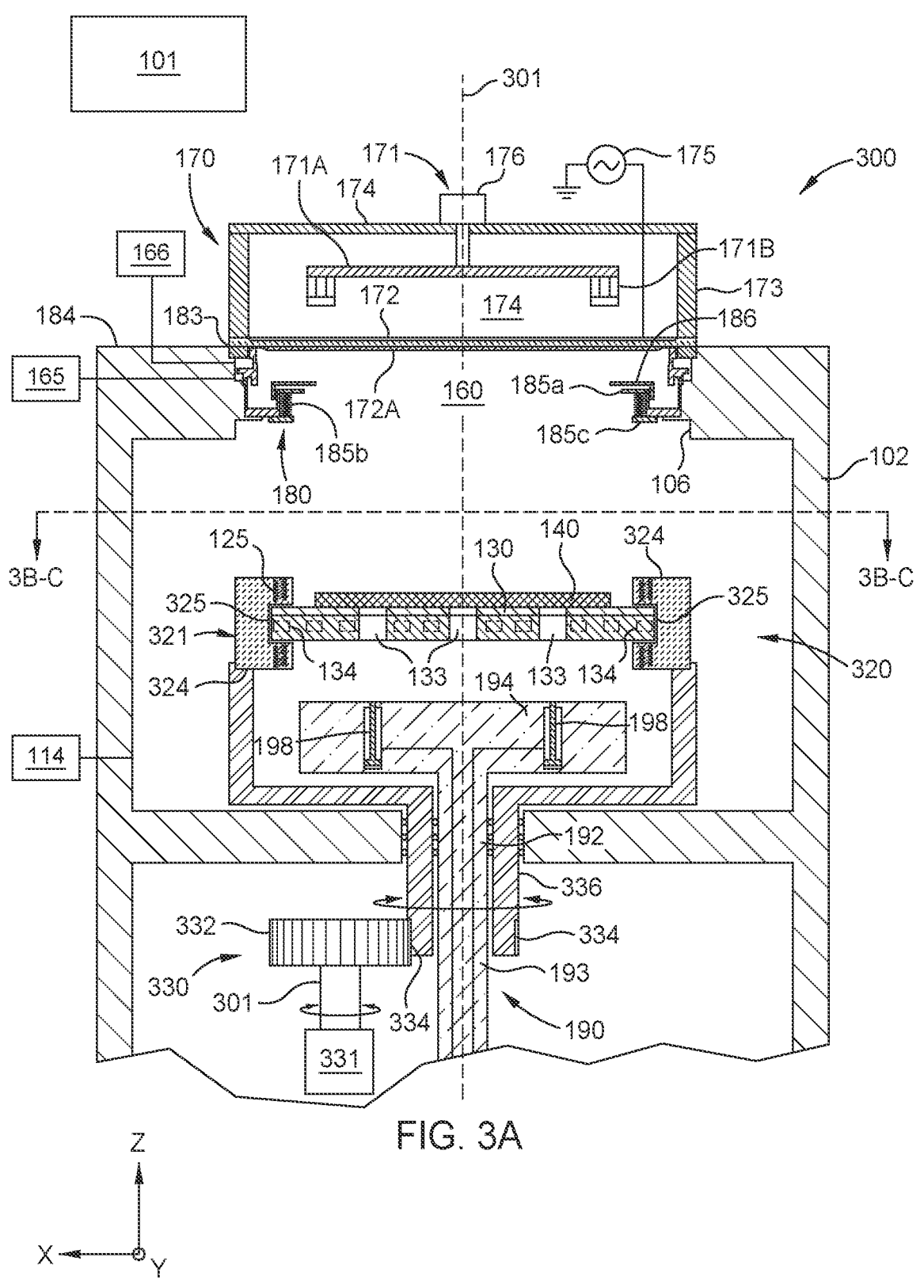
FIG. 3A is a partial side cross-sectional view of a process station, according to one embodiment.
Figures 3B, 3C:
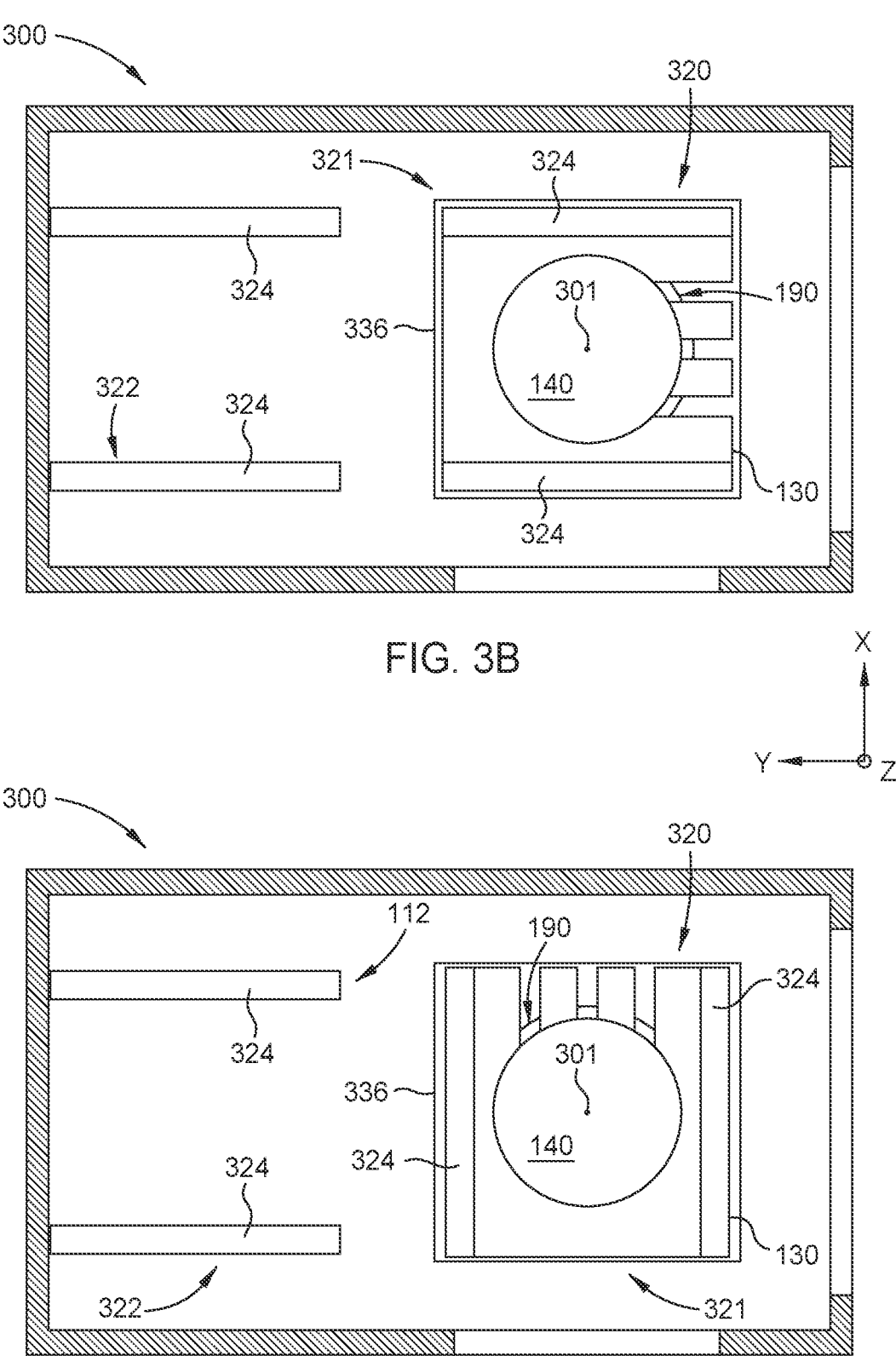
FIG. 3B is a top cross-sectional view of a process station with a first track segment in a first position, according to the embodiment of FIG. 3A.
FIG. 3C is a top cross-sectional view of a process station with a first track segment in a second position, according to the embodiment of FIG. 3A.

FIGS. 3A-3C illustrate a station 300 configured to change the axial direction of travel of the carrier 130, The station 300 is a routing station and may be included in a substrate processing system. FIG. 3A is a cross-section of the station 300. FIGS. 3B and 3C are a top view of a cross-section of the station 300 about section line 3B-C. Station 300 may further be a process station with similar components as process station 100 as indicated by the reference signs without reciting the description of these components of the process station 100 for brevity. A substrate 140 may be processed in the station 300 in a similar manner as described with respect to the process station 100. An X-Y-Z coordinate system is included in the figures to illustrate the axial direction of travel of the carrier 130 and substrate 140 within the station 300.

Station 300 includes a magnetic levitation assembly 320 with a selectively changeable axial direction of conveyance. The axial direction of conveyance of is changed to change the axial direction of travel of the carrier 130. The magnetic levitation assembly 320 is at least partially disposed in the transport region 112. The magnetic levitation assembly 320 may include a first track segment 321, a second track segment 322, and an actuator 330.

The first track segment 321 and second track segment 322 may be rails 324. The rails 324 may include a plurality of magnets, such as coils 125 used to generate an electromagnetic current, to levitate and propel the carrier 130. The rails 324 may include a groove 325, and the carrier 130 may be partially received in the groove 325. As shown in FIG. 3B, the grooves 325 in each rail 324 oppose each other and are aligned. The carrier 130 is levitated within the groove 325. Magnets can be positioned on both sides of the groove 325. In some embodiments, the carrier 130 is levitated and propelled within the groove 325 without contacting the surface of the groove 325.

FIG. 3A illustrates an exemplary actuator 330 is coupled to the rails 324 of the first track segment 321. The actuator 330 rotates the first track segment 321 around a central axis 301, such as rotating the first track segment 321 between a first position shown in FIG. 3B and a second position shown in FIG. 3C. The actuator 330 may include a motor 331 activated to selectively rotate the first track segment 321 about the central axis 301. The motor may be an electric motor, a hydraulic motor, or the like. The motor 331 may include a gear 332 that interfaces with teeth 334 of a body 336 attached to the rails 324. The pedestal 192 may be partially disposed in the body 336, and the actuator 330 can rotate the rails 324 relative to the pedestal 192 and housing 102. In an alternative embodiment, the body 336 may be a ring around the rails 324 with an opening for the pedestal 192 that is rotatable by an actuator 330 to rotate the first track segment 321.

When the first track segment 321 is in the first position, the grooves 325 of the first track segment 321 are aligned with the grooves 325 of the rails 324 of the second track segment 322. The carrier 130 is conveyed into the station 300 in the Y-direction with the first track segment 321 in the first position. FIG. 3B illustrates the carrier 130 in the carrier transfer position. The substrate 140 is processed in a similar manner as described with respect to process station 100 while the first track segment 321 is in the first position. The carrier 130 is moved to the carrier transfer position to transfer the substrate 140 onto the lift pins 198 of the pedestal 192. The carrier 130 moves along the second track segment 321 to the park position (levitated with in the groove of the second track segment 322) in the Y-direction after the substrate 140 is transferred onto the lift pins 198. The pedestal 192 is then moved to the process position to place the substrate 140 into the process region 160 for processing.

Once the process is complete, the pedestal 192 is lowered to the pedestal transfer position to return the substrate 140 into the transport region 112 to be transferred onto the carrier 130. The substrate 140 is supported above the surface of the support plate 194 on the lift pins 198 clear of the path of travel of the carrier 130. The carrier 130 is moved from the park position to the carrier transfer position in the Y-direction to retrieve the substrate 140. The actuator 330 is activated to rotate the first track segment 321 from the first position to the second position to rotate the carrier 130 after the substrate 140 is transferred to the carrier 130 from the lift pins 198. Rotating the first rack segment 321 changes the axial direction that the carrier 130 is conveyed by the magnetic levitation assembly 320. The actuator 330 may rotate the rails 324 about 90 degrees as shown in FIG. 3C. The carrier 130 and substrate 140 may then exit the station 300 in the X-direction.

FIGS. 4A-4E are a top view of a partial cross-section of an exemplary arrangement of stations 400. An X-Y-Z coordinate system is included in the figures to illustrate the axial direction of travel of the carrier 130 and substrate 140 within the arrangement of stations 400. The arrangement 400 may include a first station 401, a second station 402, a third station 403, and a fourth station 404. The carrier 130 transports the substrate 140 through each of the stations 401-404 in sequence. The second station 402 and third station 403 are configured to change the axial direction of travel of the carrier 130.

Figure 4A:
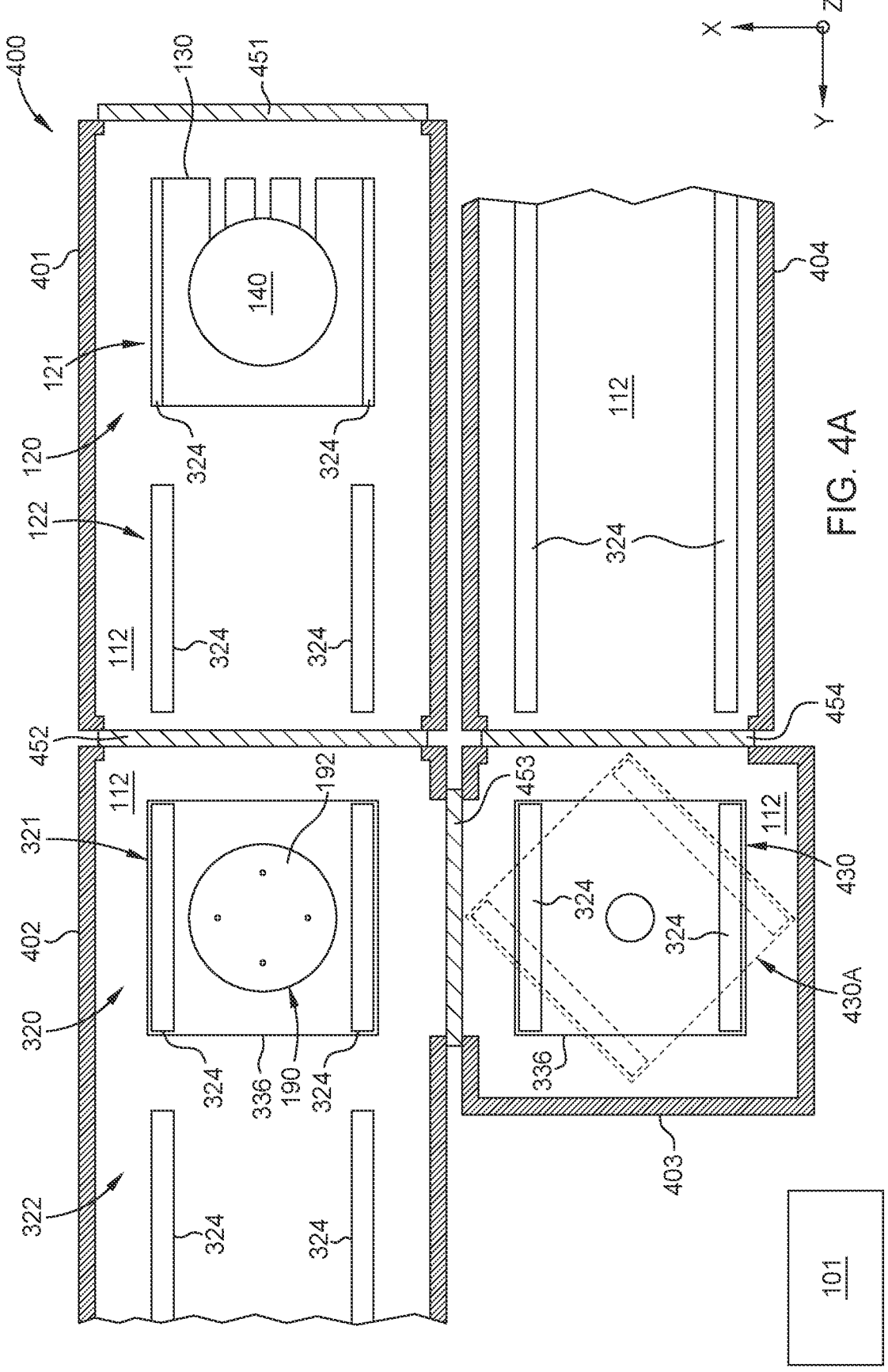
FIG. 4A is a partial top cross-sectional view of an arrangement of stations with a substrate disposed on a carrier within the first station, according to one embodiment.

The first station 401 may be similar to process station 100 with rails 324 substituted for the rails 124 of the first track segment 121 and second track segment 122. Rails 126 may be omitted from first station 201 as shown in FIG. 4A. The second station 202 may be a process station that is similar to station 300. The third station 403 may be a load lock station with a magnetic levitation assembly 430. The magnetic levitation assembly 430 is similar to the magnetic levitation assembly 320 and includes a first track segment 321 rotatable by an actuator 330. FIG. 4A also shows the magnetic levitation partially 430 rotated from the position shown in FIG. 4A as shown by the dashed lines labeled 430A. The fourth station 404 may be a conveyance station that includes a magnetic levitation assembly 440 with rails 324 that are not rotatable.

Figure 4B:
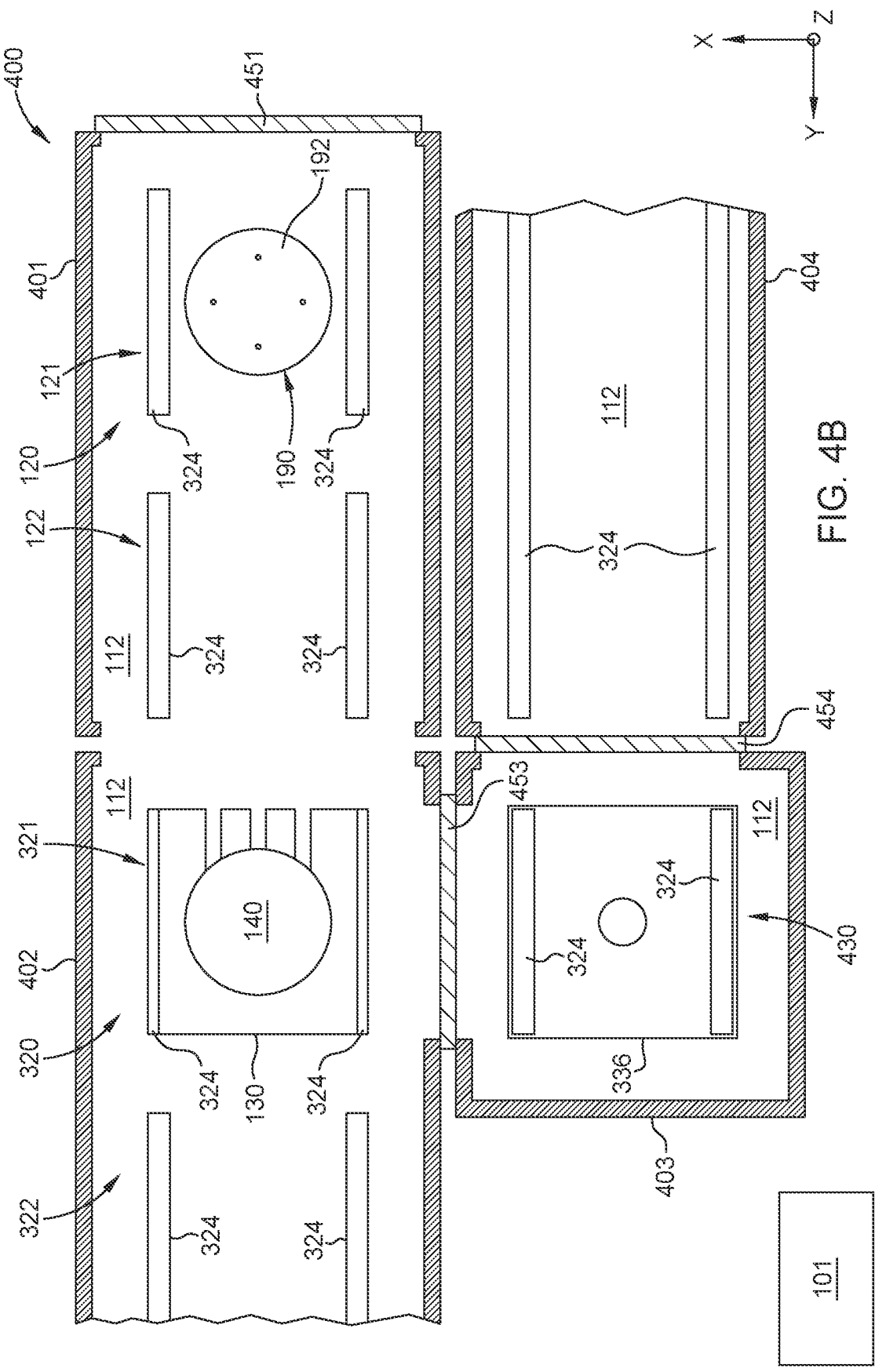
FIG. 4B is a partial top cross-sectional view of an arrangement of stations with a substrate disposed on a carrier within a second station, according to the embodiment of FIG. 4A.
Figure 4C:
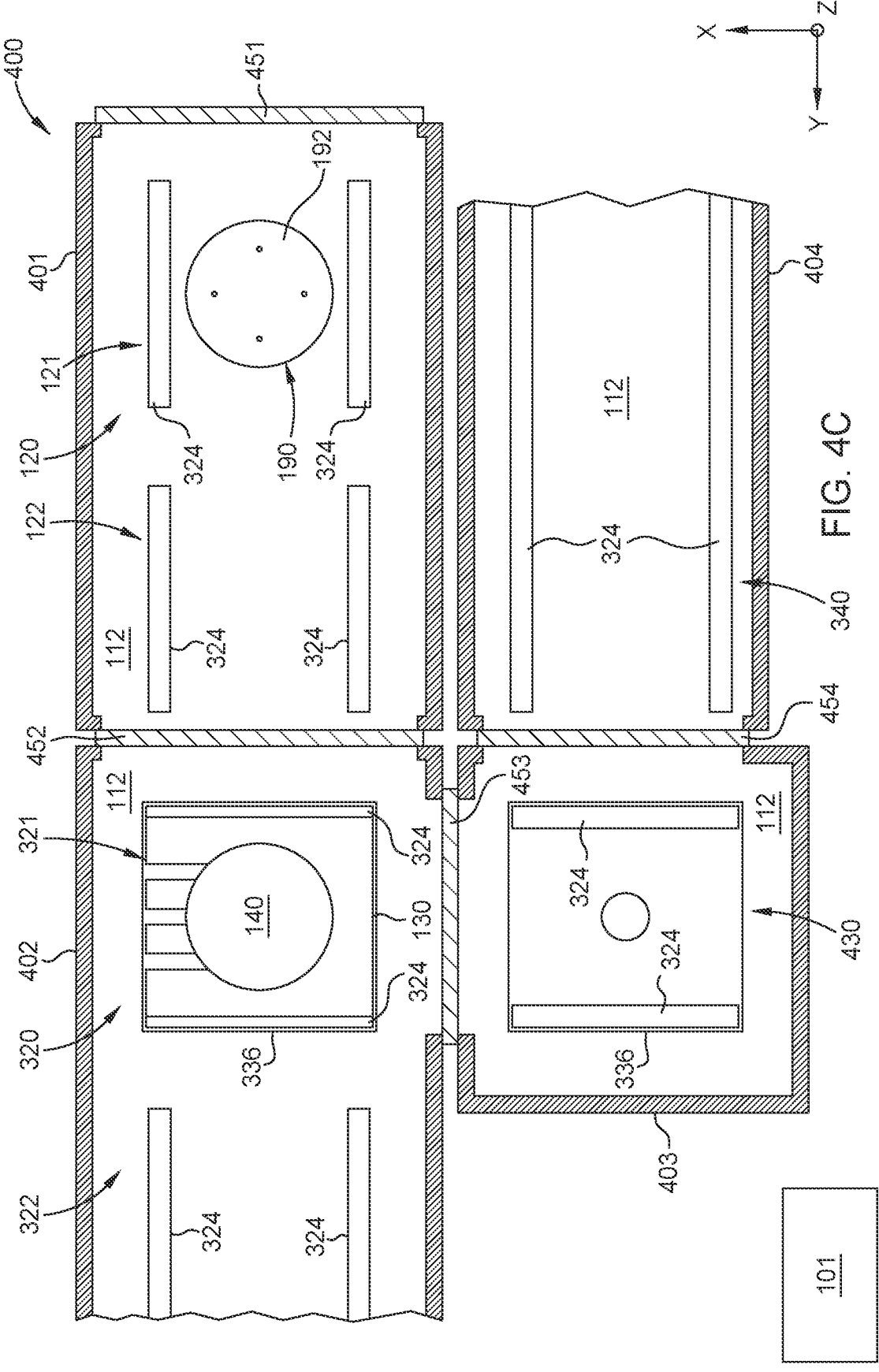
FIG. 4C is a partial top cross-sectional view of an arrangement of stations with a carrier and substrate after being rotated within a second station, according to the embodiment of FIG. 4A.
Figure 4D:
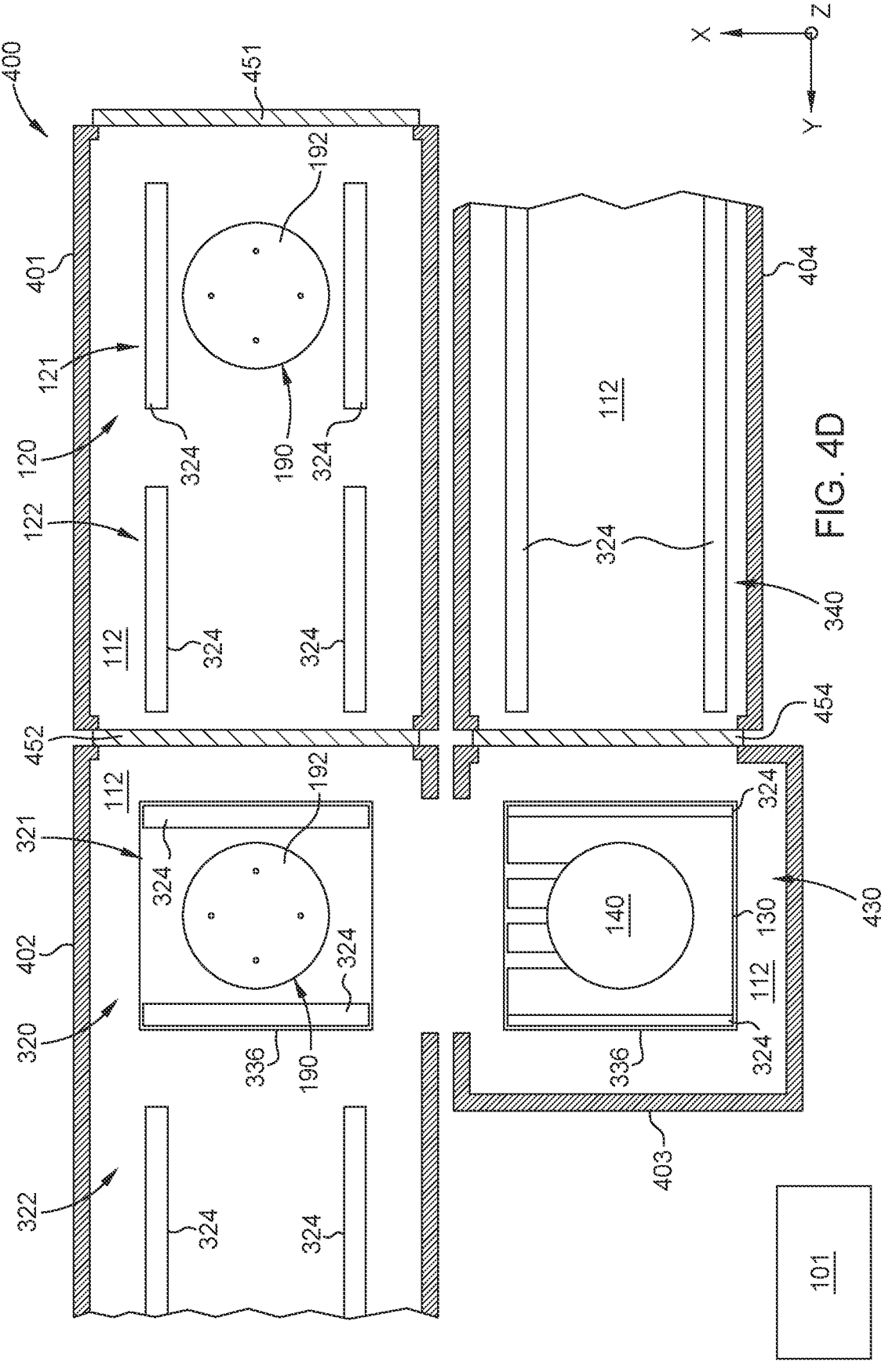
FIG. 4D is a partial top cross-sectional view of an arrangement of stations with a substrate disposed on a carrier within a third station, according to the embodiment of FIG. 4A.
Figure 4E:
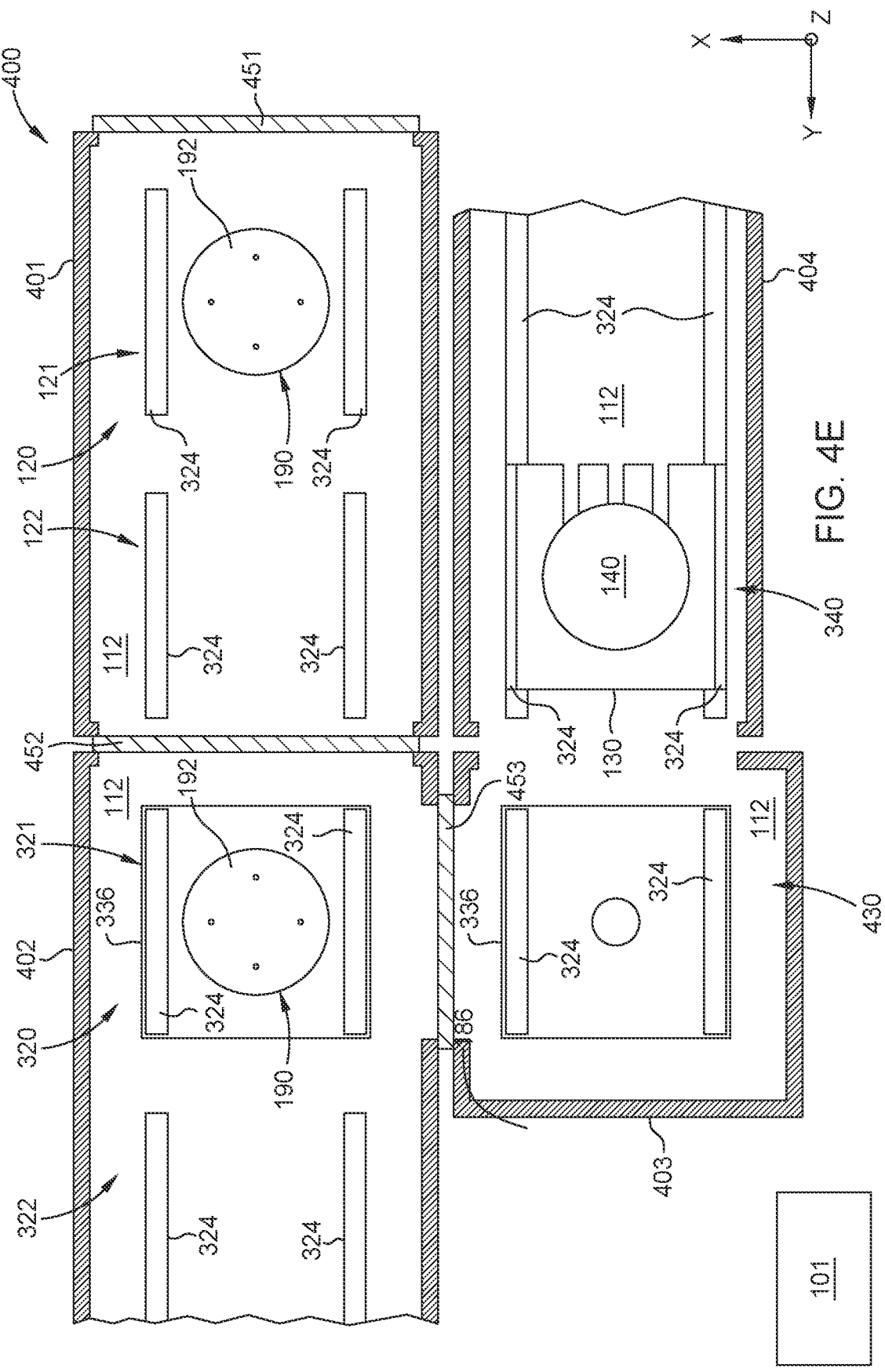
FIG. 4E is a partial top cross-sectional view of an arrangement of stations with a carrier and substrate disposed in a fourth station, according to the embodiment of FIG. 4A.

The carrier 130 and substrate 140 are moved into the first station 401, when a slit valve 451 is open, in the Y-direction as shown in FIG. 4A. The substrate 140 is processed within first station 401 in a similar manner as the process station 100. After processing, the carrier 130 conveys the substrate 140 along the rails 324 of the first station 401 in the Y-direction and into the second station 402 when a slit valve 452 is open as shown in FIG. 4B. The rails 324 in the second station 402 receive the carrier 130 and levitate and propel the carrier 130 within the second station 402. The substrate 140 may be processed within the second station 402 as described with respect to the station 100. As shown in FIG. 40, the rails 324 in the second station 402 are rotated to change the axial direction of travel of the carrier 130 after the substrate 140 processed. The rails 324 in the third station 403 are also rotated to align the rails 324 in both the second station 402 and third station 403. The carrier 130 is then moved in the X-direction along the rails 324 to move the substrate into the third station 403 while a third slit valve 453 is open as shown in FIG. 4D. The rails 324 within the third station 403 are then rotated into alignment with the rails 324 of the fourth station 404 to allow the carrier to enter the fourth station 404 while a fourth slit valve 454 is open in the Y-direction. The rails 324 in the second station 402 are also rotated into alignment with the rails 324 of the first station 401 in preparation for an additional carrier to convey an additional substrate into the second station 402 from the first station 401. FIG. 4E illustrates the carrier 130 in the fourth station 404 after being conveyed in the Y-direction from the third station 403.

FIGS. 5A-5D are a top view of a partial cross-section of an exemplary arrangement of stations 500. An X-Y-Z coordinate system is included in the figure to illustrate the axial direction of travel of the carrier 130 and substrate 140 within the arrangement of stations 500. The arrangement 500 may include a first station 501, a second station 502, a third station 503, and a fourth station 504. The carrier 130 transports the substrate 140 through each of the stations 501-504. The second station 502 and third station 503 are routing stations configured to change the axial direction of travel of the carrier 130 without physically moving the magnetic levitation tracks.

The first station 501 may be similar to process station 100 and is labelled accordingly. The second station 502 may be a process station similar to the process station 100 except that magnetic levitation assembly 120 is substituted with a magnetic levitation assembly 520 including a first track segment 521 and an optional second track segment 522. The axial direction of conveyance of the magnetic levitation assembly 520 is selectively changeable to change the axial direction of travel of the carrier 130. The first track segment 521 includes first rails 524 and second rails 526. The first and second rails 524, 526 may be connected together by corner members 528. The corner members 528 may include a magnet, such as a permanent magnet, or the corner member 528 may be composed of a non-magnetic material. The first rails 524 and second rails 526 may have the same or different lengths.

The first rail 524 includes an arrangement of magnets, such as alternating permanent magnets 524p and electromagnets 524e. The second rails 526 also include an arrangement of magnets, such as alternating permanent magnets 526p and electromagnets 526e. The permanent magnets 524p interact with the magnets 134 of the carrier 130 to levitate the carrier 130. The electromagnets 524e, 526e interact with the magnets 134 to levitate and propel the carrier 130. The electromagnets 524e, 526e may be selectively turned on and off by the controller 101. The controller 101 can also selectively change the strength of the magnetic field generated by the electromagnets 524e, 526e by increasing or decreasing the current supplied to the electromagnets 524e, 526e from a power source (not shown) to selectively propel the carrier 130 in response to the interaction of the electromagnets 524e, 526e with the magnets 134 of the carrier 130. The controller 101 may use the electromagnets 524e to move the carrier 130 in the Y-direction and the electromagnets 526e to move the carrier 130 in the X-direction. For example, the strength of the electromagnets 524e may adjusted to propel the carrier 130 in the Y-direction while the electromagnets 526e are shut-off. The strength of the electromagnets 526e may adjusted to propel the carrier 130 in the X-direction while the electromagnets 524e are shut-off. In some embodiments, the axial direction of conveyance of the magnetic levitation assemblies 520, 530 may be changed by turning off the electromagnets 524e and turning on the electromagnets 526e, or vice versa. In some embodiments, the axial direction of conveyance of the magnetic levitation assemblies 520, 530 may be changed by decreasing the strength of the electromagnets 524e and increasing the strength of the electromagnets 526e, or vice versa.

Figure 5A:
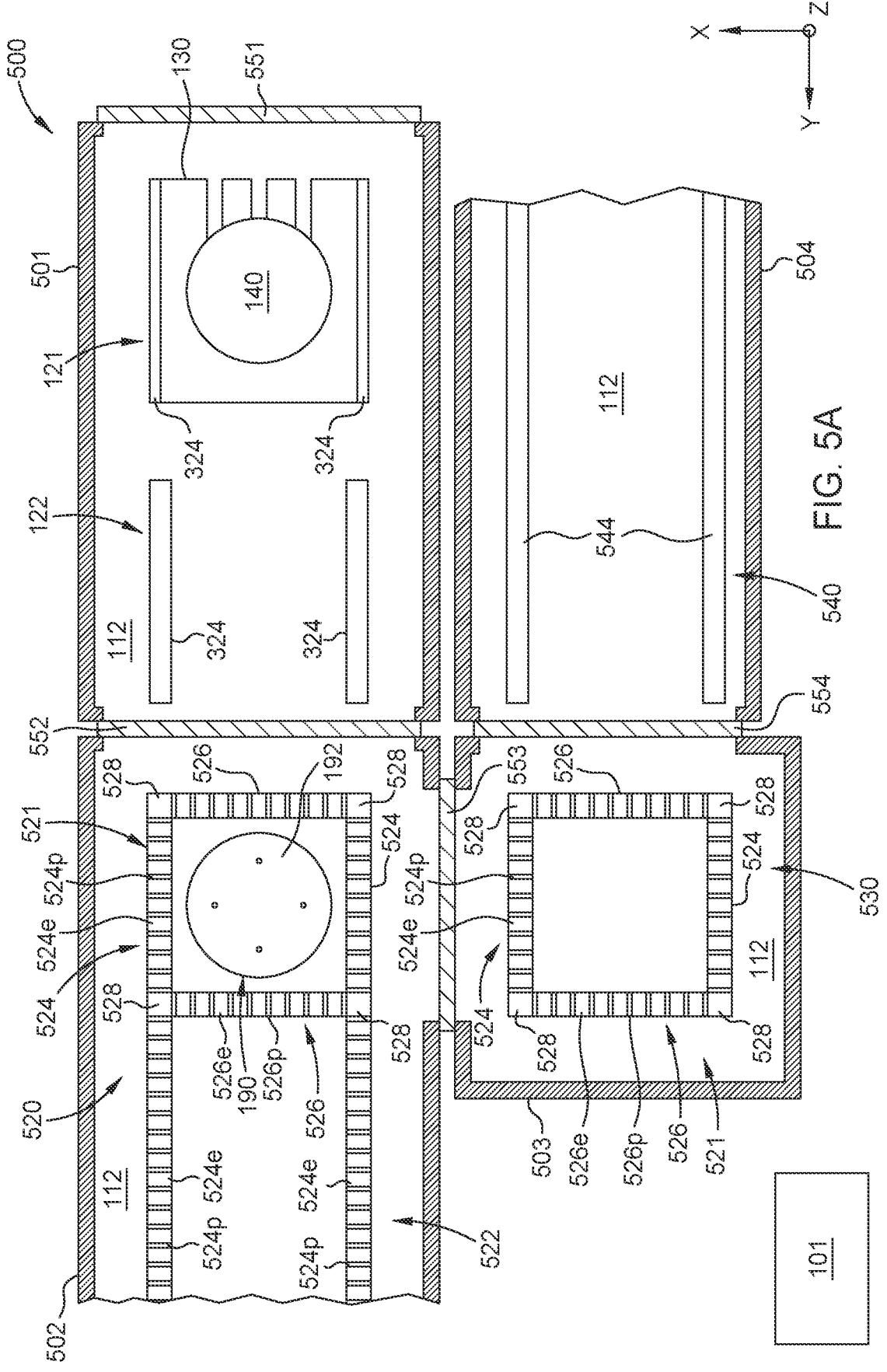
FIG. 5A is a partial top cross-sectional view of an arrangement of stations with a substrate disposed on a carrier within the first station, according to one embodiment.

The second rails 526 may be disposed between each first rail 524 as shown in FIG. 5A. The second rails 526 may be shorter than or equal in length to the first rails 524. In some embodiments, the first rails 524 and second rails 526 touch. In some embodiments, the first rails 524 and second rails 526 are integral with one another.

The third station 503 is a load lock station that includes a magnetic levitation assembly 530 having a first track segment 521 but omits the second track segment 522. The fourth station 504 may be a conveyance station with a magnetic levitation assembly 540 including rails 544 that have plurality of magnets, such as alternating permanent magnets and electromagnets similar to rail 524. In some embodiments, the rails 544 may be similar to rails 244 in FIG. 2A.

Figure 5B:
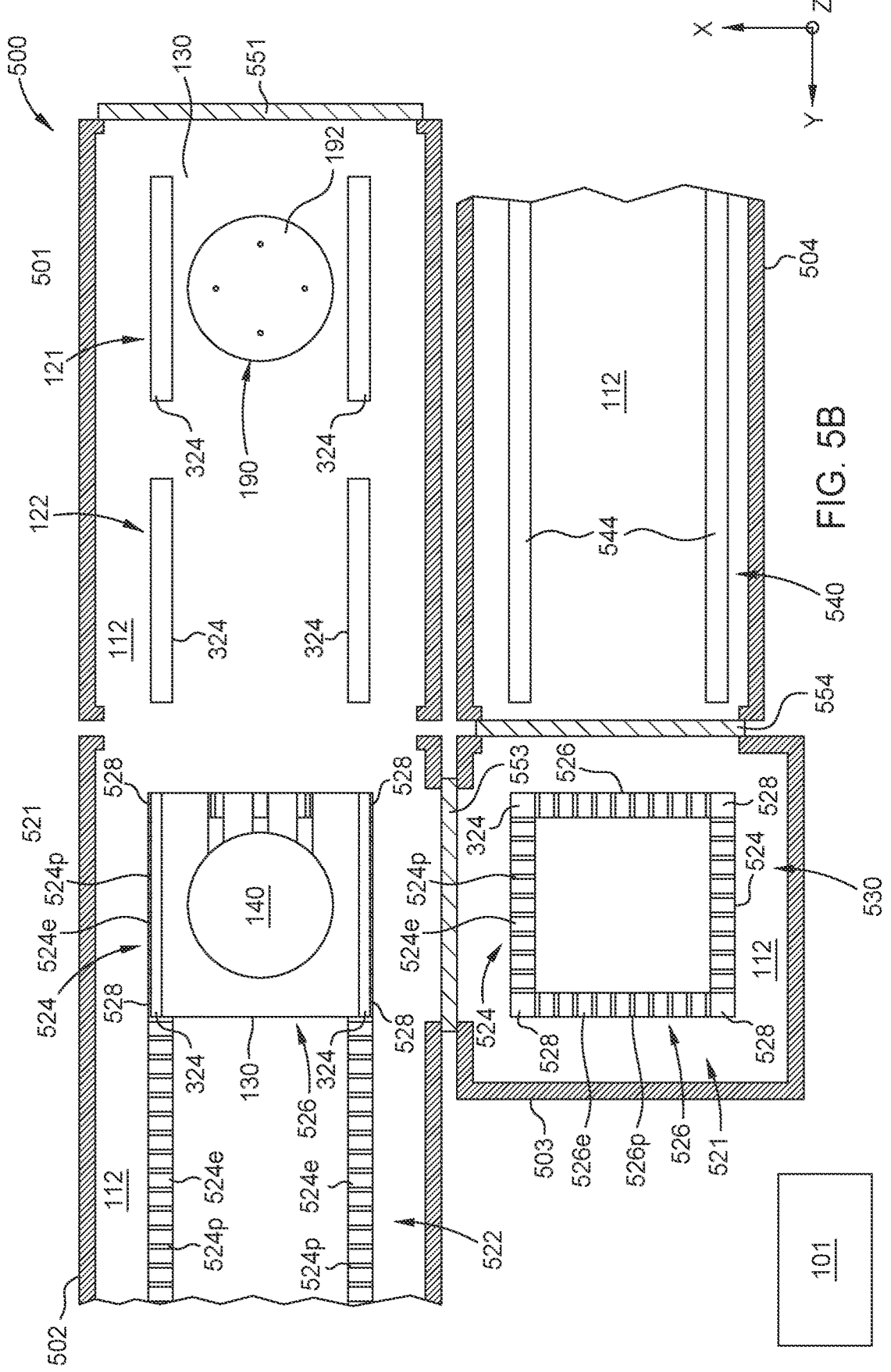
FIG. 5B is a partial top cross-sectional view of an arrangement of stations with a substrate disposed on a carrier within a second station, according to the embodiment of FIG. 5A.
Figure 5C:
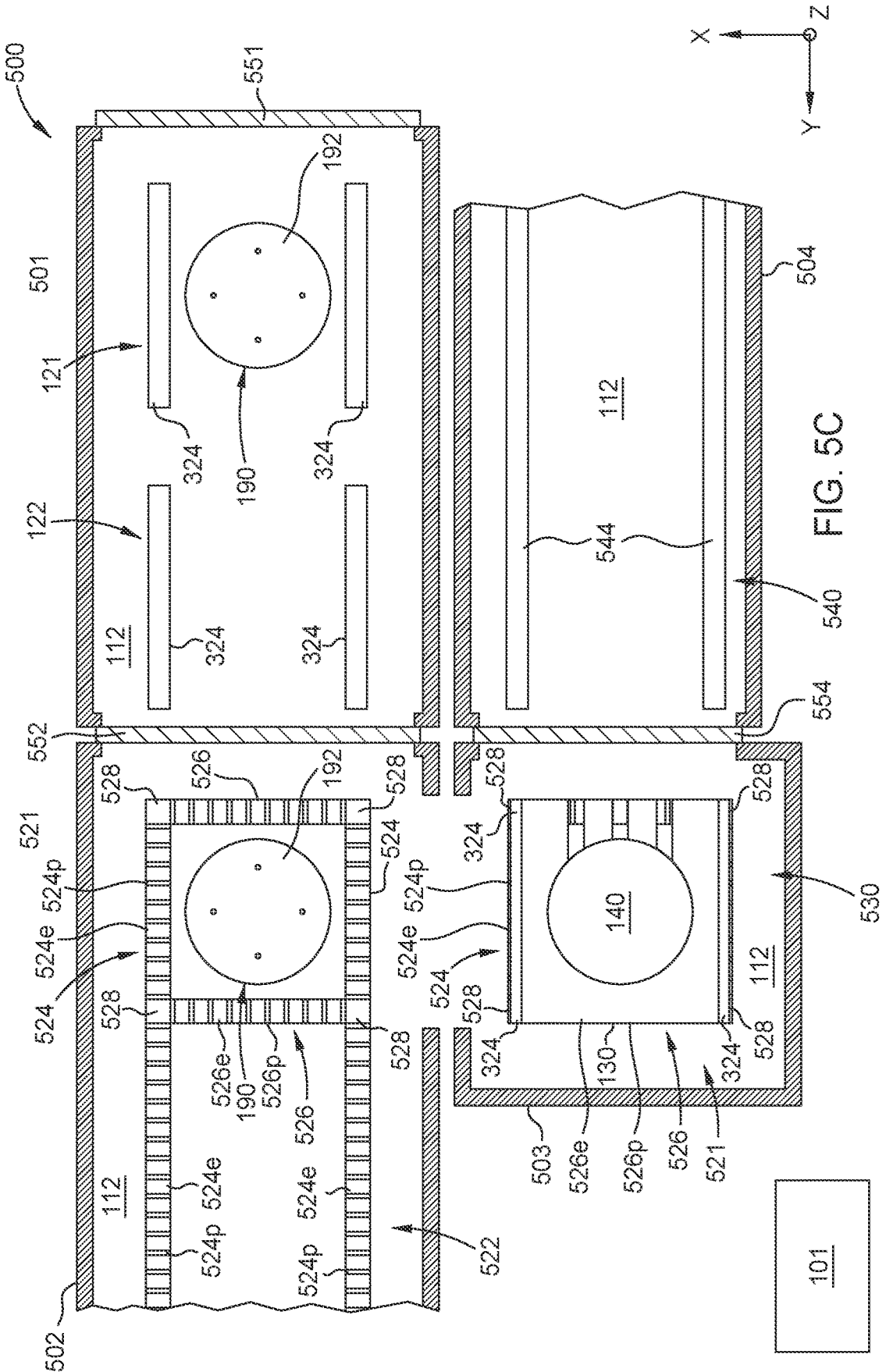
FIG. 5C is a partial top cross-sectional view of an arrangement of stations with a substrate disposed on a carrier within a third station, according to the embodiment of FIG. 5A.
Figure 5D:
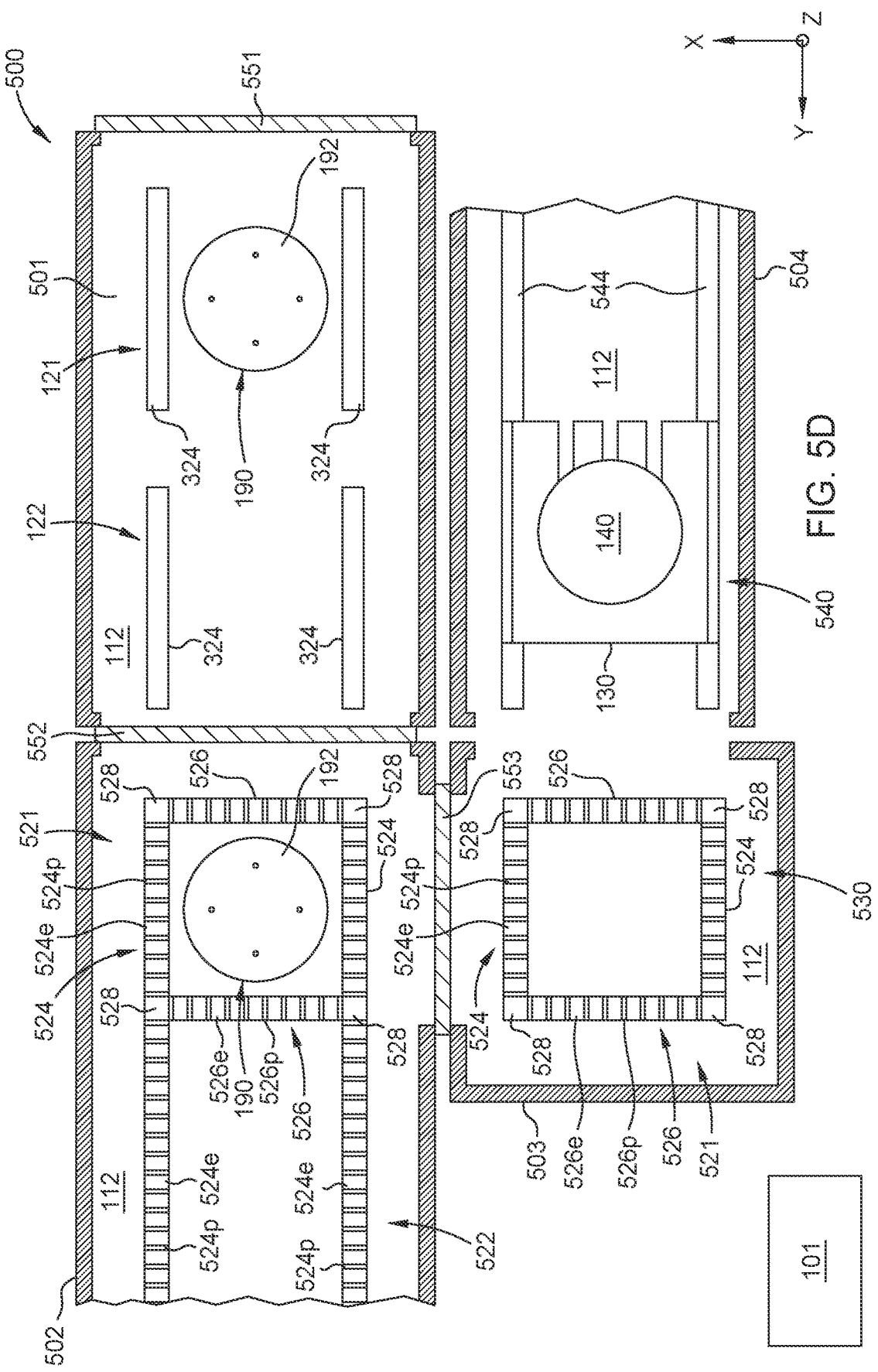
FIG. 5D is a partial top cross-sectional view of an arrangement of stations with a substrate disposed on a carrier within a fourth station, according to the embodiment of FIG. 5A.

FIGS. 5A-5D illustrate a sequence of moving the carrier 130 through the arrangement of stations 500. The carrier 130 conveys the substrate 140 into the first station 501 while a first slit valve 551 is open to the carrier transfer position as shown in FIG. 5A. The carrier 130 is processed in the first station 501 in a similar manner as described with respect to process station 100. After the substrate 140 is transferred back onto the carrier 130, the carrier 130 is conveyed into the second station 502 by coordinating the electromagnetic coils 125 (not shown) within the rails 124, 126. As shown in FIG. 5B, the carrier 130 is moved into the second station 502, while a second slit valve 552 is open, and to the carrier transfer position above the first track segment 521 to transfer the substrate 140 to the lift pins 198. The carrier 130 is then moved to the park position above the second track segment 522 using the electromagnets 524e of the first rails 524. The substrate 140 is lifted into the process region 160 (not shown) of the second station 502 by the pedestal 192. The pedestal 192 is lowered to the pedestal transfer position after the substrate 140 is processed. The carrier 130 is moved back to the carrier transfer position by the electromagnets 524e of the first rails 524 so that the substrate 140 can be transferred back onto the carrier 130. Once the transfer is complete, the carrier 130 is conveyed to the third station 503 in the X-direction while a third slit valve 553 is open using the electromagnets 526e of the second rails 526 as shown in FIG. 5C, The electromagnets 524e in the first rails 524 in the third station 503 may be coordinated to convey the carrier 130 into the fourth station 504 in the Y-direction, while a fourth slit valve 554 is open, as shown in FIG. 5D.

Figure 6A:
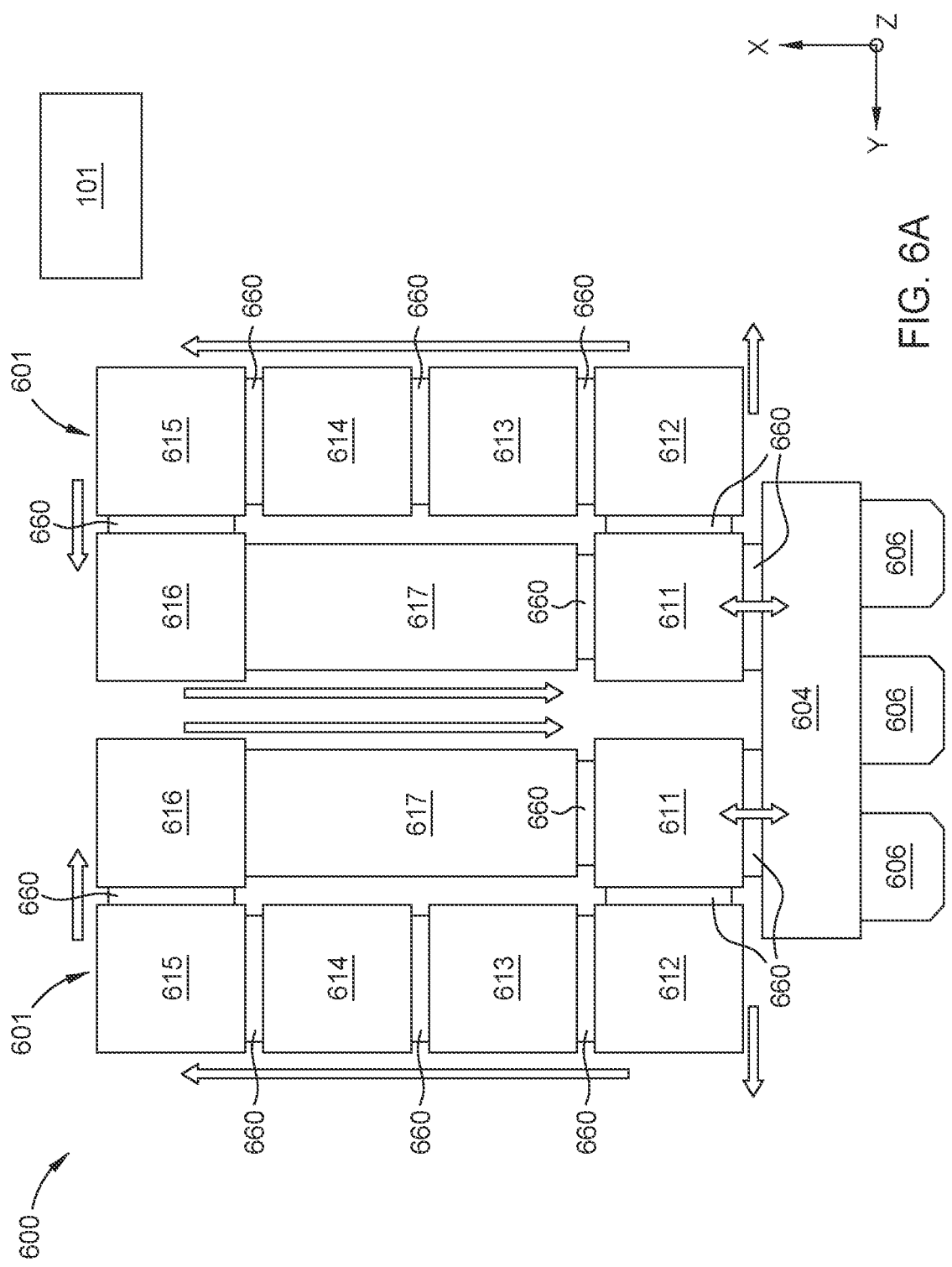
FIG. 6A is a top schematic view of a substrate processing system, according to one embodiment.
Figure 6B:
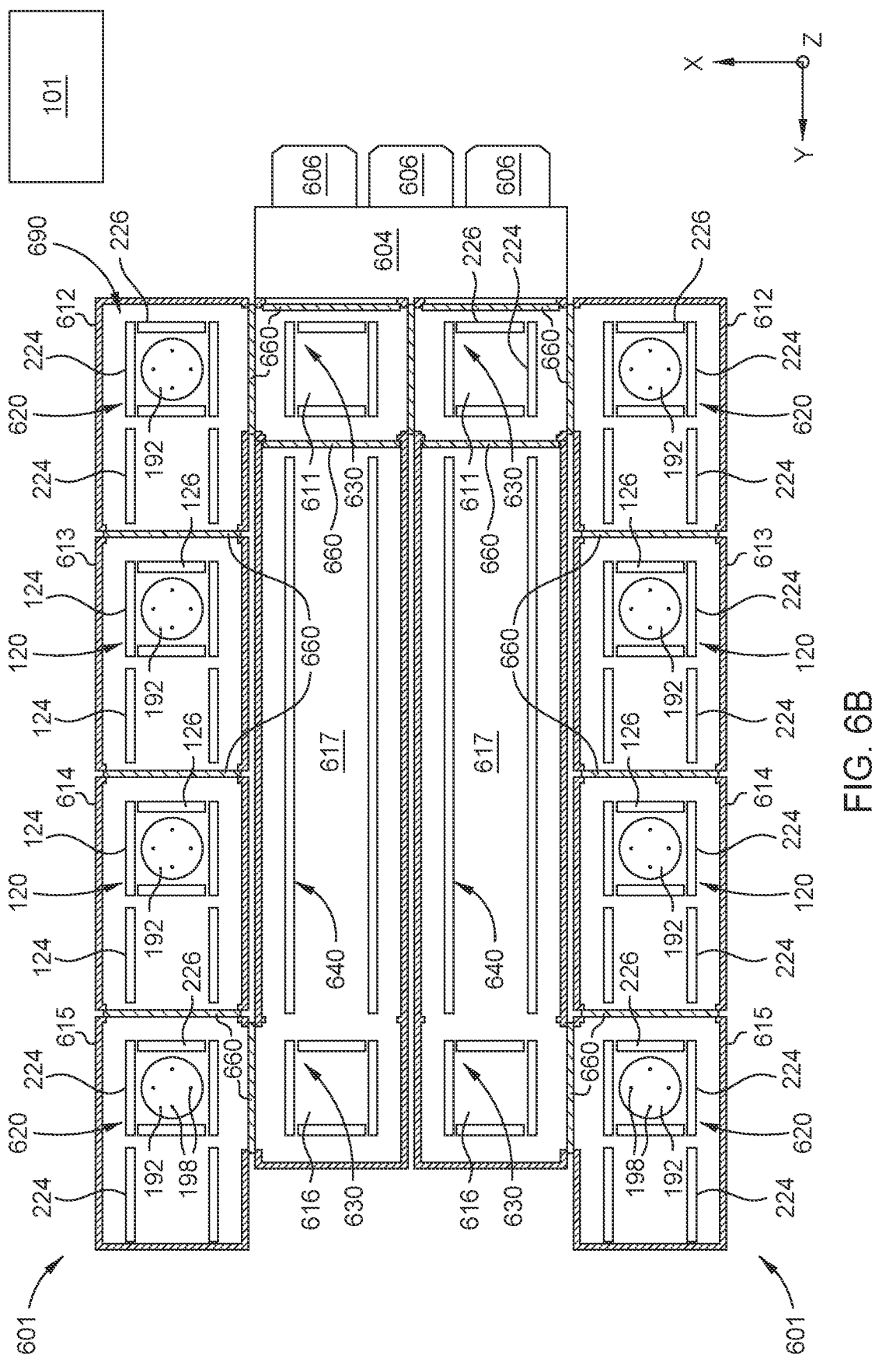
FIG. 6B is a partial top cross-sectional view of substrate processing system, according to the embodiment of FIG. 6A.

FIGS. 6A-6B illustrates a schematic substrate processing system 600. The substrate processing system 600 includes the controller 101, at least one processing line 601, and a factory interface 604. While FIG. 6A illustrates two processing lines 601, the substrate processing system 600 may have only one processing line 601 or more than two processing lines 601. Each processing line 601 is configured to fabricate a substrate 140 (not shown). Each processing line 601 includes a plurality of stations, such as stations 611-617 shown in FIG. 6. Each processing line 601 includes a magnetic transportation system 690 formed from the individual magnetic levitation assemblies of the stations 611-617 that conveys a substrate 140 disposed on a carrier 130 (not shown) through the processing line 601. Each processing line 601 may include a plurality of slit valves 660 to selectively isolate each station. The slit valves 660 are selectively opened and closed to allow a clear path for the travel of the carrier 130 and to selectively isolate the stations 611-617 from one another and to facilitate the pressurization or depressurization of a station.

The substrate processing system 600 is used to process multiple substrates in each processing line 601 to produce a desired fabricated substrate. For example, the substrate processing system 600 may be a PVD system as shown in FIG. 6A. The first station 611 is a first load lock, the second station 612 is a degas station, the third station 613 is a pre-clean station, the fourth station 614 is a tantalum nitride deposition station, the fifth station 615 is a copper deposition station, the sixth station 616 is a second load lock, and the seventh station 617 is a conveyance station. The magnitude of a vacuum within each station may increase from station to station. For example, the magnitude of the vacuum in the fifth station 615 may exceed the magnitude of a vacuum in the other stations.

Multiple substrates are processed in each processing line 601 simultaneously. The carrier 130 is moved to the carrier transfer position within each process station 612-615, which facilitates the transfer of the substrate 140 onto the pedestal assembly 190. Once the substrate 140 is transferred to the pedestal assembly 190, such as being supported above the carrier 130 by extended lift pins 198, the carrier 130 moves to the park position. The pedestal assembly 190 moves to the process position to place the substrate 140 in the process region of each process station 612-615 for processing. Once the process is complete, the pedestal 192 returns to the pedestal transfer position so that the substrate 140 can be returned onto the carrier 130 so that the carrier 130 and substrate 140 may be conveyed into a different station.

The first station 611 is coupled to the factory interface 604. The factory interface 604 may be coupled to one or more front opening unified pods (FOUPs) 606. FOUPs 606 may each be a container having a stationary cassette therein for holding multiple substrates. FOUPs 606 may each have a front opening interface configured to be used with factory interface 604. Factory interface 604 may have a buffer chamber (not shown) and one or more robot assemblies (not shown) configured to transfer substrates via linear, rotational, and/or vertical movement between FOUPs 606 and the carrier 130 within the first station 611.

FIG. 6B is a top perspective view of a cross-section of the substrate processing system 600 to illustrate the magnetic levitation assemblies within the substrate processing system 600. The magnetic levitation assemblies form the magnetic transportation system 690 that circulates the carriers 130 through the substrate processing system 600.

FIG. 6B includes an X-Y-Z co-ordinate system to show the axial direction of travel of the carrier and substrate through the substrate processing system 600. The arrows illustrate the direction that one or more carriers circulate within the processing line 601. The carrier and substrate travel in the X-direction to move from the first station 611 to the second station 612. The carrier and substrate travel in the Y-direction from the second station 612 to the fifth station 615. The carrier and substrate travel in the X-direction from the fifth station 615 to the sixth station 616. The carrier and substrate then travel in the Y-direction from the sixth station 616 back to the first station 611 through the seventh station 617. The first station 611, the second station 612, the fifth station 615, and the sixth station 616 each include a magnetic levitation assembly configured to change the axial direction of travel of the carrier and substrate. The first station 611 and second station 612 and fifth station 615 and sixth station 616 cooperate to change the axial direction of travel of the carrier 130.

The first station 611 and sixth station 616 (e.g., load locks) have a magnetic levitation assembly 630. FIG. 6B illustrates the magnetic levitation assembly 630 as being similar to the magnetic levitation assembly 230 and including the rails 224, 226. In some embodiments, the magnetic levitation assembly 630 may be similar to the magnetic levitation assemblies 430, 530 as described above.

The second station 612 and fifth station 615 (e.g., process stations) have a magnetic levitation assembly 620. FIG. 6B illustrates the magnetic levitation assembly 620 as being similar to the magnetic levitation assembly 220 and including rails 224, 226. In some embodiments, the magnetic levitation assembly 620 may be similar to the magnetic levitation assemblies 320, 520 as described above.

Third station 613 and fourth station 614 may be similar to process station 100 described above, or another station described above to process a substrate. The third station 613 and fourth station 614 each have a magnetic levitation assembly 120 including a first track segment 121 with rails 124, 126 and a second track segment 122 with rails 124. In some embodiments, the second rail 126 is omitted. In some embodiments, the magnetic levitation assembly 120 in the third station 613 and fourth station 614 may instead have rails selected from the rails 224, 226, 324, 524, and 526 as described above or any other rails described herein.

The magnetic assembly 630 of the first station 611 and magnetic levitation assembly 620 of the second station 612 cooperate to change the axial direction of travel of the carrier 130. Additionally, the magnetic levitation assembly 620 of the fifth station 615 and the magnetic levitation assembly 630 of the sixth station 616 cooperate to change the axial direction of travel of the carrier 130.

The seventh station 617 may be similar to stations 204, 404, 504, and may include a magnetic levitation assembly 640 that includes rails selected from rails 124, 126, 224, 226, 324, 524, and 526 as described above or any other rails described herein.

A carrier 130 with a substrate 140 may circulate within the substrate processing system 600 as follows. A substrate 140 is transferred from a FOUP 606 to a carrier 130 located in the first station 611. The carrier 130 is then conveyed to the second station 612 in the X-direction. The carrier 130 is conveyed from the second station 612 to the fifth station 615 in the Y-direction through the third station 613 and fourth station 614. The substrate 140 may be processed in the stations 612-615. The carrier 130 is then conveyed from the fifth process station 615 to the sixth station 616 in the X-direction. The carrier 130 is then conveyed into the seventh station 617 from the sixth station 616 in the Y-direction. The seventh station 617 conveys the carrier 130 back to the first station 611 in the Y-direction. Once the carrier 130 has returned to the first station 611, the fabricated substrate 140 is removed from carrier 130 in the first station 611 and transferred to a FOUP 606. A next substrate 140 is then placed on the carrier 130 located in the first station 611 for the processing cycle in the substrate processing system 600 as described above.

Multiple substrates may circulate through each processing line 601 at the same time. Each process station within each processing line (e.g., stations 612-615) may process a substrate contained therein simultaneously or asynchronously.

The number of carriers 130 may be equal to or less than the number of stations. The number of stations in each processing line 601 may be more or less than the seven stations shown in FIG. 6A. For example, the processing line 601 may have more than ten stations.

In one example, a first substrate on a first carrier is conveyed into the second station 612 from the first station 611. A second substrate on a second carrier is conveyed into the third station 613 from the second station 632. A third substrate on a third carrier is conveyed into the fourth station 614 from the third station 613. A fourth substrate on a fourth carrier is conveyed into the fifth station 615 from the fourth process station 614. A fifth substrate on a fifth carrier is conveyed into the sixth station 616 from the fifth station 615. After the five carriers have been conveyed, the one or more of the slit valves 660 may be closed to isolate the process stations 612-615 while the four substrates disposed therein are processed. While the process stations 612, 615 process a substrate disposed therein, the fifth substrate on the fifth carrier is conveyed back into to the first station 611 along the magnetic levitation assembly 640 of the seventh station 617. The fifth substrate is then removed from the first station 611 and a sixth substrate is placed on the fifth carrier now disposed in the first station 611 in preparation for processing in the second station 612. The sixth substrate may be placed on the fifth carrier in the first station 611 before stations 612-615 have completed processing the substrate disposed therein.

Each processing line 601 may have a separate seventh station 617, In some embodiments, each processing line 601 may share a seventh station 617 that has two magnetic levitation assemblies 640 such that each processing line 601 is able to process one or more substrates independently from one another.

Figure 7:
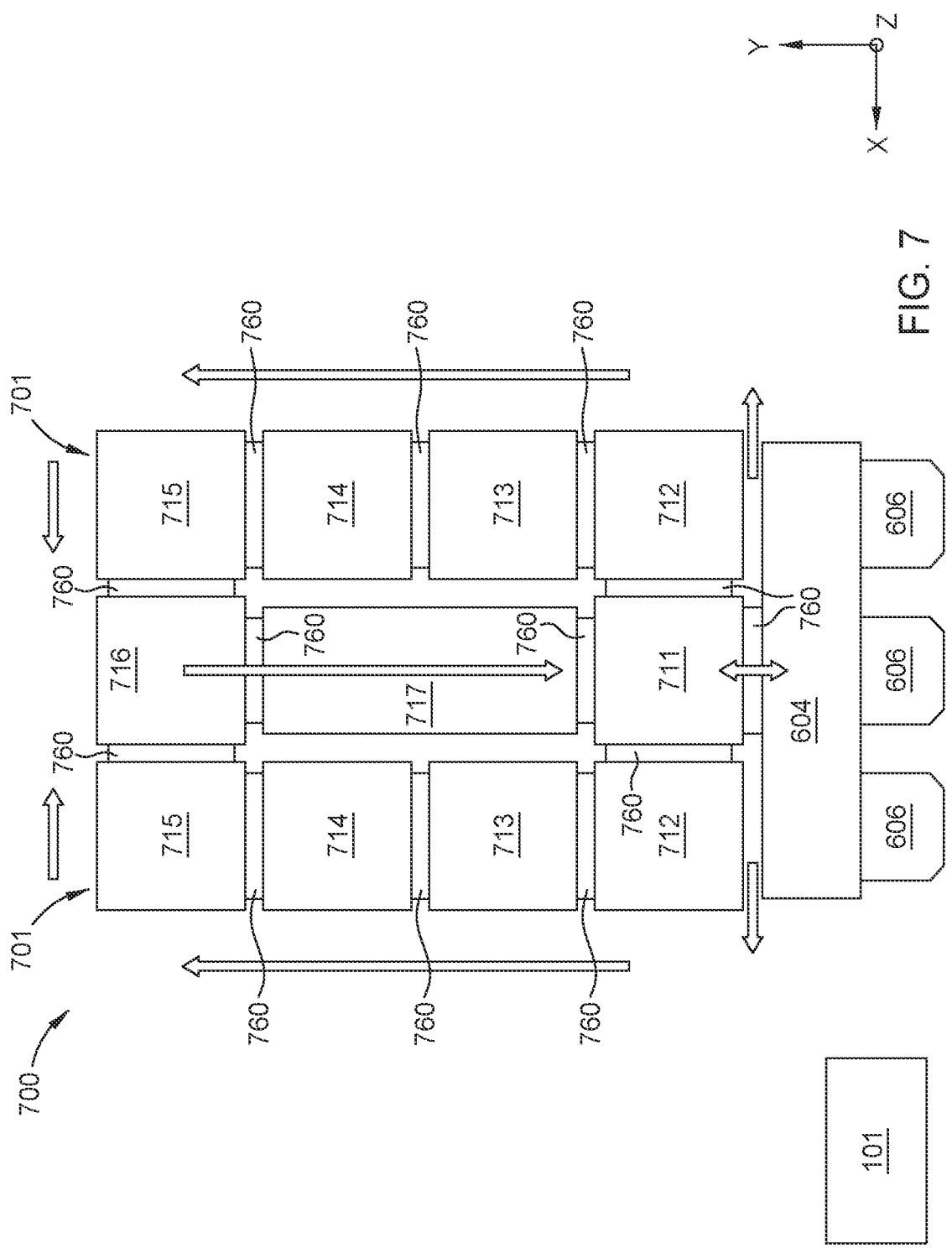
FIG. 7 is a top schematic view of a substrate processing system, according to one embodiment.

FIG. 7 illustrates a schematic substrate processing system 700 that includes a controller 101, at least one processing line 701, and a factory interface 604. Substrate processing system 700 differs from system 600 in that both processing lines share one or more stations, including sharing the magnetic levitation assembly of each shared station. The one or more stations may be shared to reduce the footprint of the substrate processing system.

As shown, both processing lines 701 each include a plurality of stations, such as stations 711-717. Each processing line 701 includes a magnetic transportation system (not shown) formed from the individual magnetic levitation assemblies of the stations 711-717 that conveys a substrate 140 (not shown) disposed on a carrier 130 (not shown) through the processing line 701.

Each processing line 701 may include a plurality of slit valves 760 to selectively isolate each station. The slit valves 760 are selectively opened and closed to allow a clear path for the travel of the carrier 130 and to selectively isolate the stations 711-717 from one another and to facilitate the pressurization or depressurization of a station.

The substrate processing system 700 is used to process multiple substrates in each processing line 701 to produce a desired fabricated substrate. For example, the substrate processing system 700 may be a PVD system. For example, the first station 711 is a first load lock, the second station 712 is a degas station, the third station 713 is a pre-clean station, the fourth station 714 is a tantalum nitride deposition station, the fifth station 715 is a copper deposition station, the sixth station 716 is a second load lock, and the seventh station 717 is a conveyance station. The substrate is transferred and processed within each process station 712-715 in a similar manner as discussed above with other process stations, including stations 612-615. The magnitude of a vacuum within each station may increase from station to station. For example, the magnitude of the vacuum in the fifth station 715 may exceed the magnitude of a vacuum in the other stations.

Each processing line 701 shares the first station 711, sixth station 716, and seventh station 717. As a result, the magnetic transportation system of each processing line 701 share the magnetic levitation assemblies in the shared stations.

The first station 711, sixth station 716, and seventh station 717 may only handle a single carrier at a time. As a result, fabrication in each processing line 701 may be offset by a period of time from one another. This offset period of time may be based on the time needed to process a substrate within the first station 711, the sixth station 716, and the seventh station 717. For example, the processing line 701 on the right hand side of the substrate processing system 700 may be offset by about 30 seconds from the other processing line 701.

The first station 711 and sixth station 716 (e.g., load locks) have a magnetic levitation assembly that may be similar to the magnetic levitation assemblies 230, 430, 530 as described above.

The second station 712 and fifth station 715 (e.g., process stations) may have a magnetic levitation assembly similar to the magnetic levitation assemblies 220, 320, 520 as described above.

The seventh station 717 may be similar to stations 204, 404, 504, and may include a magnetic levitation assembly with rails selected from the rails 124, 126, 224, 226, 324, 524, and 526 as described above or any other rails described herein.

The third station 713 and the fourth station 714 (e.g., process stations) may be similar to process station 100 described above, or another station described above to process a substrate. The third station 713 and fourth station 714 each have a magnetic levitation assembly 120 (not shown) including a first track segment 121 (not shown) and a second track segment 122 (not shown). The rails of each track segment 121, 122 may be configured in a similar manner as rails 124, 126, 224, 226, 324, 524, and 526 as described above or any other rails described herein.

The magnetic levitation assembly of the first station 711 and magnetic levitation assembly of the second station 712 cooperate to change the axial direction of travel of the carrier 130. Additionally, the magnetic levitation assembly of the fifth station 715 and the magnetic levitation assembly of the sixth station 716 cooperate to change the axial direction of travel of the carrier 130.

FIG. 7 includes an X-Y-Z coordinate system to show the axial direction of travel of the carrier and substrate through the substrate processing system 700, The arrows illustrate the direction that one or more carriers circulate within the processing line 701. The carrier 130 receives a substrate entering the first station 711 in the Y-direction from an FOUP 606 of the factory interface 604. The carrier 130 is then conveyed to the second station 712 in the X-direction. The carrier 130 is conveyed from the second station 712 to the fifth station 715 in the Y-direction. The carrier 130 is then conveyed from the fifth process station 715 to the sixth station 716 in the X-direction. The carrier 130 is then conveyed into the seventh station 717 from the sixth station 716 in the Y-direction. The carrier 130 is returned to the first station 711 from the seventh station 717 in the Y-direction, and the now fabricated substrate 140 is transferred to an FOUP 606. Another substrate may be placed onto the carrier in the first station 711 for the processing operation described above.

Figure 8:
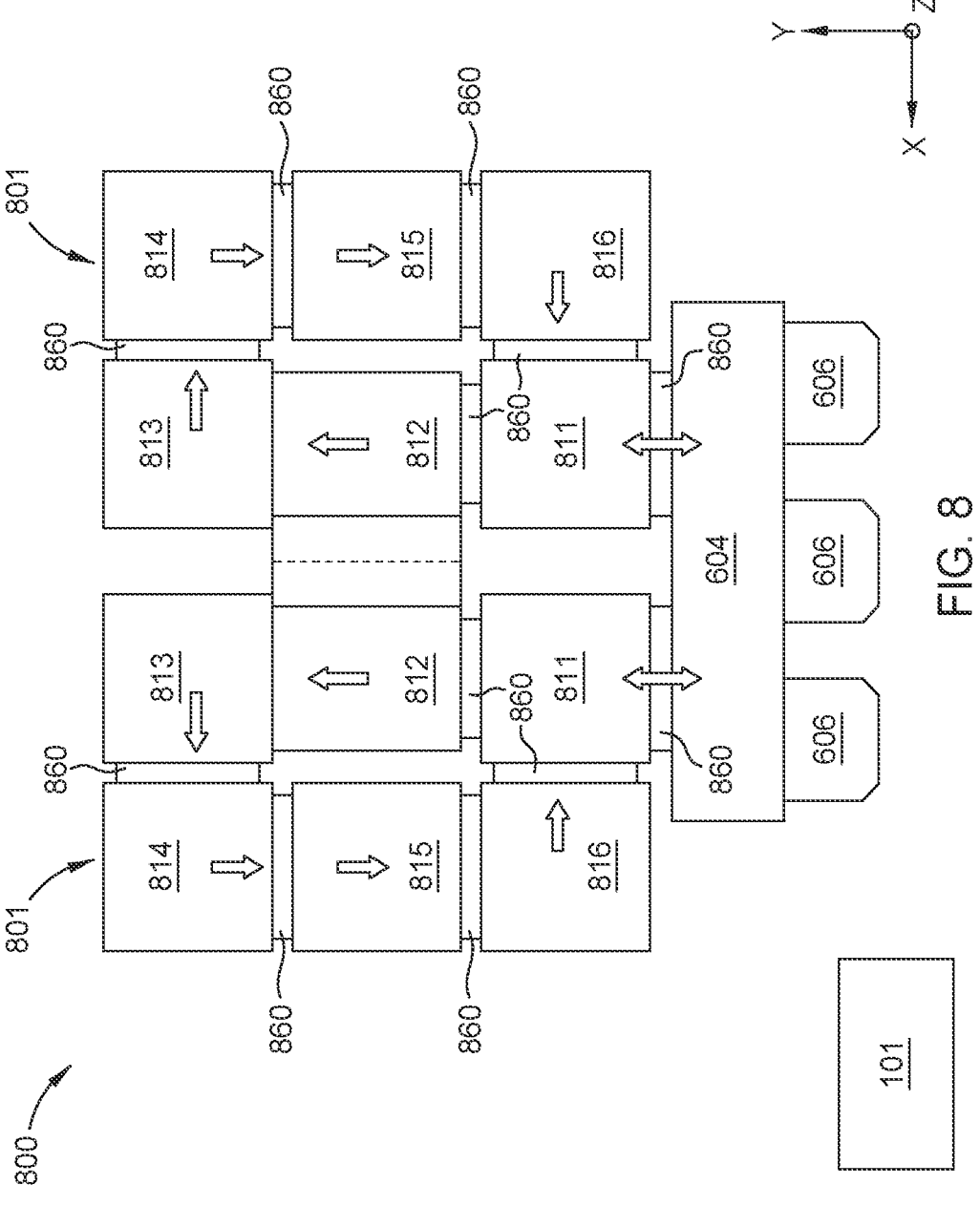
FIG. 8 is a top schematic view of a substrate processing system, according to one embodiment.

FIG. 8 illustrates an alternative substrate processing system 800 including one or more processing lines 801, a factory interface 604, and FOUPs 604. The substrate processing line 800 differs from system 600 in that each processing line 801 has one less station and that the carriers 130 circulate in the opposite direction as the system 600.

As shown, both processing lines 801 each include a plurality of stations, such as stations 811-816. Each processing line 801 includes a magnetic transportation system (not shown) formed from the individual magnetic levitation assemblies of the stations 811-816 that conveys a substrate 140 (not shown) disposed on a carrier 130 (not shown) through the processing line 801. Each processing line 801 is independent of the others.

Each processing line 801 may include a plurality of slit valves 860 to selectively isolate each station. The slit valves are selectively opened and closed to allow a clear path for the travel of the carrier 130 and to selectively isolate the stations 811-816 from one another and to facilitate the pressurization or depressurization of a station.

Each processing line 801 may have a separate second station 812. In some embodiments, each processing line 801 may share a second station 812 that has two magnetic levitation assemblies such that each processing line 801 is able to process one or more substrates independently from one another.

The substrate processing system 800 is used to process multiple substrates in each processing line 801 to produce a desired fabricated substrate. For example, the substrate processing system 800 may be a PVD system. For example, the first station 811 is a first load lock, the second station 812 is a conveyance station, the third station 813 is a degas station, the fourth station 814 is a pre-dean station, the fifth station 815 is a tantalum nitride deposition station, the sixth station 816 is a copper deposition station. The substrate is transferred and processed within each process station 813-816 in a similar manner as discussed above with other process stations, such as process station 100. The PVD system shown in FIG. 8 eliminates the second load lock 612 of system 600, which decreases the process time and decreases the footprint of the substrate processing system 800. The magnitude of a vacuum within each station may increase from station to station. For example, the magnitude of the vacuum in the sixth station 816 may exceed the magnitude of a vacuum in the other stations.

The first station 811 (e.g., load lock) has a magnetic levitation assembly that may be similar to the magnetic levitation assemblies 230, 430, 530 as described above.

The second station 812 may be similar to stations 204, 404, 504, and may include rails selected from rails 124, 126, 224, 226, 324, 524, and 526 as described above or any other rails described herein.

The third station 813, fourth station 814, and sixth station 816 (e.g., process stations) have a magnetic levitation assembly similar to the magnetic levitation assemblies 220, 320, 520 as described above.

The fifth station 815 (e.g., tantalum nitride process station) may be similar to process station 100 described above, or another station described above to process a substrate. The fifth station 815 has a magnetic levitation assembly 120 (not shown) including a first track segment 121 (not shown) and a second track segment 122 (not shown). The rails of each track segment 121, 122 may be configured in a similar manner as rails 124, 126, 224, 226, 324, 524, and 526 as described above or any other rails described herein.

The magnetic assembly of the third station 813 and magnetic levitation assembly of the fourth station 814 cooperate to change the axial direction of travel of the carrier 130. Additionally, the magnetic levitation assembly of the sixth station 816 and the magnetic levitation assembly of the first station 811 cooperate to change the axial direction of travel of the carrier 130.

FIG. 8 includes an X-Y-Z coordinate system to show the axial direction of travel of the carrier 130 and substrate 140 through the substrate processing system 800. The arrows illustrate the direction that one or more carriers circulate within the processing line 801. The carrier 130 receives a substrate entering the first station 811 in the Y-direction from an FOUP 606 of the factory interface 604. The carrier 130 is then conveyed to the second station 812 in the Y-direction. The first station 811 also receives the carrier 130 from the sixth station 816 in the X-direction. The carrier 130 is conveyed from the second station 812 to the third station 813 in the Y-direction. The carrier 130 is then conveyed from the third station 813 to the fourth station 814 in the X-direction. The carrier is then conveyed from the fourth station 814 to the fifth station 815 and then to the sixth station 816 in the Y-direction. The carrier 130 is then conveyed from the sixth station 816 back to the first station 811 in the X-direction. The now fabricated substrate 140 is transferred to a FOUP 606. Another substrate may be placed onto the carrier 130 in the first station 811 for the processing operation described above.

Figure 9:
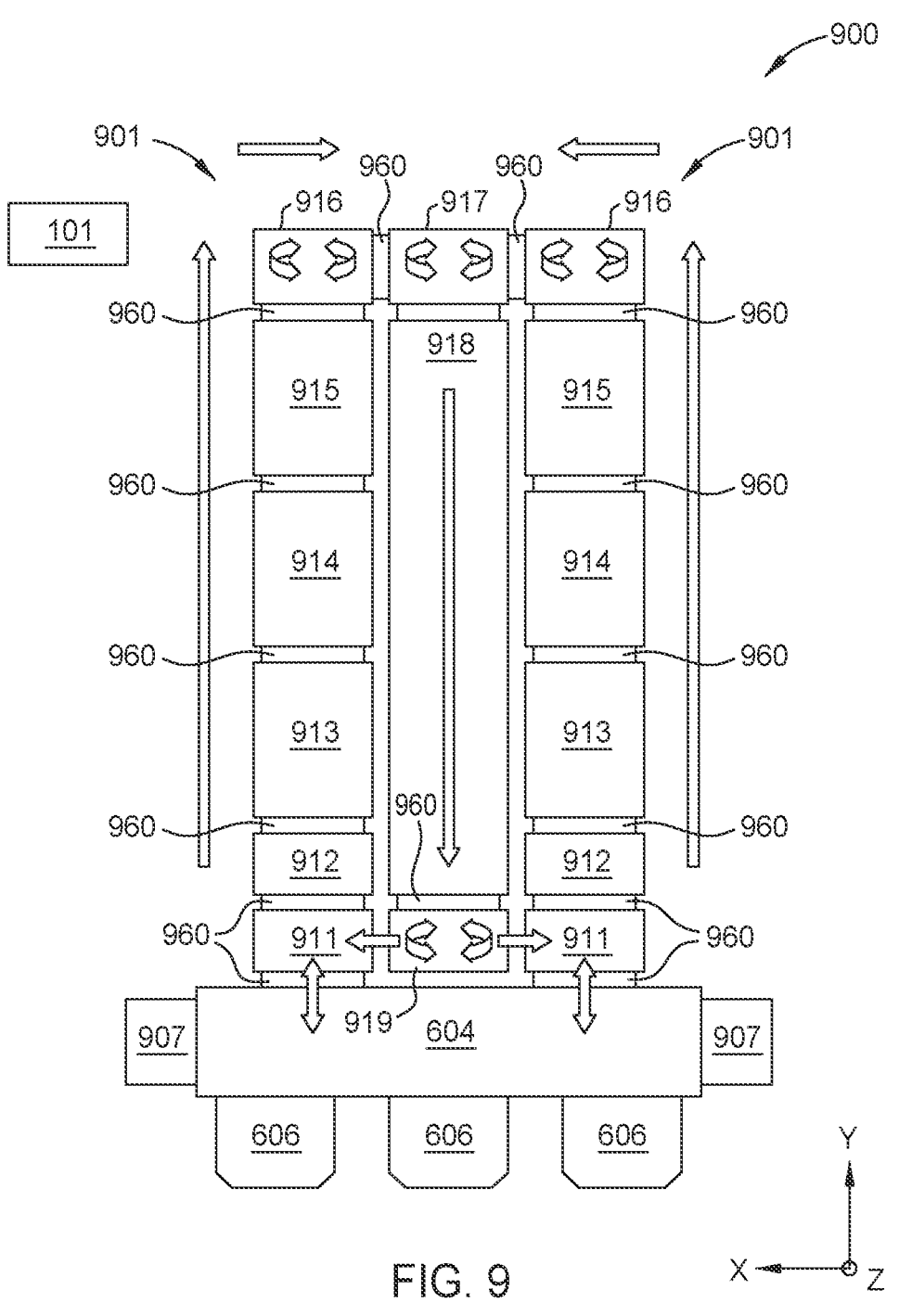
FIG. 9 is a top schematic view of a substrate processing system, according to one embodiment.

FIG. 9 illustrates a schematic substrate processing system 900 that includes a controller 101, at least one processing line 901, and a factory interface 604. The system 900 is shown with two processing lines 901 that share one or more stations, including sharing the magnetic levitation assembly (not shown) of each shared station. The one or more stations may be shared to reduce the footprint of the substrate processing system.

As shown, both processing lines 901 each include a plurality of stations, such as stations 911-919. Each processing line 901 includes a magnetic transportation system (not shown) formed from the individual magnetic levitation assemblies of the stations 911-919 that conveys a substrate 140 (not shown) disposed on a carrier 130 (not shown) through the processing line 901.

Each processing line 901 shares the seventh station 917, eighth station 918, and ninth station 919. As a result, the magnetic transportation system of each processing line 901 share the magnetic levitation assemblies in the shared stations.

Each processing line 901 may include a plurality of slit valves 960 to selectively isolate each station. The slit valves 960 are selectively opened and closed to allow a clear path for the travel of the carrier 130 and to selectively isolate the stations 911-919 from one another and to facilitate the pressurization or depressurization of a station.

The substrate processing system 900 is used to process multiple substrates in each processing line 901 to produce a desired fabricated substrate. For example, the substrate processing system 900 may be a PVD system. The first station 911 may be a load lock that can selectively change the axial direction of conveyance of the carrier 130, such that the carrier 130 can be conveyed from the first station 911 into the second station 912 in the Y-direction while also being able to receive a carrier 130 from the ninth station 919 in the X-direction. The second station 912 may be a buffer station, a degas station, a shutter station, a vacuum soak station, or a combination thereof. The third station 913 may be a pre-clean station, the fourth station 914 may be a tantalum nitride deposition station, and the fifth station 915 may be a copper deposition station. The sixth station 916 and seventh station 917 may each be a routing station that is selectively able to change the direction of axial travel of the carrier. The eighth station 918 may be a conveyance station that conveys the carrier 130 from the seventh station 917 to the ninth station 919.

The seventh station 917, eighth station 918, and ninth station 919 may only handle a single carrier 130 at a time. As a result, fabrication in each processing line 901 may be offset by a period of time from one another. This offset period of time may be based on the time needed to process a substrate within the seventh station 917, eighth station 918, and ninth station 919. For example, each processing line 901 may be offset by about 30 seconds from each other.

The sixth station 916, seventh station 917, and ninth station 919 (e.g., routing stations) may have a magnetic levitation assembly similar to the magnetic levitation assemblies 230, 430, 530 as described above. For example, the sixth station 916, seventh station 917, and ninth station 919 may each have magnetic levitation assembly 530 to rotate the carrier 130 change the axial direction of travel of the carrier 130.

The first station 911 (e.g., load lock) may have a magnetic levitation assembly that may be similar to the magnetic levitation assemblies 230, 430, 530 as described above to change the axial direction of conveyance of the carrier.

The second station 912 may include a magnetic levitation assembly 120 with one or both of the first track segment 121 and second track segment 122. The rails of each track segment 121, 122 may be configured in a similar manner as rails 124, 126, 224, 226, 324, 524, and 526 as described above or any other rails described herein. The second station 912 may be configured similar to process station 100, with the substrate 140 being lifted into a process region 160 for degassing or vacuum soaking. In some embodiments, the opening 106, kit assembly 180, and pedestal assembly 190 are omitted and the source assembly 170 is disposed in the transport region 112 to process the substrate 140 directly on the carrier 130. For example, degassing and vacuum soaking occur while the substrate 140 is disposed on the carrier 130 within the second station 912. The second station 912 may be a buffer station, with the transport region 112 of the second station 912 selectively isolated by one or more slit valves 960 to provide an isolated volume within the processing line 901 between the outside environment and another station. For example, the buffer chamber may be used to reduce the chance of contaminants entering into another station, such as the next station in the processing line that the carrier 130 travels into. In some embodiments, the third station 913 is a shutter station including shutter disks. The shutter disks are used in the place of the substrate to clean processing equipment, such as cleaning buildup within the process region 160, When needed, the carrier 130 can be conveyed into the second station 912 without a substrate 140 disposed thereon to receive a shutter disk. The carrier 130 and shutter disk are then conveyed through the processing line 901 to dean one or more stations. In some embodiments, the carrier 130 may be conveyed into the second station 912 with a substrate 140 disposed thereon. The second station 912 may include one or more robotic arms configured to remove the substrate 140 form the carrier 130 and to replace it with a shutter disk when a cleaning operation is necessitated.

The third station 913, fourth station 914, and fifth station 915 (e.g., process stations) may be similar to process station 100 described above, or another station described above to process a substrate. Each station may have a magnetic levitation assembly 120 (not shown) including a first track segment 121 (not shown) and a second track segment 122 (not shown). The rails of each track segment 121, 122 may be configured in a similar manner as rails 124, 126, 224, 226, 324, 524, and 526 as described above or any other rails described herein.

The eighth station 918 may be similar to stations 204, 404, 504, and may include a magnetic levitation assembly with rails selected from 124, 126, 224, 226, 324, 524, and 526 as described above or any other rails described herein.

The magnetic levitation assembly of the first station 911 and magnetic levitation assembly of the ninth station 919 cooperate to change the axial direction of travel of the carrier 130. Additionally, the magnetic levitation assembly of the sixth station 916 and the magnetic levitation assembly of the seventh station 917 cooperate to change the axial direction of travel of the carrier 130.

FIG. 9 includes an X-Y-Z coordinate system to show the axial direction of travel of the carrier 130 and substrate 140 through the substrate processing system 900. The arrows illustrate the direction that one or more carriers circulate within the processing line 901. The carrier 130 receives a substrate entering the first station 911 in the Y-direction from a FOUP 606 of the factory interface 604. The substrate may be pre-heated in a pre-heater 907 of the factory interface 604 prior to entering the first station 911. The carrier 130 is then conveyed to the second station 912 in the Y-direction. The carrier 130 is then conveyed from the second station 912 to the sixth station 916 in the Y-direction through the stations 913-915. The substrate may have a layer deposited in one or more of the stations, such as in the fourth station 914 (e.g., tantalum nitride station) and the fifth station 915 (e.g., copper deposition station). After the carrier 130 is received in the sixth station 916, the carrier 130 is then conveyed in the X-direction to the seventh station 917. The seventh station 917 then conveys the carrier 130 in an opposite direction along the Y-direction to the ninth station 919. The carrier 130 is then is further conveyed in the X-direction back to the first station 911 from the ninth station 919. The now fabricated substrate is transferred to a FOUP 606 from the first station 911. Another substrate 140 may be placed onto the carrier 130 in the first station 911 for the processing operation described above.

A shutter disk may be conveyed on a carrier 130 from the second station 912 to the first station 911 in a similar manner as a substrate.

FIG. 10A illustrates and a schematic substrate processing system 1000 that includes a controller 101, at least one processing line 1001, and a factory interface 604.

As shown, both processing lines 1001 each include a plurality of stations, such as stations 1011-1018. Each processing line 1001 includes a magnetic transportation system (not shown) formed from the individual magnetic levitation assemblies of the stations 1011-1018 that conveys a substrate 140 (not shown) disposed on a carrier 130 (not shown) through the processing line 1001. Each processing line 1001 is independent of the others. As shown, the processing lines 1001 are physically separated by one another by a gap 1002. The gap 1002 may be sized such that a technician may walk between each processing line 1001 to service one or more stations.

Each processing line 1001 may include a plurality of slit valves 1060 to selectively isolate each station. The slit valves are selectively opened and closed to allow a clear path for the travel of the carrier 130 and to selectively isolate the stations 1011-1017 from one another and to facilitate the pressurization or depressurization of a station.

The substrate processing system 1000 is used to process multiple substrates in each processing line 1001 to produce a desired fabricated substrate. For example, the substrate processing system 1000 may be a PVD system. For example, the first station 1011 is a first load lock, the second station 1012 is a degas station, the third station 1013 is a pre-clean station, the fourth station 1014 is a routing station, the fifth station 1015 is a routing station, the sixth station 1016 is a tantalum nitride deposition station, the seventh station 1017 is a copper deposition station, the eighth station 1018 is a routing station that also serves as a buffer station. The substrate is transferred and processed within each process station 1012-1013 and 1016-1017 in a similar manner as discussed above with other process stations, including stations 612-615. The PVD system shown in FIG. 10A eliminates the second load lock 612 of system 600 and the conveyance station 617, which decreases the process time and decreases the footprint of the substrate processing system 1000. The magnitude of a vacuum within each station may increase from station to station. For example, the magnitude of the vacuum in the seventh station 1017 may exceed the magnitude of a vacuum in the other stations.

The first station 1011 (e.g., load lock) may have a magnetic levitation assembly that may be similar to the magnetic levitation assemblies 230, 430, 530 as described above.

The second station 1012, the third station 1013, sixth station 1016, and seventh station 1017 (e.g., process stations) may be similar to process station 100 described above, or another station described above to process a substrate. Each of the stations 1012-1013 and 1016-1017 has a magnetic levitation assembly 120 (not shown) including a first track segment 121 (not shown) and a second track segment 122 (not shown). The rails of each track segment 121, 122 may be configured in a similar manner as rails 124, 126, 224, 226, 324, 524, and 526 as described above or any other rails described herein.

The fourth station 1014, fifth station 1015, and eighth station 1018 (e.g., routing stations) may have a magnetic levitation assembly similar to the magnetic levitation assemblies 230, 430, 530 as described above. The fifth station 1015 may also include a plurality of shutter disks to be placed on a carrier 130 without a substrate. The shutter disks are used when needed in the place of the substrate to clean processing equipment, such as cleaning buildup within the process region 160.

The magnetic levitation assembly of the first station 1011 and magnetic levitation assembly of the eighth station 1018 cooperate to change the axial direction of travel of the carrier 130. Additionally, the magnetic levitation assembly of the fourth station 1014 and the magnetic levitation assembly of the fifth station 1015 cooperate to change the axial direction of travel of the carrier 130.

FIG. 10A includes an X-Y-Z coordinate system to show the axial direction of travel of the carrier and substrate through the substrate processing system 1000. The arrows illustrate the direction that one or more carriers circulate within the processing line 1001. The carrier 130 receives a substrate entering the first station 1011 in the Y-direction from an FOUP 606 of the factory interface 604. The carrier 130 is then conveyed to the second station 1012 in the Y-direction. The first station 1011 also receives the carrier 130 from the eighth station 1018 in the X-direction. After the carrier 130 is conveyed into the second station 1012, the carrier 130 is conveyed to the fourth station 1014 through the third station 1013 in the Y-direction. The carrier 130 is then conveyed from the fourth station 1014 to the fifth station 1015 in the Y-direction. The carrier 130 is then conveyed from the fifth station 1015 to the eighth station 1018 in the Y-direction through the stations 1016-1017. The carrier 130 is then conveyed in the X-direction back into the first station 1111. The now fabricated substrate 140 is transferred to a FOUP 606. Another substrate may be placed onto the carrier in the first station 1011 for the processing operation as described above.

A shutter disk may be conveyed on a carrier 130 from the fifth station 1015 to the first station 1011 in a similar manner as a substrate.

In some embodiments of substrate processing system 1000A, the processing line 1001 has a non-deposition portion 1003 and a deposition portion 1004. The non-deposition portion 1003 may include a linear arrangement of stations, such as the first station 1011, the second station 1012, the third station 1013, and the fourth station 1014, that do not subject the substrate to a process that deposits a layer on the substrate. After the substrate passes through the non-deposition portion 1003, the substrate is conveyed into the deposition portion 1004 that may be a linear arrangement of stations, such as the fifth station 1015, the sixth station 1016, the seventh station 1017, and the eight station 1018, that includes at least one station that deposits at least one layer the substrate. For example, the non-deposition portion 1003 includes the first station 1011 that is a first load lock, the second station 1012 that is a degas station, the third station 1013 that is a pre-clean station, and the fourth station 1014 that is a routing station. The deposition portion 1004 includes the fifth station 1015 that is a routing station, the sixth station 1016 that is a tantalum nitride deposition station, the seventh station 1017 that is a copper deposition station, and the eighth station 1018 that is a routing station that also serves as a buffer station.

FIG. 10B illustrates an alternative substrate processing system 10008, which is the same as the substrate processing system 1000A except that the gap 1002 is omitted.

In some embodiments, one or more of the stations of the processing lines 1001 may be contained in the same housing. For example, the stations 1012-1013 in each processing line 1001 may be a double station that share the same housing.

FIG. 100 illustrates an alternative substrate processing system 10000, which is the same as substrate processing system 1000A except that each processing line 1001 is connected to a separate factory interface 604 and FOUPs 606.

Figures 10D, 10E:
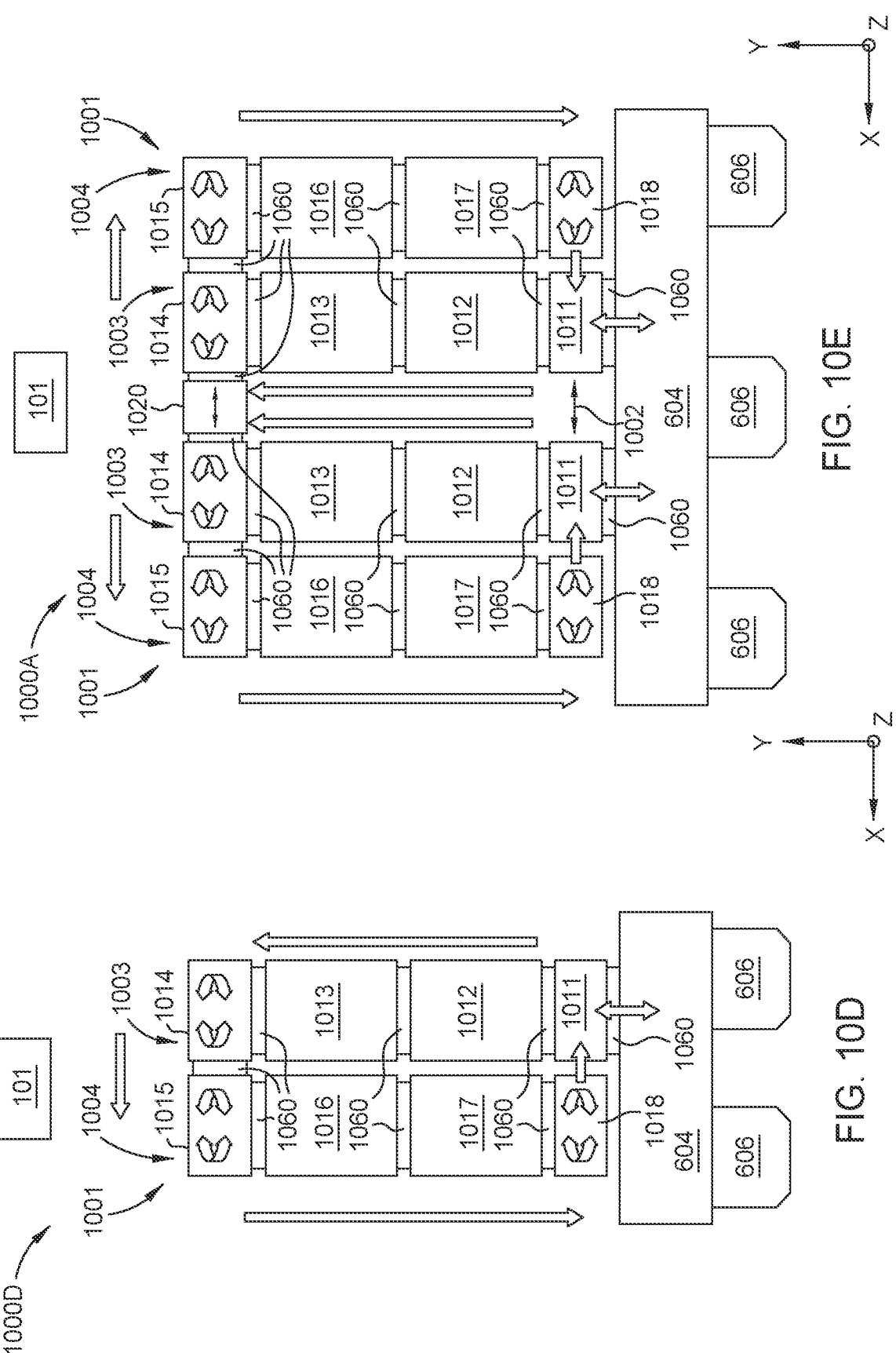

FIG. 10D illustrates an alternative substrate processing system 1000D, which is the same as substrate processing system 1000A except that there is only one processing line 1001.

FIG. 10E illustrates an alternative substrate processing system 1000E, which is the same as substrate processing system 1000A except that there is a transfer station 1020 to transfer a carrier between the processing lines 1001. While the transfer station 1020 is shown located between the fourth stations 1014 in each processing line 1001, the transfer station may be located between two stations of adjacent processing lines, such as being between first stations 1001. The transfer station 1020 includes a magnetic levitation assembly that may be similar to the magnetic levitation assemblies 120, 230, 430, 530 as described above. For example, the transfer station 1020 may have a magnetic levitation assembly 120 with only one track segment 121, In some embodiments, the substrate processing system 1000E has multiple transfer stations 1020 between adjacent processing lines 1001.

The transfer station 1020 is used to transfer the carrier and substrate 130 thereon between the processing stations. The transfer station 1020 may be positioned in the gap 1002. The transfer station 1020 may be used to divert a carrier to a different processing line 1001 that includes one or more stations configured to complete a desired process. In some embodiments, the transfer chamber 1020 is used to divert a carrier to a different processing line 1001 when one of the downstream stations in a processing line 1001 needs to be shut down for maintenance.

In some embodiments, the transfer station 1020 is not used to transfer every substrate being processed within the substrate processing system 1000 between processing lines 1001. Instead, the transfer station 1020 is used when it is desirable to transfer one or more substrates between the processing lines 1001.

In some embodiments, one processing line 1001 is a non-deposition processing line and the other is a deposition processing line. The stations in the non-deposition processing line complete processes that do not deposit a layer on the substrate. The deposition processing line includes at least one station, or only stations, that completes a deposition process to deposit at least one layer on the substrate. A transfer station 1020 may be used to transfer the carrier and substrate thereon from the non-deposition processing line to the deposition processing line. In other words, the transfer station 1020 allows the substrate to be transferred between different processing lines without exposing the substrate to the atmosphere.

Figure 11A:
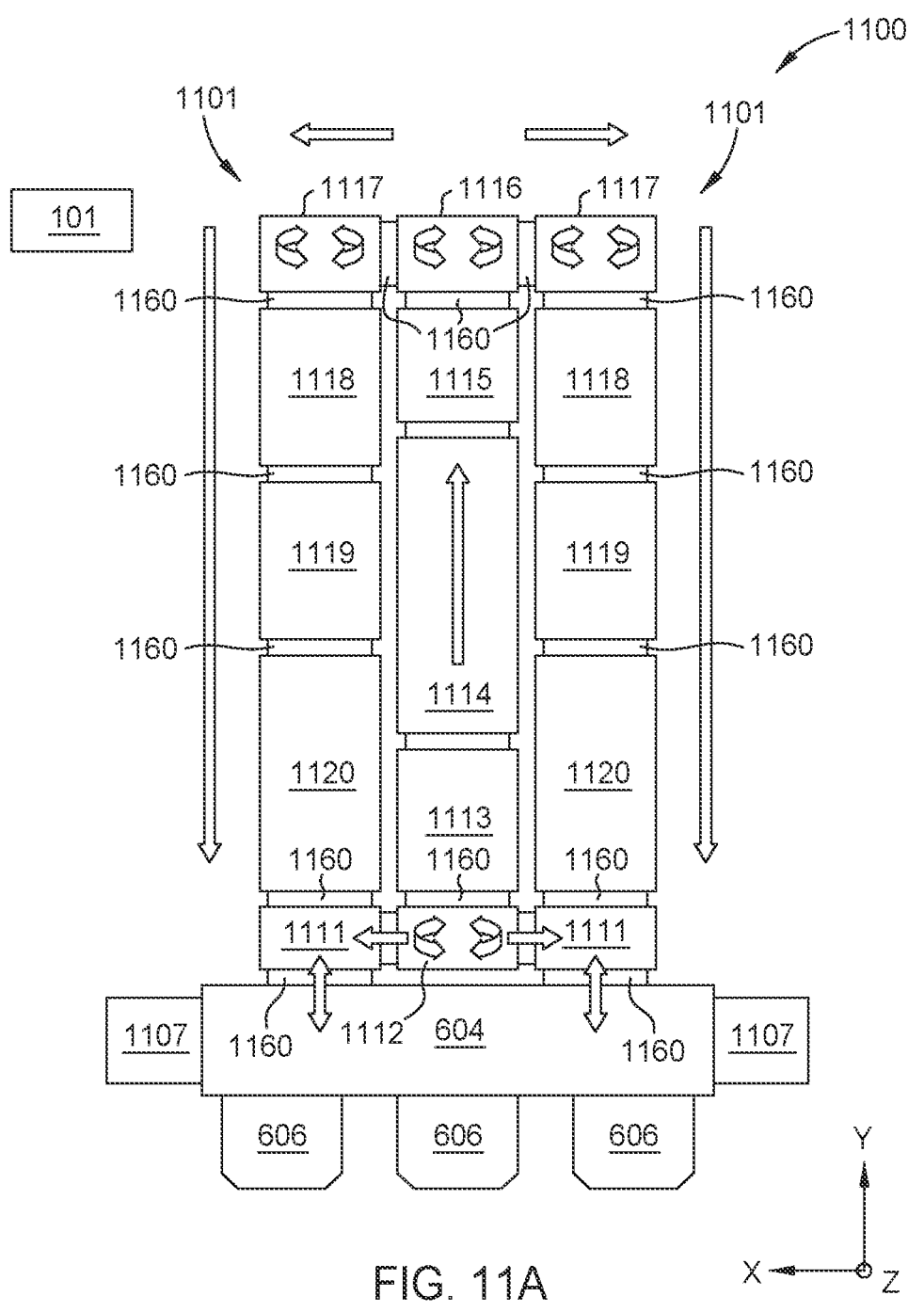
FIG. 11A is a top schematic view of a substrate processing system, according to one embodiment.
Figure 11B:
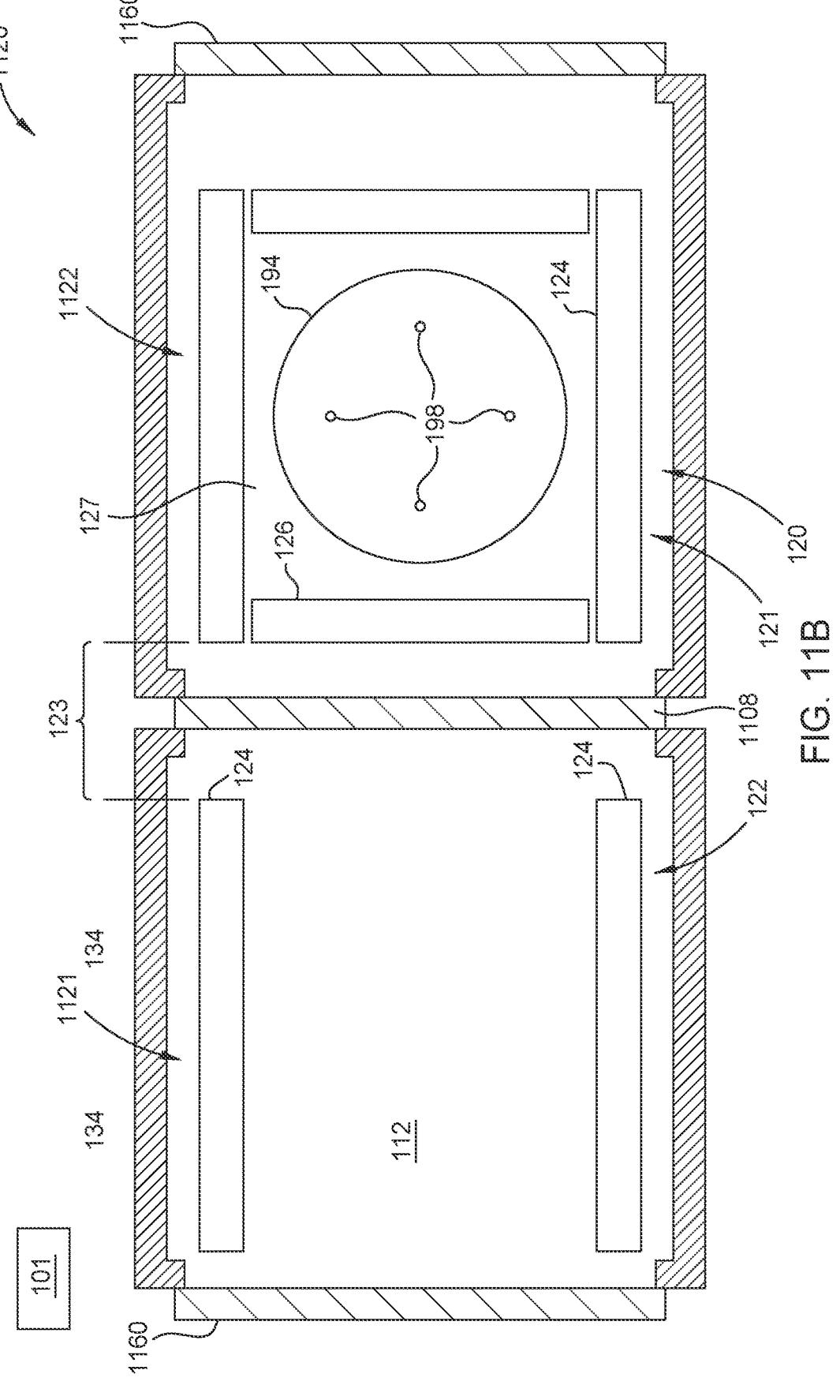
FIG. 11B is a top cross-sectional view of a process station includable in a substrate processing system, according to one embodiment.

FIGS. 11A-11B illustrate a schematic of substrate processing system 1100, which includes the controller 101, at least one processing line 1101, and a factory interface 604. The substrate processing system 1100 is shown with two processing lines 1101 that share one or more stations, including sharing the magnetic levitation assembly of each shared station. The one or more stations may be shared to reduce the footprint of the substrate processing system.

As show, both processing lines 1101 each include a plurality of stations, such as stations 1111-1120. Each processing line 1101 includes a magnetic transportation system (not shown) formed from the individual magnetic levitation assemblies of the stations 1111-1120 that conveys a substrate 140 (not shown) disposed on a carrier 130 (not shown) through the processing line 1101. Each processing line 1101 may include a plurality of slit valves 1160 to selectively isolate each station. The slit valves are selectively opened to allow a clear path for the travel of the carrier 130 through the processing line 1101.

The substrate processing system 1100 is used to process multiple substrates in each processing line 1101 to produce a desired fabricated substrate. For example, the substrate processing system 1100 may be a PVD system. For example, the first station 1111 may be a load lock, the second station 1112 may be a routing station selectively able to change the direction of axial travel of the carrier 130 to direct a carrier received from both first station 1111 in the X-direction into the third station 1113 in the Y-direction. The third station 1113 may be a degas station. The fourth station 1114 may be a conveyance station configured to convey the carrier 130 from the third station 1113 to the fifth station 1115. The degassed substrate 140 may cool within the fourth station 1114. The carrier 130 may be moved between each end of the fourth station 1114 over a selected dwell time sufficient to allow the substrate 140 to cool to a desired temperature.

The fifth station 1115 may be a shutter station. The sixth station 1116 and seventh stations 1117 may be a routing station selectively able to change the direction of axial travel of the carrier 130. The sixth station 1116 directs the carrier into either the left hand side or right hand side processing line 1101. The eighth station 1118 may be a pre-clean station, the ninth station 1119 may be a tantalum nitride deposition station, and the tenth station 1120 may be a copper deposition station. In some embodiments, the third station 113, fourth station 1114, and fifth station 1115 may be integrated into one station.

Each processing line 1101 shares stations 1112-1116. As a result, the magnetic transportation system of each processing line 1101 share the magnetic levitation assembly in the shared stations.

The shared stations 1112-1116 may only handle a single carrier 130 at a time. As a result, fabrication in each processing line 1101 may be offset by a period of time for each other. This offset period of time may be based on the time needed to process a substrate within the shared stations 1112-1116. For example, the processing lines 1101 may be offset by about 30 seconds from each other.

The first station 1111 (e.g., load lock) has a magnetic levitation assembly that may be similar to the magnetic levitation assemblies 230, 430, 530 as described above.

The second station 1112, sixth station 1116, and seventh station 1117 (e.g., routing stations) may have a magnetic levitation assembly similar to the magnetic levitation assemblies 230, 430, 530 as described above.

The third station 1113 may include a magnetic levitation assembly 120 (not shown) with one or both of the first track segment 121 (not shown) and second track segment 122 (not shown), The rails of each track segment 121, 122 may be configured in a similar manner as rails 124, 126, 224, 226, 324, 524, and 526 as described above or any other rails described herein. The third station 1113 may be configured similar to process station 100, with the substrate 140 being lifted into a process region 160 for degassing. In some embodiments, the opening 106, kit assembly 180, and pedestal assembly 190 are omitted and the source assembly 170 is disposed in the transport region 112 to degas the substrate 140 directly on the carrier 130.

The fourth station 1114 may be similar to stations 204, 404, 504, and may include a magnetic levitation assembly with rails selected from rails 124, 126, 224, 226, 324, 524, and 526 as described above or any other rails described herein.

The fifth station 1115 may include a magnetic levitation assembly 120 (not shown) with one or both of the first track segment 121 (not shown) and second track segment 122 (not shown). The rails of each track segment 121, 122 may be configured in a similar manner as rails 124, 126, 224, 226, 324, 524, and 526 as described above or any other rails described herein. A plurality of shutter disks may be disposed in the fifth station 1115. When a cleaning operation is necessitated, the carrier 130 can be conveyed into the fifth station 1115 without a substrate 140 disposed thereon to receive a shutter disk. The carrier 130 and shutter disk are then conveyed through the processing line 1101 to clean one or more stations. In some embodiments, the carrier 130 may be conveyed into the fifth station 1115 with a substrate 140 disposed thereon. One or more robotic arms disposed within the fifth station 1115 may remove the substrate 140 from the carrier 130 and replace the substrate 140 with a shutter disk.

The eighth station 1118, ninth station 1119, and tenth station 1120 (e.g., process stations) may be similar to process station 100 described above, or another station described above to process a substrate. Each station may have a magnetic levitation assembly 120 including a first track segment 121 and a second track segment 122. The rails of each track segment 121, 122 may be configured in a similar manner as rails 124, 126, 224, 226, 324, 524, and 526 as described above or any other rails described herein.

FIG. 11B illustrates the transport region 112 of the tenth station 1120 with the magnetic levitation assembly 120 disposed therein. As shown, the tenth station 1120 is similar or the process station 100 but includes a slit valve 1108 that can close to bifurcate the transport region 112 to form a buffer region 1121 that is isolated from the other region 1122 where the pedestal 192 and first track segment 121 are located. The buffer region 1121, as shown, is the portion of the transport region 112 on the side of the slit valve 1108 containing the second track segment 122. The buffer region 1121 acts in a similar manner as a buffer station. The slit valve 1108 is closed after the carrier 130 is moved to the park position above the second track segment 122 after the substrate 140 is transferred from the carrier 130 to the pedestal assembly 190. The sit valve 1108 may be closed while substrate 140 is processed. A vacuum pump, such as vacuum pump 114, may be in communication with each region 1121, 1122 of the transport region 112 such that the pressure on each side of the slit valve 1108 may be adjusted independently from one another.

The magnetic levitation assembly of the first station 1111 and magnetic levitation assembly of the second station 1112 cooperate to change the axial direction of travel of the carrier 130. Additionally, the magnetic levitation assembly of the sixth station 1116 and the magnetic levitation assembly of the seventh station 1117 cooperate to change the axial direction of travel of the carrier 130.

FIG. 11A includes an X-Y-Z coordinate system to show the axial direction of travel of the carrier and substrate through the substrate processing system 1100. The arrows illustrate the direction that one or more carriers circulate within the processing line 1101. The carrier 130 is circulated through a processing line 1101 as follows. The carrier 130 receives a substrate entering the first station 1111 in the Y-direction from a FOUP 606 of the factory interface 604. The substrate may be pre-heated in a pre-heater 1107 of the factory interface 604 prior to entering the first station 1111. The carrier 130 is then transferred in the X-direction to the second station 1112. The second station 1112 changes the axial direction of the carrier 130 such that the carrier 130 is conveyed from the second station 1112 to the third station 1113 in the Y-direction. The carrier 130 is then conveyed from the third station 1113 to the sixth station 1116 in the Y-direction through fourth station 1114 and fifth station 1115. The sixth station 1116 changes the axial direction of travel of the carrier 130 to convey the carrier 130 in the X-direction into the seventh station 1117. The seventh station changes the axial direction of travel of the carrier 130 to convey the carrier 130 in the Y-direction into the eighth station 1118. The carrier 130 is then conveyed back into first station 1111 through the ninth station 1119 and tenth station 1120 in the Y-direction. The now fabricated substrate 140 is transferred to a FOUP 606. Another substrate may be placed onto the carrier in the first station 1111 for the processing operation described above.

Figures 12, 13A:
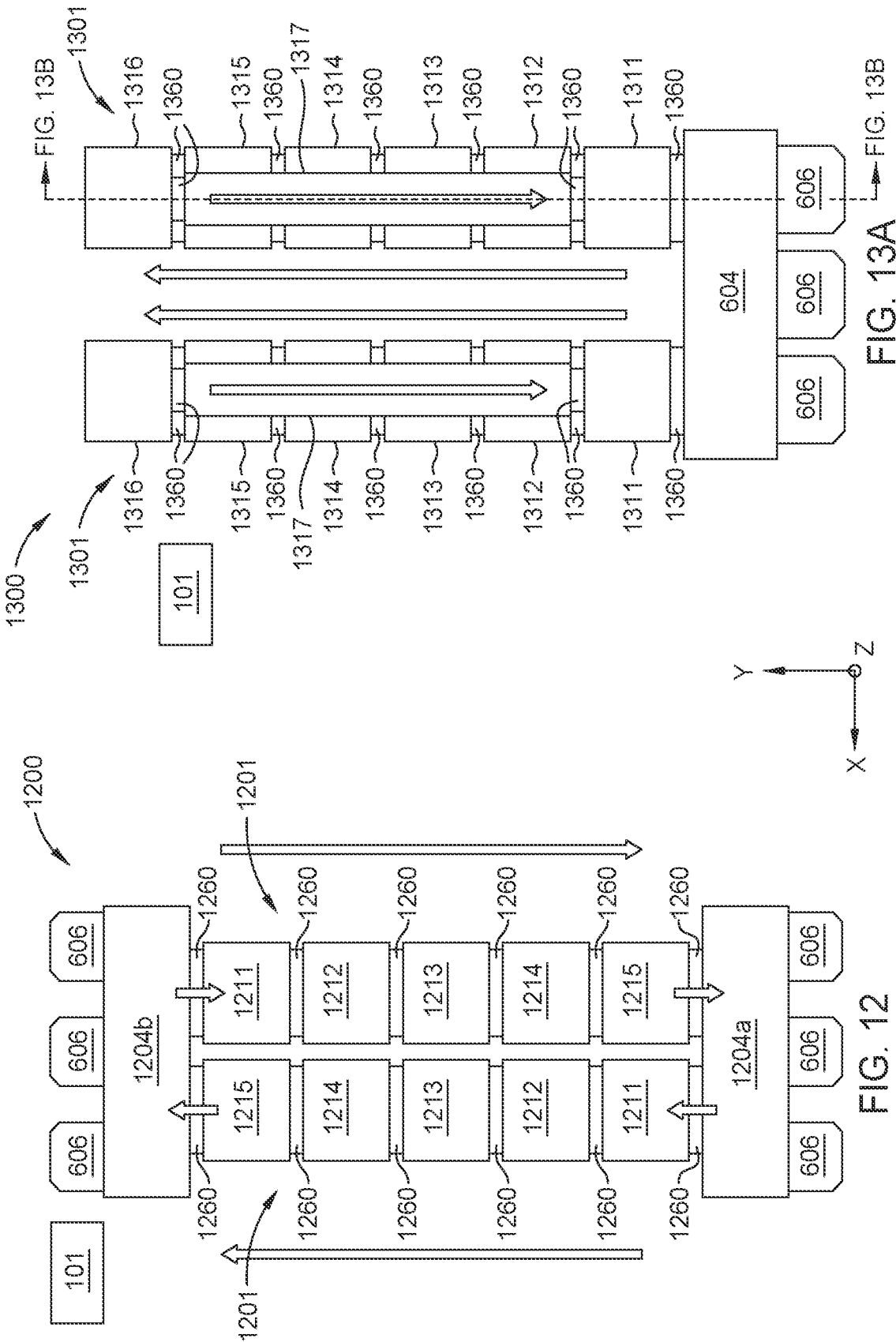
FIG. 12 is a top schematic view of a substrate processing system, according to one embodiment.
FIG. 13A is a top schematic view of a substrate processing system, according to one embodiment.

FIG. 12 illustrates a schematic of a substrate processing system 1200 with at least one processing line 1201, a first factory interface 1204a, a second factory interface 1204b, and a controller 101. The substrate processing system 1200 has a linear processing line 1201 that does not change the axial direction of the carrier 130. Instead, the carrier 130 is conveyed in a linear fashion from one factory interface to the other along a first axial direction. The linear processing line 1201 may include a plurality of slit valves 1260.

The factory interfaces 1204a,b are similar to the factory interface 604 as described above. Each processing line 1201 includes a plurality of stations, such as stations 1211-1215. The two processing lines 1201 shown in FIG. 12 transport the carrier in opposite directions along the same axial direction of travel as indicated by the arrows.

The substrate processing system 1200 is used to process multiple substrates in each processing line 1201 to produce a desired fabricated substrate. For example, the substrate processing system 1200 may be a PVD system. For example, the first station 1211 may be a load lock, the second station 1212 may be a pre-clean station and a degas station, the third station 1213 may be a tantalum nitride deposition station, the fourth station 1214 may be copper deposition station, and the fifth station 1215 may be a load lock. A carrier 130 and substrate 140 are placed in the first station 1211 and then transported through the processing line 1201 to the fifth station 1215. The substrate 140 may be processed in each station, such as stations 1212-1214.

After the substrate 140 is fabricated, the substrate is removed from the fifth station 1215 and placed into a FOUP 606. The carrier 130 is also removed from the fifth station 1215. The carrier 130 may later be returned into the first station 1211 to convey an additional substrate 140.

Figure 13B:
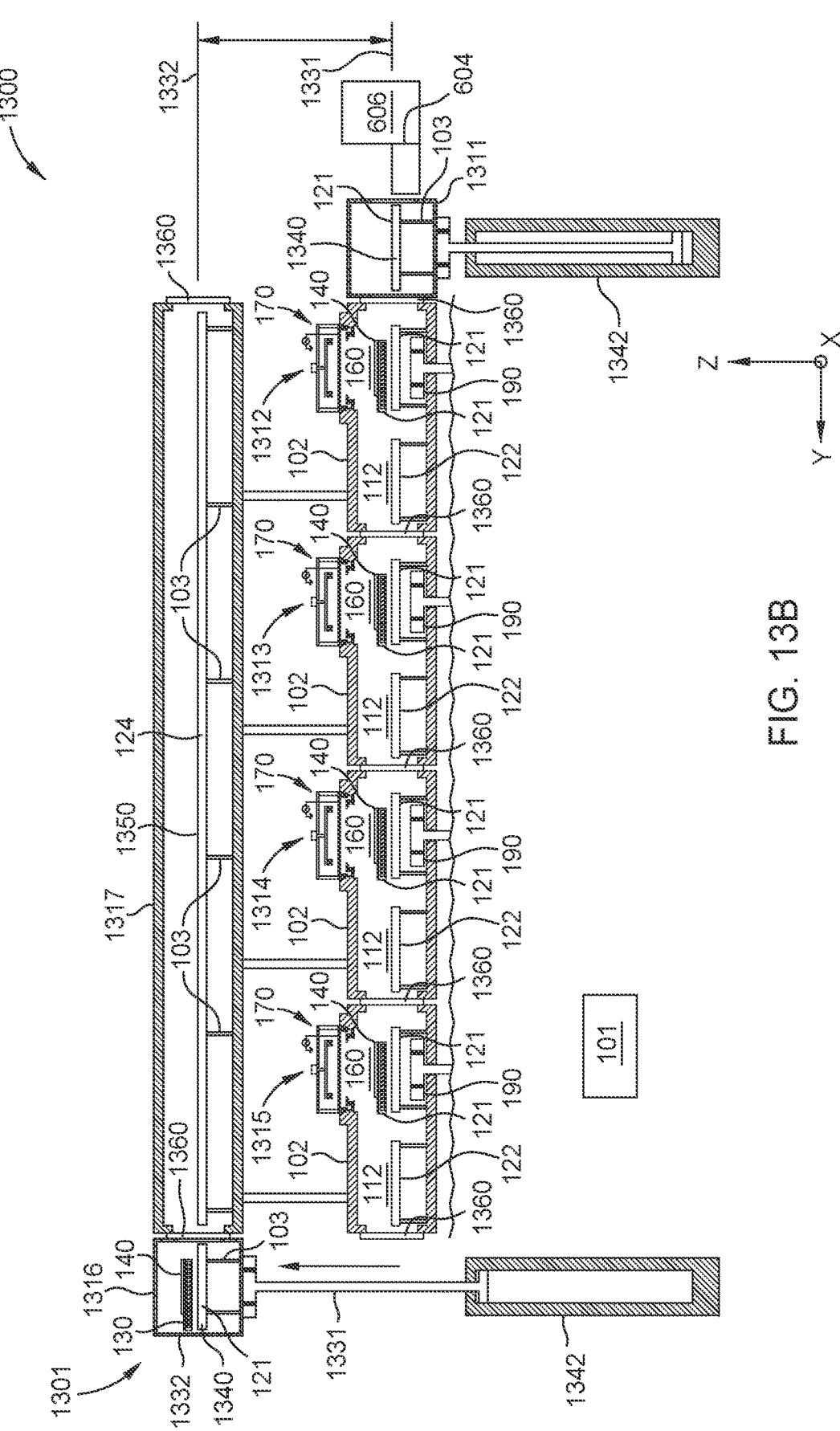
FIG. 13B is a partial side cross-sectional view of a substrate processing system, according to the embodiment of FIG. 13A.

FIGS. 13A-13B illustrate a substrate processing system 1300 with at least one processing line 1301, a factory interface 604, and a controller 101. The substrate processing system 1300, as shown, has two linear processing lines 1301 that do not change the axial direction of the carrier 130.

Each processing line 1301 includes one or more stations, such as stations 1311-1317. A lift station (e.g., station 1311, 1316) is placed at each end of the processing line 1301 to raise and lower the carrier 130 between a first conveyance plane 1331 and a second conveyance plane 1332. The carrier 130 is conveyed in a linear fashion along the first conveyance plane 1331 through one or more stations (e.g., 1311-1316) in a first direction along an axial direction of travel. The carrier 130 is then lifted to the second conveyance plane 1332, where the carrier 130 is conveyed in an opposite (second) direction along the same axial direction to convey the carrier 130 back to the first station (e.g., 1311). The carrier 130 is then returned to the first conveyance plane 1331.

The substrate processing system 1300 may be PVD system including stations 1311-1317. The first station 1311 and sixth stations 1316 are lift stations. The second station 1312 may be a degas station, the third station 1313 may be a pre-dean station, the fourth station 1314 may be a tantalum nitride deposition station, the fifth station 1315 may be a copper deposition station. The carrier 130 is conveyed from the first station 1311 to the sixth station 1316 along the first conveyance plane 1331. The seventh station 1317 is disposed above the stations 1312-1315. The seventh station may be a conveyance station configured to convey the carrier 130 from the sixth station 1316 to the first station 1311 along the second conveyance plane 1332.

FIG. 13B illustrates a cross-sectional view of the substrate processing system 1300 along section He shown in FIG. 13A. The stations 1312-1315 are similar to process stations 100. Some, but not all, of the reference signs from process station 100 are used to label features of stations 1312-1315 to maintain clarity of FIG. 13B. The first station 1311 and sixth station 1316 each include a magnetic levitation assembly 1340. The magnetic levitation assembly 1340 may be similar to the magnetic levitation assembly 120, or another magnetic levitation assembly described above. As shown, the magnetic levitation assembly 120 includes a first track segment 121. The first station 1311 and sixth stations 1316 are mounted to an actuation assembly 1342 configured to move the respective station 1311, 1316 between an upper position and a lower position. The actuation assembly 1342 may include a stepper or servo motor actuated lead screw assembly, linear motor assembly, pneumatic cylinder actuated assembly or other conventional mechanical linear actuation mechanism. In some embodiments, the actuator assembly 1342 may raise or lower the rails relative to the housing of the first station 1311 and sixth station 1316 rather than lifting and lowering the station 1311, 1316.

The seventh station 1317 may be similar to stations 204, 404, 504, and may include a magnetic levitation assembly 1350. While FIG. 13B depicts the magnetic levitation assembly 1350 as having one track segment made of rails 124, the magnetic levitation assembly 1350 may include rails selected from rails 124, 126, 224, 226, 324, 524, and 526 as described above or any other rails described herein. The rails, such as rails 124, of each station 1311-1316 are co-planar when the first and sixth stations 1311, 1316 are in the lower position to convey the carrier 130 along the first conveyance plane 1331. The rails, such as rails 124, of first station 1311 and the sixth station 1316 are co-planar with the rails, such as rails 124, of the seventh station 1317 when the respective first station 1311 and sixth station 1316 are in the upper position to convey the carrier 130 along the second conveyance plane 1332.

A plurality of carriers 130 and substrates 140 are shown in the processing line 1301. Once a carrier 130 is conveyed into the sixth station 1316 along the first conveyance plane 1331, the sixth station 1316 is moved to the upper position as shown in FIG. 13B. The first station 1311 is shown in the lower position after a fabricated substrate 140 has been removed from the carrier 130 and after the carrier 130 is conveyed along the first conveyance plane 1331 into the second station 1312 with new substrate 140 placed thereon. The first station 1311 is then raised to the upper position using the actuation assembly 1342 to receive a carrier 130 conveyed along the second conveyance plane 1332 from the sixth station 1316 through the seventh station 1317, The first station 1311 is returned to the lower position to allow the fabricated substrate 140 to be removed from the carrier 130. The sixth station 1316 is returned to the lower position to receive an additional carrier 130 from the fifth station 1315.

Figures 14, 15:
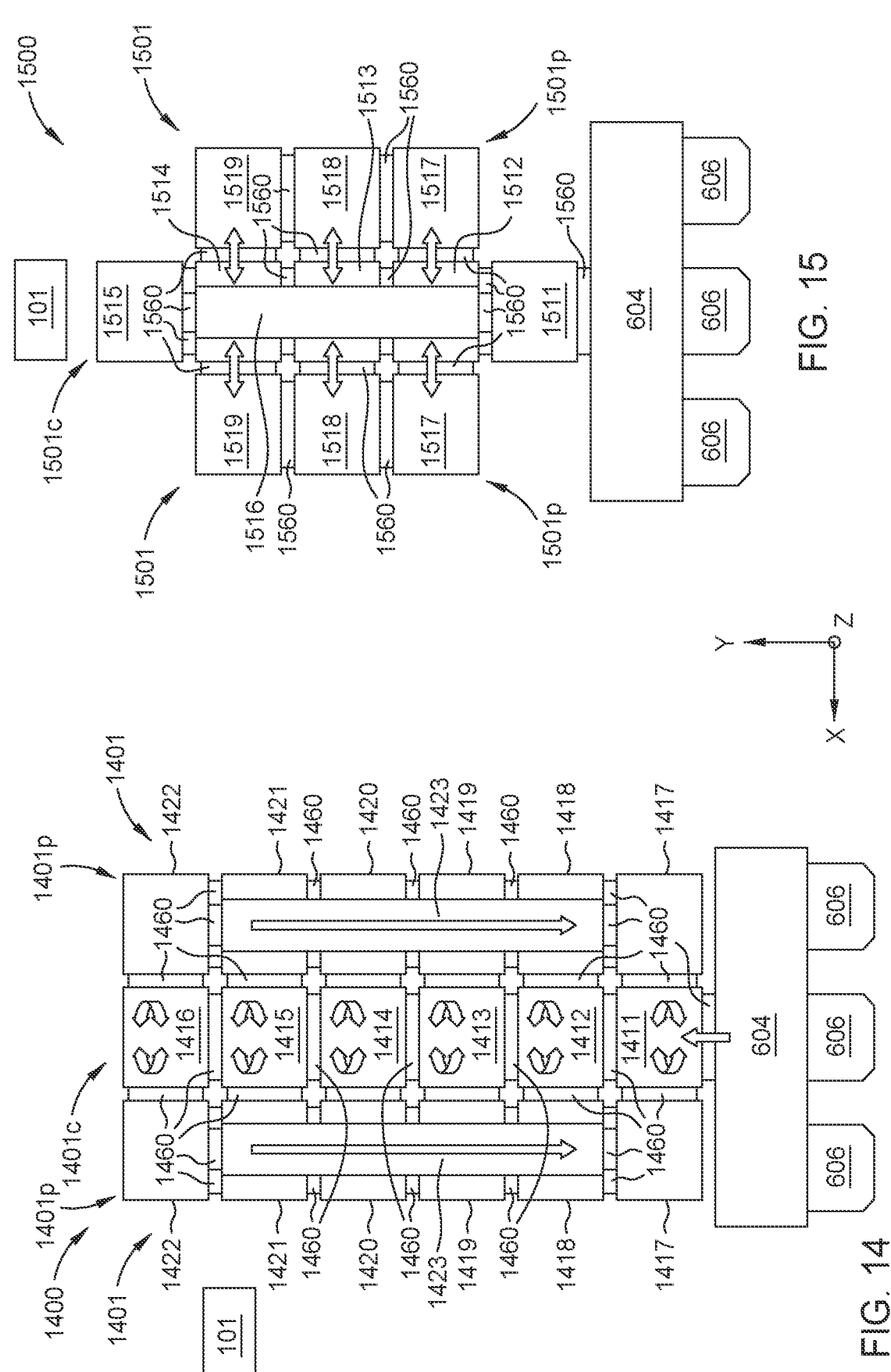
FIG. 14 is a top schematic view of a substrate processing system, according to one embodiment.
FIG. 15 is a top schematic view of a substrate processing system, according to one embodiment.

FIG. 14 illustrates a schematic substrate processing system 1400 that includes a controller 101, at least one processing line 1401, and a factory interface 604. For example, the substrate processing system 1400 may be a PVD system.

As shown, both processing lines 1401 each includes a plurality of stations, such as stations 1411-1423. Each processing line 1401 is offset from each other by a period of time such that substrates can be processed and/or conveyed in both processing lines 1401 at the same time. Each processing line 1401 shares a central arrangement of stations 1401*c* and a processing arrangement of stations 1401*p*. Each processing line 1401 includes a magnetic transportation system (not shown) formed from the individual magnetic levitation assemblies of the stations 1411-1423 that conveys a substrate 140 disposed on a carrier 130 through the processing line 1401. Each processing line 1401 may include a plurality of slit valves 1460 that can be opened to clear a path of travel for the carrier 130 and selectively closed to isolate the stations 1411-1423 from each other.

Each station 1411-1416 in the central arrangement of stations 1401*c* is configured to change the axial direction of travel of a carrier 130. For example, each of the stations 1411-1416 may be routing stations that have a magnetic levitation assembly similar to the magnetic levitation assemblies 230, 430, 530 as described above.

The processing arrangement of stations 1401*p* includes stations 1417-1423. The processing arrangement of stations 1401*p* includes a lift station, shown as seventh station 1417 and twelfth station 1422, to move a carrier 130 between a first and second conveyance plane in a similar manner as the lift stations described above with respect to substrate processing system 1300. A substrate 140 is processed in each of the process stations, shown as stations 1418-1421. Each of the stations 1418-1421 may be similar to process station 100 described above, or another station described above to process a substrate. Each station 1418-1421 may have a magnetic levitation assembly 120 including a first track segment 121 and a second track segment 122. The rails of each track segment 121, 122 may be configured in a similar manner as rails 124, 126, 224, 226, 324, 524, and 526 as described above or any other rails described herein. The thirteenth station 1423 may be similar to stations 204, 404, 504 and include a magnetic levitation assembly with one track segment made of one or more of the rails 124, 126, 224, 226, 324, 524, and 526 as described above. When the seventh station 1417 and twelfth station 1422 are moved to an upper position, the rails of these stations are co-planar with the rails within the thirteenth station 1423 to convey a carrier along the second conveyance plane.

The carrier 130 is not conveyed linearly in the Y-direction of travel through the process stations 1418-1421 of the processing arrangement of stations 1401*p*, Instead, the carrier 130 is exchanged between the central arrangement of stations 1401*c* and the processing arrangement of stations 1401*p*. The controller 101 determines if the carrier 130 is conveyed into the processing arrangement of stations 1401*p* on the left or right hand side of the central arrangement of stations 1401*c*.

FIG. 14 includes an X-Y-Z coordinate system to show the axial direction of travel of the carrier and substrate through the substrate processing system 1400. The carrier 130 may be conveyed in a processing line 1401 as follows. A substrate 140 is first transferred from an FOUP 606 to a carrier 130 disposed in the first station 1411. The first station 1411 then conveys the carrier 130 to the second station 1412 in the Y-direction. The second station 1412 then conveys the carrier 130 into the eighth station 1418, where the substrate 140 can be processed, such as being degassed. The eighth station 1418 then conveys the carrier 130 in the X-direction back to the second station 1412. The carrier 130 is then conveyed in the Y-direction to the third station 1413. The third station 1413 then conveys the carrier 130 to the ninth station 1419, where the substrate 140 can be processed, such as undergoing a pre-cleaning. The ninth station 1419 then conveys the carrier 130 back into the third station 1413 in the X-direction. The third station 1413 then conveys the carrier 130 in the Y-direction to the fourth station 1414. The fourth station 1414 then conveys the substrate in the X-direction into the tenth station 1420, where the substrate 140 is processed, such having a tantalum nitride layer deposited thereon. The tenth station 1420 then conveys the carrier 130 back to the fourth station 1414 in the X-direction. The fourth station 1414 then conveys the carrier 130 into the fifth station 1415 in the Y-direction. The fifth station 1415 then conveys the carrier 130 into the eleventh station 1421 in the X-direction, where the substrate 140 is processed, such as having a copper layer deposited thereon. The carrier 130 is then conveyed from the eleventh station 1421 back to the fifth station 1415 in the X-direction. The fifth station 1415 conveys the carrier 130, with the now fabricated substrate 140 thereon, into the sixth station 1416 in the Y-direction. The carrier 130 is then conveyed from the sixth station 1416 to the twelfth station 1422 in the X-direction. The carrier 130 is lifted from a first conveyance plane to a second conveyance plane within the twelfth station 1422 where the carrier 130 is conveyed in the Y-direction into the thirteenth station 1423. The carrier 130 travels in the Y-direction along the second conveyance plane and into the seventh station 1417 which has been moved to the upper position. The seventh station 1417 then lowers the carrier 130 back to the first conveyance plane, where the carrier 130 is conveyed back into the first station 1411 in the X-direction. The fabricated substrate 140 may be removed from the carrier 130 in the first station 1411 and placed in a FOUP 606. A new substrate 1400 may be placed on the carrier 130 for the processing cycle as described above.

FIG. 15 illustrates a schematic substrate processing system 1500 that includes a controller 101, at least one processing line 1501, and a factory interface 604. For example, the substrate processing system 1500 may be a PVD system.

As shown, both processing lines 1501 each include a plurality of stations, such as stations 1511-1519. Each processing line 1501 is offset from each other by a period of time such that substrates can be processed and/or conveyed in both processing lines 1501 at the same time. Each processing line 1501 shares a central arrangement of stations 1501c shown as including stations 1511-1515 and a processing arrangement of stations 1501p. Each processing line 1501 includes a magnetic transportation system (not shown) formed from the individual magnetic levitation assemblies of the stations 1511-1519 that conveys a substrate 140 (not shown) disposed on a carrier 130 (not shown) through the processing line 1501. Each processing line 1501 may include a plurality of slit valves 1560 that can be opened to clear a path of travel for the carrier 130 and selectively closed to isolate the stations 1511-1519 from each other.

The central arrangement of stations 1501c includes stations 1511-1516. A lift station is disposed at each end of the central arrangement of stations 1501c, shown as first station 1511 and fifth station 1515, to move a carrier 130 between a first and second conveyance plane in a similar manner as the lift stations described above with respect to substrate processing system 1300. The stations 1512-1514 are configured to change the axial direction of travel of a carrier 130. For example, each of the stations 1512-1514 may be routing stations that have a magnetic levitation assembly similar to the magnetic levitation assemblies 230, 430, 530 as described above. The sixth station 1516 is disposed above the stations 1511-1515. The sixth station 1516 may be similar to stations 204, 404, 504 and include a magnetic levitation assembly with one track segment made of one or more of the rails 124, 126, 224, 226, 324, 524, and 526 as described above. When the first station 1511 and the fifth station 1515 are moved to the upper position, the rails of these stations are co-planar with the rails within the sixth station 1516.

The processing arrangement of stations 1501p includes stations 1517-1519. Each of the stations 1517-1519 may be similar to process station 100 described above, or another station described above to process a substrate. Each station 1517-1519 may have a magnetic levitation assembly 120 (not shown) including a first track segment 121 (not shown) and a second track segment 122 (not shown). The rails of each track segment 121, 122 may be configured in a similar manner as rails 124, 126, 224, 226, 324, 524, and 526 as described above or any other rails described herein.

The carrier 130 is not conveyed linearly in the Y-direction of travel through the process stations 1517-1519 of the processing arrangement of stations 1501p. Instead, the carrier 130 is exchanged between the central arrangement of stations 1501c and the processing arrangement of stations 1501p) The controller 101 determines if the carrier 130 is conveyed into the processing arrangement of stations 1501p on the left or right hand side of the central arrangement of stations 1501c.

FIG. 15 includes an X-Y-Z coordinate system to show the axial direction of travel of the carrier and substrate through the substrate processing system 1500. The carrier 130 may be conveyed in a processing line 1501 as follows. A substrate 140 is first transferred from a FOUP 606 to a carrier 130 disposed in the first station 1511 when the first station 1511 is in a lower position to convey a carrier along the first conveyance plane. The first station 1511 then conveys the carrier 130 to the second station 1512 in the Y-direction. The second station 1512 then conveys the carrier 130 into the seventh station 1517 in the X-direction, where the substrate 140 is processed. After the substrate 140 is processed in the seventh station 1517, the carrier 130 is conveyed back into the second station 1512. The carrier 130 is then conveyed into the third station 1513 in the Y-direction and then conveyed into the eighth station 1518 from the third station 1513 in the X-direction. After the substrate 140 is processed in the eighth station 1518, the carrier 130 is conveyed back into the third station in the X-direction. The carrier 130 is then conveyed in the Y-direction to the fourth station 1514 and then conveyed in the X-direction from the fourth station 1514 to the ninth station 1519. After the substrate 140 is processed in the ninth station 1519, the carrier 130 is conveyed back into the fourth station 1514 in the X-direction. The carrier 130 is then conveyed into the fifth station 1515 along the first conveyance plane in the Y-direction while the fifth station 1515 is in the lower position. The fifth station 1515 lifts the carrier 130 from the first conveyance plane to the second plane. The carrier 130 is then conveyed along the second conveyance plane in the Y-direction from the fifth station 1515 to the first station 1511 through the sixth station 1516. Once the carrier 130 is in the first station 1511, the first station 1511 lowers the carrier 130 back to the first conveyance plane. The fabricated substrate 140 may be removed from the carrier 130 in the first station 1511 and placed in an FOUP 606. A new substrate 1400 may be placed on the carrier 130 for an additional processing cycle.

The amount of time to complete a process within a station may vary depending on the process. For example, a first station may take about half of the time to complete a process than an adjacent second station, which causes a carrier to in the first station to wait within the first station after processing until the process in the second station is completed. The differential in processing time between stations bottlenecks throughput. A processing line may be branched to avoid a bottleneck to maximize throughput.

Figure 16:
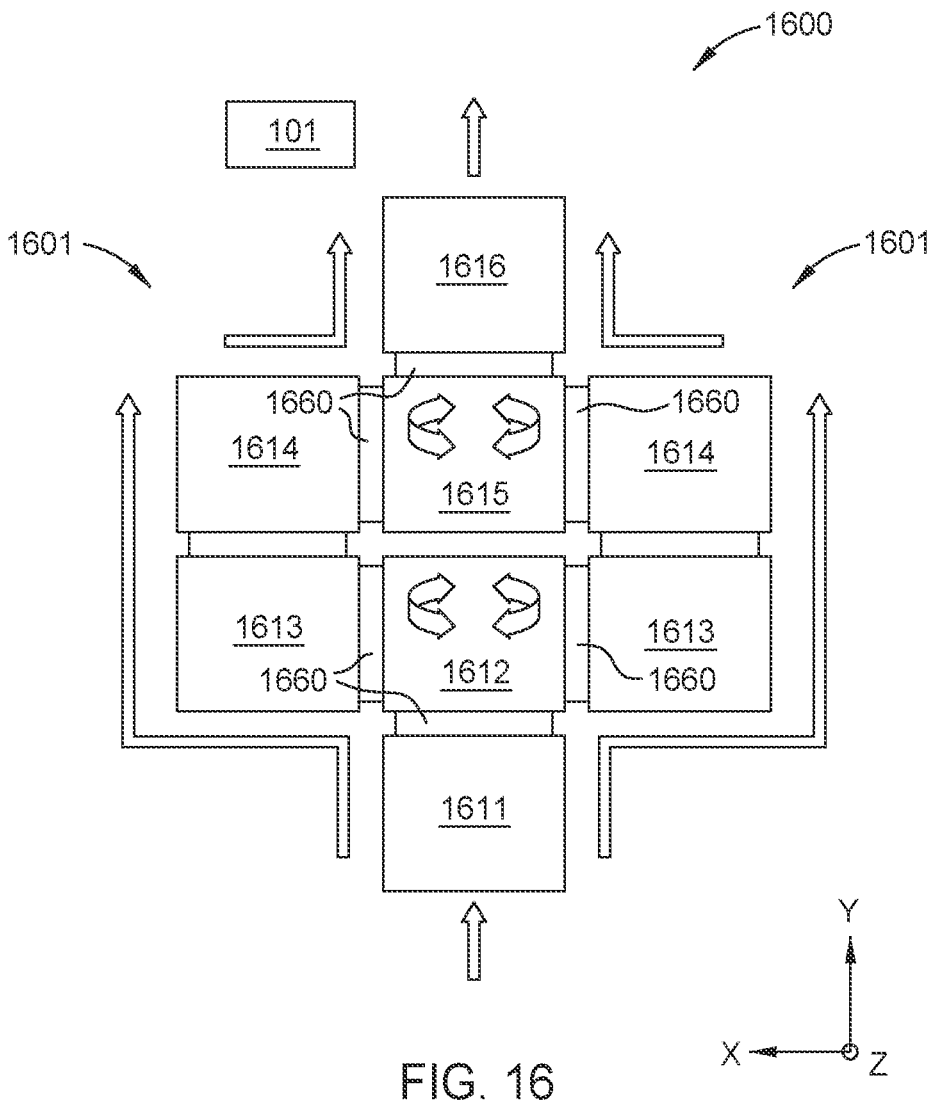
FIG. 16 is a top schematic view of a branched arrangement of stations includable in a substrate processing system, according to one embodiment.

FIG. 16 illustrates a branched arrangement of stations 1600 than can be included in one of the processing lines of a substrate processing system described above. The branched arrangement 1600 includes a plurality of stations and a plurality of branches. FIG. 16 includes an X-Y-Z, coordinate system to show the axial direction of travel of the carrier and substrate through the branched arrangement 1600. The arrows illustrate the direction that one or more carriers travel through the branched arrangement of stations 1600.

The branched arrangement 1600 is shown in FIG. 16 with stations 1611-1616. A carrier (not shown), such as carrier 130, with a substrate 140 (not shown) disposed thereon is conveyed into the first station 1611. Slit valves 1660 are disposed between the stations 1611-1616. The first station 1611 may be a process station 100, or other processcioning station, as described above. The first station 1611 may process the substrate 140 in about half the time as another process station within a branch 1601 of a processing line. Each branch 1601 diverges at the second station 1612. A carrier 130 within the second station 1612 is conveyed into one of the two branches 1601 in the X-direction. A carrier 130 may be conveyed into each branch 1601 in an alternating fashion offset by a period of time. The offset period of time may be based on the amount of time needed to process and convey the substrate within the branched arrangement 1600. Each branch 1601 may be include one or more stations, such as the third station 1613 and fourth station 1614. The carrier 130 is conveyed linearly through the branch 1601 in the Y-direction. The two branches 1601 converge at the fifth station 1615, where the carrier 130 is conveyed in the X-direction from the fourth station 1614 to the fifth station 1615. Carriers entering the fifth station 1615 are subsequently conveyed into the sixth station 1616 in the Y-direction.

In some embodiments, and as shown in FIG. 16, each branch 1601 may both diverge and converge. In some embodiments, each branch 1601 may only diverge.

The branched arrangement 1600, however, may include three or more branches, and each branch may include one or more stations.

The first station 1611 and sixth station 1616 may be similar to the process station 100 described above and may have a magnetic levitation assembly 120 including a first track segment 121 and a second track segment 122. The rails of each track segment 121, 122 may be configured in a similar manner as rails 124, 126, 224, 226, 324, 524, and 526 as described above or any other rails described herein.

The stations 1612-1615 are configured to change the axial direction of travel of the carrier 130. Each of the stations 1612-1615 may be stations that have a magnetic levitation assembly similar to the magnetic levitation assemblies 220, 230, 320, 430, 520, 530 as described above, such as a process station or a routing station. For example, the second station 1612 and fifth station 1615 may be routing stations and the third station 1613 and fourth station 1614 may be process stations.

Multiple carriers 130 and substrates 140 may be conveyed and processed simultaneously or asynchronously within the substrate processing systems described above. For example, the number of carriers within a substrate processing system may be equal to, less than, or more than the number of stations of the substrate processing system.

The number of stations in each processing line of a substrate processing system may vary depending on the desired process or desired travel path of the carrier. For example, each processing line may have two or more stations, such as more than ten stations.

In some embodiments, one or more stations can be located along the second conveyance plane of a substrate processing system such that a substrate is processed in stations orientated at the first conveyance plane and at the second conveyance plane.

Figure 17A:
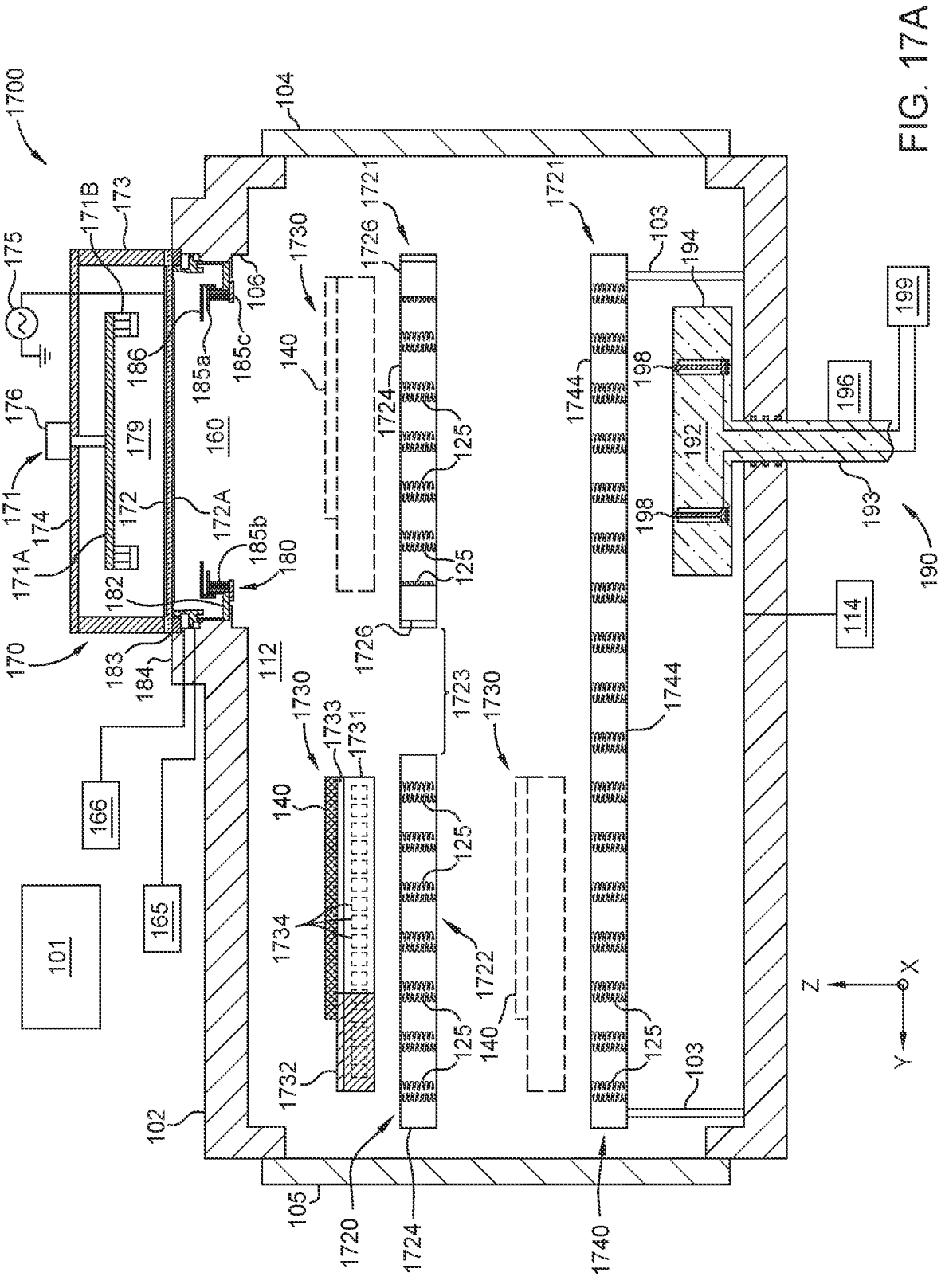
FIG. 17A is a side cross-sectional view of a station according to one embodiment.
Figure 17B:
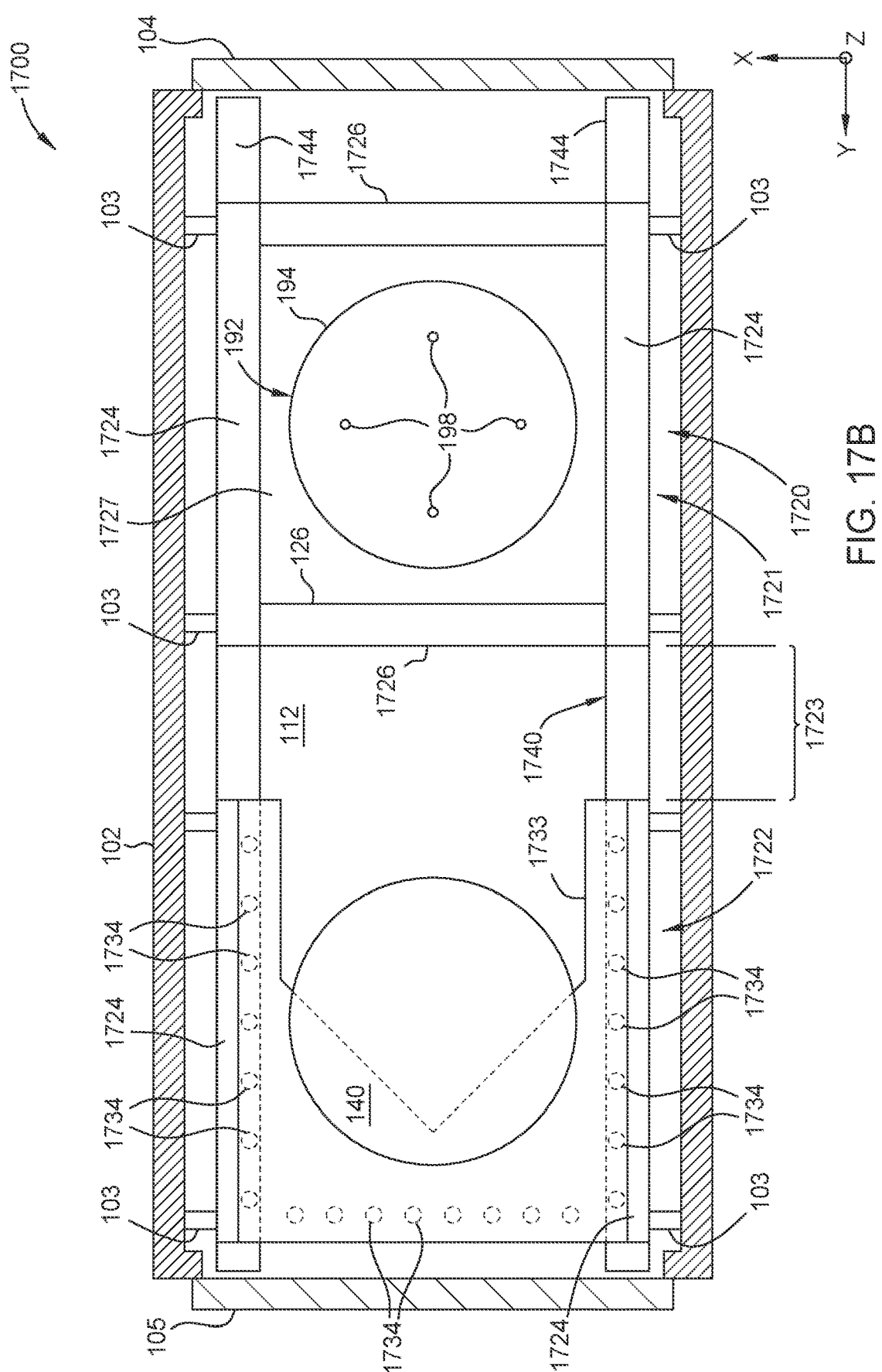
FIG. 17B is a top cross-sectional view of a station according to the embodiment shown in FIG. 17A.

FIG. 17A-17B illustrates a station 1700 that may be incorporated into any substrate processing system disclosed herein. The station 1700 is similar to station 100. Station 1700 may be a process station with similar components as process station 100 as indicated by the reference signs without reciting the description of these components of the process station 100 for brevity. In some embodiments, the station 1700 may not include a source assembly 170, process kit assembly 180, pedestal assembly 190, or opening 106.

FIG. 17A illustrates a cross-section of the station 1700. The station 1700 includes a first magnetic levitation assembly 1720 disposed above a second magnetic levitation system 1740 within the transport region 112 of the housing 102. The first magnetic levitation assembly 1720 and second magnetic levitation assembly 1740 provide parallel travel paths for different carriers, such as alternative carrier 1730. The first magnetic levitation assembly 1720 conveys the carrier 1730 in the transport region 112 between positions to facilitate processing of the substrate 140. After processing is complete, the first magnetic levitation assembly 1740 conveys the carrier 1730 out of the station 1700 through the open second slit valve 105. The second magnetic levitation assembly 1740 provides a return path for the carrier 1730 through the station 1700.

The first magnetic levitation assembly 1720 may have a first track segment 1721 separated from a second track segment 1722 by a gap 1723. The first and second track segments 1721 and 1722 are aligned to convey the carrier 1730 along a first conveyance plane. The first track segment 1721 and the second track segment 1722 may be a pair of spaced apart magnetic first rails 1724 as shown in FIG. 17A. In some embodiments, a track segment, such as the first track segment 1721, may optionally include a second pair of rails 1726 perpendicular to first rails 1724 as shown in FIG. 17B. The second rails 1726 may be disposed between each first rail 1724. The second rails 1726 may be shorter than or equal in length to the first rails 1724. In some embodiments, the first rails 1724 and second rails 1726 touch. In some embodiments, the first rails 1724 and second rails 1726 are integral with one another. As shown in FIG. 17A, the first rails 1724 and second rails 1726 are positioned within the transport region 112 by rail support members 103 connected to the housing 102.

The second magnetic levitation assembly 1740 may be a pair of spaced apart rails 1744 aligned to convey the carrier 1730 along a second conveyance plane and positioned within the transport region 112 by rail support members 103 connected to the housing. As shown in FIG. 17A, the rails 1744 are disposed below rails 1724 and 1726. In some embodiments, the second magnetic levitation assembly 1740 has two track segments in a similar configuration as the first magnetic levitation assembly 1720. A slit valve (not shown) may be closed between the gaps between track segments of the first and second magnetic levitation assemblies 1720, 1740 to bifurcate the transport region to create a buffer region to further isolate the process region 160 from other stations or the outside environment.

Each rail 1724, 1726, 1744 includes a plurality of magnets. The plurality of magnets may include electromagnets, permanent magnets, or a combination of both electromagnets and permanent magnets. For example, each rail 1724, 1726, and 1744 may have a plurality of electromagnets in the form of coils 125 disposed within the respective rail used to generate an electromagnetic current to levitate and propel the carrier 1730. The rails of the first and second magnetic assemblies 1720, 1740 are spaced apart such that a space 1727 (FIG. 17B) is present between the rails such that the pedestal assembly 190 can pass through the space in the Z-direction without contacting the rails of the magnetic levitation assemblies 1720, 1740. The controller 101 may cause electric current to be applied to the coils 125 to move the carrier 1730 in a linear fashion to positions above the rails 1724, 1726, 1744.

FIGS. 17A-178 depict an alternative carrier 1730. The carrier 1730 is conveyable within the transport region 112 by the first and second magnetic levitation assemblies 1720 and 1740. However, carrier 130 may be substituted for carrier 1730. The carriers 1730 may be substituted for carrier 130 in any of the substrate processing systems disclosed herein.

The substrate carrier 1730 may be formed from a non-magnetic material, such as aluminum. In some embodiments, it is beneficial to select the material from which the substrate carrier 1730 is made to include a material that can also withstand high processing temperatures. In one example, the substrate carrier 1730 is made from a ceramic material (e.g., alumina, quartz, zirconia, etc.). In some cases, the substrate carrier 1730 may be coated with an electrically conductive coating to resolve any charge build-up issues in the substrate carrier 1730 during processing within the station 1700.

The carrier 1730 includes a base 1731 and a substrate supporting surface 1732. The base 1731 includes a plurality of magnets 1734, such as a plurality of permanent magnets. The plurality of magnets 1734 may be arranged adjacent the edges of the base 1731. The magnets 1734 are positioned such that when the carrier 1730 is disposed above either the first or second magnetic levitation assembly 1720, 1740, the magnets 1734 interact with at least one rail of the first or second magnetic levitation assembly 1720, 1740 disposed underneath the carrier 1730. In some configurations, the plurality of magnets 1734 may be arranged such that they form a Halbach array or other similar configuration. The substrate 140 can be placed on the substrate supporting surface 1732 of the carrier 1730. The carrier 1730 may include a recess 1733 formed in the substrate supporting surface 1732 as shown in FIG. 17B. Lift pins 198 of the pedestal assembly 190 can be inserted through the recess 1733 to engage the bottom surface of the substrate 140 when the carrier 1730 is in a carrier transfer position.

The recess 1733 allows the lift pins 198 access to the bottom side of the substrate 140. The recess 1733 is also sized to allow sufficient clearance for a blade (not shown) of a factory interface to enter the recess 1733 to place the substrate 140 onto or remove the substrate from the substrate supporting surface 1732. While the recess 1733 is shown as a pentagonal recess in FIG. 17B, the recess 1733 could instead be a hemispherical recess, V-shaped, or other shape, to allow the lift pins 198 to contact the underside of the substrate 140 and to allow sufficient clearance for the blade of the factory interface to enter the recess 1733.

A carrier 1730 with a substrate 140 disposed thereon may enter into the station 1700 through the open first slit valve 104 for processing. The first magnetic levitation assembly 1720 is configured to convey the carrier 1730 with the substrate 140 thereon within the transport region 112 for processing. The first magnetic levitation assembly 1720 may move the carrier 1730 between a carrier transfer position and a park position in a similar manner as the magnetic levitation assembly 120 of station 100, and the pedestal assembly 190 and source assembly 170 may be operated in a similar manner as described regarding station 100 to process the substrate 140.

For example, the carrier 1730 with the substrate 140 is moved to the carrier transfer position above the first track segment 1721, which places the substrate 140 above the support plate 194 of the pedestal 192. The pedestal 192 is moved to the pedestal transfer position to place the support plate 194 adjacent to the bottom surface of the substrate 140. The lift pins 198 are actuated to pass through the recess 1733 to lift the substrate 140 so that the substrate 140 is disengaged from the substrate supporting surface 1732. The carrier 1730 then moves to the park position above the second track segment 1722 while the substrate 140 remains supported on the lift pins 198. The lift pins 198 exit the open end of the recess 1733 as the carrier 1730 moves away from the carrier transfer position. The lift pins 198 are retracted to place the substrate 140 on the upper surface of the support plate 194 after the carrier 1730 is clear from the pedestal 192. The pedestal 192 is raised to the process position to move the substrate 140 from the transport region 112 and into the process region 160 through the opening 106. The substrate 140 undergoes a process in the process region 160, such as PVD. The slit valves 104, 105 may be closed during processing. Once the process is completed, the pedestal 192 is returned to the pedestal transfer position. The lift pins 198 are actuated to lift the substrate 140 above the support plate 194 to allow sufficient clearance for the substrate supporting surface 1732 to move beneath the substrate 140. The carrier 1730 is moved from the park position to the carrier transfer position to place the substrate supporting surface 1732 beneath the substrate 140. The lift pins 198 enter the recess 1733 as the carrier 1730 moves to the carrier transfer position. Once the carrier 1730 is in the carrier transfer position, the lift pins 198 are retracted to lower the substrate 140 into engagement with the substrate supporting surface 1732. The pedestal 192 is moved back to the lower position. The carrier 1730 and now process substrate 140 are then conveyed out of the transport region 112 through open second slit valve 105 by the first magnetic levitation assembly 1720. This substrate 140 may undergo additional processing in subsequent stations 1700.

The carrier 1730 and substrate 140 that is conveyed out of the station 1700 by the first magnetic levitation assembly 1720 through the open second slit valve 105 may re-enter the station 1700 through the open second slit valve 105. The carrier 1730 re-enters the station 1700 above the second magnetic levitation assembly 1740 and is conveyed along the second conveyance plane. The carrier is lowered from the first conveyance plane to the second conveyance plane by a lift station. The carrier 1730 is moved through the transport region 112 from the open second slit valve 105 towards the open first slit valve 104 by the second magnetic levitation 1740. The pedestal 192 blocks the travel path of the carrier 1730 along the second magnetic levitation assembly 1740 when the pedestal 192 is in the pedestal transfer position or process position. The carrier 1730 may be held at a return park position along the second magnetic levitation assembly 1740 while the pedestal 192 blocks the travel path of the carrier 1730. Once the pedestal 192 is returned to a lower position beneath the rails 1744, the second magnetic levitation assembly 1740 then conveys the carrier 1730 out of the transport region through open first slit valve 104. The return park position may be underneath the second track segment 1722 of the first magnetic levitation assembly 1720 or a position along the second magnetic levitation assembly 1740 that does not interfere with the movement of the pedestal 192. In some embodiments, the controller 101 waits to move the pedestal 192 from the lower position to the pedestal transfer position until after a carrier 1730 bearing a processed substrate 140 is conveyed into and out of the transport region 112 by the second magnetic levitation assembly 1740.

Figure 18A:
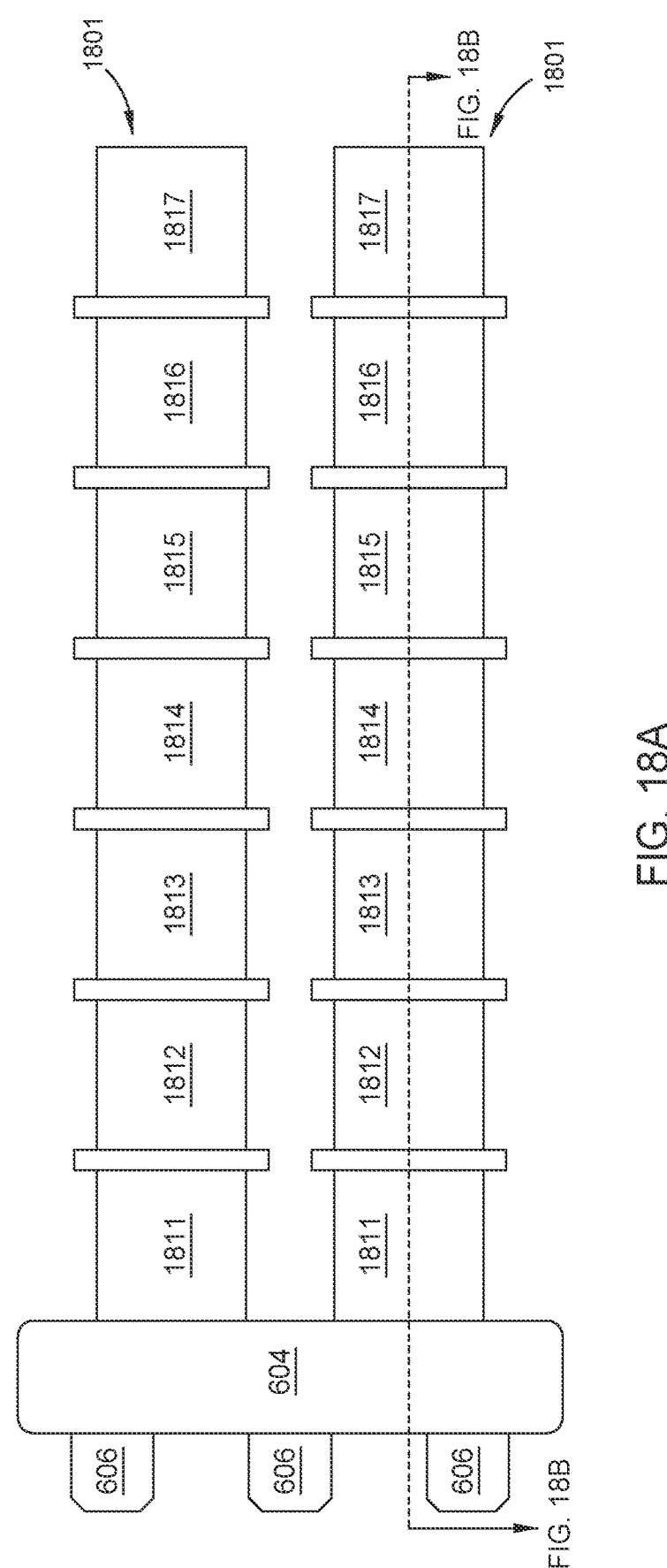
FIG. 18A is a top schematic view of a substrate processing system, according to one embodiment.
Figure 18B:
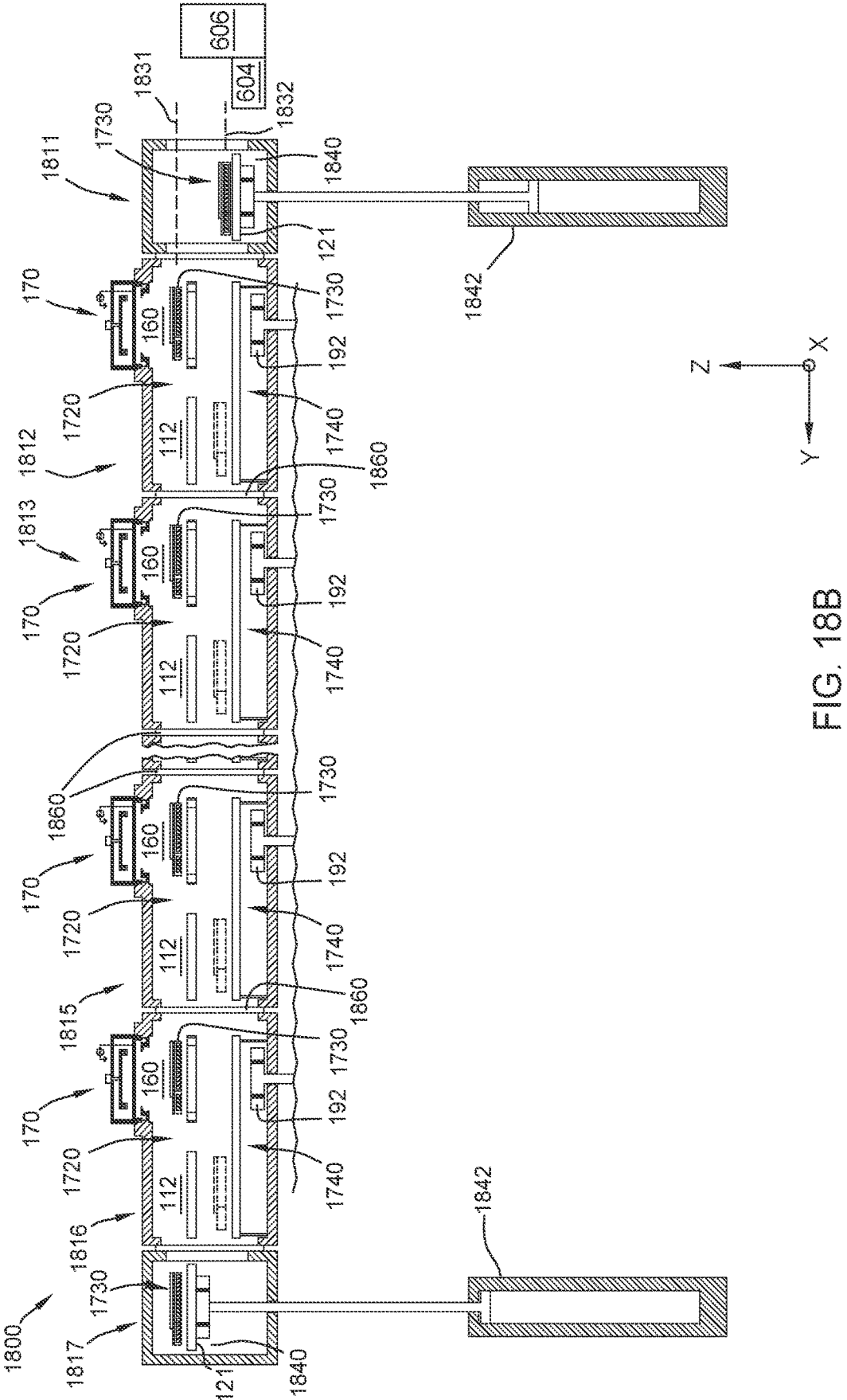
FIG. 18B is a partial side cross-sectional view of a substrate processing system, according to the embodiment of FIG. 18A.

FIGS. 18A-18B illustrate a substrate processing system 1800 with at least one processing line 1801, a factory interface 604, and a controller 101. The substrate processing system 1800, as shown, has two linear processing lines 1801 that do not change the axial direction of travel of the carrier 1730.

Each processing line 1801 includes one or more stations, such as stations 1811-1817. A lift station (e.g., station 1811, 1817) is placed at each end of the processing line 1801 to raise and lower the carrier 1730 between a first conveyance plane 1831 and a second conveyance plane 1832. The stations 1812-1816 each be station 1700. The stations 1812-1816 have a first and second magnetic levitation assembly, such as the first and second magnetic levitation assemblies 1720 and 1740. The rails of the first magnetic levitation assemblies in each station 1812-1816 are aligned to convey the carrier along the first conveyance plane 1831 and the rails of the second magnetic levitation assemblies in each station 1812-1816 are aligned to convey the carrier along the second conveyance plane 1832.

The carrier 1730 is conveyed in a linear fashion along the first conveyance plane 1831 through one or more stations (e.g., 1811-1816) in a first direction along an axial direction of travel and into a lift station (e.g., lift station 1817). The carrier 1730 is then lowered by the lift station to the second conveyance plane 1832, where the carrier 1730 is conveyed in a linear fashion in an opposite direction along the same axial direction of travel to convey the carrier 1730 back to the first station (e.g., 1811). In other words, substrates 140 on carriers 1730 are conveyed along the first conveyance plane 1831 for processing and returned along the second conveyance plane 1832.

The substrate processing system 1800 may be a PVD system including stations 1811-1817. The first station 1811 and seventh stations 1817 are lift stations, and the first station 1811 may also be a load lock. The second station 1812 may be a buffer station, the third station 1813 may be a degas station, the fourth station 1814 may be a pre-clean station, the fifth station 1815 may be a tantalum nitride deposition, and the sixth station 1816 may be a copper deposition station.

FIG. 18B illustrates a partial cross-sectional view of the substrate processing system 1800 along section line shown in FIG. 18A. As shown, station 1814 is omitted. The stations 1812, 1813, 1815, and 1816 are similar to stations 1700. Some, but not all, of the reference signs from station 1700 are used to label features of stations 1812, 1813, 1815, 1816 to maintain clarity of FIG. 18B. A slit valve 1860 is disposed between each station. The first station 1811 and seventh station 1817 each include a first magnetic levitation assembly 1840. The magnetic levitation assembly 1840 may be similar to the magnetic levitation assembly 120, or another magnetic levitation assembly described above. As shown, the magnetic levitation assembly 1840 includes a first track segment 121 that is moveable by an actuation assembly 1842 between an upper position to convey the carrier 1730 along the first conveyance plane 1831 and a lower position to convey the carrier 1730 along the second conveyance plane 1832. The actuation assembly 1842 may include a stepper or servo motor actuated lead screw assembly, linear motor assembly, pneumatic cylinder actuated assembly or other conventional mechanical linear actuation mechanism. The first station 1811 is shown with the track segment 121 in a lower position to convey the carrier 1730 along the second conveyance plane 1832 and the track segment 121 of the seventh station 1817 in an upper position to convey the carrier 1730 along the first conveyance plane 1831. In some embodiments, the actuator assembly 1842 may raise or lower the stations 1811, 1817 rather than raising and lowering the rails relative to the housing of the first station 1811 and seventh station 1817.

A plurality of carriers 1730 and substrates 140 are shown in the processing line 1801. A substrate 140 may be placed onto a carrier 1730 located in the first station 1811 when the track segment 121 of the first station 1811 is in the upper position. The carrier 1730 and substrate 140 are then conveyed through the stations 1812-1816 along the first conveyance plane 1831 by the first magnetic levitation assemblies 1720 in each of the stations 1812-1816. The substrate 140 may be processed in one or more of the stations, and the carrier 1730 may be moved between the park position and carrier transfer position in each station. The carrier 1730 exits the sixth station 1816 and enters the seventh station 1817 along the first conveyance plane 1831 when the track segment 121 of the seventh station 1817 is in the upper position. Once a carrier 1730 is conveyed into the seventh station 1817 along the first conveyance plane 1831 the actuation assembly 1842 is actuated to move the track segment 121 of the seventh station 1817 to lower position such that the track segment 121 is aligned with the second magnetic levitation 1740 assembly of the sixth station 1816. The carrier 1730 may then be conveyed from the seventh station 1817 into the sixth station 1816 along the second conveyance plane 1832. The track segment 121 of the seventh station 1817 is then moved back to the upper position by the actuation assembly 1842 to receive the next carrier 1730. The track segment 121 of the first station 1811 is also moved to the lower position to receive the carrier 1730 traveling along the second conveyance plane 1832. The processed substrate 140 can be removed from the carrier 1730 upon return to the first station 1811. The substrate 140 can be removed from the carrier 1730 while the track segment 121 of the first station is in the lower position or after the track segment 121 has been moved back to the upper position.

In some embodiments, the carrier 1730 returning to the first station 1811 from the seventh station 1817 along the second conveyance plane 1832 travels through the stations 1812-1816 without stopping. In other words, the controller 101 delays raising the pedestal 192 in station 1812-1816 until after the returning carrier 1730 has returned to the first station 1811. Alternatively, the carrier 1730 may be moved to a park position along the second magnetic levitation assembly 1740 of a station while a different substrate is processed in that station. For example, each station 1812-1816 may have a first carrier 1730 in a park position along the first magnetic levitation assembly 1720 and a second carrier 1730 in a park position (as shown in phantom in FIG. 18B) along the second magnetic levitation assembly 1740 while a substrate 140 is being processed in each of the station 1812-1816. After the process is complete and the pedestal 192 is lowered, then each carrier 1730 moves to the next station along the respective first and second conveyance plane 1831, 1832.

Figure 19A:
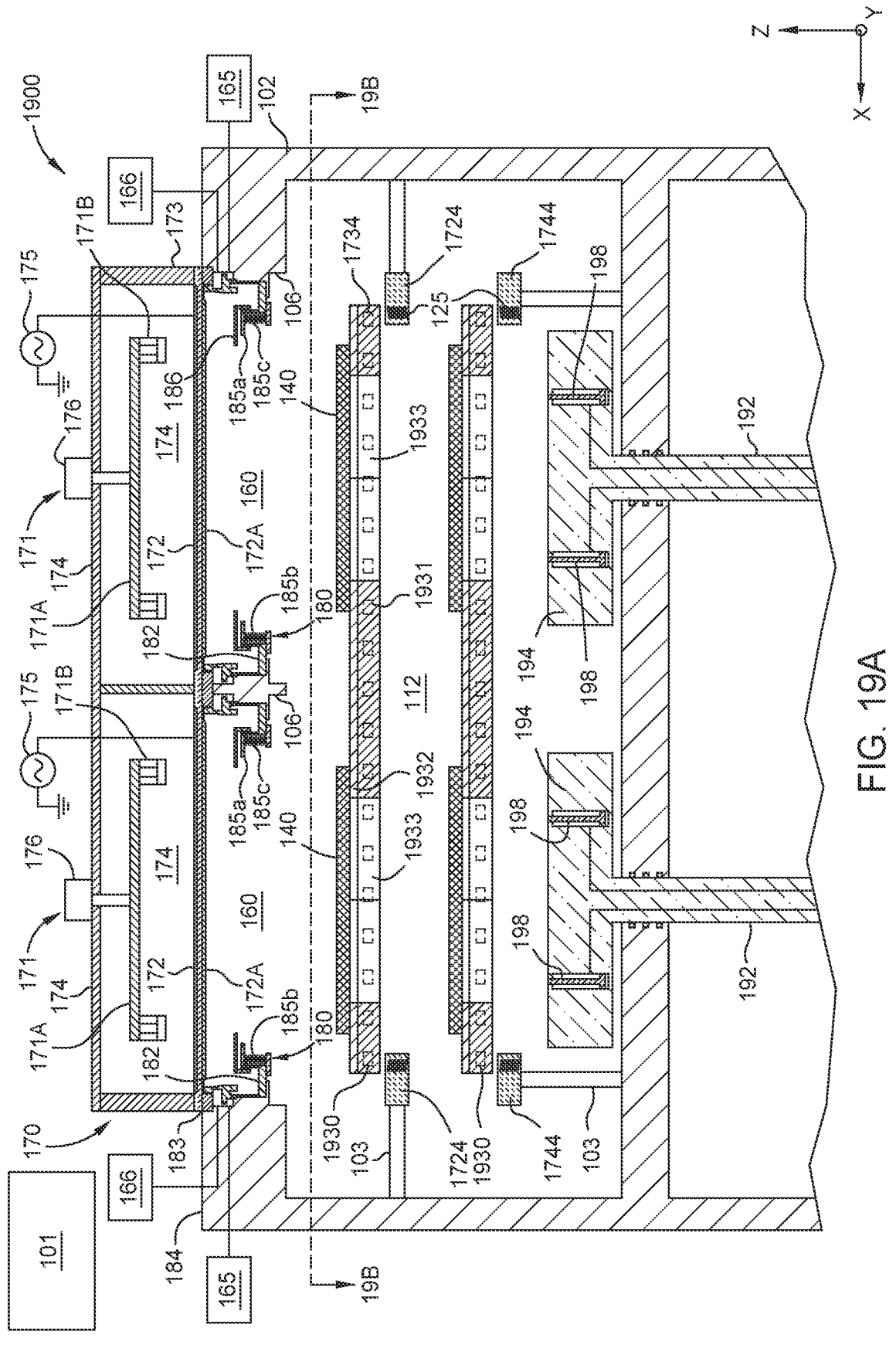
FIG. 19A is a side cross-sectional view of a station according to one embodiment.
Figure 19B:
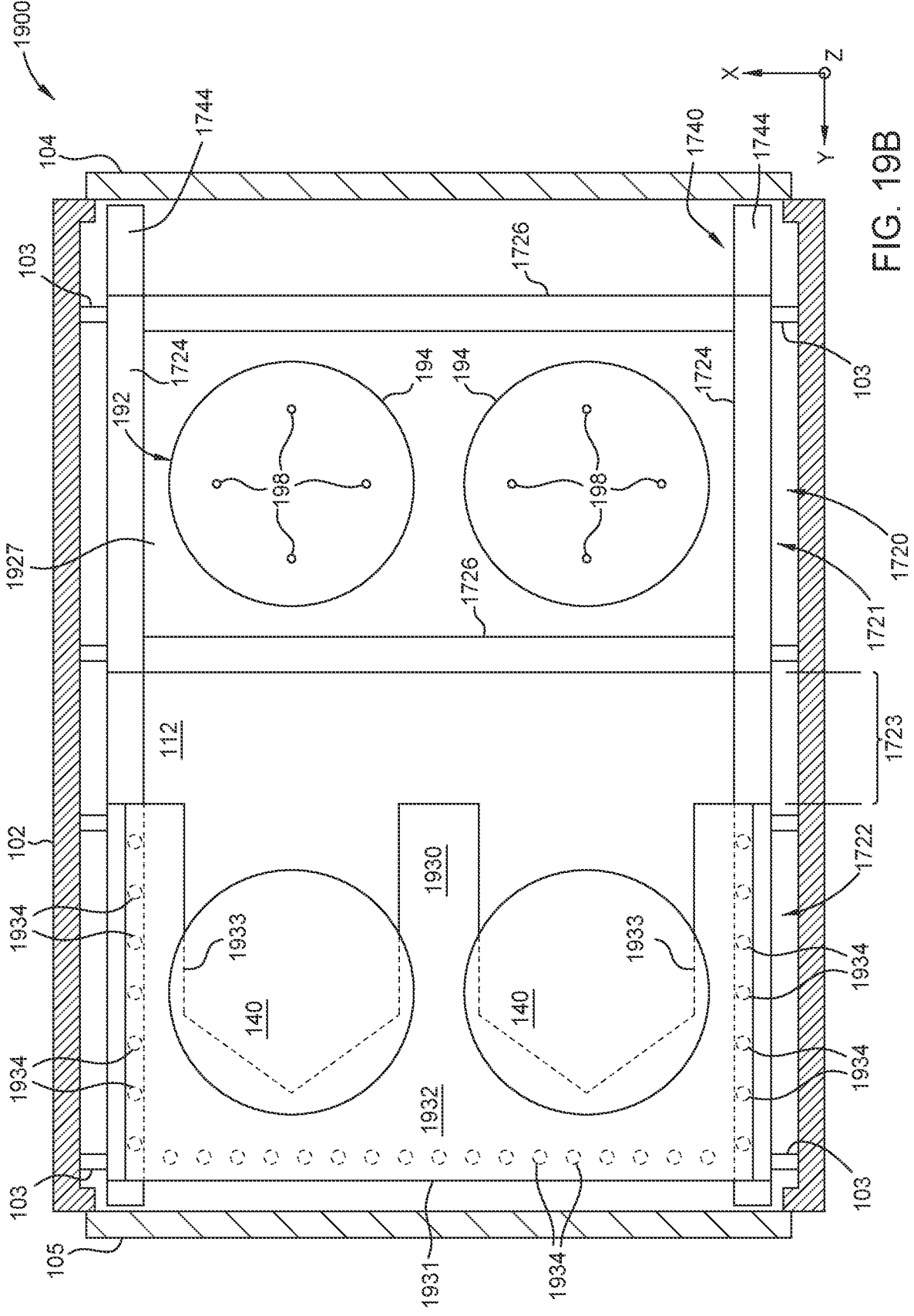
FIG. 19B is a top cross-sectional view of a station according to the embodiment shown in FIG. 19A.

FIGS. 19A-19B illustrate a station 1900 that may be incorporated into any substrate processing system disclosed herein. The station 1900 may be a process station with similar components as the station 1700 as indicated by the reference signs without reciting the description of these components of the station 1700 for brevity. The station 1900 differs from the station 1700 in that the station 1900 includes duplicate components such that two or more substrates can be processed in the station at the same time.

FIG. 19A is a cross-sectional view of the station 1900. The station 1900 may include two openings 106, two source assemblies 170, two process kit assemblies 180, and two pedestal assemblies 190. A first and second magnetic levitation assembly 1720, 1740 are disposed in the transport region 112. The pedestal 192 is disposed between the first rails 1724 of the first magnetic levitation assembly 1720 and the rails 1744 of the second magnetic levitation assembly 1740. The rails 1724 and 1744 are spaced apart such that both pedestal assemblies 190 can be raised and lowered in the space 1927 between each set of rails 1724, 1744 without contact. A carrier 1930 (shown in FIG. 19B) is used to facilitate processing of two substrates 140 simultaneously within the station 1900.

FIG. 19B is a top cross-sectional view of the station 1900 which shows the carrier 1930 in a park position above the second track segment 1722 of the first magnetic levitation assembly 1720. As shown, two substrates 140 are supported on the carrier 1930. A second carrier 1930 is also shown above the second magnetic levitation assembly 1740 below the first carrier 1930.

The carrier 1930 may be formed from a non-magnetic material, such as aluminum. In some embodiments, it is beneficial to select the material from which the carrier 1930 is made to include a material that can also withstand high processing temperatures. In one example, the carrier 1930 is made from a ceramic material (e.g., alumina, quartz, zirconia, etc.). In some cases, the carrier 1930 may be coated with an electrically conductive coating to resolve any charge build-up issues in the substrate carrier 1930 during processing within the process station 1900.

The carrier 1930 includes a base 1931 and a substrate supporting surface 1932. The base 1931 includes a plurality of magnets 1934, such as a plurality of permanent magnets. The plurality of magnets 1934 may be arranged adjacent the edges of the base 1931. The magnets 1934 are positioned such that when the carrier 1930 is disposed above either the first or second magnetic levitation assembly 1720, 1740, the magnets 1934 interact with at least one rail of the first or second magnetic levitation assembly 1720, 1740 disposed underneath the carrier 1930. In some configurations, the plurality of magnets 1934 may be arranged such that they form a Halbach array or other similar configuration. The two substrates 140 can be placed on the substrate supporting surface 1932 of the carrier 1930. The carrier 1930 includes a recess 1933 formed in the substrate supporting surface 1932 for each substrate 140. The recesses 1933 are positioned such that each recess 1933 is positioned above a different pedestal 192. Lift pins 198 of each pedestal assembly 190 can be inserted through each recess 1933 to engage the bottom surface of the substrate 140 when the carrier 1930 is in a carrier transfer position. In some embodiments, each recess 1933 may be a portion of a single recess formed in the base 1931.

Each recess 1933 allows the lift pins 198 access to the bottom side of the substrate 140. Each recess 1933 is also sized to allow sufficient clearance for a blade (not shown) of a factory interface to enter the recess 1933 to place the substrate 140 onto the substrate supporting surface 1932. While the recess 1933 is shown as a pentagonal recess in FIG. 19B, each recess 1933 could instead be a hemispherical recess, V-shaped, or other shape, to allow the lift pins 198 to contact the underside of the substrate 140 and to allow sufficient clearance for the blade of the factory interface to enter the recess 1933.

A carrier 1930 with two substrates 140 disposed thereon may enter into the station 1900 through the open first slit valve 104 for processing. The first magnetic levitation assembly 1720 may move the carrier 1930 between a carrier transfer position and a park position in a similar manner as the magnetic levitation assembly 120 of station 100, and the pedestal assembly 190 and source assembly 170 may be operated in a similar manner as described regarding station 100 to process the substrate 140.

For example, the carrier 1930 is moved to the carrier transfer position above the first track segment 1721, which places each substrate 140 above the support plate 194 of a respective pedestal 192. Each pedestal 192 is moved to the pedestal transfer position to place the support plate 194 adjacent to the bottom surface of the substrate 140. The lift pins 198 are actuated to pass through each recess 1933 to lift the substrate 140 so that the substrate 140 is disengaged from the substrate supporting surface 1932. Each substrate 140 may be disengaged from the substrate supporting surface 1932 simultaneously. In some embodiments, one substrate 140 is disengaged from the carrier 1930 prior to the other substrate 140. For example, the first substrate 140 may be disengaged from the carrier 1930 but the second substrate 140 is misaligned on the carrier 1930. The position of the carrier 1930 may be adjusted above the pedestal 192 to facilitate alignment of the substrate 140 with the lift pins 198. After the carrier 1930 is repositioned, the second substrate 140 may be disengaged from the carrier 1930 by actuating the lift pins 198.

The carrier 1930 moves to the park position above the second track segment 1722 after both substrates 140 are disengaged from the carrier 1930. The lift pins 198 exit the open end of each recess 1933 as the carrier 1930 moves away from the carrier transfer position. The lift pins 198 are retracted to place the substrate 140 on the upper surface of the respective support plate 194 after the carrier 1930 is clear from both pedestals 192. Each pedestal 192 is raised to the process position to move each substrate 140 from the transport region 112 and into a respective process region 160. The substrate 140 undergoes a process in the process region 160, such as PVD, The slit valves 104, 105 may be closed during processing. Once the process is completed, each pedestal 192 is returned to the pedestal transfer position. The lift pins 198 are actuated to lift each substrate 140 above the corresponding support plate 194 to allow sufficient clearance for the substrate supporting surface 1932 to move beneath the substrate 140. The carrier 1930 is moved from the park position to the carrier transfer position to place the substrate supporting surface 1932 beneath the substrate 140. The lift pins 198 enter each recess 1933 as the carrier 1930 moves to the carrier transfer position. Once the carrier 1930 is in the carrier transfer position, the lift pins 198 are retracted to lower the substrates 140 into engagement with the substrate supporting surface 1932. Each pedestal 192 is moved back to the lower position. The carrier 1930 and now processed substrates 140 are then conveyed out of the transport region 112 through open second slit valve 105 by the first magnetic levitation assembly 1720. This substrates 140 may undergo additional processing in subsequent stations 1700.

The carrier 1930 and substrates 140 that are conveyed out of the station 1900 by the first magnetic levitation assembly 1720 through the open second slit valve 105 may re-enter the station 1900 through the open second slit valve 105. The second magnetic levitation assembly 1740 may convey the carrier 1930 through the transport region 112 along the second conveyance plane and out of the open first slit valve 104 in a similar manner as the carrier 1730.

While the station 1900 is shown with two pedestal assemblies 190, source assemblies 170, processing kit assemblies 180, and openings 106, the station 1900 may include three or more sets of these components. The carrier 1930 may include additional recesses 1933 and be sized to accommodate additional substrates 140 for processing in the station 1900. For example, the station 1900 may process three, four, five, or more substrates 140 simultaneously.

In some embodiments, the carrier 1930 may be substituted for the carrier 130 in any of the disclosed substrate processing systems. For example, processing stations of a substrate processing system, such as system 600, may accommodate carrier 1930 and include duplicate components needed to process two substrates simultaneously. The magnetic levitation assemblies may be arranged, for example, to accommodate the carrier 1930 as well as to facilitate changing the axial direction of travel of the carrier 1930.

Figure 20:
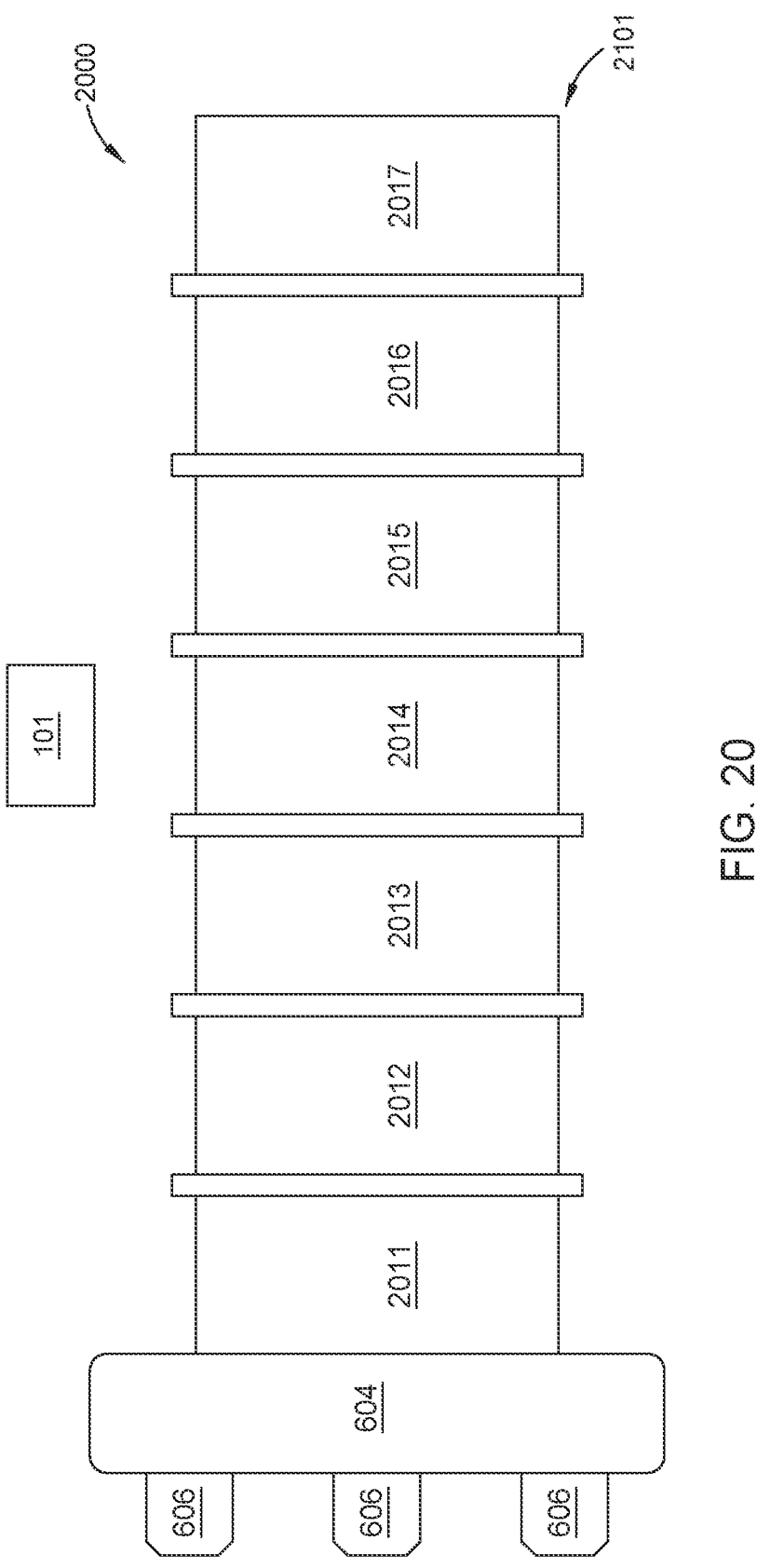
FIG. 20 is a top schematic view of a substrate processing system, according to one embodiment.

FIG. 20 illustrates a substrate processing system 2000 with a processing line 2001, a factory interface 604, and a controller 101. The substrate processing system 2000, as shown, has a linear processing lines 2001 that do not change the axial direction of travel of the carrier 1930. Carriers 1930 are conveyed through the processing line 2001 to facilitate processing multiple substrates in each station simultaneously.

The processing line 2001 includes one or more stations, such as stations 2011-2017. A lift station (e.g., station 2011, 2017) is placed at each end of the processing line 2001 to raise and lower the carrier 1930 between a first conveyance plane and a second conveyance plane in a similar manner as the substrate processing system 1800. The stations 2012-2016 have a first and second magnetic levitation assembly, such as the first and second magnetic levitation assemblies 1720 and 1740. The rails of the first magnetic levitation assemblies in each station 2012-2016 are aligned to convey the carrier 1930 along the first conveyance plane and the rails of the second magnetic levitation assemblies in each station 2012-2016 are aligned to convey the carrier 1930 along the second conveyance plane.

The carrier 1930 is conveyed in a linear fashion along the first conveyance plane through one or more stations (e.g., 2011-2017) in a first direction along an axial direction of travel. The carrier 1930 is then lowered to the second conveyance plane by the second lift station 2011. The carrier 1930 is conveyed in an opposite direction along the same axial direction to convey the carrier 1930 back to the first station (e.g., 2011) along the second conveyance plane. In other words, substrates 140 on carriers 1930 are conveyed along the first conveyance plane for processing and returned along the second conveyance plane.

The substrate processing system 2000 may be a PVD system including stations 2011-2017. The first station 2011 and seventh stations 2017 are lift stations, and the first station 2011 may also be a load lock. The second station 2012 may be a buffer station, the third station 2013 may be a degas station, the fourth station 2014 may be a pre-clean station, the fifth station 2015 may be a tantalum nitride deposition, and the sixth station 2016 may be a copper deposition station.

Shutter disks may be circulated through a substrate processing system to be used in a cleaning or seasoning operation. The shutter disk may also be used to protect the supporting surface 194 from damage during chamber cleaning and or seasoning processes. A shutter disk may be placed onto a carrier in the first station of the substrate processing system by the factory interface 604, such as by a robotic arm, instead of a substrate 140. The carrier then conveys the shutter disk through the substrate processing system.

In some embodiments, a shutter disk is placed on a carrier within a shutter station of the substrate processing system instead of being placed onto a carrier by the robotic interface. A carrier without a substrate disposed thereon is circulated through the substrate processing system to the shutter station to have the shutter disk placed thereon. A shutter station 2100 (FIGS. 21A-21B) may include similar components as process station 100 as indicated by the reference signs without reciting the description of these components of the process station 100 for brevity.

In some embodiments, the shutter disk is a singular disk. In some embodiments, the shutter disk is a two-piece assembly, but the shutter disk assembly may include additional components. In addition, although described herein as a disk, the shutter disk may have any suitable geometry for protecting a support plate 194 within a particular process chamber.

Figure 21A:
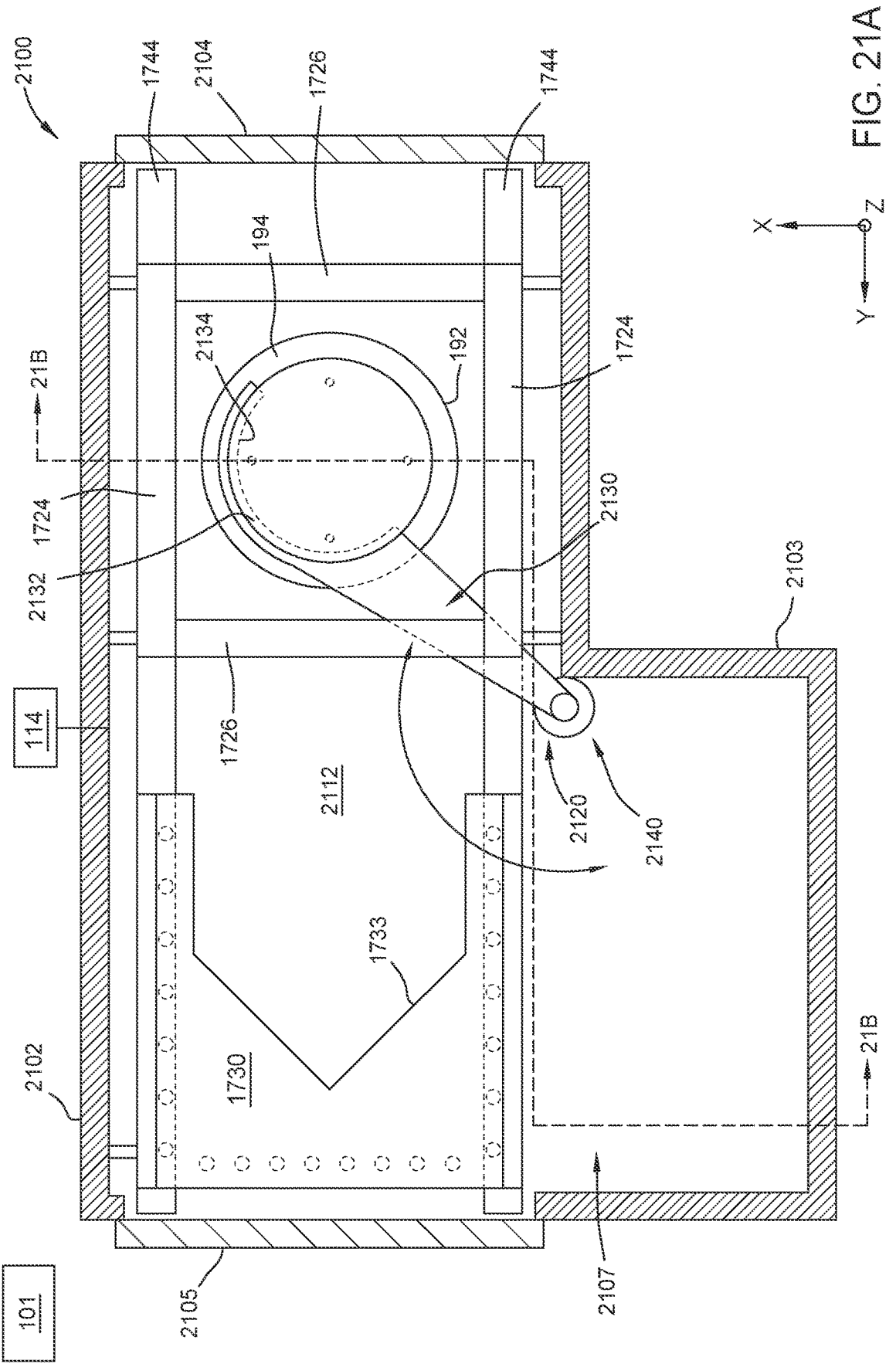
FIG. 21A is top cross-sectional view of a shutter station according to one embodiment.
Figure 21B:
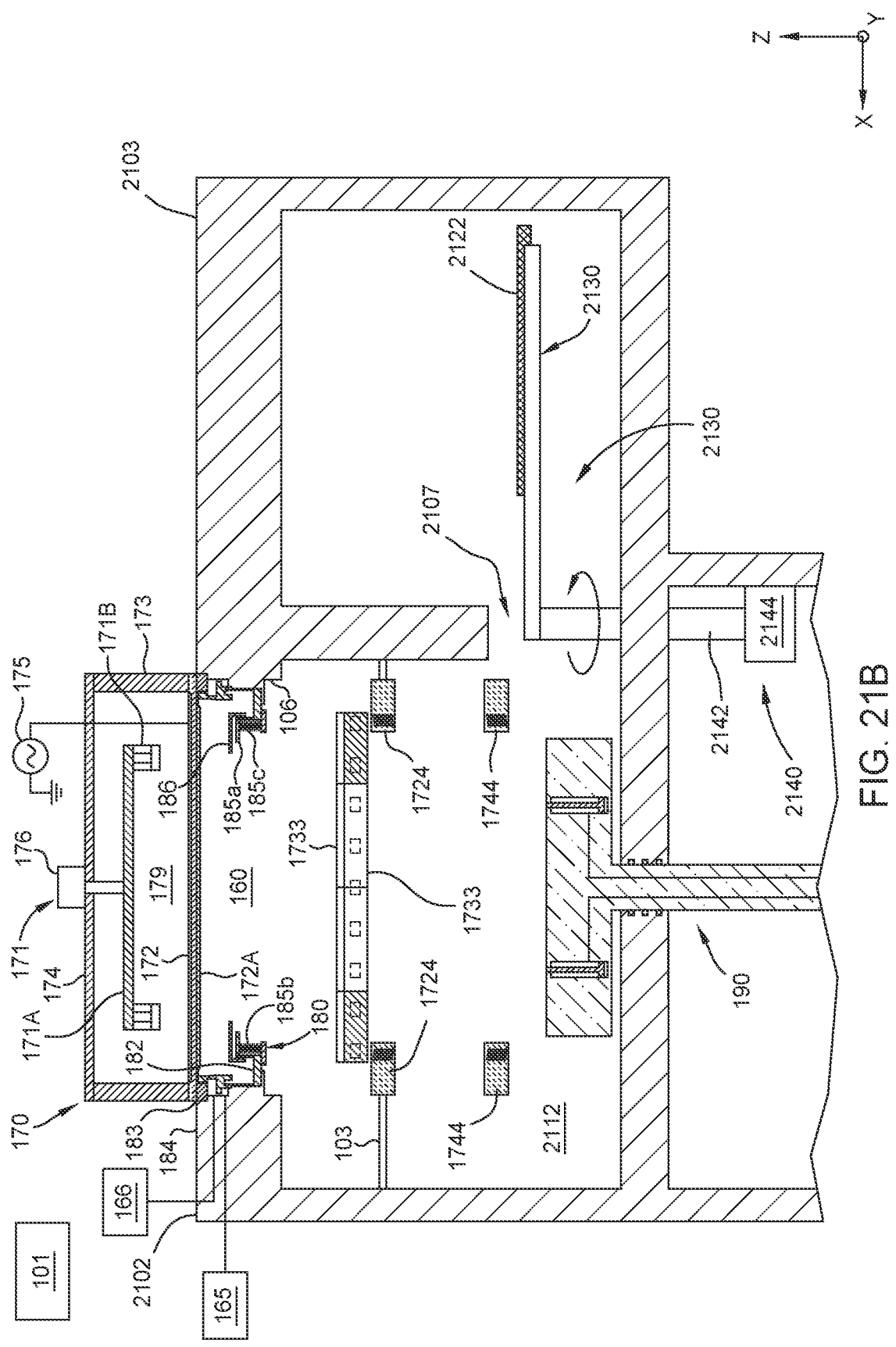
FIG. 21B is a side cross-sectional view of a shutter station according to the embodiment of FIG. 21A.

FIGS. 21A-21B illustrate a shutter station 2100 that may be incorporated into any substrate processing system disclosed herein. The shutter station 2100 allows a shutter disk to be placed on a carrier, such as carrier 130, 1730, 1930, as the carrier is circulated through the substrate processing system. The carrier (carrier 1730 shown for simplicity) may be circulated through the substrate processing system without a substrate disposed thereon to receive the shutter disk in the shutter station.

The shutter station 2100 includes a housing 2102, a shutter garage 2103, a transport region 2112 within the housing 2102, a shutter assembly 2120, and a pedestal assembly 190, The shutter garage 2103 may be attached to or integral with the housing 2102. One or more magnetic levitation assemblies are disposed within the transport region 2112. While first and second magnetic levitation assemblies 1720, 1740 are shown disposed in the transport region 2112, it is contemplated that only one magnetic levitation assembly, such as magnetic levitation assembly 120, is disposed within the transport region 2112. The shutter station 2100 may optionally include a source assembly 170 and a process kit assembly 180 as shown in FIG. 21B.

The transport region 2112 may be in communication with a vacuum pump 114 to evacuate the transport region 2112. For example, the vacuum pump 114 may reduce the pressure within the transport region 2112 to a sub-atmospheric pressure on the order of about $10^{-3}$ torr. The vacuum pump 114 may be a turbopump, cryopump, roughing pump or other useful device that is able to maintain a desired pressure within the transport region 2112.

The shutter assembly 2120 facilitates transferring a shutter disk 2122 onto the carrier, such as carrier 1730 as shown in FIGS. 21A-21B. The shutter assembly 2120 includes an arm 2130 and an actuation assembly 2140. The actuation assembly 2140 is configured to selectively move the arm 2130 between a first position (FIG. 21B) in which the shutter disk 2122 is disposed in the shutter garage 2103 and a second position (FIG. 21A) in which the shutter disk 2122 is disposed above the pedestal 192. The arm 2130 may move through an opening 2107 formed in the housing 2102 between the transport region 2112 and the shutter garage 2103. The arm 2130 and shutter disk 2122 are disposed above the pedestal 192 and below a magnetic levitation assembly, such as second magnetic levitation assembly 1740, when the arm 2130 is in the second position.

In some embodiments, the arm 2130 is completely disposed in the shutter garage 2103 when in the first position. In some embodiments, the arm 2130 is partially disposed in the transport region 2112 when in the first position.

The arm 2130 includes a shutter support surface 2132 and a recess 2134. The shutter support surface 2132 is configured to support the shutter disk 2122 so that the shutter disk 2122 does not fall off the arm 2130 while the arm 2130 is moved. The shutter support surface 2132 may engage a portion of the periphery of the shutter disk 2122. The recess 2134 is sized to allow the lift pins 198 access to the underside of the shutter disk 2122 and to allow the arm 2130 to move from the second position to the first position while the shutter disk 2122 is supported by the extended lift pins 198.

The actuation assembly 2140 includes a shaft 2142 and an actuator 2144. The shaft 2142 is coupled to the arm 2130 and the actuator 2144. The actuator 2144 is actuated to control the position of the arm 2130. The actuator 2144 rotates the shaft 2142 which in turn moves the arm 2130. The actuator 2144 may also raise and lower the arm 2130 in the Z-direction. For example, the actuator 2144 may raise the arm 2130 so that the arm 2130 is disposed between the first and second magnetic levitation assemblies 1720, 1740 once moved to the second position. The actuator 2144 may include a stepper or servo motor actuated lead screw assembly, linear motor assembly, pneumatic cylinder actuated assembly or other conventional mechanical linear actuation mechanism.

A shutter disk 2122 is placed onto the shutter support surface 2132 of the arm 2130 prior to a shutter disk transfer operation. The shutter garage 2103 may be opened to place the shutter disk 2122 onto the arm 2130 or the arm 2130 may be moved to retrieve a shutter disk 2122 from a shutter disk cassette (not shown) disposed in the shutter garage 2103 that includes a plurality of shutter disks.

A carrier, such as the carrier 1730, may be conveyed into the shutter station 2100 without a substrate 140 disposed thereon to receive the shutter disk 2122. The actuator 2144 causes the arm 2130 to move from the first position to the second position to place the shutter disk 2122 over the pedestal 192. The carrier 1730 may be in the park position while the arm 2130 is moved to the second position. The pedestal 192 may be lifted in the Z-direction to place the support plate 194 adjacent to the bottom of the shutter disk 2122. The lift pins 198 are actuated to disengage the shutter disk 2122 from the shutter support surface 2132. The actuator 2114 causes the arm to return to the first position from the second position after the shutter disk 2122 is supported by the lift pins 198 and disengaged from the shutter support surface 2132. The lift pins 198 may be retracted to place the shutter disk 2122 onto the support plate 194 of the pedestal 192 once the arm 2130 is clear, such as when the arm 2130 is returned to the first position.

If the shutter station 2100 includes a source assembly 170 and a process kit assembly 180, then the pedestal 192 may be raised to place the shutter disk 2122 into the process region 160 for a cleaning or seasoning operation. Once the cleaning or seasoning operation is complete, the pedestal 192 is lowered to a pedestal transfer position. The lift pins 198 are extended to lift the shutter disk 2122 above the support plate 194 to allow sufficient clearance for the substrate supporting surface 1732 to move beneath the shutter disk 2122. The carrier 1730 is then moved from the park position to the carrier transfer position. The lift pins 198 are then retracted to place the shutter disk 2122 onto the substrate support surface 1732. The pedestal 192 may then return to the lower position. The shutter disk 2122 may then be conveyed on the carrier 1730 like a substrate 140. Alternatively, the shutter disk 2122 may be transferred from the pedestal 192 to the carrier 1730 without first placing the shutter disk 2122 into the process region 160 if a cleaning or seasoning operation is not needed in the shutter station 2100 but is needed in a subsequent station in the substrate processing system.

In some embodiments, the shutter station 2100 does not include a source assembly 170 and a process kit assembly. The shutter disk 2122 is transferred to the pedestal 192 by the arm 2130 and then transferred from the pedestal 192 to the carrier 1730.

In some embodiments, the carrier 1930 may be circulated with one or no substrates 140 disposed thereon into the shutter station 2100 such that a shutter disk 2122 can be placed on the carrier 1930. The shutter station 2100 may be configured to have two or more shutter assemblies 2120 to place multiple shutter disks 2122 on the carrier 1930.

Figure 22A:
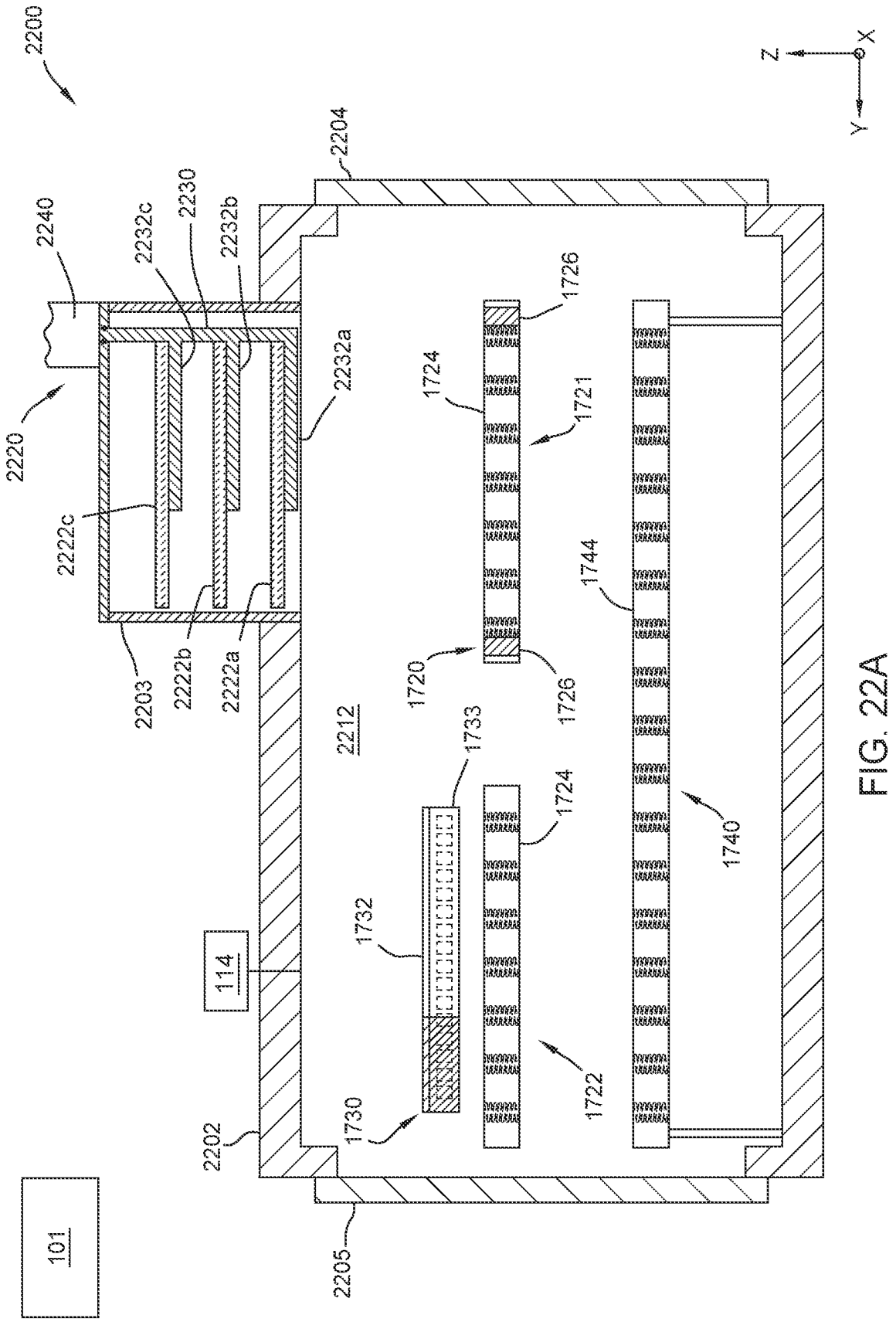
FIG. 22A is a side cross-sectional view of a shutter station according to one embodiment, with a carrier in a park position and a shutter carriage in an first position.
Figure 22B:
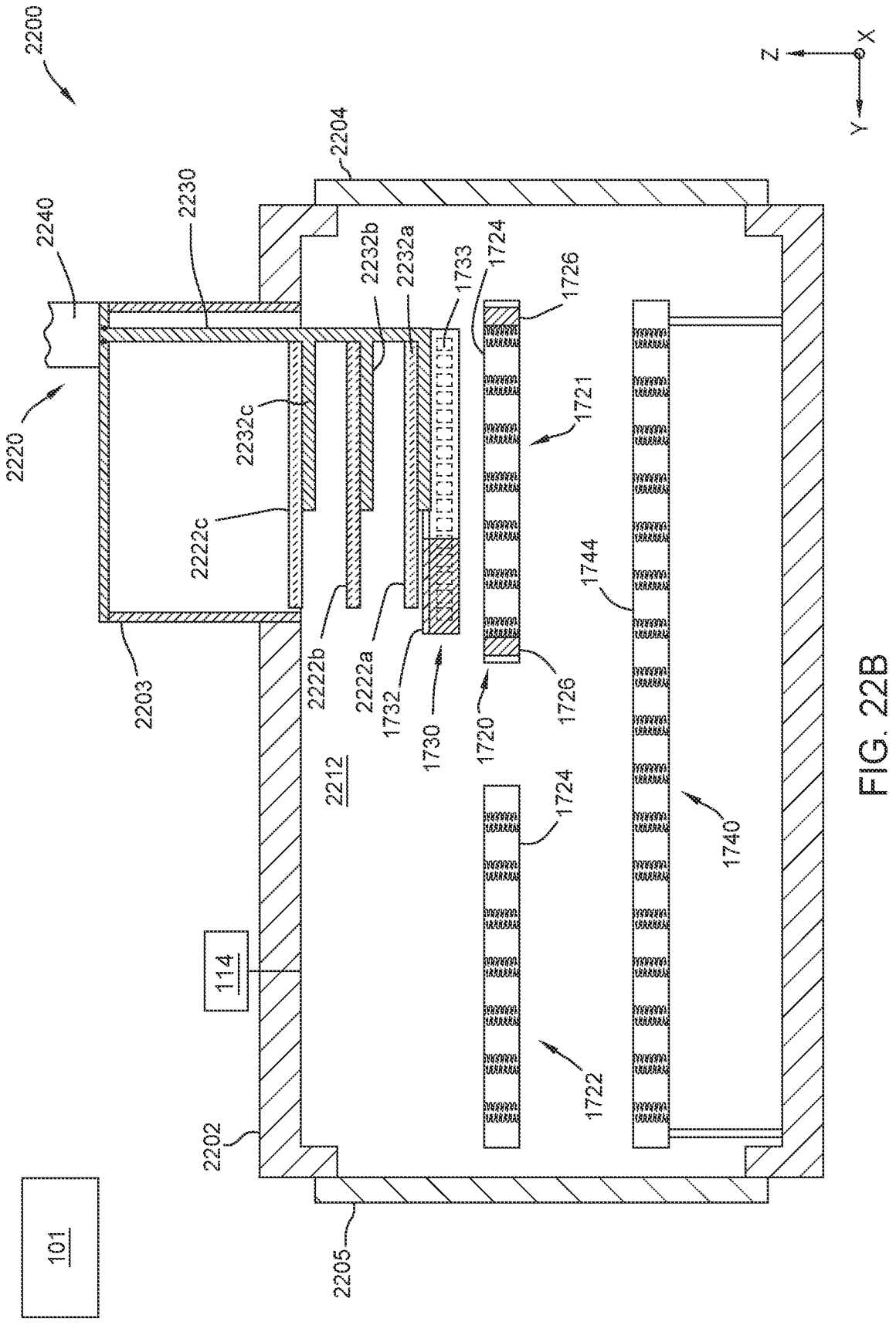
FIG. 22B is a side cross-sectional view of a shutter station according to the embodiment of FIG. 21A, with a carrier in a carrier transfer position and a shutter carriage in a second position.
Figure 22C:
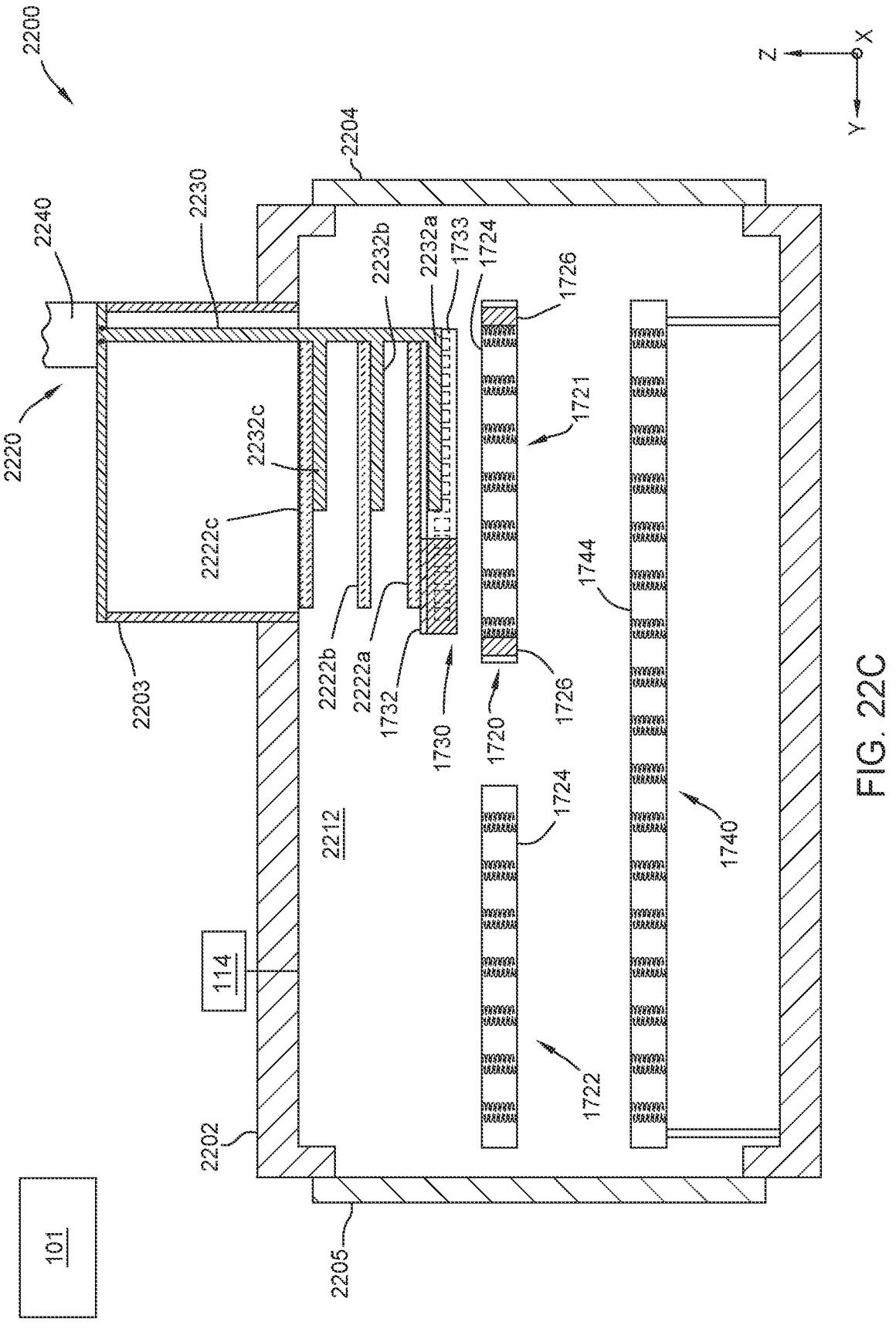
FIG. 22C is a side cross-sectional view of a shutter station according to the embodiment of FIG. 21A, with a carrier in a carrier transfer position and a shutter carriage in a third position.

FIGS. 22A-22C illustrate a shutter station 2200 that may be incorporated into any substrate processing system disclosed herein. The shutter station 2202 may be controlled by the controller 101. The shutter station 2200 allows a shutter disk to be placed on a carrier, such as carrier 130, 1730, 1930, as the carrier (carrier 1730 shown for clarity) is circulated through the substrate processing system. The carrier 1730 may be circulated through the substrate processing system without a substrate disposed thereon to receive the shutter disk in the shutter station. The shutter station 2200 may include similar components as process station 100 as indicated by the reference signs without reciting the description of these components of the process station 100 for brevity.

The shutter station 2200 includes a housing 2202, a shutter garage 2203, a transport region 2212 within the housing 2202, and a shutter assembly 2220. The shutter garage 2203 may be attached to or integral with the housing 2202. One or more magnetic levitation assemblies are disposed within the transport region 2212. While first and second magnetic levitation assemblies 1720, 1740 are shown disposed in the transport region 2212, it is contemplated that only one magnetic levitation assembly, such as magnetic levitation assembly 120, is disposed within the transport region 2212.

The transport region 2112 may be in communication with a vacuum pump 114 to evacuate the transport region 2112. For example, the vacuum pump 114 may reduce the pressure within the transport region 2112 to a sub-atmospheric pressure on the order of about $10^{-3}$ torr. The vacuum pump 114 may be a turbopump, cryopump, roughing pump or other useful device that is able to maintain a desired pressure within the transport region 2112.

The shutter assembly 2220 facilitates transferring a shutter disk 2222 onto the carrier, such as carrier 1730 as shown in FIGS. 22A-220. The shutter disk assembly includes a shutter carriage 2230 and an actuation assembly 2240. The shutter carriage 2230 includes a plurality of supports 2232, such as three supports shown in FIGS. 22A-220, separated apart from one another to hold different shutter disks. A first shutter disk 2222a is disposed on the first support 2232a, a second shutter disk 2222b is disposed on the second support 2232b, and a third shutter disk 2222c is disposed on the third support 2232c. The supports 2232a-c are positioned such that a carrier can move between the adjacent supports to retrieve a shutter disk 2222. Additionally, the supports 2232 are shaped to avoid contact with the carrier, such as carrier 1730, as the carrier 1730 is moved to retrieve the shutter disk 2222. For example, each support 1732a-c may be sized to fit within the recess 1733 of carrier 1730. The supports 2232 may be one or more blades. The shutter garage 2203 can be opened to allow shutter disks 2222 to be placed onto the support members 2232 of the shutter carriage 2230.

The actuation assembly 2240 is configured to raise and lower the shutter carriage 2230. The actuation assembly 2240 may include a stepper or servo motor actuated lead screw assembly, linear motor assembly, pneumatic cylinder actuated assembly or other conventional mechanical linear actuation mechanism.

FIG. 22A illustrates the carrier 1730 in a park position and the shutter carriage 2230 in a first position (e.g., upper position) within the shutter garage 2203. When the shutter carriage 2230 is in the first position, the carrier 1730 can pass underneath the shutter carriage 2230 without contact. The carrier 1730 enters the shutter station 2200 through the open first slit valve 2204 and moves to the park position while the shutter carriage 2230 is in the first position. Once the carrier 1730 is in the park position, the actuation assembly 2240 lowers the shutter carriage 2230 to a position place a shutter disk 2222 in a shutter transfer position. For example, the shutter carriage 2230 may be lowered to a second position (FIG. 22B) to place the first shutter disk 2222a in a first shutter transfer position. After the first shutter disk 2222a is in the first shutter transfer position, the carrier 1730 is moved to the carrier transfer position underneath the first shutter disk 2222a. The support 2232a may enter the recess 1733 as the carrier 1730 moves to the carrier transfer position. In some embodiments, the first support member 2232a is positioned above the supporting surface 1732 when the first shutter disk 222a is in the first shutter transfer position.

FIG. 22B shows the carrier 1730 in the carrier transfer position and the first shutter disk 2222a in the first shutter transfer position. A clearance is present between the bottom surface of the first shutter disk 2222a and the substrate supporting surface 1732 of the carrier 1730. Once the carrier 1730 is in the carrier transfer position, the actuation assembly 1740 lowers the shutter carriage 2230 relative to the carrier 1730 to a third position (FIG. 220) to engage the first shutter disk 2222a with the substrate supporting surface 1732. Once the first shutter disk 2222a contacts the carrier 1730, the carrier 1730 supports the weight of the first shutter disk 2222a which allows the support 2232a to disengage from the first shutter disk 2222a. After the first shutter disk 2222a is transferred to the carrier 1730, the carrier 1730 is moved away from the shutter carriage 2230. Once the carrier 1730 and first shutter disk 2222a are clear from the shutter carriage 2230, the shutter carriage 2230 may be returned to the first position from the third position. The carrier 1730 and first shutter disk 2222a may be conveyed out the second slit valve 2205 and into other stations in a substrate processing system where the first shutter disk 2222a is transferred onto a pedestal assembly 190.

Additional carriers 1730 with substrate 140 disposed thereon may be conveyed through the shutter station 2220 until it is desired to place shutter disk 2222b, 2222c on a different carrier 1730. Shutter disks 2222b, 2222c may be placed on a carrier 1730 in the same manner as the first shutter disk 2222a. For example, the second shutter disk 2222b is transferred to a different carrier 1730 by moving the shutter carriage 2230 to a fourth position (not shown) to place the second shutter disk 2222b in a second shutter transfer position. The second support member 2332b may be disposed in or above the recess 1733 and the first support member 2332a is below the carrier 1730 when the shutter carriage 2230 is in the fourth position. The shutter carriage 2230 is lowered to a fifth position when the carrier 1730 is in the carrier transfer position to engage the second shutter disk 2222b with the carrier 1730 and to disengage the second shutter disk 2222b from the second support member 2232b. The third shutter disk 2222c is transferred to a different carrier 1730 by moving the shutter carriage 2230 to a sixth position (not shown) to place the third shutter disk 2222c in a third shutter transfer position. The third support member 2332c may be disposed in or above the recess 1733 and the second and third support members 2332a,b are below the carrier 1730 when the shutter carriage 2230 is in the sixth position. The shutter carriage 2230 is lowered to a seventh position when the carrier 1730 is in the carrier transfer position to engage the third shutter disk 2222c with the carrier 1730 and to disengage the third shutter disk 2222c from the third support member 2232c.

In some embodiments, the carrier 1930 may be circulated with one or no substrates 140 disposed thereon into the shutter station 2200 such that a shutter disk can be placed on the carrier 1930. The shutter station 2220 may be configured to have two or more shutter assemblies 2220 to place multiple shutter disks 2222 on the carrier 1930.

Figure 23A:
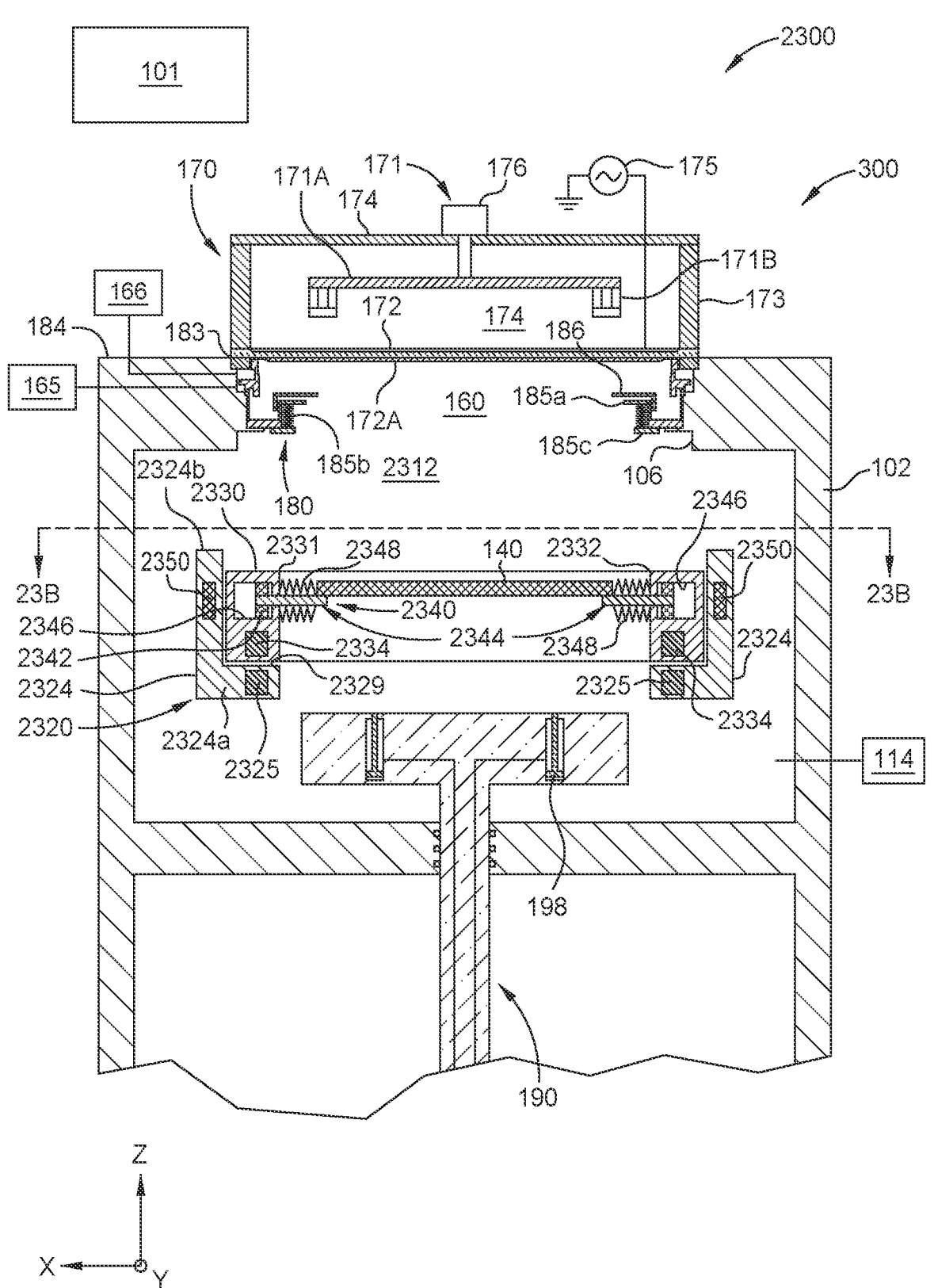
FIG. 23A is a side cross-sectional view of a station according to one embodiment, showing a carrier supporting a substrate levitated above a pair of magnetic rails.
Figure 23B:
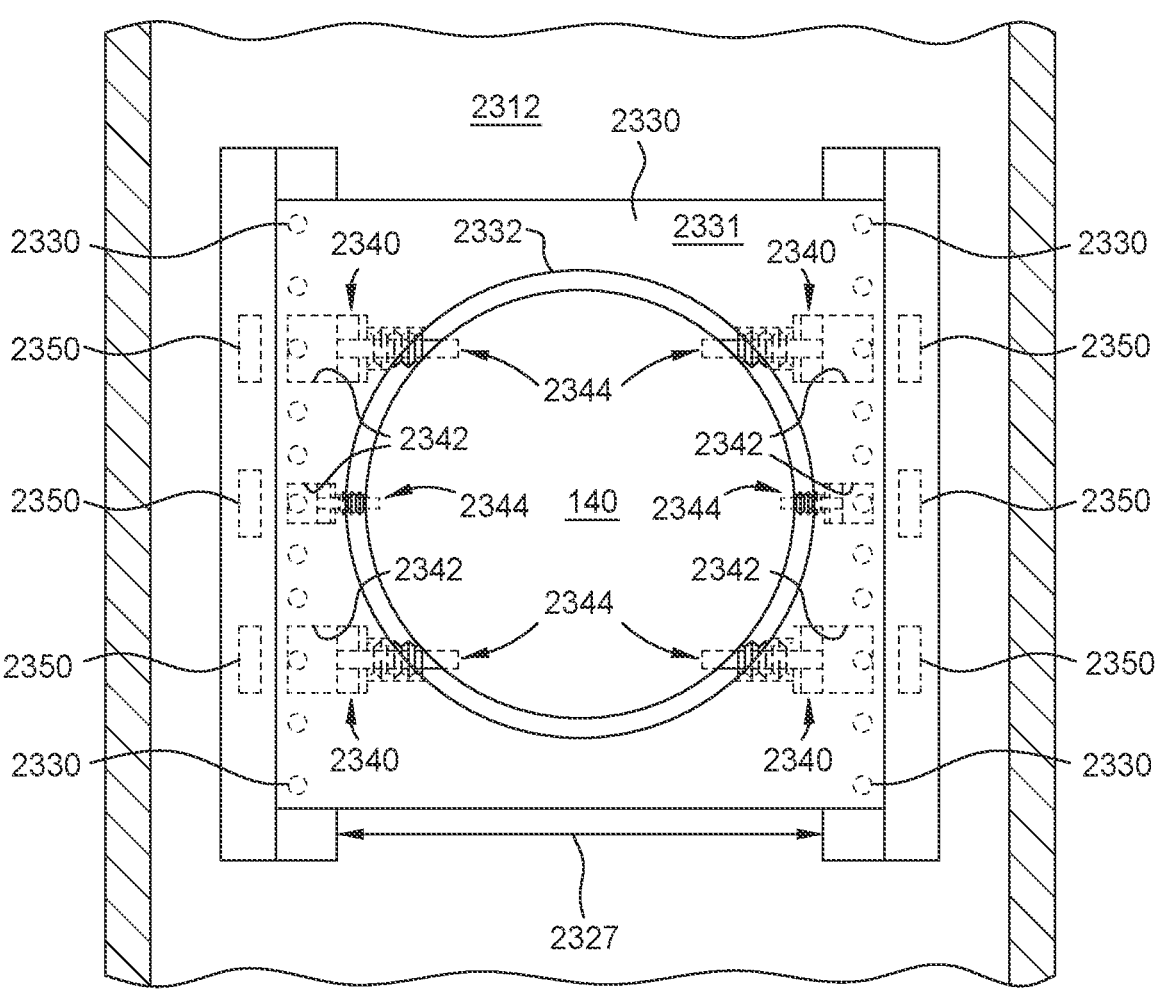
FIG. 23B is a top cross-sectional view of a station according to the embodiment of FIG. 23A, showing a carrier supporting a substrate levitated above a pair of magnetic rails.
Figure 23C:
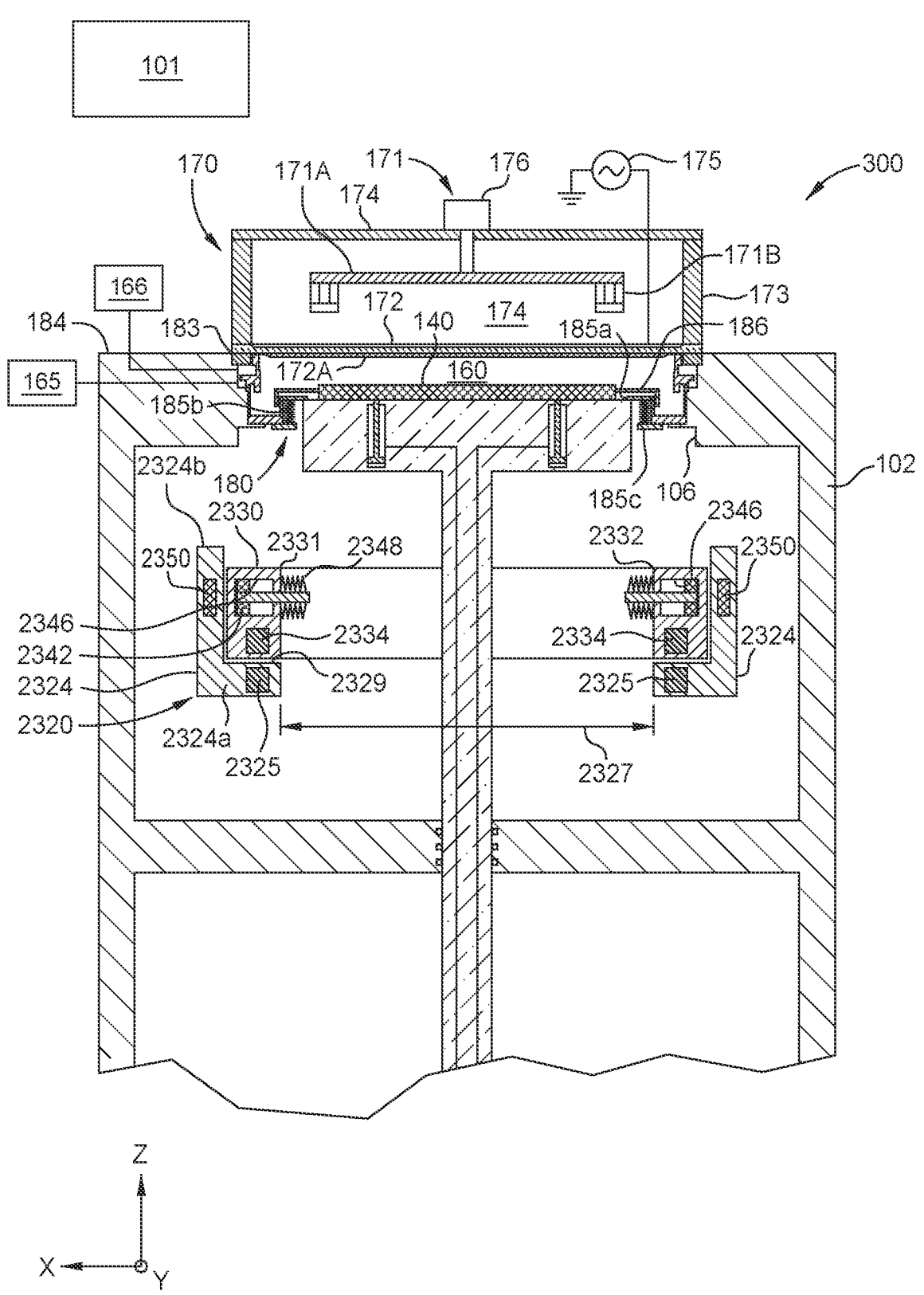
FIG. 23C is a side cross-sectional view of a station according to the embodiment of FIG. 238, showing the substrate positioned within a process region of the station.

FIGS. 23A-23C illustrates an alternative station 2300 for use in a substrate processing system. The station 2300 may be incorporated into any substrate processing system disclosed herein. A carrier 2330 is conveyed into the station 2300 with a substrate 140 thereon. The substrate 140 may be processed within the station 2300. The carrier 2330 is configured to avoid needing to be conveyed to a park position to facilitate processing of a substrate 140 within the station 2300. The alternative station 2300 may be controlled by the controller 101.

The station 2300 may be a process station with similar components as the process station 100 as indicated by the reference signs without reciting the description of these components of the process station 100 for brevity. A magnetic levitation assembly 2320 is disposed in a transport region 2312. The station 2300 may optionally include a source assembly 170, a process kit assembly 180, and a pedestal assembly 190.

The transport region 2312 may be in communication with a vacuum pump 114 to evacuate the transport region 112. For example, the vacuum pump 114 may reduce the pressure within the transport region 2312 to a sub-atmospheric pressure on the order of about $10^{-3}$ torr. The vacuum pump 114 may be a turbopump, cryopump, roughing pump or other useful device that is able to maintain a desired pressure within the transport region 2312.

FIG. 23A illustrates a cross-sectional view of the station 2300 showing a substrate 140 positioned above the pedestal 192. FIG. 23B illustrates a top cross-sectional view of the station 2300. FIG. 23C illustrates a side cross-sectional view of the station 2300 showing the substrate 140 positioned within the process region 160.

The magnetic levitation assembly 2320 includes a pair of rails 2324 spaced apart from one another. A space 2327 is present between the rails 2324 sized to allow the pedestal 192 to move to a processing position without contacting either rail 2324. The pedestal 192 is positioned below a space 2327 between the rails 2324, the opening 106, process kit assembly 180, and source assembly 170. The pedestal 192 is raised to a process position to process the substrate 140 within the station 2300 in a similar manner as disclosed with respect to station 100.

The substrate carrier 2330 may be formed from a non-magnetic material, such as aluminum. In some embodiments, it is beneficial to select the material from which the substrate carrier 2330 is made to include a material that can also withstand high processing temperatures. In one example, the substrate carrier 2330 is made from a ceramic material (e.g., alumina, quartz, zirconia, etc.). In some cases, the substrate carrier 2330 may be coated with an electrically conductive coating to resolve any charge build-up issues in the substrate carrier 2330 during processing within the station 2300.

Carrier 2330 includes a base 2331. A pedestal port 2332 is formed in the base 2331. The pedestal port 2332 is an opening in the base 2331 sized to allow the pedestal 192 to pass through the pedestal portion 2332 without contacting the carrier 2330. A plurality of magnets 2334, such as permanent magnets, may be arranged adjacent the edges of the base 2331 so that the magnets 2334 may interact with at least one rail 2324 of the magnetic levitation assembly 2320. In some configurations, the plurality of magnets 2334 may be arranged such that they form a Halbach array or other similar configuration. The plurality of magnets 2334 may be disposed or embedded within the base 2331.

A plurality of substrate support assemblies 2340 are coupled to the base 2331, such as being embedded within the base 2331 as shown in FIG. 23A. The substrate support assemblies 2340 are configured to support the substrate 140 at least partially within or above the pedestal port 2332. As shown in FIG. 23A, the substrate support assembly 2340 includes a magnet 2342 attached to a support member 2344 disposed within a bore 2346 formed within the base 2331. The magnet 2342 may be a permanent magnet and the support member 2344 may be a pin. The support member 2344 is shown in an extended position in FIG. 23A and a retracted position in FIG. 23O. The support member 2344 may be disposed in the port 2332 in both the extended and retracted positions, or the support member 2344 may be fully withdrawn into the base 2331 when in the retracted position. The support member 2344 is moved between the extended and retracted positions by a force exerted on the magnet 2342. The support member 2344 may be biased towards the extended position by a biasing member 2348. The biasing member 2348 may be an expandable bellows as shown in FIG. 23A. The biasing member 2348 may be disposed about the support member 2344. The biasing member 2348 may be disposed in the pedestal port 2332 and not disposed in the bore 2346, such as abutting a wall of the port as shown in FIG. 23A. In some embodiments, the biasing member 2348 may be a spring element disposed around the support member 2344 within the bore 2346.

In some embodiments, the substrate support assemblies 2340 are positioned above or below the pedestal port 2332 such that the support members 2344 are extended and retracted without entering the pedestal port 2332.

FIG. 23A is a cross-sectional view of the station 2300. The rails 2324 may be "L" shaped as shown with a first portion 2324a extending from a second portion 2324b. The rails 2324 include a plurality of magnets, such as electromagnets 2325, configured to interact with the magnets 2334 to levitate and/or convey the carrier 2330. The plurality of magnetics may be a combination of permanent magnets and electromagnets.

Electromagnets 2325, such as coils, are shown disposed in the first portion 2324a of the rails 2324 that can be used to generate an electromagnetic current to levitate and propel the carrier 2330. The coils 2325 are disposed below a shoulder 2329 formed on the surface of the first portion 2324a of the rails 2324. The carrier 2330 is levitated and moved above the shoulder 2329.

An electromagnet 2350 is positioned along each rail 2324 for each substrate support assembly 2340. Each electromagnet 2350 may be embedded within the second portion 2324b of each rail 2324. The electromagnets 2350 may be selectively turned on and off. For example, the magnet 2342 is attracted to the electromagnet 3250 when turned on, which causes the support member 2344 to move to the retracted position. When the electromagnet 2350 is turned off, the biasing member 2348 returns the support member 2344 to the extended position. In some embodiments, the polarity of the electromagnet 2350 is changed to push and pull the magnet 2342 to extend and retract the support member 2344.

The substrate 140 is supported by the substrate members 2344 when in the extend position to allow the carrier 2330 to move the substrate 140 into and out of the station 2300. When the carrier 2330 is conveyed into the station 2300 to process a substrate 140, the carrier 2330 is moved to a carrier transfer position as shown in FIG. 23A-23C. Each electromagnet 2350 is aligned with a corresponding magnet 2342 of a substrate support assembly 2340 when the carrier 2330 is in the carrier transfer position. Additionally, the pedestal port 2332 is positioned to accommodate the vertical movement of the pedestal 192 when the carrier 2330 is in the carrier transfer position.

Once the carrier 2330 is in the carrier transfer position, the pedestal 192 is moved to a pedestal transfer position underneath the substrate 140. The lift pins 198 are extended to disengage the substrate 140 from the substrate support members 2344 such that a clearance is present between the underside of the substrate 140 and the substrate members 2344. The extended substrate members 2344 block the vertical travel of the pedestal 192. The electromagnets 2350 are activated after the substrate 140 is disengaged from support members 2344 to retract the substrate support members 2344. The lift pins 198 are retracted to place the substrate 140 onto the support plate 194 of the pedestal 192. The pedestal 192 is raised through the pedestal port 2332 to the processing position shown in FIG. 23O after the substrate members 2344 are retracted to place the substrate 140 in the process region 160.

After the process is complete, the pedestal 192 is returned the pedestal transfer position and the lift pins 198 are extended to position the substrate 140 above the support plate 194, The substrate 140 and pedestal 192 are positioned such that the substrate members 2344 can extend beneath the substrate 140 without contacting the substrate 140 or pedestal 192. Once the substrate members 2344 are returned to the extended position, the lift pins 198 are retracted to place the bottom surface of the substrate 140 into engagement with the substrate members 2344. The lift pins 198 may be fully retracted and the pedestal 192 may be moved to a lower position after the substrate 140 is engaged with the substrate members 2344. The carrier 2330 may be conveyed out of the station 2300 by the magnetic levitation assembly 2320.

In some embodiments, the station 2300 includes a second magnetic levitation assembly above or below the magnetic levitation assembly 2320 within the transport region. This second magnetic levitation assembly is used to return a processed substrate through the station 2300 within the transport region 2312. The controller 101 may wait to raise the pedestal 192 to the process position until after a carrier 2330 conveying a substrate above the second magnetic levitation assembly enters and exits the station 2300.

Station 2300 reduces the amount of time spent positioning the carrier 2330 within the transport region by avoiding the need to move the carrier 2330 to a park position to facilitate lifting the pedestal 192. The length of the station 2300 is reduced because the second track segment is omitted. Additionally, the length of the magnetic rails 2324 may be shorter since the carrier 2330 is not moved to a park position within the transport region 112.

In some embodiments, the station 2300 includes a shutter garage and shutter assembly, such as the shutter garage 2103 and shutter assembly 2120 as shown in FIG. 21A-21B. Shutter disks can be transferred to the carrier 2330 and supported by the support members 2344 in a similar manner as the substrate 140.

Figure 24A:
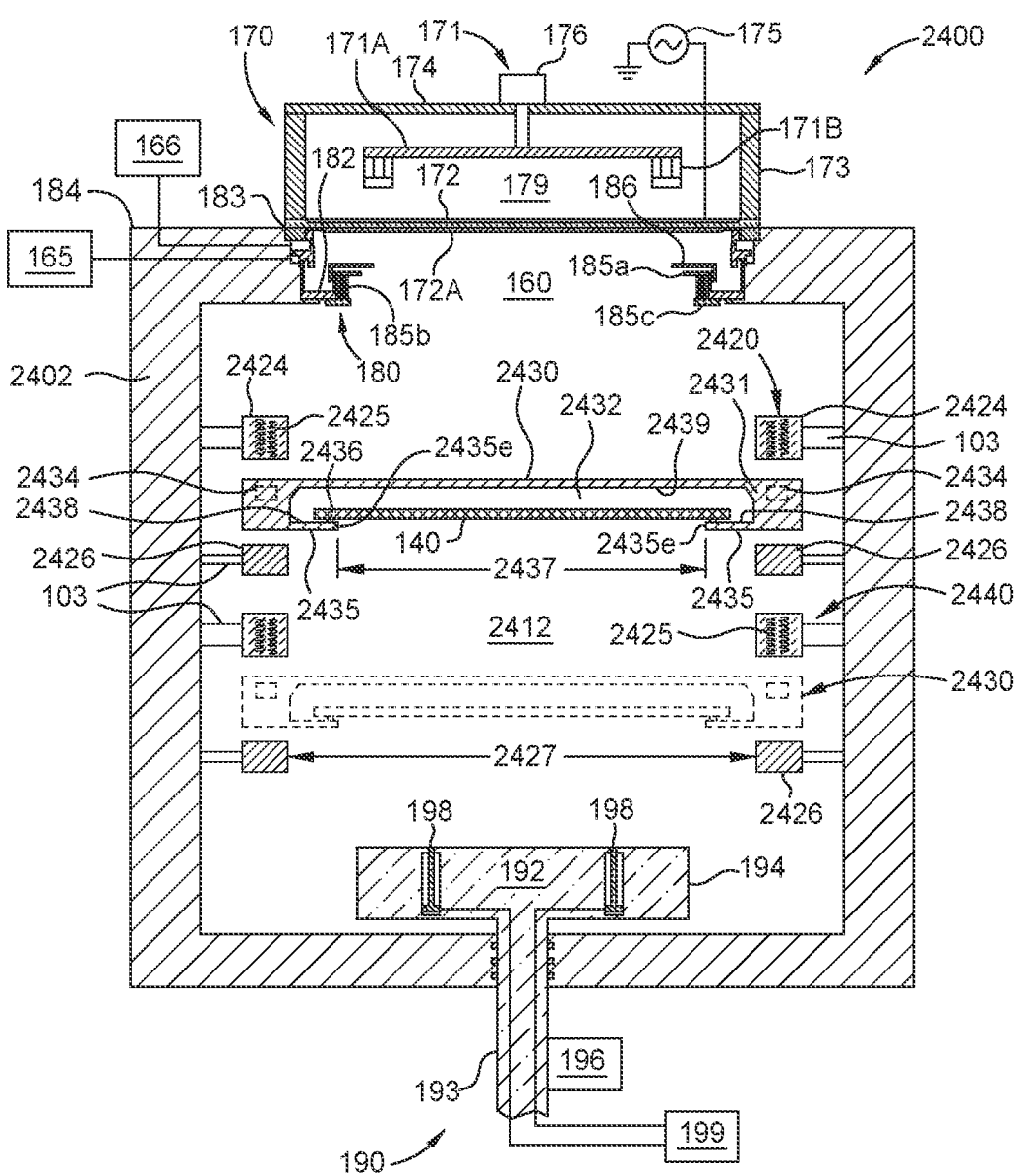
FIG. 24A is a cross-sectional view of a station according to one embodiment.

FIG. 24A-240 illustrates an alternative station 2400 and alternative carrier 2430. The carrier 2430 is conveyed into the station 2400 with a substrate 140 thereon. The substrate 140 may be processed within the station 2400. The alternative station 2400 is controlled by the controller 101. An X-Y-Z coordinate system is included to show the axial direction of travel of the components of the station 2400 and carrier 2430.

Figure 24B:
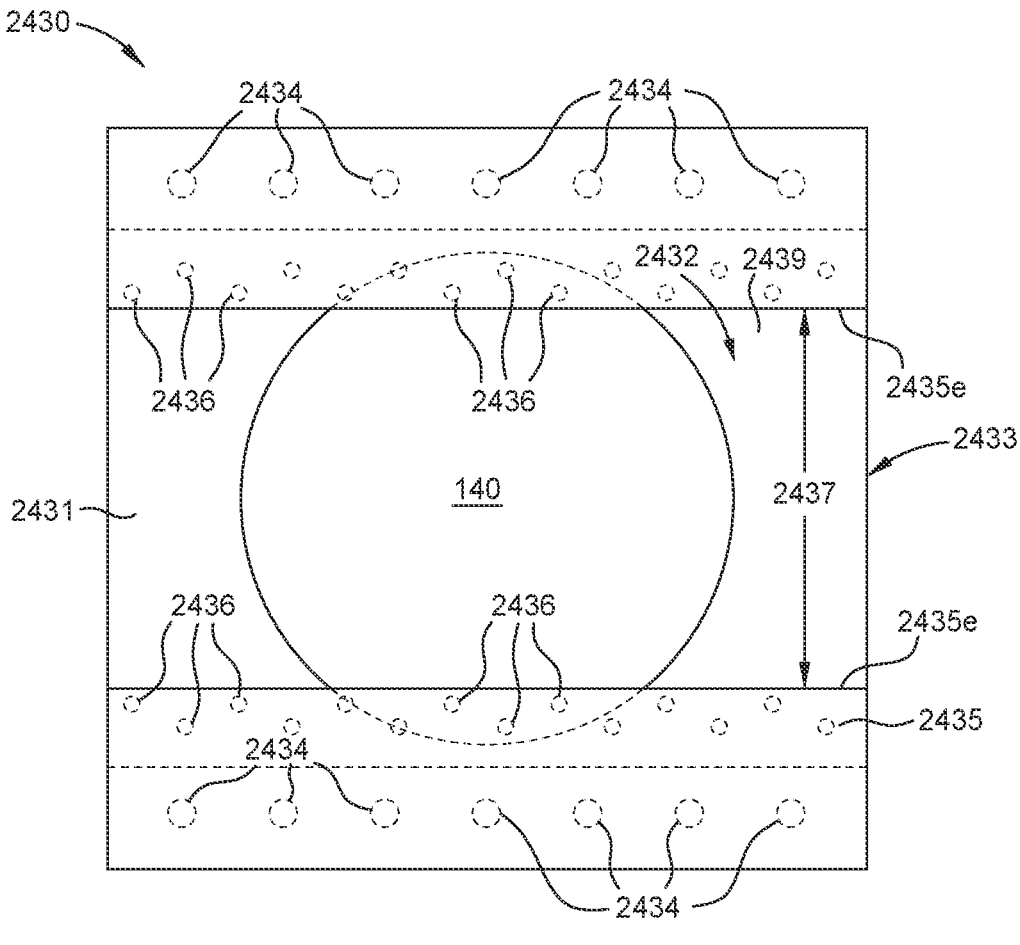
FIG. 24C is a cross-sectional view of the station according the embodiment of FIG. 24A, showing the substrate disengaged from the carrier.
Figure 24C:
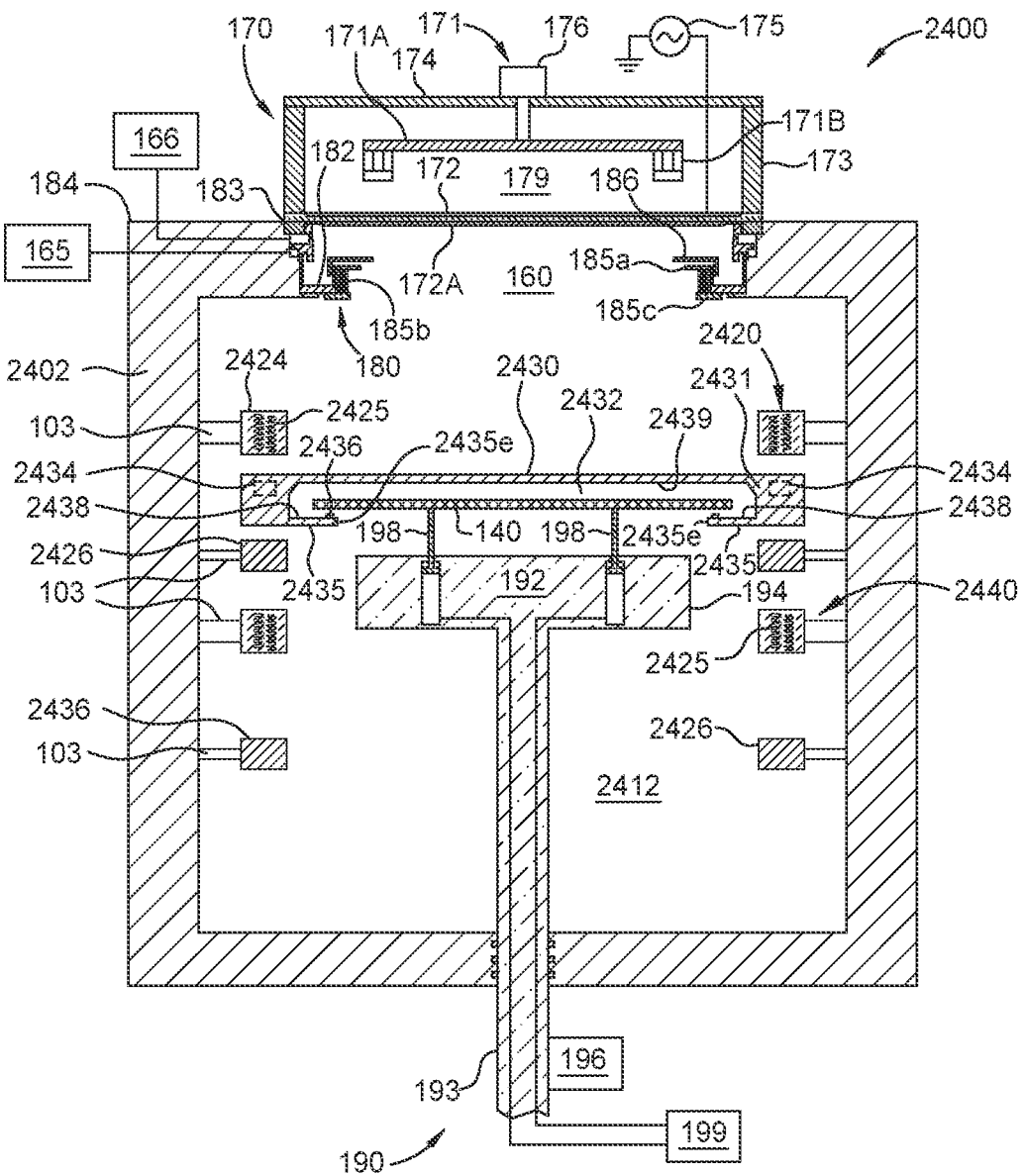

FIG. 24A illustrates a cross-sectional view of the station 2400 showing the substrate 140 engaged with the carrier 2430 and positioned above the pedestal 192. FIG. 24B illustrates a bottom view of the carrier 2430. FIG. 24C illustrates a side cross-sectional view of the station 2400 showing the substrate 140 disengaged from the carrier 2430.

The station 2400 may be a process station with similar components as the process station 100 as indicated by the reference signs without reciting the description of these components of the process station 100 for brevity. A first magnetic levitation assembly 2420 and an optional second magnetic levitation assembly 2440 may be disposed in a transport region 2412 within a housing 2402. The station 2400 may optionally include a source assembly 170, a process kit assembly 180, and a pedestal assembly 190.

The transport region 2412 may be in communication with a vacuum pump 114 to evacuate the transport region 2112. For example, the vacuum pump 114 may reduce the pressure within the transport region 2412 to a sub-atmospheric pressure on the order of about $10^{-3}$ torr. The vacuum pump 114 may be a turbopump, cryopump, roughing pump or other useful device that is able to maintain a desired pressure within the transport region 2412.

The substrate carrier 2430 may be formed from a non-magnetic material, such as aluminum. In some embodiments, it is beneficial to select the material from which the substrate carrier 2430 is made to include a material that can also withstand high processing temperatures. In one example, the substrate carrier 2430 is made from a ceramic material (e.g., alumina, quartz, zirconia, etc.). In some cases, the substrate carrier 2430 may be coated with an electrically conductive coating to resolve any charge build-up issues in the substrate carrier 2430 during processing within the station 2400.

The carrier 2430 includes a base 2431. An opening 2432 configured to receive the substrate 140 is formed in the base 2431. As shown in FIGS. 24A-13, two support members 2435 extends from the underside of the base 2431. Opposing edges 2435e of the support members 2435 are separated by a gap 2437. The gap 2437 is sized to allow the lift pins 198 to engage with the bottom side of the substrate 140. The support members 2435 and gap 2437 define the opening 2432. A portion of the opening 2432 is disposed between the overlapping and opposing upper surface 2438 of support members 2435 and the bottom surface 2439 of the base 2431. The support members 2435 may generally rectangular shaped as shown by the dashed lines in FIG. 248. The opening 2432 extends along the length of the carrier, and the substrate 140 can enter or exit either end 2433 of the opening 2432. The two open ends 2433 allow for the carrier 2430 to move in either direction to transfer a substrate 140 to lift pins 198.

In some embodiments, the carrier 2430 includes a single support member 2435. For example, the single support member may be generally U-shaped with the opposing edges 2435e being a generally U-shaped surface that defines an opening 2432 having only one open end 2433. In some embodiments, the carrier 2430 includes more than two support members 2435, such as three support members 2435.

A plurality of magnets 2434, such as permanent magnets, may be arranged adjacent the edges of the base 2431 so that the magnets 2434 may interact with at least one rail 2424 of the magnetic levitation assembly 2420. In some configurations, the plurality of magnets 2434 may be arranged such that they form a Halbach array or other similar configuration. The plurality of magnets 2434 may be disposed or embedded within the base 2431. The magnets 2434 may be partially disposed in the base 2431 and a respective support member 2435, or the magnets 2434 may be fully disposed in either the base 2431 or a respective support member 2435.

In some embodiments, the carrier 2430 includes one or more engagement members 2436 disposed on the upper surface 2438 of the support members 2435. The engagement members 2436 extend from the upper surface 2438. The substrate 140 is engaged with the engagement members 2436, rather than the upper surface 2438 to reduce the contact area between the substrate 140 and the carrier 2430. The engagement members 2436 serve as the substrate supporting surface of the carrier 2430. Reducing the contact area reduces the amount of particulates produced by the physical contact of the substrate 140 with the carrier 2430. The one or more engagement members 2436 may be integrally formed with or attached to the support member 2435. For example, the one or more engagement member 2436 may be a plurality of raised protrusions or a single ridge formed by the upper surface 2438 of a support member 2435. The engagement members may be spaced from the edge 2435e of the support member 2435. In some embodiments, the engagement members 2435 may be made of a ceramic or a material that is different from the material of the base 2431.

In some embodiments, the carrier 2430 does not include one or more engagement members 2436 and the substrate 140 is engaged with the upper surface 2438 of the support members 2435.

The first magnetic levitation assembly 2420 is configured to levitate and propel the carrier 2430 to positions within the transport region 2412 along a first conveyance plane, such as conveying the carrier 2430 along the Y-axis between a carrier park and a carrier transfer position. The first magnetic levitation assembly 2420 may include a pair of spaced apart first rails 2424 aligned to convey the carrier 2430 along the first conveyance plane. The first rails 2424 include a plurality of magnets, such as electromagnets 2425, configured to interact with the magnets 2434 to levitate and/or convey the carrier 2430 beneath the first rails 2424. The plurality of magnetics may be a combination of permanent magnets and electromagnets, Electromagnets 2425, such as coils, are shown disposed in the first rails 2424 that can be used to generate an electromagnetic current to levitate and propel the carrier 2430. The strength of the electromagnets 2425 may be adjusted to maintain a consistent distance between the first rails 2424 and the carrier 2430 levitated beneath. The first magnetic levitation assembly 2420 may also include an optional pair of second rails 2426 disposed beneath the pair of first rails 2424. These second rails 2426 are positioned parallel to the first rails 2424, and the carrier 2430 is conveyed between the first rails 2424 and second rails 2426 without contact. The second rails 2426 may not include magnets. The non-magnetic second rails 2426 are included to catch the carrier 2430 in the event of a power failure to the electromagnets 2425. In some embodiments, the second rails 2426 include a plurality of magnets, such as electromagnets, to assist in levitating and propelling the carrier 2430. In some embodiments, the second rails 2446 include a plurality of permanent magnets to levitate the carrier 2430 in the event of a power failure to the electromagnets 2425. The first rails 2424 and second rails 2426 are spaced apart such that a space 2427 is present between the rails. This space 2427 is sized to allow the pedestal assembly 190 to pass through the space 2427 in the Z-direction without contacting the rails 2424, 2426. The rails 2424, 2426 may be positioned with in the transport region 2412 by rail support members 103 connected to the housing 2402.

The station 2400 may optionally include a second magnetic levitation assembly 2440 disposed in the transport region 2412. The second magnetic levitation assembly 2440 is configured to levitate and propel the carrier 2430 to positions within the transport region 2412 along a second conveyance plane. The second magnetic levitation assembly 2440 may be the same as the first magnetic levitation assembly 2420 as shown in FIG. 24A, including a pair of first rails 2424 and second rails 2426. This second magnetic levitation assembly is used to return a processed substrate through the station 2400 within the transport region 2412.

The carrier 2430 may be incorporated into any of the substrate processing systems disclosed herein. In some embodiments, the carrier 2430 is levitated above a pair of magnetic rails instead of being levitated below a pair of magnetic rails as shown in FIG. 24A.

In some embodiments, the first and second magnetic levitation assemblies 2420, 2440 include a first and second track sections.

The carrier 2430 with a substrate 140 disposed in the opening 2432 is conveyed by the first magnetic levitation assembly 2420 to the carrier transfer position. The pedestal 192 is raised to the pedestal transfer position to place the support plate below the carrier 2430. The lift pins 198 are extended and pass through the gap 2437 to engage the bottom surface of the substrate 140. The lift pins 198 are further extended to disengage the substrate 140 from the engagement members 2436, which transfers the substrate 140 from the carrier 2430 to the lift pins 198, FIG. 24C illustrates the substrate 140 disengaged from the engagement members 2436 and supported by the lift pins 198. As shown, the substrate 140 is suspended in the opening 2432 on the lift pins 198 without contacting the bottom surface 2439 of the base 2431.

After the substrate 140 is transferred to the lift pins 198, the carrier 2430 is moved to the park position. The substrate 140 and lift pins 198 exit the open end 2433 of the opening 2432 as the carrier 2430 moves to the park position. The lift pins 198 are lowered to engage the substrate 140 with the support plate 194, and then the pedestal 192 is raised to the process position. After the substrate 140 is processed, the pedestal 192 is returned to the pedestal transfer position. The lift pins 198 are extended to position the substrate 140 above the support plate 194 such that the substrate 140 can enter the opening 2432 without contacting the carrier 2430. Once the substrate 140 is in position, the carrier 2430 is returned to the carrier transfer position. The lift pins 198 are then retracted to engage the substrate 140 with the engagement members 2436 to transfer the substrate 140 back onto the carrier 2430. Once the substrate 140 is transferred back to the carrier 2430, the carrier 2430 may be conveyed into a different station of a substrate processing system.

The controller 101 may wait to raise the pedestal 192 to the pedestal transfer position until after another carrier 2430 has been conveyed through the transport region 2412 by the second magnetic levitation assembly 2440.

In some embodiments, the carrier 2430 may be substituted for the carrier 130 or carrier 1730 in any of the disclosed substrate processing systems. For example, processing stations of a substrate processing system, such as system 600 or system 1800, may be configured to accommodate carrier 2430. The station 2400 may also be included in any of the disclosed substrate processing systems, such as system with one plane of conveyance (e.g., system 600) or a system with two planes of conveyance (e.g. system 1800).

In some embodiments, the carrier 2430 may be configured to convey two or more substrates simultaneously, such as by having two or more different sets of support member(s) 2435 for two or more different substrates. The station 2400 and include duplicate components needed to process two or more substrates simultaneously.

In some embodiments, the magnetic levitation assemblies 2420, 2440 may be arranged or modified to facilitate changing the axial direction of travel of the carrier 2430.

Figure 25A:
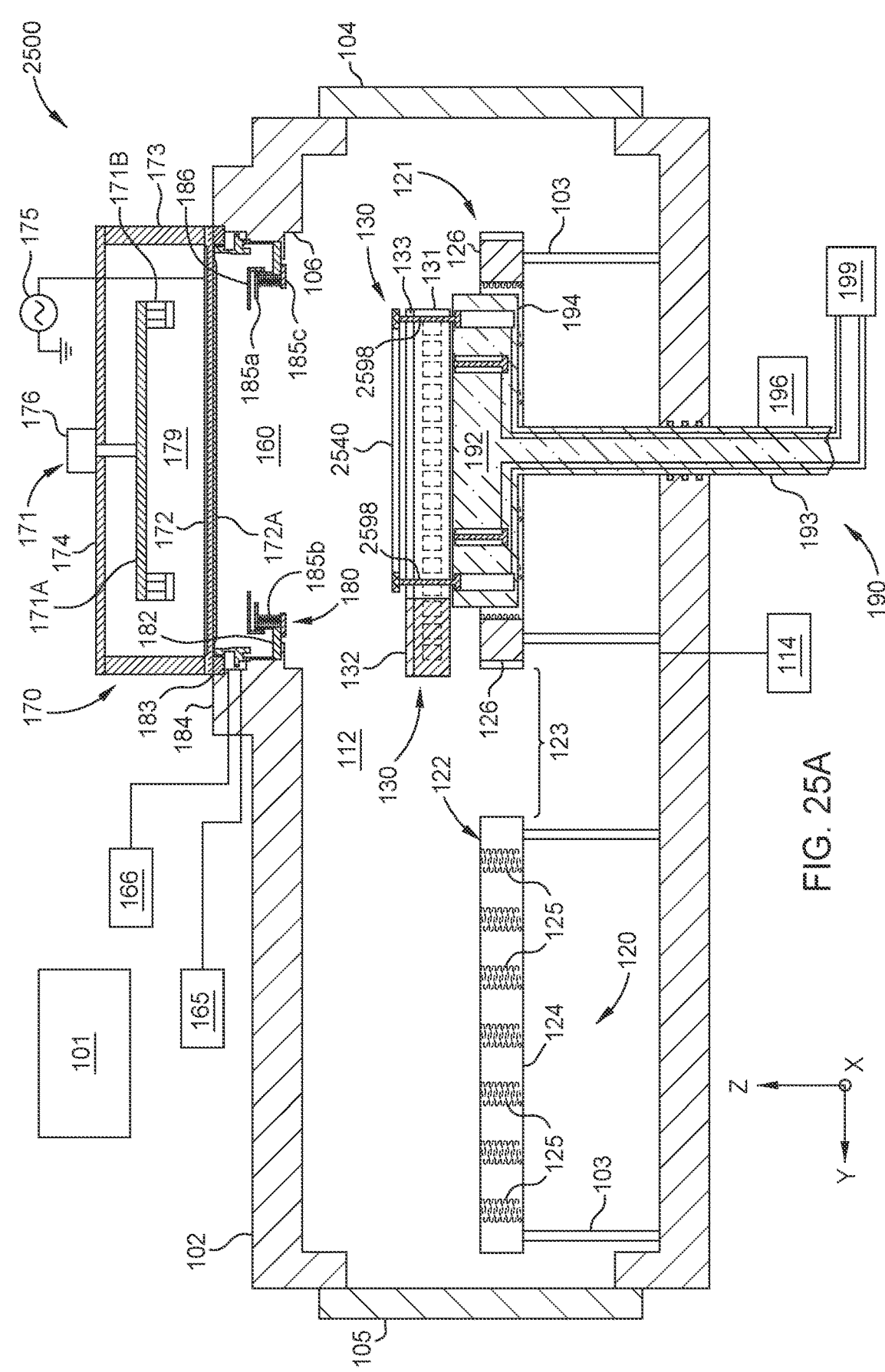
FIG. 25A is a side cross-sectional view of a process station with a deposition ring disposed above a carrier levitated in a carrier transfer position above magnetic levitation rails disposed therein, according to one embodiment.
Figure 25B:
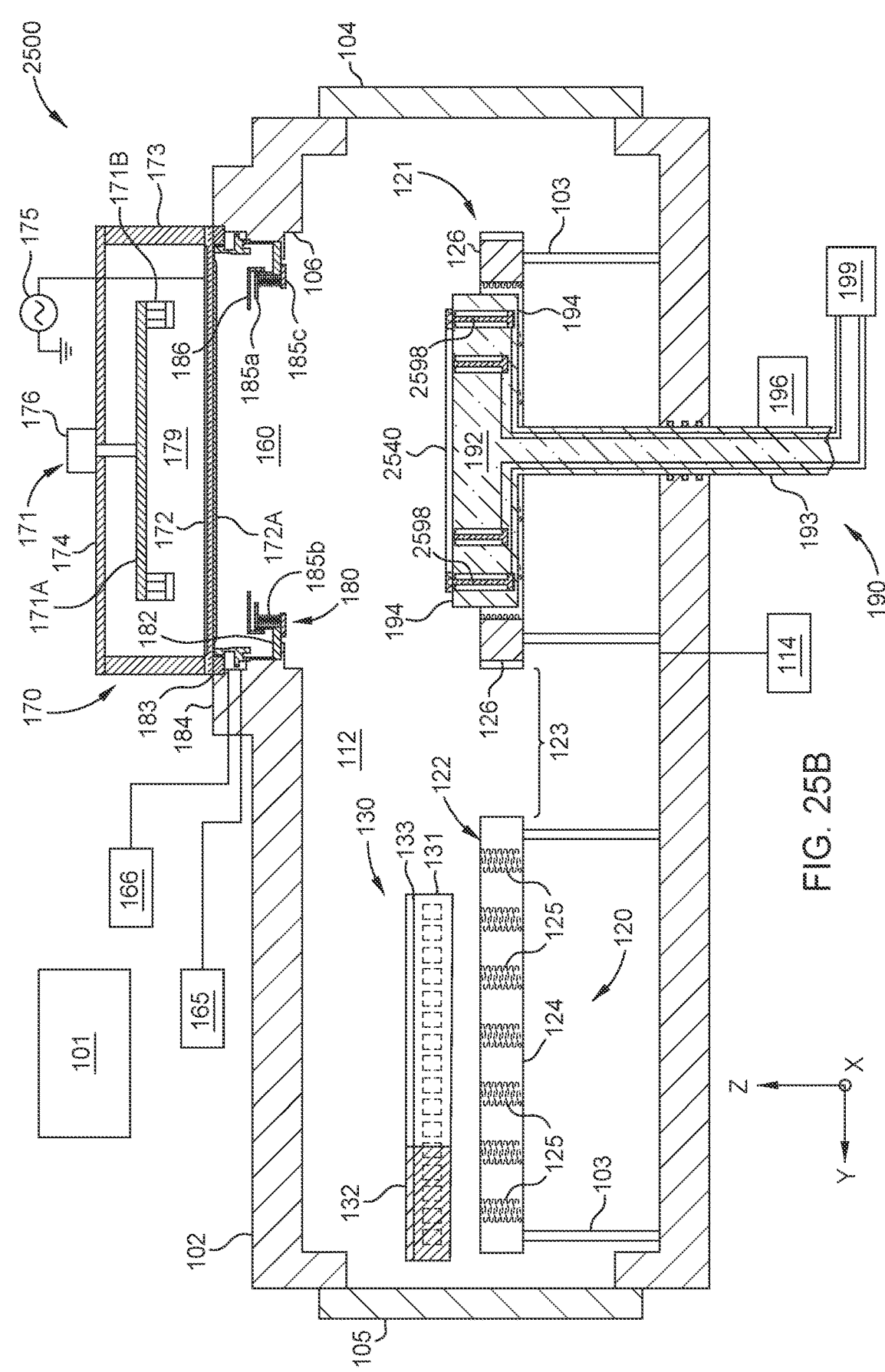
FIG. 25B is side cross-sectional view of a process station with a carrier in a park position and the deposition ring disposed on a pedestal, according to the embodiment of FIG. 25A.

In some embodiments, the carrier 2430 conveys a shutter disk or other component Instead of a substrate 140, FIG. 25A-25B illustrate a station 2500 that may be incorporated into any substrate processing system disclosed herein. Station 2500 may be a process station with similar components as process station 100 as indicated by the reference signs without reciting the description of these components of the process station 100 for brevity. The station 2500 may have one magnetic levitation assembly, such as magnetic levitation assembly 120 as shown in FIG. 25A, or the station 2500 may have two magnetic levitation assemblies similar to station 1700. The pedestal assembly 190 includes first lift pins 198 and second lift pins 2598. The second lift pins 2598 are disposed around the first lift pins 198. Thus, the second lift pins 2598 can be used to lift components with a larger diameter, such as the deposition ring 2540, as compared to first lift pins 198. The lift pin actuator 199 may operate the first lift pins 198 and the second lift pins 2598 independently.

Carrier 130 may be conveyed into the transport region 112 of the station 2500 with a replacement deposition ring 2540 engaged with the substrate supporting surface 132. The deposition ring 2540 may be engaged with the upper plate 185a and/or the cover ring 186 during processing of a subsequent substrate 140. The prior deposition ring may have already been removed from the station 2500 on a prior carrier 130.

To transfer the deposition ring 2540 from the carrier 130 to the support plate 194, the carrier 130 is conveyed to the carrier transfer position above the pedestal 192. The pedestal 192 is moved to the pedestal transfer position. The lift pin actuator 199 causes the second lift pins 2598 to extend through a slot 133 to lift the deposition ring 2540 above the substrate supporting surface 132 as shown in FIG. 25A. The carrier 130 is then moved to the park position. After the carrier 130 is clear from the pedestal 192 and the deposition ring 2540, the lift pin actuator 199 retracts the second lift pins 2598 to engage the deposition ring 2540 onto the support plate 194 as shown in FIG. 25B. The carrier 130 may then be conveyed out of the station 2500. An additional carrier 130 with a substrate 140 disposed thereon may be conveyed into the station 2500 for processing with the replacement deposition ring 2540.

In some embodiments, a substrate 140 and replacement deposition ring 2540 may be conveyed into station 2500 together on the same carrier 130. The lift pin actuator 199 may cause both the first lift pins 198 and second lift pins 2598 to extend and retract together to lift the substrate 140 and the deposition ring 2540, respectively, from the substrate supporting surface 132. The lift pin actuator 199 may then cause the first and second lift pins 198, 2598 to retract together to place the substrate 140 and the deposition ring 2540 onto the support plate 194. Similarly, a shutter disk and deposition ring 2540 may be conveyed into the station 2500 together on the same carrier 130.

The second lift pins 2598 may be used to transfer other components from a carrier to the supporting plate 194. For example, the second lift pins 2598 may be used to transfer a calibration element, edge ring, or a replacement component of the process kit assembly 180.

FIG. 26 is a flowchart of a method 2600 for moving a substrate, such as moving a substrate within a process station 100 or other station described in this disclosure on an carrier 130, 1730, 1930, or 2430. The controller 101 may control each operation of the method.

At operation 2602, the carrier with a substrate 140 disposed thereon is moved to a carrier transfer position by a magnetic levitation assembly, such as magnetic levitation assembly 120. The substrate 140 is positioned above the pedestal 192 in a first position when the carrier is in the carrier transfer position.

At operation 2604, the pedestal 192 is moved from the first position to a pedestal transfer position beneath the substrate 140.

At operation 2606, the substrate 140 is lifted off the substrate supporting surface 132 of the carrier. The substrate 140 may be lifted using lift pins 198 of the pedestal 192. The lift pins 198 may be extended to lift the substrate 140 off the carrier, such as lifting the substrate 140 off the substrate supporting surface 132.

At operation 2608, the carrier is moved to a carrier park position by the magnetic levitation assembly. The carrier is positioned away from the pedestal 192 and substrate 140 in the carrier park position such that the pedestal may lift the substrate 140 without lifting or contacting the carrier.

At operation 2610, the substrate 140 is lowered into engagement with the support plate 194 of the pedestal 192. The substrate 140 may be lowered by retracting the lift pins 198.

At operation 2612, the pedestal 192 is moved to a process position to place the substrate 140 in a process region 160 of the station. The pedestal 192 may sealingly engage with a sealing assembly 185 of the station.

At operation 2614, the substrate 140 is processed in the process region 160 by a source assembly 170 of the station. The substrate 140 may be subjected to a PVD, CVD, PECVD, ALD, PEAL©, etch, lithography, ion implantation, aching, cleaning, thermal process (e.g., rapid thermal processing, anneal, cool down, thermal management control) degas, and/or other useful substrate process within the process region 160.

At operation 2616, the pedestal 192 is moved from the process position to the pedestal transfer position after the substrate 140 is processed in the process region 160. The substrate 140 is disengaged from the support plate 194 of the pedestal 192 to provide a clearance for the carrier to move between the substrate 140 and the pedestal 192. The substrate 140 may be disengaged from the support plate 194 using the lift pins 198, such as extending the lift pins 198 to lift the substrate 140 off the support plate 194.

At operation 2618, the carrier is returned to the carrier transfer position from the carrier park position by the magnetic levitation assembly. The substrate supporting surface 132 of the carrier is disposed underneath the substrate 140 when the carrier is returned to the carrier transfer position.

At operation 2620, the substrate 140 is lowered into engagement with the substrate supporting surface of the carrier, such as engaging the substrate with an engagement member 2436. The substrate 140 may be lowered using the lift pins 198, such as retracting the lift pins 198. The pedestal 192 may be returned to the first position.

At operation 2622, the carrier with the substrate 140 disposed thereon is then moved out of the station using the magnetic levitation assembly. Another carrier with a substrate disposed thereon may move into the station to repeat the method 2600.

Figure 27:
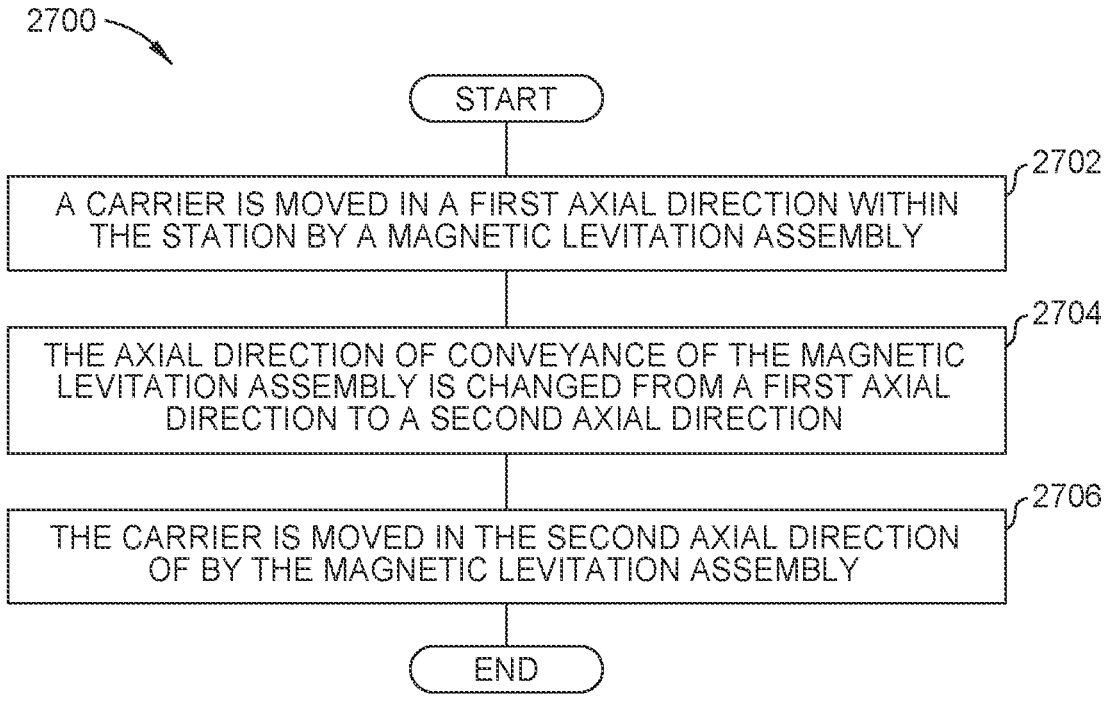
FIG. 27 is a flowchart of a method of operating a substrate station.

FIG. 27 is a flowchart of a method 2700 of operating a substrate station, such as a substrate station disclosed in this disclosure. The controller 101 may control each operation of the method.

At operation 2702, a carrier is moved in a first axial direction within the station by a magnetic levitation assembly.

At operation 2704, the axial direction of conveyance of the magnetic levitation assembly is changed from a first axial direction to a second axial direction. Prior to changing the axial direction of conveyance, the carrier may be conveyed between one or more positions along the first axial direction, such as between a carrier transfer position and a carrier park position.

For' example, the magnetic levitation assembly may be magnetic levitation assembly 220, 230. The direction of conveyance of the magnetic levitation assembly 220 is changed by moving the rails 224, 226 between positions. The magnetic levitation assembly 220 conveys the carrier in the Y-direction when the first rails 224 are in the upper position and the second rails 226 are in the lower position. The magnetic levitation assembly 220 conveys the carrier in the X-direction when the second rails 226 are in the upper position and the first rails 224 are in the lower position.

For example, the magnetic levitation assembly may be magnetic levitation assembly 320, 430. The direction of conveyance of the magnetic levitation assembly 320 is changed by rotating the first track segment 321. The carrier is moveable between positions along a first axial direction (e.g., Y-direction) while the first track segment 321 is in a first position. The first track segment 321 is rotatable to a second position by the actuator 330 to rotate the carrier. The carrier is moveable between positions along the second axial direction (e.g., X-direction) when the first track segment is in the second position.

For example, the magnetic levitation assembly may be magnetic levitation assembly 520, 530. In some embodiments, the axial direction of conveyance of the magnetic levitation assemblies 520, 530 may be changed by turning off the electromagnets 524e and turning on the electromagnets 526e, or vice versa. In some embodiments, the axial direction of conveyance of the magnetic levitation assemblies 520, 530 may be changed by decreasing the strength of the electromagnets 524e and increasing the strength of the electromagnets 526e, or vice versa.

At operation 2706, the carrier is moved in the second axial direction of by the magnetic levitation assembly.

In some embodiments, the substrate processing system includes one or more linear processing lines made of a plurality of stations. The linear processing He does not include a station with a magnetic levitation assembly configured to change the axial direction of travel from an X-direction to a Y-direction, or vice versa. A factory interface is disposed at each end of the linear processing He. The unprocessed substrate enters the Hear processing line from the first factory interface and travels to each station on a carrier. The substrate exits at the opposite end of the linear processing line and is transferred to the second factory interface.

In some embodiments, the substrate processing system has two processing lines including a plurality of stations. Each processing line has the first and last station in common. The substrate processing is offset by predetermined amount of time so that the shared station can accommodate processing in both processing lines. For example, the first substrate enters the first station and is then directed into the first processing line. A second substrate is placed into the first station after the predetermined amount of time and is then directed into the second processing line.

In one embodiment, the substrate processing system may have one or more lift assemblies to lift the carrier to a position above the other stations in the processing line. The carrier can be conveyed above the other stations in the processing line to an additional lift, which can then lower the carrier back into the first station in the processing line.

Each processing line the substrate processing system may be separated by a distance, such as a distance sufficient to allow a person to walk between the two adjacent processing lines to perform maintenance.

In some embodiments, each processing line may include two or more branches. For example, a first process station may take half the time to process the substrate than other stations. The first process station feeds the substrate into two other branches of stations connected thereto to maximize throughput.

In some embodiments, the permanent magnets are a rare-earth magnet, such as a samarium-cobalt and neodymium-iron-boron magnet.

In some embodiments, the carrier is changed from a first axial direction of travel to a second axial direction of travel. The carrier is conveyed linearly along the first axial direction and linearly along the second axial direction. The first axial direction of travel may be perpendicular to the second axial direction of travel. In some embodiments, the first axial direction of travel may not be perpendicular to the second axial direction of travel. For example, the first axial direction of travel may be at an angle of about 45 degrees from the second axial direction of travel.

The carrier may change directions along an axial direction of travel without changing the axial direction of travel. For example, the carrier may move in a linear fashion between a park and carrier transfer position along a first axial direction of travel, such as the direction of an X-axis of a substrate processing system, without changing to a different axial direction of travel, such as the direction of a Y-axis of the substrate processing system.

In one embodiment, a method of operating a substrate station includes moving a carrier in a first axial direction with a magnetic levitation assembly. The method further includes changing an axial direction of conveyance of the magnetic levitation assembly from a first axial direction to a second axial direction. The method further includes, moving the carrier in the second axial direction.

In some embodiments of the method of operating the substrate station, moving the carrier in the first axial direction includes moving the carrier between a carrier transfer position and a park position.

In some embodiments of the method of operating the substrate station, changing the axial direction of conveyance of the magnetic levitation assembly includes moving the first rails of the magnetic levitation assembly to a lower position while a second pair of rails are in an upper position.

In some embodiments of the method of operating the substrate station, changing the axial direction of conveyance of the magnetic levitation assembly includes rotating rails of the magnetic levitation assembly relative to a housing of a station.

In some embodiments of the method of operating the substrate station, the rails include a groove, wherein the carrier is partially disposed in the groove of each rail.

In some embodiments of the method of operating the substrate station, wherein changing the axial direction of conveyance of the magnetic levitation assembly includes shutting-off a plurality of first electromagnets disposed in first rails and increasing current supplied to a plurality of second electromagnets disposed in second rails.

In some embodiments of the method of operating the substrate station, changing the axial direction of conveyance of the magnetic levitation assembly includes decreasing current supplied to a plurality of first electromagnets disposed in first rails and increasing current supplied to a plurality of second electromagnets disposed in second rails.

In some embodiments, the rails of each magnetic levitation assembly may be attached directly to the walls of the housing of the station instead of being suspended in a position by a support member.

In some embodiments, any station disclosed herein, such as process station 100, may include one or more position sensors in communication with the controller 101 to detect the position of the carrier, such as carrier 130, in 3-dimensional space. The controller 101 may use these sensors to position the carrier. For example, these sensors may be used for local center finding to position the carrier in the carrier transfer position such that the center of the substrate 140 is positioned above the center of the pedestal 192.

In some embodiments, the rails of the magnetic levitation assembly only includes electromagnetic rails.

In some embodiments, the plurality of electromagnets in each rail are controlled independent from one another by the controller 101 to facilitate levitating and/or propelling a carrier. For example, the controller 101 may adjust the amount of current provided to each electromagnet such that each electromagnet generates an electromagnetic field of a different strength. For example, the controller may adjust the amount of current provided to each electromagnet such that two or more electromagnets generate an electromagnetic field of the same strength.

In some embodiments, a carrier may be conveyed from a first station to a second station in a first direction along a first direction of axial travel. The carrier may then be moved from the second station and back into the first station in a second direction along the first axial direction of travel.

In some embodiments, a carrier may convey a calibration element into the substrate processing system, such as conveying the calibration element into a processing station of the substrate processing system. The calibration element may be used to calibrate alignment or to calibrate sensors within a station, such as a temperature sensor.

In some embodiments, a carrier is configured to convey a replacement deposition ring into a station, such as process station 100. The carrier is conveyed to the carrier transfer position, where the pedestal 192 is raised to engage the deposition ring with the support plate 194 and further raised to disengage the deposition ring from the carrier.

In some embodiments, a carrier is configured to convey a deposition ring into a station, such as process station 100, simultaneously with a substrate 140 or shutter disk. The carrier is conveyed to the carrier transfer position, where the pedestal 192 is raised to the pedestal transfer position. The pedestal 192 is also raised to engage the deposition ring with the support plate 194 and disengage the deposition from the carrier. After the carrier is moved to the park position, the pedestal 192 is moved to the process position.

The substrate supporting surface of carriers 130, 1730, 1930, may include engagement members, such as engagement members 2436, to engage with and support the substrate 140, shutter disk, or other component.

In some embodiments, the carrier and substrate may be circulated through a substrate processing system disclosed herein multiple times to deposit multiple layers onto the substrate. The substrate may be conveyed multiple times through one or more stations of the substrate processing system, and may be processed therein, prior to being removed from the substrate processing system.

In some embodiments, a routing station may only be configured to change the axial direction of travel of a substrate carrier. In some embodiments, a routing station may also include components of a process station to process a substrate therein in addition to changing the axial direction of travel of a substrate carrier. In some embodiments, a routing station may be configured as a load lock or a buffer chamber.

In some embodiments, any substrate processing system disclosed herein may have multiple processing lines stacked on top of one another connected to the same factory interface. For example, substrate processing system 1000D may include two or more processing lines 1001 stacked on top of one another, such as two processing lines 1001 connected to the same interface. The processing in the stacked processing lines may be offset, such that the lower processing line is offset from the other processing line by 30 seconds.

In one embodiment, a method of processing a substrate within a substrate process station includes moving a carrier with a substrate disposed thereon to a carrier transfer position within the substrate process station to position the substrate above a pedestal. The carrier is moved by a magnetic levitation assembly disposed within the substrate process station. The method further includes moving the pedestal from a first position to a pedestal transfer position beneath the substrate. The method further includes extending lift pins to raise the substrate from a substrate supporting surface of the carrier. The method further includes moving the carrier to a park position within the substrate process station using the magnetic levitation assembly. The method further includes retracting the lift pins to lower the substrate onto a substrate supporting surface of the pedestal. The method further includes moving the pedestal to a process position to place the substrate in a process region of the substrate process station. The method further includes processing the substrate in the process region.

In some embodiments of the method of processing the substrate within the process station, the process may be at least one of chemical vapor deposition, plasma enhanced chemical vapor deposition, atomic layer deposition, plasma enhanced atomic layer deposition, etch, lithography, ion implantation, ashing, cleaning, thermal process, or a degas.

In some embodiments of the method of processing the substrate within the process station, the method further includes moving the pedestal from the process position to the pedestal transfer position. The method further includes extending the lift pins to raise the substrate from the substrate supporting surface of the pedestal.

In some embodiments of the method of processing the substrate within the process station, the method further includes moving the carrier from the park position to the carrier transfer position, using the magnetic levitation assembly, such that the substrate supporting surface of the carrier is beneath the substrate.

In some embodiments of the method of processing the substrate within the process station, the method further includes retracting the lift pins to engage the substrate with the substrate supporting surface of the carrier. The method further includes moving the pedestal to the first position. The method further includes conveying the carrier with the substrate disposed thereon out of the processing station with the magnetic levitation assembly.

In one embodiment, a substrate process station includes a housing including a transport region and process region. The process station further includes a source assembly. The process station further includes a magnetic levitation assembly disposed in the transport region. The magnetic levitation assembly includes a first track segment including a first plurality of electromagnets and a second track segment including a second plurality of electromagnets. The process station further includes a pedestal assembly comprising a pedestal disposed within the housing, an actuator assembly, and lift pins. The process station further includes a controller comprising a non-transitory computer-readable medium comprising instructions that when executed by one or more processors in the controller cause the substrate process station to conduct an operation. The operation including activating one or more of the first plurality of electromagnets to move a carrier with a substrate disposed thereon to a carrier transfer position above the pedestal. The operation further including actuating the actuator assembly to move the pedestal from a first position to a pedestal transfer position beneath the substrate disposed on the carrier. The operation further including extending the lift pins to disengage the substrate from the carrier. The operation further including activating one or more of the first plurality of electromagnets and one or more of the second plurality of electromagnets to move the carrier from the carrier transfer position to a carrier park position within the substrate process station. The operation further including retracting the lift pins to place the substrate on a surface of the pedestal. The operation further including actuating the actuator assembly to move the pedestal to a process position to place the substrate in the process region. The operation further including operating the source assembly to process the substrate within the process region.

In some embodiments of a substrate process station, the process may be at least one of chemical vapor deposition, plasma enhanced chemical vapor deposition, atomic layer deposition, plasma enhanced atomic layer deposition, etch, lithography, ion implantation, ashing, cleaning, thermal process, or a degas.

In some embodiments of a substrate process station, the operation further comprises actuating the actuator assembly to move the pedestal from the process position to the pedestal transfer position and extending the lift pins to disengage the substrate from the pedestal.

In some embodiments of a substrate process station, the operation further comprises activating one or more of the first plurality of electromagnets and one or more of the second plurality of electromagnets to move the carrier from the carrier park position to the carrier transfer position.

In some embodiments of a substrate process station, the operation further comprises retracting the lift pins to engage the substrate with the carrier.

In some embodiments of a substrate process station, the operation further comprise activating one or more of the first plurality of electromagnets and one or more of the second plurality of electromagnets to move the carrier with the substrate disposed thereon out of the process station.

While the foregoing is directed to embodiments of the present disclosure, other and further embodiments of the disclosure may be devised without departing from the basic scope thereof, and the scope thereof is determined by the claims that follow,

What is claimed is:

1. A shutter station, comprising:
a housing including a transport region;
a first magnetic levitation assembly disposed in the transport region configured to levitate and propel a first carrier;
a shutter garage coupled to the housing;
an arm moveable from a first position to a second position, wherein a substrate supported on the arm is disposed in the shutter garage when the arm is in the first position; and
a pedestal disposed within the transport region and moveable to a transfer position to receive a shutter disk disposed on the arm in the second position, wherein the shutter disk is disposed above the pedestal when the arm is in the second position, and wherein the arm is disposed above the pedestal and below the first magnetic levitation assembly in the second position.

2. The shutter station of claim 1, the arm further comprising a recess configured to receive a plurality of lift pins coupled to the pedestal.

3. The shutter station of claim 1, further comprising:
a second magnetic levitation assembly disposed in the transport region configured to levitate and propel a second carrier, wherein the second magnetic levitation assembly is disposed below the first magnetic levitation assembly.

4. The shutter station of claim 3, wherein the arm is disposed below the second magnetic levitation assembly in the second position.

5. The shutter station of claim 3, wherein the first and second magnetic levitation assemblies each include at least one pair of magnetic rails.

6. The shutter station of claim 1, wherein the housing includes a process region, and the pedestal is moveable from the transfer position to a process position to place the shutter disk in the process region.

7. A shutter station, comprising:
a housing including a transport region;
a first magnetic levitation assembly disposed in the transport region configured to levitate and propel a first carrier between a park position and a carrier transfer position; and
a shutter assembly, the shutter assembly including:
a shutter carriage including a first support member configured to support a first shutter disk;
an actuation assembly configured to move the shutter carriage within the housing, wherein:
the shutter carriage is configured to be lowered from a first position to a second position to place the first shutter disk in a first shutter transfer position above the first carrier; and
the shutter carriage is configured to be lowered from the second position to a third position while the first carrier is in the park position to engage the first shutter disk with the first carrier and to disengage the first shutter disk from the first support member.

8. The shutter station of claim 7, wherein the shutter carriage includes a second support member configured to support a second shutter disk, wherein the shutter carriage is moveable from the first position to a fourth position to place the second shutter disk in a second shutter transfer position above the first carrier; and
the shutter carriage is moveable from the fourth position to a fifth position while the first carrier is in the park position to engage the second shutter disk with a second carrier and to disengage the second shutter disk from the second support member.

9. The shutter station of claim 8, wherein the first and second support members are blades.

10. The shutter station of claim 7, wherein the first support member is sized to move within a recess of the first carrier without contacting the first carrier as the shutter carriage moves from the second position to the third position.

11. The shutter station of claim 7, wherein the first magnetic levitation assembly includes at least one pair of rails including a plurality of electromagnets.

12. The shutter station of claim 7, further comprising:
a second magnetic levitation assembly disposed in the transport region below the first magnetic levitation assembly, wherein the second magnetic levitation assembly is configured to levitate and propel a second carrier.

13. The shutter station of claim 7, wherein the shutter carriage is disposed in a shutter garage in the first position, and wherein the first carrier is conveyable underneath the shutter carriage by the first magnetic levitation assembly without contacting the shutter carriage while the shutter carriage is in the first position.

14. The shutter station of claim 7, wherein the first support member is disposed in a recess of the first carrier when the shutter carriage is in the second position.

15. A method of transferring a shutter to a carrier, comprising:
moving an arm with a shutter disk disposed thereon from a first position to a second position to place the shutter disk above a pedestal;
extending a plurality of lift pins coupled to the pedestal into a recess of the arm to engage the shutter disk and to disengage the shutter disk from the arm;
moving the arm to the first position after the shutter disk is disengaged from the arm; and
retracting the plurality of lift pins to engage the shutter disk with the carrier levitated above a magnetic levitation assembly, wherein the arm is positioned above the pedestal and below the magnetic levitation assembly when in the second position.

16. The method of claim 15, wherein the carrier is moved from a park position to a carrier transfer position by the magnetic levitation assembly to position the carrier underneath the shutter disk prior to retracting the plurality of lift pins.

17. The method of claim 15, wherein a plurality of support members of the carrier are extended between the shutter disk and the pedestal prior to retracting the plurality of lift pins.

18. The method of claim 17, wherein the retracting the plurality of lift pins engages the shutter disk with the plurality of support members.

* * * * *